(12) United States Patent
Kaneko et al.

(10) Patent No.: US 9,508,934 B2
(45) Date of Patent: Nov. 29, 2016

(54) ORGANIC FILM TRANSISTOR, ORGANIC SEMICONDUCTOR FILM, AND ORGANIC SEMICONDUCTOR MATERIAL AND USE APPLICATIONS THEREOF

(71) Applicant: FUJIFILM Corporation, Tokyo (JP)

(72) Inventors: Akihiro Kaneko, Kanagawa (JP); Koji Takaku, Kanagawa (JP); Yasunori Yonekuta, Kanagawa (JP); Yuki Hirai, Kanagawa (JP); Hiroki Sugiura, Kanagawa (JP); Masashi Koyanagi, Kanagawa (JP); Kensuke Masui, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/993,403

(22) Filed: Jan. 12, 2016

(65) Prior Publication Data

US 2016/0126460 A1    May 5, 2016

Related U.S. Application Data

(63) Continuation of application No. PCT/JP2014/068972, filed on Jul. 17, 2014.

(30) Foreign Application Priority Data

Jul. 19, 2013 (JP) ................................. 2013-150934
Jul. 19, 2013 (JP) ................................. 2013-151034

(51) Int. Cl.
  *C08G 59/00* (2006.01)
  *H01L 51/00* (2006.01)
  *C08G 61/12* (2006.01)
  *C08L 65/00* (2006.01)
  *H01L 51/05* (2006.01)

(52) U.S. Cl.
  CPC ......... *H01L 51/0036* (2013.01); *C08G 61/126* (2013.01); *C08L 65/00* (2013.01);
  (Continued)

(58) Field of Classification Search
  CPC ....... C07C 17/12; C07C 25/02; C07C 45/46; C07C 49/697; C07C 49/665

USPC ......................................................... 528/403
See application file for complete search history.

(56) References Cited

U.S. PATENT DOCUMENTS

2004/0116700 A1    6/2004  Hartmann et al.
2009/0036643 A1*   2/2009  Marks .................... C07C 17/12
                                              528/380

OTHER PUBLICATIONS

Translation of the International Preliminary Report on Patentability issued in corresponding PCT Application No. PCT/JP2014/068972 mailed Jan. 28, 2016.

(Continued)

*Primary Examiner* — Shane Fang
(74) *Attorney, Agent, or Firm* — Studebaker & Brackett PC

(57) ABSTRACT

An organic film transistor containing a compound, which is composed of n repeating units represented by Formula (101-1), in a semiconductor active layer is an organic film transistor using a compound having high carrier mobility and high solubility in an organic solvent;

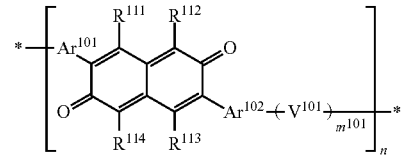

Formula (101-1)

where each of $R^{111}$ to $R^{114}$ independently represents a hydrogen atom or a substituent; each of $Ar^{101}$ and $Ar^{102}$ independently represents a heteroarylene group or an arylene group; $V^{101}$ represents a divalent linking group; m represents an integer of 0 to 6; when m is equal to or greater than 2, two or more groups represented by $V^{101}$ may be the same as or different from each other; and n is equal to or greater than 2.

35 Claims, 1 Drawing Sheet

(52) U.S. Cl.
CPC ... *H01L51/0043* (2013.01); *C08G 2261/1412* (2013.01); *C08G 2261/1424* (2013.01); *C08G 2261/18* (2013.01); *C08G 2261/314* (2013.01); *C08G 2261/3223* (2013.01); *C08G 2261/3243* (2013.01); *C08G 2261/344* (2013.01); *C08G 2261/414* (2013.01); *C08G 2261/92* (2013.01); *H01L 51/0003* (2013.01); *H01L 51/0545* (2013.01); *H01L 51/0558* (2013.01)

(56) References Cited

OTHER PUBLICATIONS

The extended European search report issued by the European Patent Office on Jun. 20, 2016, which corresponds to European Patent Application No. 14826059.9-1552 and is related to U.S. Appl. No. 14/993,403.

International Search Report and Written Opinion—PCT/JP2014/068972 mailed Sep. 2, 2014.

Chung et al., "Alternating Copolymers Containing Bithiophene and Dialkoxynaphthalene for the Applications to Field Effect Transistor and Photovoltaic Cell: Performance and Stability", Chem. Mater., 2009, 21, pp. 5499-5507.

Giguère et al., "4,10-Dibromoanthanthrone as a New Building Block for p-Type, n-Type, and Ambipolar n-Conjugated Materials", Chemistry-A European Journal, 2013, 19(1), pp. 372-381.

Taguchi et al., "Actinoperylone, a novel perylenequinone-type shunt product, from a deletion mutant of the actVA-ORF5 and ORF6 genes for actinorhodin biosynthesis in Streptomyces coelicolor A3(2)", Tetrahedron Letters, 2008, 49 (7), pp. 1208-1211.

* cited by examiner

ORGANIC FILM TRANSISTOR, ORGANIC SEMICONDUCTOR FILM, AND ORGANIC SEMICONDUCTOR MATERIAL AND USE APPLICATIONS THEREOF

CROSS-REFERENCE TO RELATED APPLICATIONS

This application is a Continuation of PCT International Application No. PCT/JP2014/068972, filed on Jul. 17, 2014, which claims priority under 35 U.S.C. Section 119(a) to Japanese Patent Application No. 2013-150934 filed on Jul. 19, 2013 and Japanese Patent Application No. 2013-151034 filed on Jul. 19, 2013. Each of the above applications is hereby expressly incorporated by reference, in its entirety, into the present application.

BACKGROUND OF THE INVENTION

1. Field of the Invention

The present invention relates to an organic film transistor, an organic semiconductor film, an organic semiconductor material, and the like. Specifically, the present invention relates to a compound having a repeating unit composed of a linking group which can form a hydrogen bond with at least two cyclohexadienone ring-condensed structures, an organic film transistor containing the compound, a composition containing the compound, an organic semiconductor material for a non-light-emitting organic semiconductor device containing the compound, a material for an organic film transistor containing the compound, a coating solution for a non-light-emitting organic semiconductor device containing the compound, and an organic semiconductor film for a non-light-emitting organic semiconductor device containing the compound.

2. Description of the Related Art

The devices using an organic semiconductor material are drawing great attention because they are expected to be superior to devices using a conventional inorganic semiconductor material such as silicon in many ways. Examples of the devices using an organic semiconductor material include a photoelectric conversion element, such as an organic film solar cell or a solid-state imaging element using an organic semiconductor material as a photoelectric conversion material, and a non-light-emitting organic transistor. The devices using an organic semiconductor material are likely to make it possible to prepare a large-area element at a lower temperature and lower cost compared to the devices using an inorganic semiconductor material. Furthermore, because the characteristics of the material can be easily changed by varying the molecular structure thereof, the material shows high variation, and it is possible to realize functions or elements which cannot be obtained from the inorganic semiconductor material.

For example, "Chem. Mater., 2009, 21, 5499" describes a polymer compound having a repeating unit composed of a dialkoxy-substituted naphthalenyl group and a linking group having two thiophene skeletons. According to the document, the polymer compound can be used as a semiconductor material and can be used for an organic film transistor.

For example, "Chemistry—A European Journal (2013), 19(1), 372-381" describes a low-molecular weight compound having two quinone ring-condensed structures, in which six rings are condensed, and the portion of the ring-condensed structure is constituted with an alkylthienyl group. According to the document, the low-molecular weight compound can be used as a semiconductor material and can be used for an organic film transistor.

US2004/116700A1 describes a low-molecular weight compound having two cyclohexadienone ring-condensed structures, in which nine rings are condensed. However, US2004/116700A1 does not describe or imply the use of the low-molecular weight compound as a semiconductor material or an organic film transistor.

"Tetrahedron Letters (2008), 49(7), 1208-1211" describes actinoperylone which is a naturally occurring low-molecular weight compound having two quinone ring-condensed structures in which seven rings are condensed. However, "Tetrahedron Letters (2008), 49(7), 1208-1211" does not describe or imply the use of the low-molecular weight compound as a semiconductor material or an organic film transistor.

SUMMARY OF THE INVENTION

In the polymer compound described in "Chem. Mater., 2009, 21, 5499", a $\pi$ plane widens to a small extent, and the overlapping of HOMO does not sufficiently occur. Furthermore, the polymer compound exhibits low carrier mobility such as 0.02 $cm^2/Vs$. Therefore, it was found that sufficient transistor characteristics cannot be obtained from the compound.

US2004/116700A1 describes a low-molecular weight compound having high $\pi$ planarity, but it does not describe the use of the compound in a semiconductor or an organic transistor. As a result of using the compound described in US2004/116700A1, the inventors of the present invention found that it is difficult to use the compound for an organic film transistor because the compound exhibits low solubility in an organic solvent.

The low-molecular weight compound described in "Chemistry-A European Journal (2013), 19(1), 372-381" is a compound having a structure in which only high $\pi$ planarity is prioritized. As a result of using the compound described in "Chemistry-A European Journal (2013), 19(1), 372-381", the inventors of the present invention found that it is difficult to use the compound for an organic film transistor because the compound exhibits low solubility in an organic solvent.

"Tetrahedron Letters (2008), 49(7), 1208-1211" describes a low-molecular weight compound which is just a naturally occurring compound, but it does not describe the use of the compound in a semiconductor or an organic film transistor. Although a hydrogen bond can be formed in molecules of the compound, the hydrogen bond is not expected to be able to increase the $\pi$ planarity owing to the structure of the compound. In addition, because the compound has a carboxylic acid, the use of the compound in a semiconductor active layer of an organic film transistor cannot be considered.

In order to solve the above problems of the related art, the inventors of the present invention conducted an investigation. An object of the present invention is to provide a compound which results in high carrier mobility when being used in a semiconductor active layer of an organic film transistor and exhibits high solubility in an organic solvent, and an organic film transistor which uses the compound.

In order to achieve the aforementioned object, the inventors of the present invention conducted an intensive research. As a result, they obtained the following knowledge. Due to the structure of the repeating unit, which is formed by introducing a heteroarylene group or an arylene group as a linking group into a position adjacent to a carbonyl group on two cyclohexadienone ring-condensed structures, an intramolecular hydrogen bond is formed between the carbonyl group of the cyclohexadienone ring-condensed structures and an atom of a ring of the heteroarylene group or the arylene group adjacent to the carbonyl group, and thus the planarity is increased. Consequently, the overlapping of HOMO sufficiently occurs, and the carrier mobility increases. The inventors also obtained the following knowledge. Generally, a compound having high planarity and high carrier mobility is known to have low solubility, but the aforementioned compound exhibits unexpectedly high solubility in a solvent, and accordingly, high carrier mobility and high solubility can be achieved simultaneously. Based on the above knowledge, the inventors accomplished the present invention. Herein, the polymer compound described in "Chem. Mater., 2009, 21, 5499" has a structure in which the aforementioned hydrogen bonding structure cannot be obtained.

The present invention which is specific means for achieving the aforementioned object is constituted as below.

[1] An organic film transistor containing a compound, which is composed of n repeating units represented by the following Formula (1-1), (1-2), (101-1), or (101-2), in a semiconductor active layer;

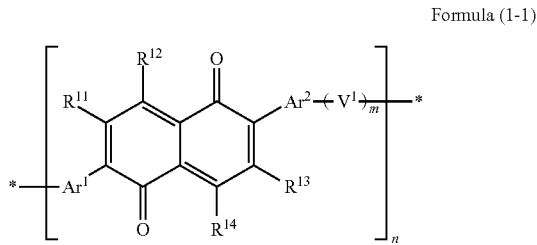

Formula (1-1)

in Formula (1-1), each of $R^{11}$ to $R^{14}$ independently represents a hydrogen atom or a substituent; each of $Ar^1$ and $Ar^2$ independently represents a heteroarylene group or an arylene group; $V^1$ represents a divalent linking group; m represents an integer of 0 to 6; when m is equal to or greater than 2, two or more groups represented by $V^1$ may be the same as or different from each other; and n is equal to or greater than 2;

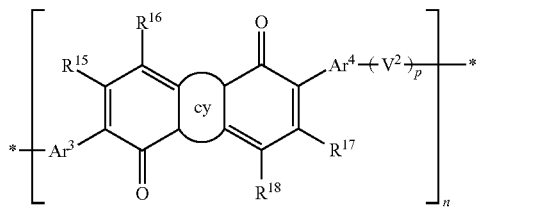

Formula (1-2)

in Formula (1-2), Cy represents a benzene ring, a naphthalene ring, or an anthracene ring; each of $R^{15}$ to $R^{18}$ independently represents a hydrogen atom or a substituent; each of $Ar^3$ and $Ar^4$ independently represents a heteroarylene group or an arylene group; $V^2$ represents a divalent linking group; p represents an integer of 0 to 6; when p is equal to or greater than 2, two or more groups represented by $V^2$ may be the same as or different from each other; and n is equal to or greater than 2;

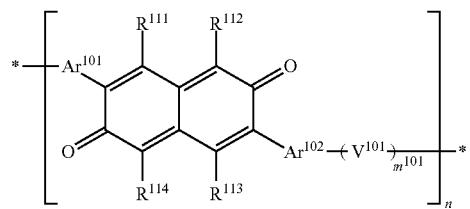

Formula (101-1)

in Formula (101-1), each of $R^{111}$ to $R^{114}$ independently represents a hydrogen atom or a substituent; each of $Ar^{101}$ and $Ar^{102}$ independently represents a heteroarylene group or an arylene group; $V^{101}$ represents a divalent linking group; $m^{101}$ represents an integer of 0 to 6; when $m^{101}$ is equal to or greater than 2, two or more groups represented by $V^{101}$ may be the same as or different from each other; and n is equal to or greater than 2; and

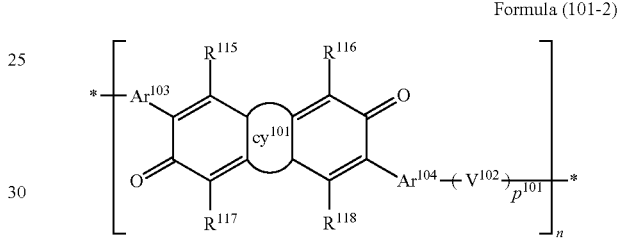

Formula (101-2)

in Formula (101-2), $Cy^{101}$ represents a benzene ring, a naphthalene ring, or an anthracene ring; each of $R^{115}$ to $R^{118}$ independently represents a hydrogen atom or a substituent; each of $Ar^{103}$ and $Ar^{104}$ independently represents a heteroarylene group or an arylene group; $V^{102}$ represents a divalent linking group; $p^{101}$ represents an integer of 0 to 6; when $p^{101}$ is equal to or greater than 2, two or more groups represented by $V^{102}$ may be the same as or different from each other; and n is equal to or greater than 2.

[2] The organic film transistor described in [1] preferably containing a compound, which is composed of n repeating units represented by the following Formula (1-1) or (1-2), in the semiconductor active layer.

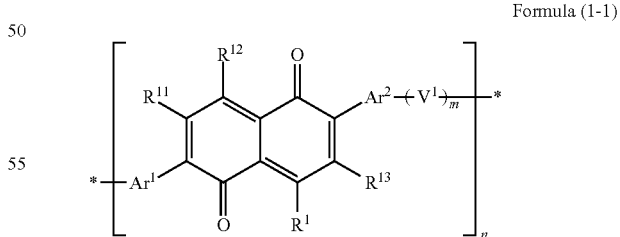

Formula (1-1)

In Formula (1-1), each of $R^{11}$ to $R^{14}$ independently represents a hydrogen atom or a substituent; each of $Ar^1$ and $Ar^2$ independently represents a heteroarylene group or an arylene group; $V^1$ represents a divalent linking group; m represents an integer of 0 to 6; when m is equal to or greater than 2, two or more groups represented by $V^1$ may be the same as or different from each other; and n is equal to or greater than 2; and Formula (1-2)

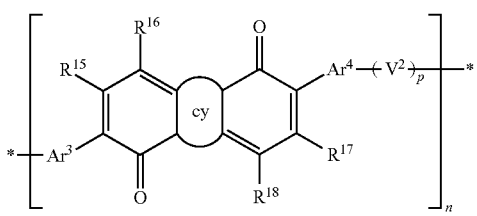

in Formula (1-2), Cy represents a benzene ring, a naphthalene ring, or an anthracene ring; each of $R^{15}$ to $R^{18}$ independently represents a hydrogen atom or a substituent; each of $Ar^3$ and $Ar^4$ independently represents a heteroarylene group or an arylene group; $V^2$ represents a divalent linking group; p represents an integer of 0 to 6; when p is equal to or greater than 2, two or more groups represented by $V^2$ may be the same as or different from each other; and n is equal to or greater than 2.

[3] The organic film transistor described in [1] or [2], in which the compound composed of n repeating units represented by Formula (1-2) is preferably a compound composed of n repeating units represented by the following Formula (2-1), (2-2), (2-3), (2-4), or (2-5).

Formula (2-1)

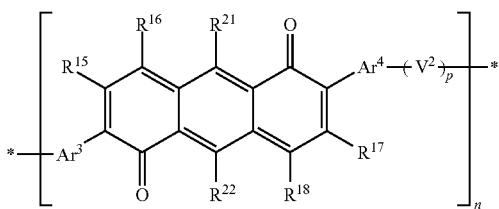

Formula (2-2)

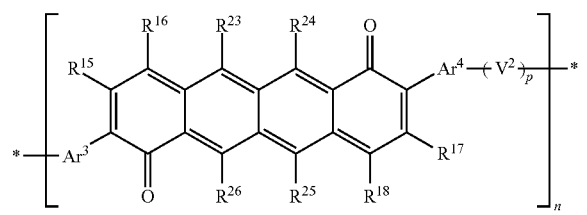

Formula (2-3)

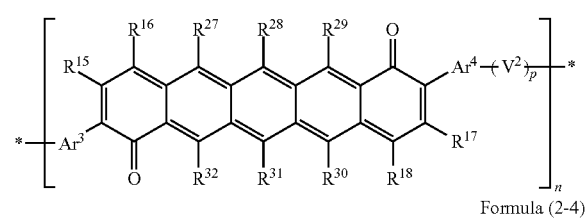

Formula (2-4)

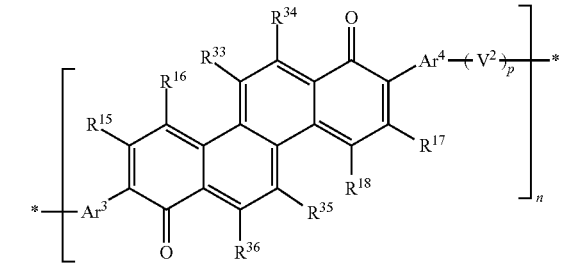

Formula (2-5)

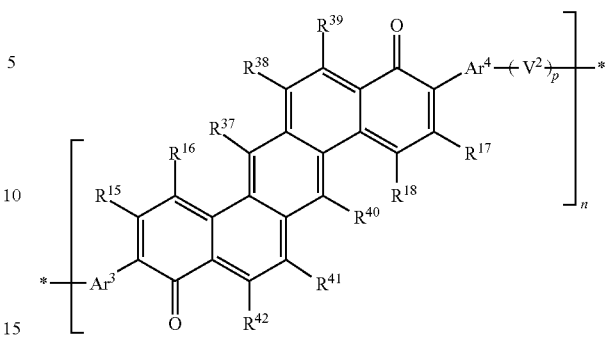

In Formulae (2-1) to (2-5), each of $R^{15}$ to $R^{18}$ and $R^{21}$ to $R^{42}$ independently represents a hydrogen atom or a substituent; each of $Ar^3$ and $Ar^4$ independently represents a heteroarylene group or an arylene group; $V^2$ represents a divalent linking group; p represents an integer of 0 to 6; when p is equal to or greater than 2, two or more groups represented by $V^2$ may be the same as or different from each other; and n is equal to or greater than 2.

[4] The organic film transistor described in [1] preferably containing a compound, which is composed of n repeating units represented by the following Formula (101-1) or (101-2), in the semiconductor active layer;

Formula (101-1)

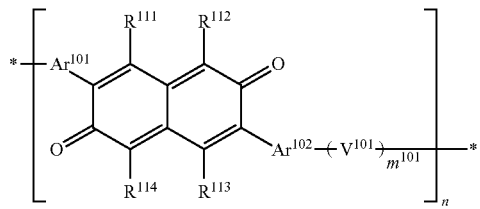

in Formula (101-1), each of $R^{111}$ to $R^{114}$ independently represents a hydrogen atom or a substituent; each of $Ar^{101}$ and $Ar^{102}$ independently represents a heteroarylene group or an arylene group; $V^{101}$ represents a divalent linking group; $m^{101}$ represents an integer of 0 to 6; when $m^{101}$ is equal to or greater than 2, two or more groups represented by $V^{101}$ may be the same as or different from each other; and n is equal to or greater than 2; and Formula (101-2)

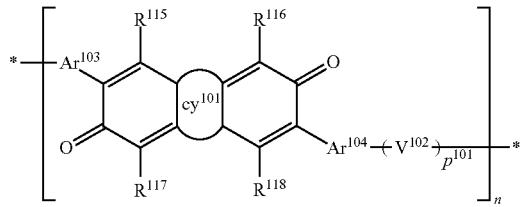

in Formula (101-2), $Cy^{101}$ represents a benzene ring, a naphthalene ring, or an anthracene ring; each of $R^{115}$ to $R^{118}$ independently represents a hydrogen atom or a substituent; each of $Ar^{103}$ and $Ar^{104}$ independently represents a heteroarylene group or an arylene group; $V^{102}$ represents a divalent linking group; $p^{101}$ represents an integer of 0 to 6; when $p^{101}$ is equal to or greater than 2, two or more groups represented by $V^{102}$ may be the same as or different from each other; and n is equal to or greater than 2.

[5] The organic film transistor described in [1] or [4], in which the compound composed of n repeating units represented by Formula (101-2) is preferably a compound composed of n repeating units represented by the following Formula (102-1), (102-2), (102-3), (102-4), or (102-5);

Formula (102-1)

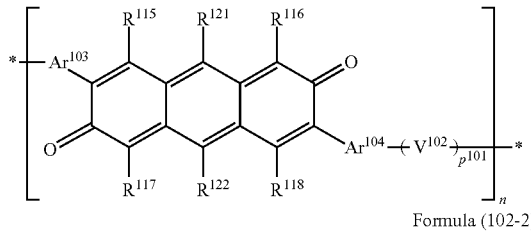

Formula (102-2)

Formula (102-3)

Formula (102-4)

Formula (102-5)

in Formulae (102-1) to (102-5), each of $R^{115}$ to $R^{118}$ and $R^{121}$ to $R^{142}$ independently represents a hydrogen atom or a substituent; each of $Ar^{103}$ and $Ar^{104}$ independently represents a heteroarylene group or an arylene group; $V^{102}$ represents a divalent linking group; $p^{101}$ represents an integer of 0 to 6; when $p^{101}$ is equal to or greater than 2, two or more groups represented by $V^{102}$ may be the same as or different from each other; and n is equal to or greater than 2.

[6] The organic film transistor described in any one of [1] to [5], in which in Formulae (1-1), (1-2), (2-1) to (2-5), (101-1), (101-2), and (102-1) to (102-5), each of $V^1$, $V^2$, $V^{101}$, and $V^{102}$ is independently preferably a divalent linking group represented by any of the following Formulae (V-1) to (V-17).

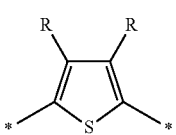
(V-1)

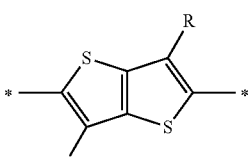
(V-2)

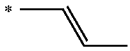
(V-3)

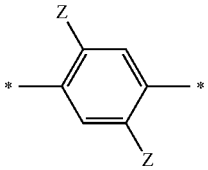
(V-4)

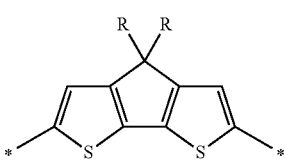
(V-5)

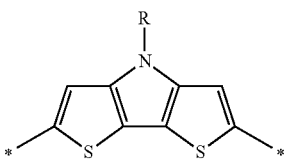
(V-6)

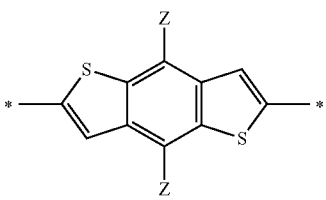
(V-7)

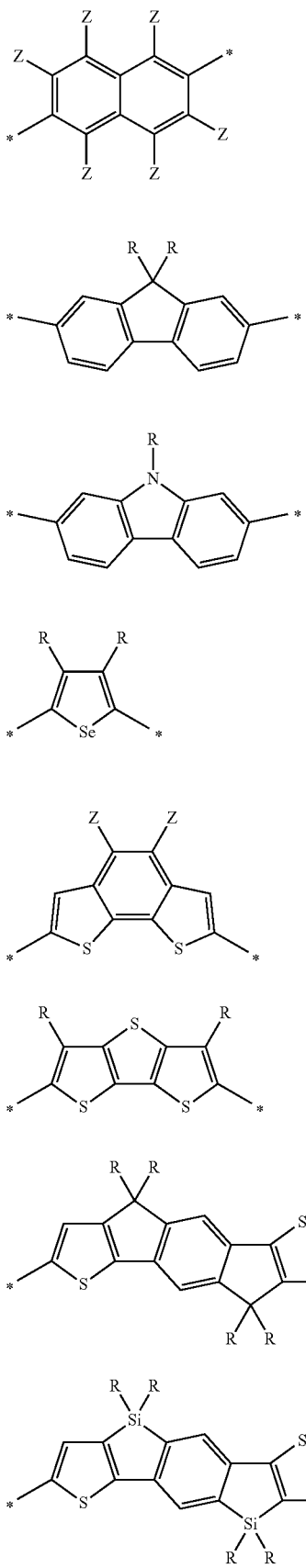

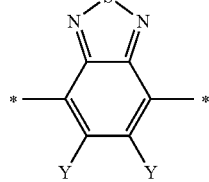
(V-16)

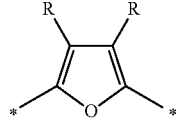
(V-17)

In Formulae (V-1) to (V-17), * represents a position where the divalent linking group is bonded to any of $Ar^1$ to $Ar^4$ and $Ar^{101}$ to $Ar^{104}$ when m, $m^{101}$, p, or $p^{101}$ is 1, and represents a position where the divalent linking group is bonded to any of $Ar^1$ to $Ar^4$, $Ar^{101}$ to $Ar^{104}$, and the divalent linking groups represented by Formulae (V-1) to (V-17) when m, $m^{101}$, p, or $p^{101}$ is equal to or greater than 2; each R in Formulae (V-1), (V-2), (V-5), (V-6), (V-9) to (V-11), (V-13) to (V-15), and (V-17) independently represents a hydrogen atom or an alkyl group; the groups adjacent to each other represented by R may form a ring by being bonded to each other; each Z in Formulae (V-4), (V-7), (V-8), and (V-12) independently represents a hydrogen atom, an alkyl group, or an alkoxy group; the groups adjacent to each other represented by Z may form a ring by being bonded to each other; each Y in Formula (V-16) independently represents a hydrogen atom, an alkyl group, an alkoxy group, a CN group, or a F atom; and the groups adjacent to each other represented by Y may form a ring by being bonded to each other.

[7] The organic film transistor described in [6], in which in Formulae (1-1), (1-2), (2-1) to (2-5), (101-1), (101-2), and (102-1) to (102-5), each of $V^1$, $V^2$, $V^{101}$, and $V^{102}$ is independently preferably a divalent linking group represented by any of Formulae (V-1) to (V-8) and (V-11) to (V-15).

[8] The organic film transistor described in any one of [1] to [7], in which in Formulae (1-1), (1-2), (2-1) to (2-5), (101-1), (101-2), and (102-1) to (102-5), each of $Ar^1$ to $Ar^4$ and $Ar^{101}$ to $Ar^{104}$ is independently preferably a divalent linking group represented by the following Formula (4-1), (4-2) or (4-3).

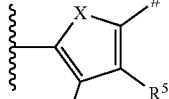
Formula (4-1)

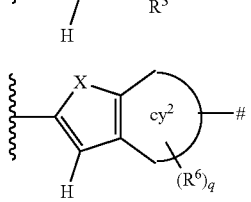
Formula (4-2)

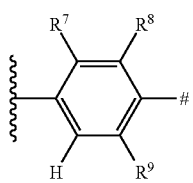

Formula (4-3)

In Formulae (4-1) to (4-3), X represents a S atom, an O atom, or a Se atom; $Cy^2$ represents a structure in which 1 to 4 rings are condensed; each of $R^5$ to $R^9$ independently represents a hydrogen atom or a substituent; q represents an integer of 0 to 6; when q is equal to or greater than 2, two or more groups represented by $R^6$ may be the same as or different from each other; the wavy line represents a position where the divalent linking group is bonded to a cyclohexadienone ring-condensed site; and #represents a position where the divalent linking group is bonded to $V^1$, $V^2$, $V^{101}$, or $V^{102}$.

[9] The organic film transistor described in [8], in which in Formulae (1-1), (1-2), (2-1) to (2-5), (101-1), (101-2), and (102-1) to (102-5), each of $Ar^1$ to $Ar^4$ and $Ar^{101}$ to $Ar^{104}$ is independently preferably a divalent linking group represented by Formula (4-1) or (4-2).

[10] The organic film transistor described in [8] or [9], in which the divalent linking group represented by Formula (4-2) is preferably a divalent linking group represented by any of the following Formulae (5-1) to (5-8).

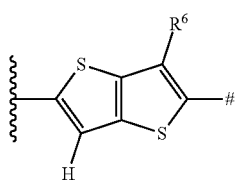

Formula (5-1)

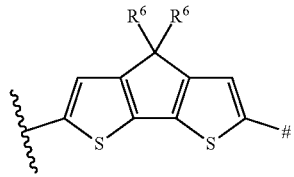

Formula (5-2)

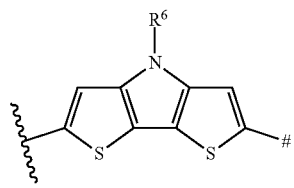

Formula (5-3)

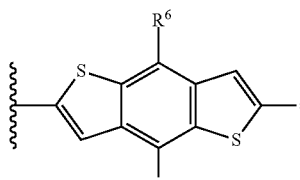

Formula (5-4)

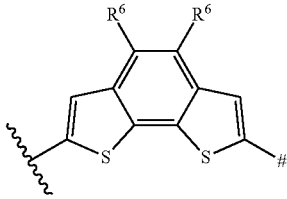

Formula (5-5)

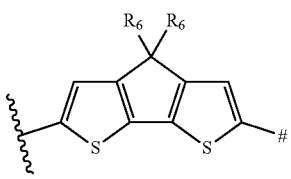

Formula (5-6)

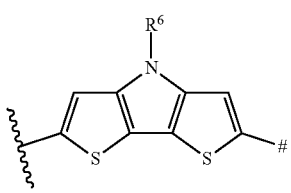

Formula (5-7)

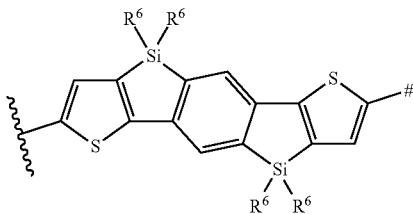

Formula (5-8)

In Formulae (5-1) to (5-8), each $R^6$ independently represents a hydrogen atom or a substituent; two or more groups represented by $R^6$ may be the same as or different from each other; the wavy line represents a position where the divalent linking group is bonded to a cyclohexadienone ring-condensed site; and #represents a position where the divalent linking group is bonded to $V^1$, $V^2$, $V^{101}$, or $V^{102}$.

[11] The organic film transistor described in any one of [1] to [10], in which each of at least one of $R^{11}$ to $R^{14}$ in Formula (1-1), at least one of $R^{15}$ to $R^{18}$ in Formula (1-2), at least one of $R^{15}$ to $R^{18}$, $R^{21}$, and $R^{22}$ in Formula (2-1), at least one of $R^{15}$ to $R^{18}$ and $R^{23}$ to $R^{26}$ in Formula (2-2), at least one of $R^{15}$ to $R^{18}$ and $R^{27}$ to $R^{32}$ in Formula (2-3), at least one of $R^{15}$ to $R^{18}$ and $R^{33}$ to $R^{36}$ in Formula (2-4), at least one of $R^{15}$ to $R^{18}$ and $R^{37}$ to $R^{42}$ in Formula (2-5), at least one of $R^{111}$ to $R^{114}$ in Formula (101-1), at least one of $R^{115}$ to $R^{118}$ in Formula (101-2), at least one of $R^{115}$ to $R^{118}$, $R^{121}$, and $R^{122}$ in Formula (102-1), at least one of $R^{115}$ to $R^{118}$ and $R^{123}$ to $R^{126}$ in Formula (102-2), at least one of $R^{115}$ to $R^{118}$ and $R^{127}$ to $R^{132}$ in Formula (102-3), at least one of $R^{115}$ to $R^{118}$ and $R^{133}$ to $R^{136}$ in Formula (102-4), and at least one of $R^{115}$ to $R^{118}$ and $R^{137}$ to $R^{142}$ in Formula (102-5) is preferably a group represented by the following Formula (W).

-L-R        Formula (W)

In Formula (W), L represents a divalent linking group represented by any of the following Formulae (L-1) to (L-12) or a divalent linking group formed by bonding of two or more divalent linking groups represented by any of the following Formulae (L-1) to (L-12); R represents a substituted or unsubstituted alkyl group, an oligo-oxyethylene group in which a repetition number v of an oxyethylene unit is equal to or greater than 2, an oligosiloxane group having two or more silicon atoms, or a substituted or unsubstituted silyl group; and R represents a substituted or unsubstituted silyl group only when L adjacent to R is a divalent linking group represented by any of the following Formulae (L-1) to (L-3);

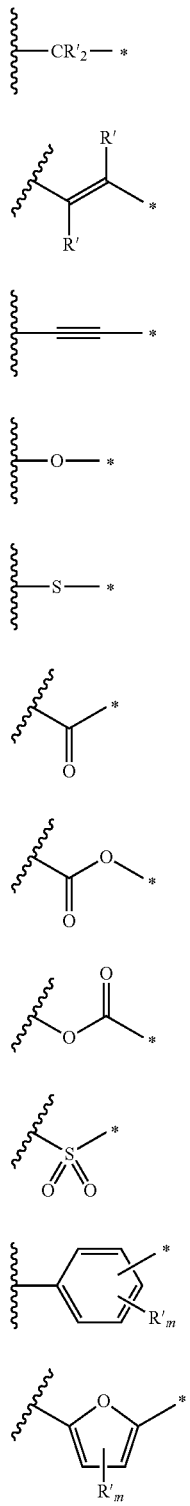

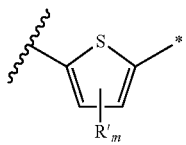

in Formulae (L-1) to (L-12), the portion of a wavy line represents a position where the divalent linking group is bonded to a cyclohexadienone skeleton; * represents a position where the divalent linking group is bonded to any of the divalent linking groups represented by Formulae (L-1) to (L-12) and R; m in Formula (L-10) is 4; m in Formulae (L-11) and (L-12) is 2; and each R' in Formulae (L-1), (L-2), (L-10), (L-11), and (L-12) independently represents a hydrogen atom or a substituent.

[12] The organic film transistor described in [11], in which in Formula (W), L is preferably a divalent linking group represented by any of Formulae (L-1), (L-4), and (L-8) or a divalent linking group formed by bonding of two or more divalent linking groups described above.

[13] The organic film transistor described in any one of [1] to [12], in which in Formulae (1-1), (1-2), (2-1) to (2-5), (101-1), (101-2), and (102-1) to (102-5), each n is independently preferably equal to or greater than 10.

[14] A compound composed of n repeating units represented by the following Formula (1-1), (1-2), (101-1), or (101-2);

Formula (1-1)

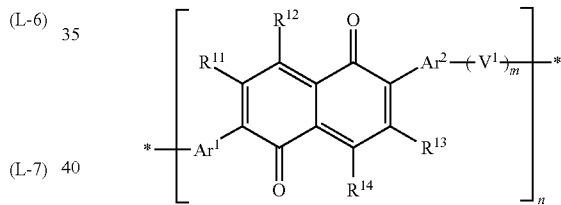

in Formula (1-1), each of $R^{11}$ to $R^{14}$ independently represents a hydrogen atom or a substituent; each of $Ar^1$ and $Ar^2$ independently represents a heteroarylene group or an arylene group; $V^1$ represents a divalent linking group; m represents an integer of 0 to 6; when m is equal to or greater than 2, two or more groups represented by $V^1$ may be the same as or different from each other; and n is equal to or greater than 2;

Formula (1-2)

in Formula (1-2), Cy represents a benzene ring, a naphthalene ring, or an anthracene ring; each of $R^{15}$ to $R^{18}$ independently represents a hydrogen atom or a substituent; each of $Ar^3$ and $Ar^4$ independently represents a heteroarylene group or an arylene group; $V^2$ represents a divalent linking group; p represents an integer of 0 to 6; when p is equal to or greater than 2, two or more groups represented by $V^2$ may be the same as or different from each other; and n is equal to or greater than 2;

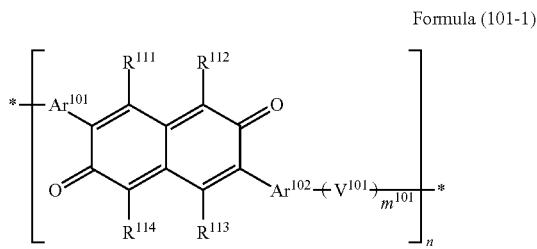

Formula (101-1)

in Formula (101-1), each of $R^{111}$ to $R^{114}$ independently represents a hydrogen atom or a substituent; each of $Ar^{101}$ and $Ar^{102}$ independently represents a heteroarylene group or an arylene group; $V^{101}$ represents a divalent linking group; $m^{101}$ represents an integer of 0 to 6; when $m^{101}$ is equal to or greater than 2, two or more groups represented by $V^{101}$ may be the same as or different from each other; and n is equal to or greater than 2; and

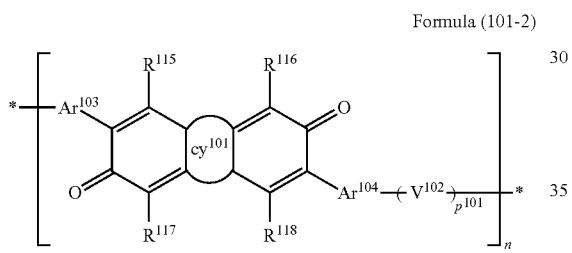

Formula (101-2)

in Formula (101-2), $Cy^{101}$ represents a benzene ring, a naphthalene ring, or an anthracene ring; each of $R^{115}$ to $R^{118}$ independently represents a hydrogen atom or a substituent; each of $Ar^{103}$ and $Ar^{104}$ independently represents a heteroarylene group or an arylene group; $V^{102}$ represents a divalent linking group; $p^{101}$ represents an integer of 0 to 6; when $p^{101}$ is equal to or greater than 2, two or more groups represented by $V^{102}$ may be the same as or different from each other; and n is equal to or greater than 2.

[15] The compound described in [14] that is preferably a compound composed of n repeating units represented by the following Formula (1-1) or (1-2).

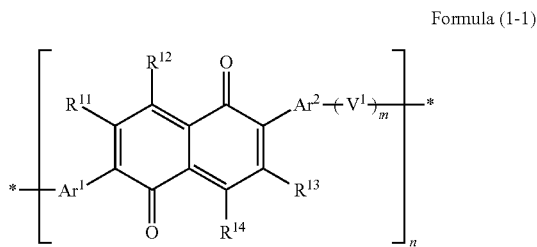

Formula (1-1)

In Formula (1-1), each of $R^{11}$ to $R^{14}$ independently represents a hydrogen atom or a substituent; each of $Ar^1$ and $Ar^2$ independently represents a heteroarylene group or an arylene group; $V^1$ represents a divalent linking group; m represents an integer of 0 to 6; when m is equal to or greater than 2, two or more groups represented by $V^1$ may be the same as or different from each other; and n is equal to or greater than 2; and Formula (1-2)

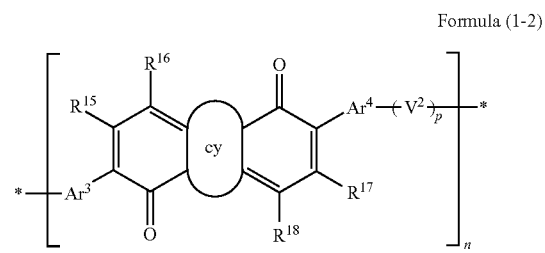

Formula (1-2)

in Formula (1-2), Cy represents a benzene ring, a naphthalene ring, or an anthracene ring; each of $R^{15}$ to $R^{18}$ independently represents a hydrogen atom or a substituent; each of $Ar^3$ and $Ar^4$ independently represents a heteroarylene group or an arylene group; $V^2$ represents a divalent linking group; p represents an integer of 0 to 6; when p is equal to or greater than 2, two or more groups represented by $V^2$ may be the same as or different from each other; and n is equal to or greater than 2.

[16] The compound described in [14] or [15], in which the compound composed of n repeating units represented by Formula (1-2) is preferably a compound composed of n repeating units represented by the following Formula (2-1), (2-2), (2-3), (2-4), or (2-5).

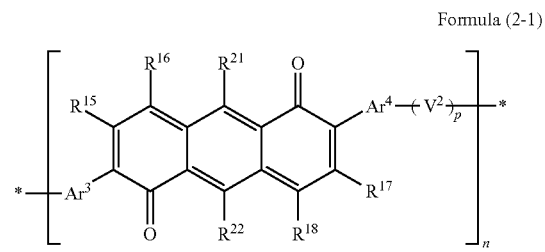

Formula (2-1)

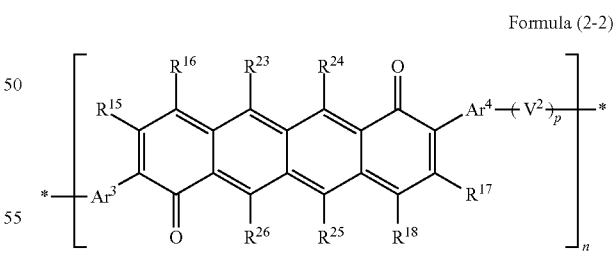

Formula (2-2)

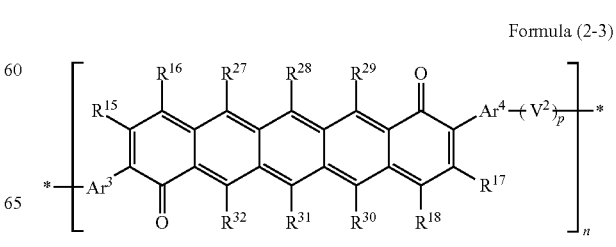

Formula (2-3)

-continued

Formula (2-4)

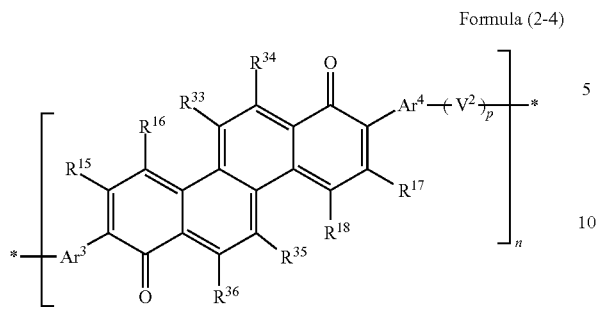

Formula (2-5)

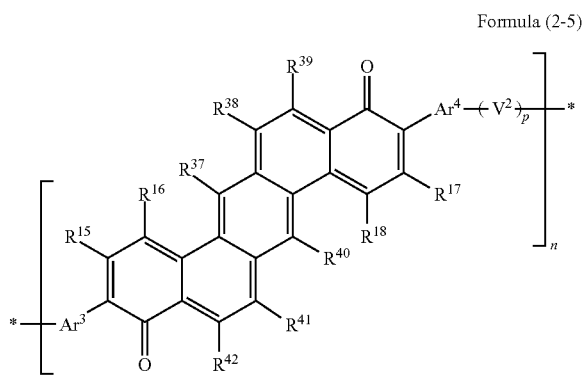

In Formulae (2-1) to (2-5), each of $R^{15}$ to $R^{18}$ and $R^{21}$ to $R^{42}$ independently represents a hydrogen atom or a substituent; each of $Ar^3$ and $Ar^4$ independently represents a heteroarylene group or an arylene group; $V^2$ represents a divalent linking group; p represents an integer of 0 to 6; when p is equal to or greater than 2, two or more groups represented by $V^2$ may be the same as or different from each other; and n is equal to or greater than 2.

[17] The compound described in [14] that is preferably a compound composed of n repeating units represented by the following Formula (101-1) or (101-2);

Formula (101-1)

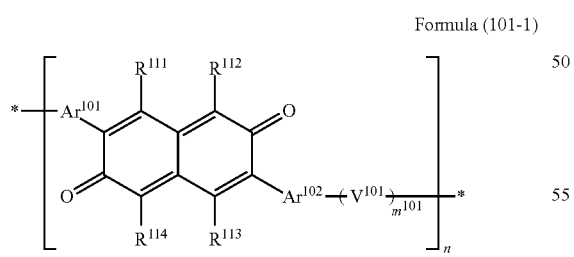

in Formula (101-1), each of $R^{111}$ to $R^{114}$ independently represents a hydrogen atom or a substituent; each of $Ar^{101}$ and $Ar^{102}$ independently represents a heteroarylene group or an arylene group; $V^{101}$ represents a divalent linking group; $m^{101}$ represents an integer of 0 to 6; when $m^{101}$ is equal to or greater than 2, two or more groups represented by $V^{101}$ may be the same as or different from each other; and n is equal to or greater than 2; and Formula (101-2)

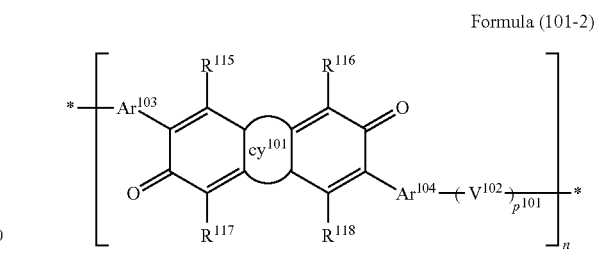

in Formula (101-2), $Cy^{101}$ represents a benzene ring, a naphthalene ring, or an anthracene ring; each of $R^{115}$ to $R^{118}$ independently represents a hydrogen atom or a substituent; each of $Ar^{103}$ and $Ar^{104}$ independently represents a heteroarylene group or an arylene group; $V^{102}$ represents a divalent linking group; $p^{101}$ represents an integer of 0 to 6; when $p^{101}$ is equal to or greater than 2, two or more groups represented by $V^{102}$ may be the same as or different from each other; and n is equal to or greater than 2.

[18] The compound described in [14] or [17], in which the compound composed of n repeating units represented by Formula (101-2) is preferably a compound composed of n repeating units represented by the following Formula (102-1), (102-2), (102-3), (102-4), or (102-5);

Formula (102-1)

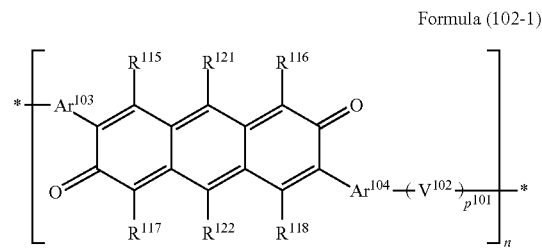

Formula (102-2)

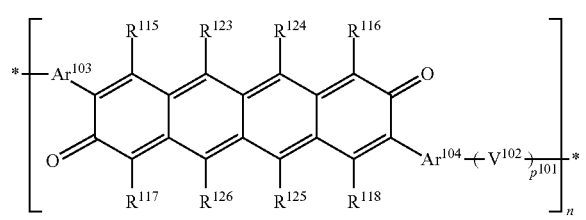

Formula (102-3)

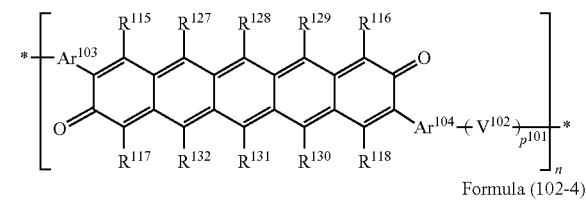

Formula (102-4)

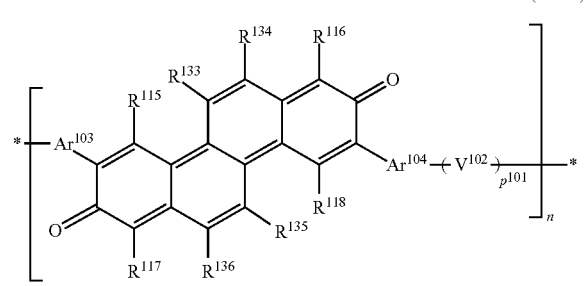

Formula (102-5)

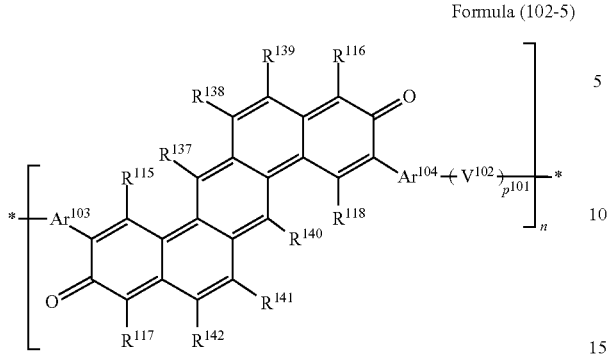

in Formulae (102-1) to (102-5), each of $R^{115}$ to $R^{118}$ and $R^{121}$ to $R^{142}$ independently represents a hydrogen atom or a substituent; each of $Ar^{103}$ and $Ar^{104}$ independently represents a heteroarylene group or an arylene group; $V^{102}$ represents a divalent linking group; $p^{11}$ represents an integer of 0 to 6; when $p^{101}$ is equal to or greater than 2, two or more groups represented by $V^{102}$ may be the same as or different from each other; and n is equal to or greater than 2.

[19] The compound described in any one of [14] to [18], in which in Formulae (1-1), (1-2), (2-1) to (2-5), (101-1), (101-2), and (102-1) to (102-5), each of $V^1$, $V^2$, $V^{101}$, and $V^{102}$ is independently preferably a divalent linking group represented by any of the following Formulae (V-1) to (V-17).

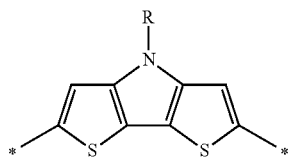 (V-1)

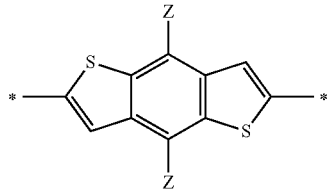 (V-2)

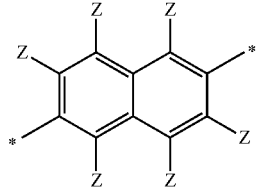 (V-3)

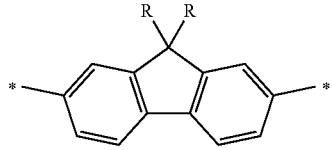 (V-4)

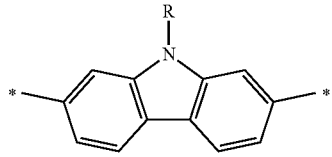 (V-5)

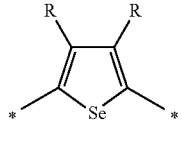 (V-6)

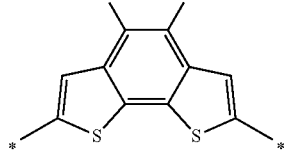 (V-7)

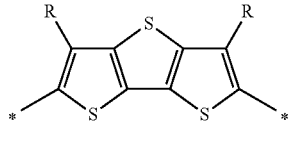 (V-8)

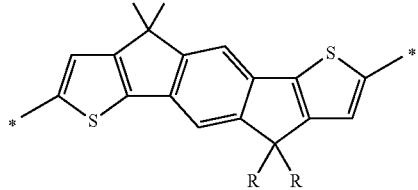 (V-9)

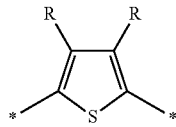 (V-10)

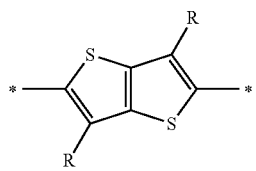 (V-11)

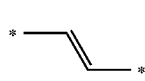 (V-12)

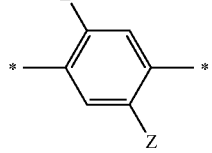 (V-13)

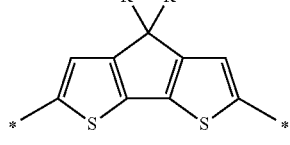 (V-14)

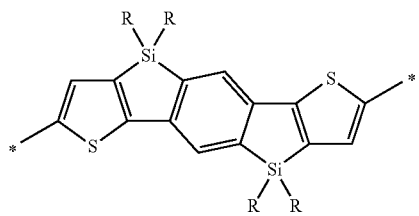
(V-15)

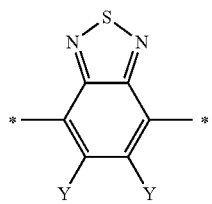
(V-16)

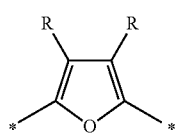
(V-17)

In Formulae (V-1) to (V-17), * represents a position where the divalent linking group is bonded to any of $Ar^1$ to $Ar^4$ and $Ar^{101}$ to $Ar^{104}$ when m, $m^{101}$, p, or $p^{101}$ is 1, and represents a position where the divalent linking group is bonded to any of $Ar^1$ to $Ar^4$, $Ar^{101}$ to $Ar^{104}$, and the divalent linking groups represented by Formulae (V-1) to (V-17) when m, $m^{101}$, p, or $p^{101}$ is equal to or greater than 2; each R in Formulae (V-1), (V-2), (V-5), (V-6), (V-9) to (V-11), (V-13) to (V-15), and (V-17) independently represents a hydrogen atom or an alkyl group; the groups adjacent to each other represented by R may form a ring by being bonded to each other; each Z in Formulae (V-4), (V-7), (V-8), and (V-12) independently represents a hydrogen atom, an alkyl group, or an alkoxy group; the groups adjacent to each other represented by Z may form a ring by being bonded to each other; each Y in Formula (V-16) independently represents a hydrogen atom, an alkyl group, an alkoxy group, a CN group, or a F atom; and the groups adjacent to each other represented by Y may form a ring by being bonded to each other.

[20] The compound described in [19], in which in Formulae (1-1), (1-2), (2-1) to (2-5), (101-1), (101-2), and (102-1) to (102-5), each of $V^1$, $V^2$, $V^{101}$, and $V^{102}$ is independently preferably a divalent linking group represented by any of Formulae (V-1) to (V-8) and (V-11) to (V-15).

[21] The compound described in any one of [14] to [20], in which in Formulae (1-1), (1-2), (2-1) to (2-5), (101-1), (101-2), and (102-1) to (102-5), each of $Ar^1$ to $Ar^4$ and $Ar^{101}$ to $Ar^{104}$ is independently preferably a divalent linking group represented by the following Formula (4-1), (4-2), or (4-3).

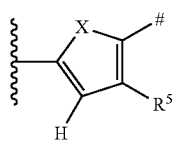
Formula (4-1)

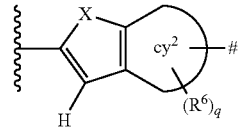
Formula (4-2)

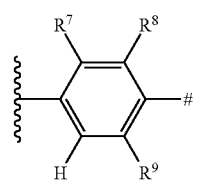
Formula (4-3)

In Formulae (4-1) to (4-3), X represents a S atom, an O atom, or a Se atom; $Cy^2$ represents a structure in which 1 to 4 rings are condensed; each of $R^5$ to $R^9$ independently represents a hydrogen atom or a substituent; q represents an integer of 0 to 6; when q is equal to or greater than 2, two or more groups represented by $R^6$ may be the same as or different from each other; the wavy line represents a position where the divalent linking group is bonded to a cyclohexadienone ring-condensed site; and #represents a position where the divalent linking group is bonded to $V^1$, $V^2$, $V^{101}$, or $V^{102}$.

[22] The compound described in [21], in which in Formulae (1-1), (1-2), (2-1) to (2-5), (101-1), (101-2), and (102-1) to (102-5), each of $Ar^1$ to $Ar^4$ and $Ar^{101}$ to $Ar^{104}$ is independently preferably a divalent linking group represented by Formula (4-1) or (4-2).

[23] The compound described in [21] or [22], in which the divalent linking group represented by Formula (4-2) is preferably a divalent linking group represented by any of the following Formulae (5-1) to (5-8).

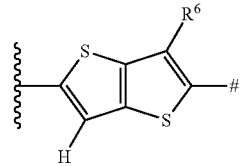
Formula (5-1)

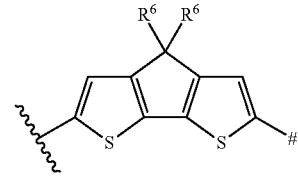
Formula (5-2)

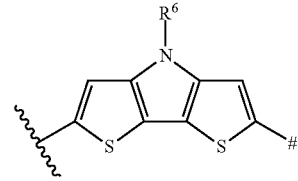
Formula (5-3)

-continued

Formula (5-4)

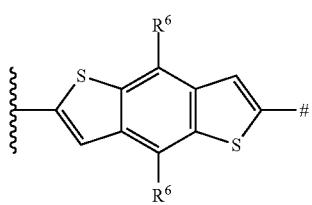

Formula (5-5)

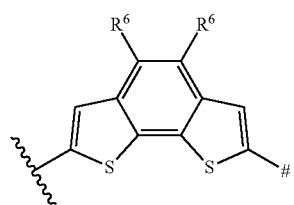

Formula (5-6)

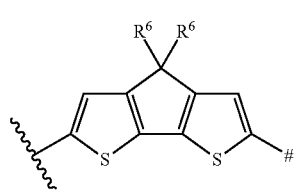

Formula (5-7)

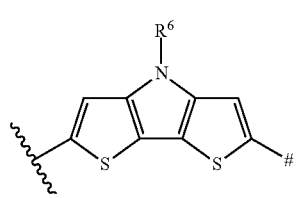

Formula (5-8)

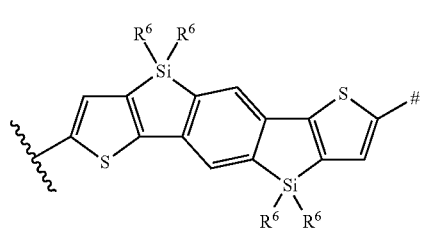

In Formulae (5-1) to (5-8), each $R^6$ independently represents a hydrogen atom or a substituent; two or more groups represented by $R^6$ may be the same as or different from each other; the wavy line represents a position where the divalent linking group is bonded to a cyclohexadienone ring-condensed site; and #represents a position where the divalent linking group is bonded to $V^1$, $V^2$, $V^{101}$, or $V^{102}$.

[24] The compound described in any one of [14] to [23], in which each of at least one of $R^{11}$ to $R^{14}$ in Formula (1-1), at least one of $R^{15}$ to $R^{18}$ in Formula (1-2), at least one of $R^5$ to $R^{18}$, $R^{21}$, and $R^{22}$ in Formula (2-1), at least one of $R^{15}$ to $R^{18}$ and $R^{23}$ to $R^{26}$ in Formula (2-2), at least one of $R^{15}$ to $R^{18}$ and $R^{27}$ to $R^{32}$ in Formula (2-3), at least one of $R^{15}$ to $R^{18}$ and $R^{33}$ to $R^{36}$ in Formula (2-4), at least one of $R^{15}$ to $R^{18}$ and $R^{37}$ to $R^{42}$ in Formula (2-5), at least one of $R^{111}$ to $R^{114}$ in Formula (101-1), at least one of $R^{115}$ to $R^{118}$ in Formula (101-2), at least one of $R^{115}$ to $R^{118}$, $R^{121}$, and $R^{122}$ in Formula (102-1), at least one of $R^{115}$ to $R^{118}$ and $R^{123}$ to $R^{126}$ in Formula (102-2), at least one of $R^{115}$ to $R^{118}$ and $R^{127}$ to $R^{132}$ in Formula (102-3), at least one of $R^{115}$ to $R^{118}$ and $R^{133}$ to $R^{136}$ in Formula (102-4), and at least one of $R^{115}$ to $R^{118}$ and $R^{137}$ to $R^{142}$ in Formula (102-5) is preferably a group represented by the following Formula (W).

-L-R      Formula (W)

In Formula (W), L represents a divalent linking group represented by any of the following Formulae (L-1) to (L-12) or a divalent linking group formed by bonding of two or more divalent linking groups represented by any of the following Formulae (L-1) to (L-12); R represents a substituted or unsubstituted alkyl group, an oligo-oxyethylene group in which a repetition number v of an oxyethylene unit is equal to or greater than 2, an oligosiloxane group having two or more silicon atoms, or a substituted or unsubstituted silyl group; and R represents a substituted or unsubstituted silyl group only when L adjacent to R is a divalent linking group represented by any of the following Formulae (L-1) to (L-3);

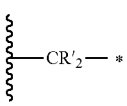

(L-1)

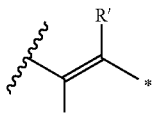

(L-2)

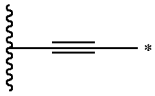

(L-3)

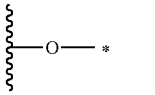

(L-4)

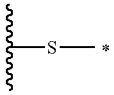

(L-5)

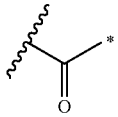

(L-6)

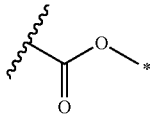

(L-7)

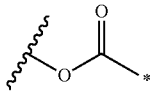

(L-8)

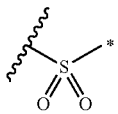

(L-9)

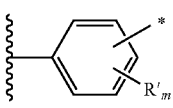

(L-10)

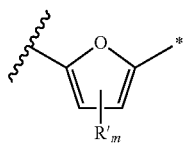
(L-11)

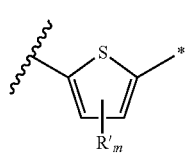
(L-12)

in Formulae (L-1) to (L-12), the portion of a wavy line represents a position where the divalent linking group is bonded to a cyclohexadienone skeleton; * represents a position where the divalent linking group is bonded to any of the divalent linking groups represented by Formulae (L-1) to (L-12) and R; m in Formula (L-10) is 4; m in Formulae (L-11) and (L-12) is 2; and each R' in Formulae (L-1), (L-2), (L-10), (L-11), and (L-12) independently represents a hydrogen atom or a substituent.

[25] The compound described in [24], in which in Formula (W), L is preferably a divalent linking group represented by any of Formulae (L-1), (L-4), and (L-8) or a divalent linking group formed by bonding of two or more divalent linking groups described above.

[26] The compound described in any one of [14] to [25], in which in Formulae (1-1), (1-2), (2-1) to (2-5), (101-1), (101-2), and (102-1) to (102-5), each n is independently preferably equal to or greater than 10.

[27] A composition containing the compound described in any one of [14] to [26] and an organic solvent.

[28] The composition described in [27], in which the organic solvent is preferably an aromatic hydrocarbon-based solvent, an ether-based solvent, or a ketone-based solvent.

[29] An organic semiconductor material for a non-light-emitting organic semiconductor device, containing the compound described in any one of [14] to [26] or the composition described in [27] or [28].

[30] A material for an organic film transistor, containing the compound described in any one of [14] to [26] or the composition described in [27] or [28].

[31] A coating solution for a non-light-emitting organic semiconductor device, containing the compound described in any one of [14] to [26] or the composition described in [27] or [28].

[32] A coating solution for a non-light-emitting organic semiconductor device, containing the compound described in any one of [14] to [26] or the composition described in [27] or [28] and a polymer binder.

[33] An organic semiconductor film for a non-light-emitting organic semiconductor device, containing the compound described in any one of [14] to [26] or the composition described in [27] or [28].

[34] An organic semiconductor film for a non-light-emitting organic semiconductor device, containing the compound described in any one of [14] to [26] or the composition described in [27] or [28] and a polymer binder.

[35] The organic semiconductor film for a non-light-emitting organic semiconductor device described in [33] or [34] that is preferably prepared by a solution coating method.

According to the present invention, it is possible to provide a compound, which results in high carrier mobility when being used in a semiconductor active layer of an organic film transistor and exhibits high solubility in an organic solvent, and an organic film transistor which uses the compound.

DESCRIPTION OF THE PREFERRED EMBODIMENTS

Figure 1:
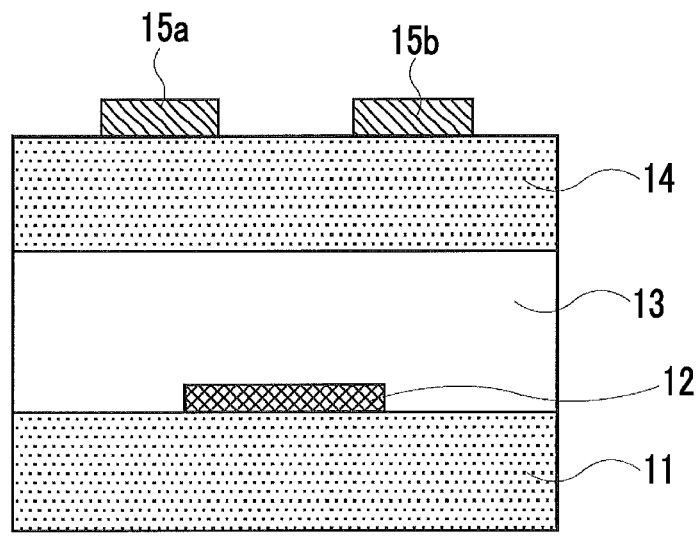
FIG. 1 is a schematic view showing the cross-section of an exemplary structure of an organic film transistor of the present invention.

Hereinafter, the present invention will be specifically descried. The following constituents are described based on typical embodiments or specific examples in some cases, but the present invention is not limited to such embodiments. In the present specification, a range of numerical values represented by using "to" means a range which includes the numerical values listed before and after "to" as a lower limit and an upper limit.

In the present invention, in a case in which hydrogen atoms are used in describing each formula without being particularly differentiated from each other, the hydrogen atoms include isotopes (a deuterium atom and the like). Furthermore, atoms constituting a substituent also include isotopes thereof.

In the present specification, a compound composed of n repeating units represented by Formula (X) has the same definition as a compound represented by Formula (X) (X is any number or letter). In Formulae (1-1), (1-2), (2-1) to (2-5), (101-1), (101-2), and (102-1) to (102-5), a terminal (for example, represented by *) other than n repeating units represents a linking group linked to a hydrogen atom or a substituent. In the compound composed of n repeating units represented by any of Formulae (1-1), (1-2), (2-1) to (2-5), (101-1), (101-2), and (102-1) to (102-5), * on a molecular terminal may be a hydrogen atom or any substituent, and the molecular terminal is preferably a hydrogen atom, a trialkyltin group, a halogen atom, a perfluoroalkanesulfonyloxy group, —B(OH)$_2$, —B(OR$^X$)$_2$, a trialkylsilyl group, an aryl group, a heteroaryl group, or the like. Herein, R$^X$ represents an alkyl group, and a plurality of alkyl groups represented by R$^X$ may form a ring by being bonded to each other.

[Organic Film Transistor]

The organic film transistor of the present invention contains a compound, which is represented by the following Formula (1-1), (1-2), (101-1), or (101-2), in a semiconductor active layer.

Formula (1-1)

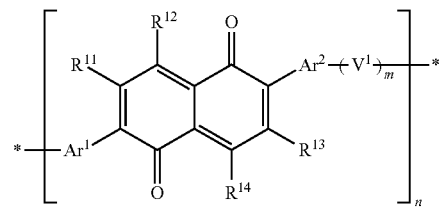

In Formula (1-1), each of $R^{11}$ to $R^{14}$ independently represents a hydrogen atom or a substituent; each of $Ar^1$ and $Ar^2$ independently represents a heteroarylene group or an arylene group; $V^1$ represents a divalent linking group; m represents an integer of 0 to 6; when m is equal to or greater than 2, two or more groups represented by $V^1$ may be the same as or different from each other; and n is equal to or greater than 2;

Formula (1-2)

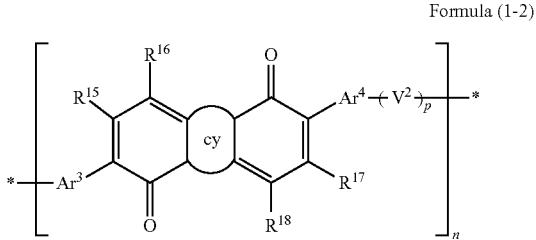

in Formula (1-2), Cy represents a benzene ring, a naphthalene ring, or an anthracene ring; each of $R^{15}$ to $R^{18}$ independently represents a hydrogen atom or a substituent; each of $Ar^3$ and $Ar^4$ independently represents a heteroarylene group or an arylene group; $V^2$ represents a divalent linking group; p represents an integer of 0 to 6; when p is equal to or greater than 2, two or more groups represented by $V^2$ may be the same as or different from each other; and n is equal to or greater than 2;

Formula (101-1)

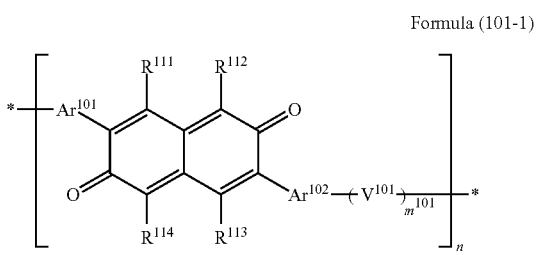

in Formula (101-1), each of $R^{111}$ to $R^{114}$ independently represents a hydrogen atom or a substituent; each of $Ar^{101}$ and $Ar^{102}$ independently represents a heteroarylene group or an arylene group; $V^{101}$ represents a divalent linking group; $m^{101}$ represents an integer of 0 to 6; when $m^{101}$ is equal to or greater than 2, two or more groups represented by $V^{101}$ may be the same as or different from each other; and n is equal to or greater than 2; and Formula (101-2)

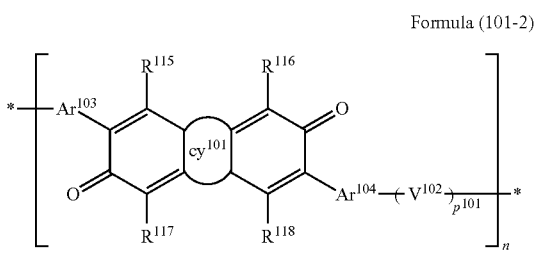

in Formula (101-2), $Cy^{101}$ represents a benzene ring, a naphthalene ring, or an anthracene ring; each of $R^{115}$ to $R^{118}$ independently represents a hydrogen atom or a substituent; each of $Ar^{103}$ and $Ar^{104}$ independently represents a heteroarylene group or an arylene group; $V^{102}$ represents a divalent linking group; $p^{101}$ represents an integer of 0 to 6; when $p^{101}$ is equal to or greater than 2, two or more groups represented by $V^{102}$ may be the same as or different from each other; and n is equal to or greater than 2.

A first preferred embodiment of the organic film transistor of the present invention contains the compound represented by Formula (1-1) or (1-2) in the semiconductor active layer.

A second preferred embodiment of the organic film transistor of the present invention contains the compound represented by Formula (101-1) or (101-2) in the semiconductor active layer.

When being used in the semiconductor active layer of the organic film transistor, the compound composed of n repeating units represented by Formula (1-1), (1-2), (101-1), or (101-2) results in high carrier mobility and exhibits high solubility in an organic solvent. Therefore, by containing the compound in the semiconductor layer, the organic film transistor of the present invention exhibits high carrier mobility.

In the compound composed of n repeating units represented by Formula (1-1), (1-2), (101-1), or (101-2), a ring-condensed cyclohexadienone skeleton has a carbonyl group, and thus the overlapping of HOMO sufficiently occurs. Accordingly, an organic film transistor having high carrier mobility can be obtained. Furthermore, the compound brings about an effect of obtaining unexpectedly high solubility in an organic solvent. Such an effect is considered to be obtained by the following mechanism. The compound composed of n repeating units represented by Formula (1-1), (1-2), (101-1), or (101-2) has a hydrogen bond between a double-bonded oxygen atom of the ring-condensed cyclohexadienone skeleton, which will be a mother skeleton, and a hydrogen atom of arylene groups or heteroarylene groups adjacent to each other on both sides of the ring-condensed cyclohexadienone skeleton. In a film, the hydrogen bond is maintained, and thus the planarity is improved. As a result, the distance between polymer molecules is shortened, and hence the carrier mobility can be improved. In a solution, the hydrogen bond is dissociated and freely rotates, and thus the solubility in an organic solvent can be improved.

Conventionally, a polycyclic ring-condensed compound having an aromatic heterocyclic ring is known to be useful as an organic EL element material. However, the usefulness of the compound as an organic EL element material does not necessarily mean that the compound is also useful as a semiconductor material for an organic film transistor. This is because the characteristics required for an organic compound vary between the organic EL element and the organic film transistor. Generally, in the organic EL element, a charge needs to be transported in the film thickness direction (usually, several nm to hundreds of nm) of the film. In contrast, in the organic film transistor, a charge (carrier) needs to be transported through a long distance between electrodes (usually, several μm to hundreds of m) in the film surface direction, and hence extremely high carrier mobility is required. Therefore, as the semiconductor material for an organic film transistor, an organic compound which has high regularity of molecular arrangement and high crystallinity is required. Furthermore, in order to achieve high carrier mobility, a π conjugation plane is preferably perpendicular to a substrate. In contrast, in the organic EL element, in order to improve light emitting efficiency, an element which has high light emitting efficiency and uniformly emits light within a plane is required. Generally, an organic compound having high crystallinity results in defectiveness in emitting light, such as uneven field intensity within a plane, uneven light emission, and emission quenching. Accordingly, as the material for an organic EL element, a material which has low crystallinity and high amorphousness is desirable. Therefore, even if an organic compound constituting the organic EL element material is directly used as the organic semiconductor material, excellent transistor characteristics are not necessarily obtained.

In addition, it is preferable that the organic film transistor of the present invention using the compound composed of n repeating units represented by Formula (1-1), (1-2), (101-1), or (101-2) shows a slight threshold voltage shift after repeated driving. In order to make the organic film transistor show a slight threshold voltage shift after repeated driving, HOMO of the organic semiconductor material needs not to be too shallow or too deep. Furthermore, the chemical stability (particularly, resistance against air oxidation and stability against oxidation and reduction) of the organic semiconductor material, the heat stability of the film state, the high film density which makes it difficult for air or moisture to permeate the film, the film quality in which the film has small defectiveness such that charge accumulation does not easily occur, and the like are required. Regarding an oligomer or a polymer compound having repeating units just like the compound composed of n repeating units represented by Formula (1-1), (1-2), (101-1), or (101-2), the higher the solubility of the compound in an organic solvent at the time of forming a film, the smaller the threshold voltage shift after repeated driving can be reduced when the compound is used in the semiconductor active layer of the organic film transistor. It is considered that because the compound composed of n repeating units represented by Formula (1-1), (1-2), (101-1), or (101-2) satisfies the aforementioned requirements, the organic film transistor shows a slight threshold voltage shift after repeated driving. That is, in the organic film transistor showing a slight threshold voltage shift after repeated driving, the semiconductor active layer has high chemical resistance, high film density, and the like, and thus the organic film transistor can effectively function as a transistor over a long period of time.

Hereinafter, preferred embodiments of the compound of the present invention, the organic film transistor of the present invention, and the like will be described.

<Compound Composed of n Repeating Units Represented by Formula (1-1), (1-2), (101-1), or (101-2)>

The compound of the present invention is composed of n repeating units represented by Formula (1-1), (1-2), (101-1), or (101-2). The compound of the present invention is contained in a semiconductor active layer, which will be described later, in the organic film transistor of the present invention. That is, the compound of the present invention can be used as a material for an organic film transistor.

Hereinafter, the compound composed of n repeating units represented by Formula (1-1), (1-2), (101-1), or (101-2) will be described.

<<Compound Composed of n Repeating Units Represented by Formula (1-1)>>

The compound composed of n repeating units represented by Formula (1-1) is represented by the following formula.

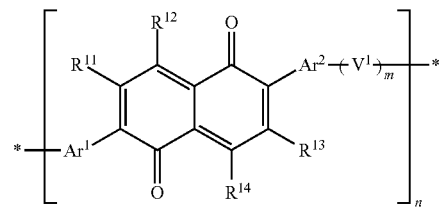

Formula (1-1)

(In Formula (1-1), each of $R^{11}$ to $R^{14}$ independently represents a hydrogen atom or a substituent; each of $Ar^1$ and $Ar^2$ independently represents a heteroarylene group or an arylene group; $V^1$ represents a divalent linking group; m represents an integer of 0 to 6; when m is equal to or greater than 2, two or more groups represented by $V^1$ may be the same as or different from each other; and n is equal to or greater than 2.)

In Formula (1-1), each of $R^{11}$ to $R^{14}$ independently represents a hydrogen atom or a substituent. Examples of the substituent that each of $R^{11}$ to $R^{14}$ can independently adopt include a halogen atom, an alkyl group (including an alkyl group having 1 to 40 carbon atoms such as a methyl group, an ethyl group, a propyl group, a butyl group, a pentyl group, a hexyl group, a heptyl group, an octyl group, a nonyl group, a decyl group, an undecyl group, a dodecyl group, a tridecyl group, a tetradecyl group, or a pentadecyl group (preferably an alkyl group having 3 to 40 carbon atoms and more preferably an alkyl group having 10 to 30 carbon atoms), a 2,6-dimethyloctyl group, a 2-decyltetradecyl group, a 2-hexyldodecyl group, a 2-ethyloctyl group, a 2-decyltetradecyl group, a 2-butyldecyl group, a 1-octylnonyl group, a 2-ethyloctyl group, a 2-octyltetradecyl group, and the like), an alkenyl group (including a 1-pentenyl group, a cycloalkenyl group, a bicycloalkenyl group, and the like), an alkynyl group (including a 1-pentynyl group, a trimethylsilylethynyl group, a triethylsilylethynyl group, a tri-i-propylsilylethynyl group, a 2-p-propylphenylethynyl group, and the like), an aryl group (including an aryl group having 6 to 20 carbon atoms such as a phenyl group, a naphthyl group, a p-pentylphenyl group, a 3,4-dipentylphenyl group, a p-heptoxyphenyl group, a 3,4-diheptoxyphenyl group, and the like), a hetero ring group (may also be referred to as a heterocyclic group, including a 2-hexylfuranyl group and the like), a cyano group, a hydroxyl group, a nitro group, an acyl group (including a hexanoyl group, a benzoyl group, and the like), an aryloxy group, a silyloxy group, a heterocyclic oxy group, an acyloxy group, a carbamoyloxy group, an amino group (including an anilino group), an acylamino group, an aminocarbonylamino group (including a ureide group), an alkoxy group (including an alkoxy group having 1 to 40 carbon atoms such as a methoxy group, an ethoxy group, a propoxy group, a butoxy group, a pentoxy group, a hexyloxy group, a heptoxy group, an octoxy group, a nonyloxy group, a decyloxy group, a 2-hexyldecyloxy group, an undecyloxy group, a dodecyloxy group, a tridecyloxy group, a tetradecyloxy group, and a pentadecyloxy group (preferably an alkoxy group having 3 to 40 carbon atoms and more preferably an alkoxy group having 10 to 30 carbon atoms)), an aryloxycarbonylamino group, alkyl and aryl sulfonylamino groups, a mercapto group, alkyl and arylthio groups (including a methylthio group, an octylthio group, and the like), a heterocyclic thio group, a sulfamoyl group, a sulfo group, alkyl and aryl sulfinyl groups, alkyl and aryl sulfonyl groups, alkyloxy and aryloxy carbonyl groups, a carbamoyl group, an arylazo group, a heterocyclic azo group, an imide group, a phosphino group, a phosphinyl group, a phosphinyloxy group, a phosphinylamino group, a phosphono group, a silyl group (a ditrimethylsilyoxy methylbutoxy group), a hydrazino group, a group represented by Formula (W) which will be described later, and other known substituents.

These substituents may further have a substituent.

In addition, these substituents may have a group derived from a polymerizable group.

Each of $R^{11}$ and $R^{13}$ is independently preferably any of a hydrogen atom, an alkyl group, an aryl group, an alkenyl group, an alkynyl group, a heterocyclic group, an alkoxy group, an alkylthio group, and a group represented by Formula (W) which will be described later, more preferably any of a hydrogen atom, an alkyl group having 1 to 12 carbon atoms, and an alkoxy group having 1 to 11 carbon atoms, particularly preferably any of a hydrogen atom, an alkyl group having 1 to 3 carbon atoms, and an alkoxy group having 1 to 3 carbon atoms from the viewpoint of making it possible to easily form an intramolecular hydrogen bond by keeping a cyclohexadienone skeleton and arylene groups or a heteroarylene groups ($Ar^1$ to $Ar^4$) adjacent to each other on both sides of the cyclohexadienone skeleton within a plane by means of suppressing the bulkiness of $R^{11}$ and $R^{13}$, more particularly preferably any of a hydrogen atom, a methyl group, and an ethoxy group, and most preferably a hydrogen atom.

Each of $R^{12}$ and $R^{14}$ is independently preferably any of a hydrogen atom, an alkyl group, an aryl group, an alkenyl group, an alkynyl group, an alkoxy group, a heterocyclic group, an alkylthio group, an amino group, and a group represented by Formula (W) which will be described later, more preferably any of a hydrogen atom, an alkyl group having 3 to 40 carbon atoms, an aryl group having 6 to 20 carbon atoms, an alkenyl group having 2 to 12 carbon atoms, an alkynyl group having 2 to 12 carbon atoms, an alkoxy group having 3 to 40 carbon atoms, a heterocyclic group having 5 to 12 carbon atoms, an alkylthio group having 1 to 12 carbon atoms, an amino group substituted with an alkyl group having 1 to 12 carbon atoms, and a group represented by Formula (W) which will be described later, and particularly preferably a group represented by Formula (W) which will be described later. Furthermore, each of $R^{12}$ and $R^{14}$ is preferably a branched substituent in which a linear substituent further has a substituent.

The alkyl group which can be adopted as $R^{12}$ and $R^{14}$ is preferably an alkyl group having 3 to 40 carbon atoms, more preferably an alkyl group having 10 to 30 carbon atoms from the viewpoint of the chemical stability and the carrier transport properties, and particularly preferably an alkyl group having 15 to 30 carbon atoms. Furthermore, the alkyl group which can be adopted as $R^{12}$ and $R^{14}$ is preferably a linear or branched alkyl group, and more preferably a branched alkyl group from the viewpoint of improving the carrier mobility and the solubility without deteriorating the intramolecular hydrogen bonding properties.

The alkoxy group which can be adopted as $R^{12}$ and $R^{14}$ is preferably an alkoxy group having 3 to 40 carbon atoms, more preferably an alkoxy group having 10 to 30 carbon atoms from the viewpoint of the chemical stability and the carrier transport properties, and particularly preferably an alkoxy group having 15 to 30 carbon atoms. Furthermore, the alkoxy group which can be adopted as $R^{12}$ and $R^{14}$ is preferably a linear or branched alkoxy group, and more preferably a branched alkoxy group from the viewpoint of improving the carrier mobility and the solubility without deteriorating the intramolecular hydrogen bonding properties.

At least one of $R^{11}$ to $R^{14}$ is preferably a group represented by the following Formula (W).

$$-L-R \quad \text{Formula (W)}$$

(In Formula (W), L represents a divalent linking group represented by any of the following Formulae (L-1) to (L-12) or a divalent linking group formed by bonding of two or more divalent linking groups represented by any of the following Formulae (L-1) to (L-12); R represents a substituted or unsubstituted alkyl group, an oligo-oxyethylene group in which a repetition number v of an oxyethylene unit is equal to or greater than 2, an oligosiloxane group having two or more silicon atoms, or a substituted or unsubstituted silyl group; and R represents a substituted or unsubstituted silyl group only when L adjacent to R is a divalent linking group represented by any of the following Formulae (L-1) to (L-3).)

(L-1)

(L-2)

(L-3)

(L-4)

(L-5)

(L-6)

(L-7)

(L-8)

(L-9)

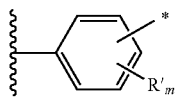

(L-10)

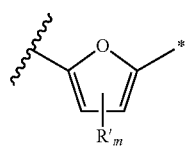

(L-11)

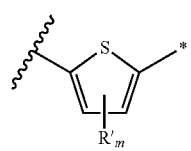

(L-12)

(In Formulae (L-1) to (L-12), the portion of a wavy line represents a position where the divalent linking group is bonded to a cyclohexadienone skeleton; * represents a position where the divalent linking group is bonded to any of the divalent linking groups represented by Formulae (L-1) to (L-12) and R; m in Formula (L-10) is 4; m in Formulae (L-11) and (L-12) is 2; and each R' in Formulae (L-1), (L-2), (L-10), (L-11), and (L-12) independently represents a hydrogen atom or a substituent.)

In Formula (W), L represents a divalent linking group represented by any of the following Formulae (L-1) to (L-12) or a divalent linking group formed by bonding of two or more divalent linking groups represented by any of Formulae (L-1) to (L-12). When L forms a linking group in which divalent linking groups represented by any of Formula (L-1) to (L-12) are bonded to each other, the number of the bonded divalent linking groups represented by any of Formula (L-1) to (L-12) is preferably 2 to 4, and more preferably 2 or 3.

Each substituent R' in Formulae (L-1), (L-2), (L-10), (L-11), and (L-12) independently represents a hydrogen atom or a substituent. Examples of the substituent which can be adopted as R' include an alkyl group having 5 to 15 carbon atoms (preferably an alkyl group having 6 to 15 carbon atoms) and an alkoxy group having 5 to 15 carbon atoms (preferably an alkoxy group having 6 to 15 carbon atoms).

m in Formula (L-10) represents 4, and m in Formulae (L-11) and (L-12) represents 2.

L is preferably a divalent linking group represented by any of Formulae (L-1), (L-4), and (L-8) or a divalent linking group formed by bonding of two or more divalent linking groups described above, more preferably a divalent linking group represented by any of Formula (L-1) and (L-4) or a divalent linking group formed by bonding of two or more divalent linking groups described above, and particularly preferably a divalent linking group represented by Formula (L-1) or a divalent linking group formed by bonding of two or more divalent linking groups described above.

In Formula (W), R represents a hydrogen atom, a substituted or unsubstituted alkyl group, an oligo-oxyethylene group in which a repetition number of an oxyethylene unit is equal to or greater than 2, an oligosiloxane group having two or more silicon atoms, or a substituted or unsubstituted silyl group. Here, R represents a substituted or unsubstituted silyl group only when L adjacent to R is a divalent linking group represented by Formula (L-3), and represents a hydrogen atom only when L adjacent to R is a divalent linking group represented by any of Formulae (L-1) to (L-3).

When L is represented by Formula (L-1), the substituted or unsubstituted alkyl group which can be adopted as R is preferably an alkyl group having 3 or more carbon atoms, more preferably an alkyl group having 3 to 40 carbon atoms, even more preferably an alkyl group having 10 to 30 carbon atoms from the viewpoint of the chemical stability and the carrier transport properties, and particularly preferably an alkyl group having 15 to 30 carbon atoms. Furthermore, when L is represented by Formula (L-1), the substituted or unsubstituted alkyl group which can be adopted as R is preferably a linear or branched alkyl group, and more preferably a branched alkyl group from the viewpoint of improving the carrier mobility and the solubility without deteriorating the intramolecular hydrogen bonding properties.

When L is represented by any of Formulae (L-2) and (L-3), the alkyl group which can be adopted as R is preferably an alkyl group having 2 or more carbon atoms, preferably an alkyl group having 3 to 18 carbon atoms, even more preferably an alkyl group having 3 to 12 carbon atoms, and particularly preferably an alkyl group having 4 to 10 carbon atoms.

When L is represented by any of Formulae (L-4) to (L-12), the alkyl group which can be adopted as R is preferably an alkyl group having 4 or more carbon atoms, preferably an alkyl group having 4 to 18 carbon atoms, even more preferably an alkyl group having 4 to 12 carbon atoms, and particularly preferably an alkyl group having 4 to 10 carbon atoms.

When -L-R in Formula (W) contains an alkyl group, if the alkyl group represented by R is equal to or greater than the lower limit of the aforementioned range, the carrier mobility is improved. Furthermore, when L contains Formula (L-1) adjacent to R, if the number of carbon atoms of the alkyl group formed by bonding of the alkylene group represented by Formula (L-1) and the alkyl group represented by R is equal to or greater than the lower limit of the aforementioned range, the carrier mobility is improved.

When R is an alkyl group having a substituent, examples of the substituent include a halogen atom and the like, and as the halogen atom, a fluorine atom is preferable. When R is an alkyl group having a fluorine-atom, a perfluoroalkyl group may be formed by substituting all the hydrogen atoms of the alkyl group with fluorine atoms.

In the present specification, when R is an oligo-oxyethylene group in which a repetition number v of an oxyethylene group is equal to or greater than 2, the "oxyethylene group" represented by R is a group represented by —$(CH_2CH_2)_vOY$ (the repetition number v of an oxyethylene unit represents an integer of equal to or greater than 2, and Y on the terminal represents a hydrogen atom or a substituent). When Y on the terminal of the oligo-oxyethylene group is a hydrogen atom, the terminal becomes a hydroxy group. The repetition number v of an oxyethylene unit is preferably 2 to 4, and more preferably 2 or 3. It is preferable that the hydroxy group on the terminal of the oligo-oxyethylene group is blocked. That is, Y preferably represents a substituent. In this case, the hydroxy group is preferably blocked by an alkyl group having 1 to 3 carbon atoms. That is, Y is preferably an alkyl group having 1 to 3 carbon atoms, more preferably a methyl group or an ethyl group, and particularly preferably a methyl group.

When R is an oligosiloxane group having 2 or more silicon atoms, the repetition number of the siloxane unit is preferably 2 to 4, and more preferably 2 or 3. Furthermore, the Si atom is preferably bonded to a hydrogen atom or an alkyl group. When the Si atom is bonded to an alkyl group, the number of carbon atoms of the alkyl group is preferably 1 to 3. For example, the Si atom is preferably bonded to a methyl group or an ethyl group. The Si atom may be bonded to the same alkyl groups or may be bonded to different alkyl groups or hydrogen atoms. The siloxane units constituting the oligosiloxane group may be the same as or different from each other, but it is preferable that they are the same as each other. When R is a substituted or unsubstituted silyl group, as the silyl group which can be adopted as R, a trialkylsilyl group having 3 to 15 carbon atoms is preferable.

Examples of the group represented by Formula (W) include a 2,6-dimethyloctyl group, a 3,7-dimethyloctyl group, a 2-decyltetradecyl group, a 2-hexyldecyl group, a 2-hexyldodecyl group, a 2-ethyloctyl group, a 2-decyltetradecyl group, a 2-butyldecyl group, a 2-octylnonyl group, a 2-octyldodecyl group, a 2-octyltetradecyl group, a 2-ethylhexyl group, a 2-butylnonyl group, a 2-hexyldecyloxy group, a ditrimethylsiloxy methylbutoxy group, a butoxy group, a hexyl group, a heptyl group, an octyl group, a nonyl group, a decyl group, an undecyl group, a dodecyl group, a tridecyl group, a tetradecyl group, a pentadecyl group, a 3,7-dimethyloctyloxy group, a 2-decyltetradecyloxy group, a 2-hexyldecyloxy group, a 2-hexyldodecyloxy group, a 2-ethyloctyloxy group, a 2-decyltetradecyloxy group, a 2-butyldecyloxy group, a 2-octyldodecyloxy group, a 2-octyltetradecyloxy group, a 2-ethylhexyloxy group, a hexyloxy group, a heptyloxy group, an octyloxy group, a nonyloxy group, a decyloxy group, an undecyloxy group, a dodecyloxy group, a tridecyloxy group, a tetradecyloxy group, a pentadecyloxy group, and the like.

Each of $Ar^1$ and $Ar^2$ independently represents a heteroarylene group or an arylene group. From the viewpoint of improving the carrier mobility by improving the intramolecular hydrogen bonding properties, it is preferable that $Ar^1$ and $R^{11}$ do not form a condensed ring by being bonded to each other. Furthermore, from the viewpoint of improving the carrier mobility by improving the intramolecular hydrogen bonding properties, it is preferable that $Ar^2$ and $R^{13}$ do not form a condensed ring by being bonded to each other. The heteroarylene group or the arylene group which can be adopted as $Ar^1$ and $Ar^2$ is not particularly limited, and examples thereof include a heteroarylene group having 4 to 30 carbon atoms and an arylene group having 6 to 30 carbon atoms. The heteroarylene group or the arylene group which can be adopted as $Ar^1$ and $Ar^2$ is preferably a divalent linking group represented by the following Formula (4-1), (4-2), or (4-3), and more preferably a divalent linking group represented by the following Formula (4-1) or (4-2). Furthermore, it is preferable that $Ar^1$ and $Ar^2$ represent the same heteroarylene groups or arylene groups.

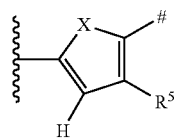

Formula (4-1)

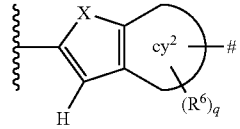

Formula (4-2)

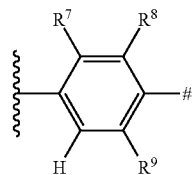

Formula (4-3)

(In Formulae (4-1) to (4-3), X represents a S atom, an O atom, or a Se atom; $Cy^2$ represents a structure in which 1 to 4 rings are condensed; each of $R^5$ to $R^9$ independently represents a hydrogen atom or a substituent; q represents an integer of 0 to 6; when q is equal to or greater than 2, two or more groups represented by $R^6$ may be the same as or different from each other; the wavy line represents a position where the divalent linking group is bonded to a cyclohexadienone ring-condensed site; and #represents a position where the divalent linking group is bonded to $V^1$ or $V^2$.)

In Formulae (4-1) to (4-3), X represents a S atom, an O atom, or a Se atom. X is preferably a S atom or a Se atom, and more preferably a S atom.

In Formulae (4-1) to (4-3), each of $R^5$ to $R^9$ independently represents a hydrogen atom or a substituent. The substituent which can be adopted as $R^5$ to $R^9$ is not particularly limited, and examples thereof include the same substituents as the substituents which can be adopted as $R^{11}$ to $R^{14}$.

The alkyl group which can be adopted as $R^5$ to $R^9$ is more preferably an alkyl group having 3 to 40 carbon atoms, even more preferably an alkyl group having 10 to 30 carbon atoms from the viewpoint of the chemical stability and the carrier transport properties, and particularly preferably an alkyl group having 15 to 30 carbon atoms. Furthermore, the alkyl group which can be adopted as $R^5$ to $R^9$ is preferably a linear or branched alkyl group, and more preferably a branched alkyl group from the view point of improving the carrier mobility and the solubility without deteriorating the intramolecular hydrogen bonding properties.

The alkoxy group which can be adopted as $R^5$ to $R^9$ is more preferably an alkoxy group having 3 to 40 carbon atoms, even more preferably an alkoxy group having 10 to 30 carbon atoms from the viewpoint of the chemical stability and the carrier transport properties, and particularly preferably an alkoxy group having 15 to 30 carbon atoms. Furthermore, the alkoxy group which can be adopted as $R^5$ to $R^9$ is preferably a linear or branched alkoxy group, and more preferably a branched alkoxy group from the viewpoint of improving the carrier mobility and the solubility without deteriorating the intramolecular hydrogen bonding properties.

These substituents may further have a substituent.

In addition, these substituents may have a group derived from a polymerizable group.

In Formula (4-2), q represents an integer of 0 to 6. q is preferably an integer of 0 to 3, more preferably an integer of 0 to 2, and even more preferably an integer of 0 or 1.

In Formula (4-2), $Cy^2$ represents a structure in which 1 to 4 rings are condensed. $Cy^2$ is preferably a structure in which 1 to 4 aromatic rings or heterocyclic aromatic rings are condensed, more preferably a structure in which 1 to 4 aromatic rings having 6 to 10 carbon atoms or 1 to 4 heterocyclic aromatic rings having 4 to 6 carbon atoms are condensed, and particularly preferably a structure in which 1 to 4 benzene rings or thiophene rings are condensed.

The divalent linking group represented by Formula (4-2) is preferably a divalent linking group represented by any of the following Formulae (5-1) to (5-8), and more preferably a divalent linking group represented by Formula (5-1).

Formula (5-1)
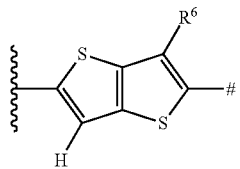

Formula (5-2)
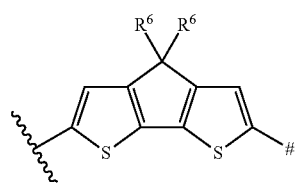

Formula (5-3)
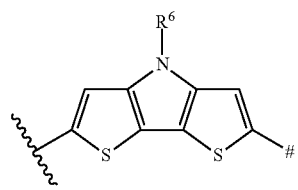

Formula (5-4)
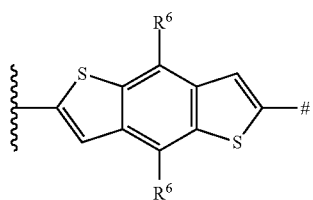

Formula (5-5)
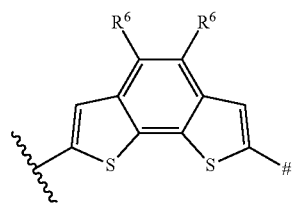

Formula (5-6)
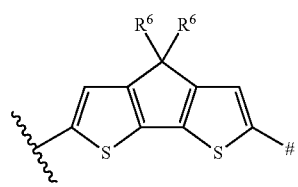

Formula (5-7)
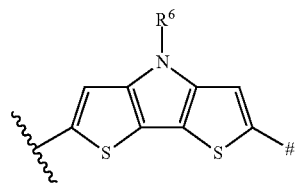

Formula (5-8)
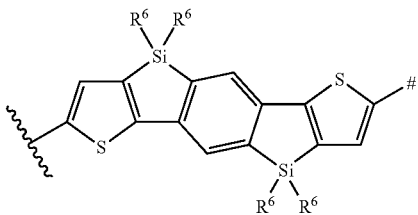

(In Formulae (5-1) to (5-8), each $R^6$ independently represents a hydrogen atom or a substituent; two or more groups represented by $R^6$ may be the same as or different from each other; the wavy line represents a position where the divalent linking group is bonded to a cyclohexadienone ring-condensed site; and #represents a position where the divalent linking group is bonded to $V^1$ or $V^2$.)

In Formulae (5-1) to (5-8), each $R^6$ independently represents a hydrogen atom or a substituent, and two or more groups represented by $R^6$ may be the same as or different from each other. Examples of the substituent which can be adopted as $R^6$ include those exemplified above as substituents which can be adopted as $R^5$ to $R^9$ in Formulae (4-1) to (4-3), and the preferred range thereof is also the same.

In Formula (1-1), $V^1$ represents a divalent linking group. From the viewpoint of improving the solubility, it is preferable that $V^1$ does not form a condensed ring by being bonded to $Ar^1$ or $Ar^2$. The divalent linking group which can be adopted as $V^1$ is not particularly limited, but is preferably represented by any of the following Formulae (V-1) to (V-17).

(V-1)
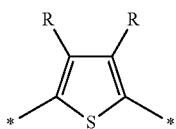

(V-2)
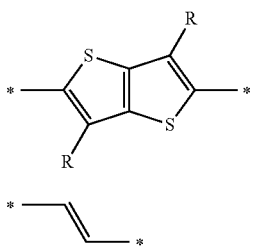

(V-3)
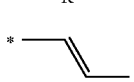

(V-4)
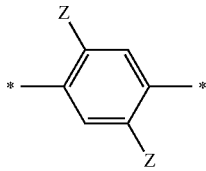

(V-5)
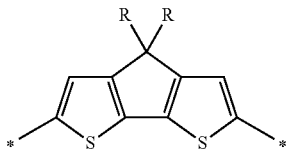

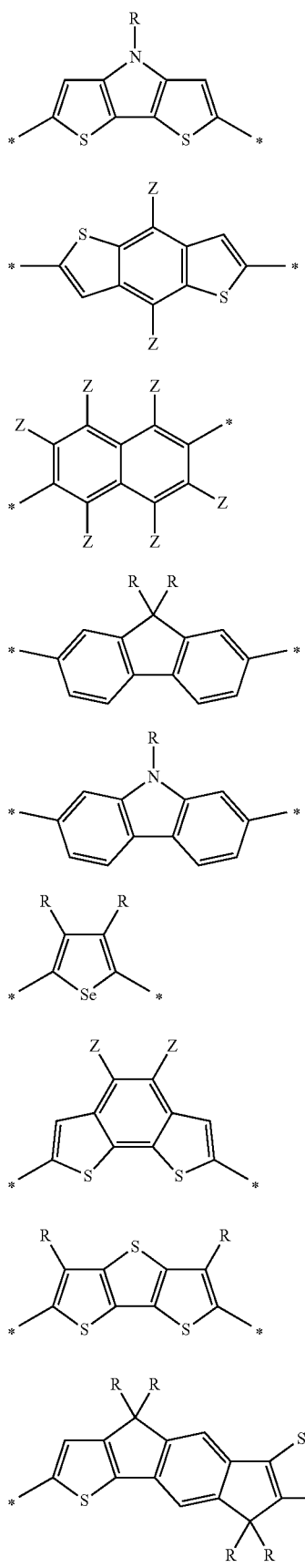

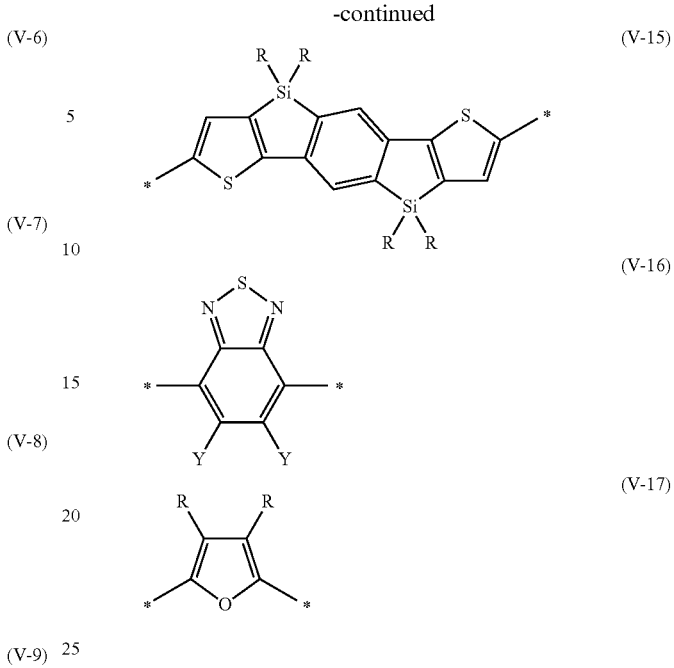

(In Formulae (V-1) to (V-17), * represents a position where the divalent linking group is bonded to any of Ar¹ to Ar⁴ when m or p is 1, and represents a position where the divalent linking group is bonded to any of Ar¹ to Ar⁴ and the divalent linking groups represented by Formulae (V-1) to (V-17) when m or p is equal to or greater than 2; each R in Formulae (V-1), (V-2), (V-5), (V-6), (V-9) to (V-11), (V-13) to (V-15), and (V-17) independently represents a hydrogen atom or an alkyl group; the groups adjacent to each other represented by R may form a ring by being bonded to each other; each Z in Formulae (V-4), (V-7), (V-8), and (V-12) independently represents a hydrogen atom, an alkyl group, or an alkoxy group; the groups adjacent to each other represented by Z may form a ring by being bonded to each other; each Y in Formula (V-16) independently represents a hydrogen atom, an alkyl group, an alkoxy group, a CN group, or a F atom; and the groups adjacent to each other represented by Y may form a ring by being bonded to each other.)

Each R in Formulae (V-1), (V-2), (V-5), (V-6), (V-9) to (V-11), (V-13) to (V-15), and (V-17) independently represents a hydrogen atom or an alkyl group, and the groups adjacent to each other represented by R may form a ring by being bonded to each other. Examples of the alkyl group which can be adopted as R include the alkyl group which can be adopted as $R^5$ to $R^9$ in Formulae (4-1) to (4-3). Furthermore, the preferred range of the alkyl group which can be adopted as R is the same as the preferred range of the alkyl group which can be adopted as $R^5$ to $R^9$.

Each Z in Formulae (V-4), (V-7), (V-8), and (V-12) independently represents a hydrogen atom, an alkyl group, or an alkoxy group, and the groups adjacent to each other represented by Z may form a ring by being bonded to each other. Examples of the alkyl group or the alkoxy group which can be adopted as Z include the alkyl group and the alkoxy group which can be adopted as $R^5$ to $R^9$ in Formulae (4-1) to (4-3). Furthermore, the preferred range of the alkyl group and the alkoxy group which can be adopted as Z is the same as the preferred range of the alkyl group and the alkoxy group which can be adopted as $R^5$ to $R^9$.

Each Y in Formula (V-16) independently represents a hydrogen atom, an alkyl group, an alkoxy group, a CN group, or a F atom, and the groups adjacent to each other represented by Y may form a ring by being bonded to each other. Y is preferably an alkyl group or an alkoxy group. Examples of the alkyl group or the alkoxy group which can be adopted as Y include the alkyl group and the alkoxy group exemplified above as the substituent which can be adopted as $R^5$ to $R^9$ in Formulae (4-1) to (4-3), and the preferred range thereof is also the same.

Among the divalent linking groups represented by Formulae (V-1) to (V-17), the divalent linking groups represented by Formulae (V-1) to (V-15) are preferable, the divalent linking groups represented by Formulae (V-1) to (V-8) and (V-11) to (V-15) are more preferable, and the divalent linking groups represented by Formulae (V-1) to (V-3) and (V-7) are particularly preferable.

In Formula (1-1), m represents an integer of 0 to 6. When m is equal to or greater than 2, two or more groups represented by $V^1$ may be the same as or different from each other. m is preferably an integer of 0 to 5, and more preferably 0 to 3.

In Formula (1-1), n represents an integer of equal to or greater than 2. n is preferably equal to or greater than 5, more preferably equal to or greater than 10, and particularly preferably equal to or greater than 30. The greater the value of n, the further the interaction between π-conjugated polymer chains can be improved, and thus the carrier mobility can be improved. The upper limit of n is not particularly limited, but it is preferably equal to or less than 2,000 and more preferably equal to or less than 1,000.

<<Compound Composed of n Repeating Units Represented by Formula (1-2)>>

The compound composed of n repeating units represented by Formula (1-2) is represented by the following Formula.

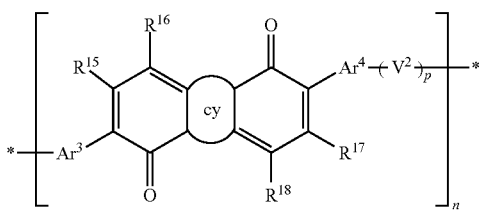

Formula (1-2)

(In Formula (1-2), Cy represents a benzene ring, a naphthalene ring, or an anthracene ring; each of $R^{15}$ to $R^{18}$ independently represents a hydrogen atom or a substituent; each of $Ar^3$ and $Ar^4$ independently represents a heteroarylene group or an arylene group; $V^2$ represents a divalent linking group; p represents an integer of 0 to 6; when p is equal to or greater than 2, two or more groups represented by $V^2$ may be the same as or different from each other; and n is equal to or greater than 2.)

In Formula (1-2), each of $R^{15}$ to $R^{18}$ independently represents a hydrogen atom or a substituent. The substituent which can be adopted as $R^{15}$ and $R^{17}$ is the same as the substituent which can be adopted as $R^{11}$ and $R^{13}$ in Formula (1-1), and the preferred range thereof is also the same. The substituent which can be adopted as $R^{16}$ and $R^{18}$ is the same as the substituent which can be adopted as $R^{12}$ and $R^{14}$ in Formula (1-1), and the preferred range thereof is also the same.

In Formula (1-2), each of $Ar^3$ and $Ar^4$ independently represents a heteroarylene group or an arylene group. From the viewpoint of improving the carrier mobility by improving the intramolecular hydrogen bonding properties, it is preferable that $Ar^3$ and $R^{15}$ do not form a condensed ring by being bonded to each other. In addition, from the viewpoint of improving the carrier mobility by improving the intramolecular hydrogen bonding properties, it is preferable that $Ar^4$ and $R^{17}$ do not form a condensed ring by being bonded to each other. The heteroarylene group or the arylene group which can be adopted as $Ar^3$ and $Ar^4$ is the same as the heteroarylene group or the arylene group which can be adopted as $Ar^1$ and $Ar^2$ in Formula (1-1), and the preferred range thereof is also the same.

In Formula (1-2), $V^2$ represents a divalent linking group. From the viewpoint of improving the solubility, it is preferable that $V^2$ does not form a condensed ring together with $Ar^3$ or $Ar^4$. The divalent linking group which can be adopted as $V^2$ is the same as the divalent linking group which can be adopted as $V^1$ in Formula (1-1), and the preferred range thereof is also the same. Here, when m or p is 1, * in Formulae (V-1) to (V-17) represents a position where the divalent linking group is bonded to any of $Ar^3$ and $Ar^4$, and when m or p is equal to or greater than 2, * in Formulae (V-1) to (V-17) represents a position where the divalent linking group is bonded to any of $Ar^3$, $Ar^4$, and the divalent linking groups represented by Formulae (V-1) to (V-17).

In Formula (1-2), p represents an integer of 0 to 6. When p is equal to or greater than 2, two or more groups represented by $V^2$ may be the same as or different from each other. p has the same definition as m in Formula (1-1), and the preferred range thereof is also the same.

In Formula (1-2), n represents an integer of equal to or greater than 2. n has the same definition as n in Formula (1-1), and the preferred range thereof is also the same.

In Formula (1-2), Cy represents a benzene ring, a naphthalene ring, or an anthracene ring. The benzene ring, the naphthalene ring, or the anthracene ring represented by Cy may have a substituent, and the substituent is not particularly limited. The substituent is the same as the substituent which can be adopted as $R^{12}$ and $R^{14}$ in Formula (1-1), and the preferred range thereof is also the same. Here, from the viewpoint of improving the long-term stability of the compound, it is preferable that a hydroxyl group (—OH group) is not substituted.

The site where the benzene ring, the naphthalene ring, and the anthracene ring represented by Cy are condensed with a cyclohexadienone ring is not particularly limited. Specifically, it is preferable that the benzene ring, the naphthalene ring, or the anthracene ring is condensed such that the compound composed of n repeating units represented by Formula (1-2) becomes a compound having a rotationally symmetric skeleton. It is more preferable that the benzene ring, the naphthalene ring, or the anthracene ring is condensed so as to form a compound composed of n repeating units represented by the following Formula (2-1), (2-2), (2-3), (2-4), or (2-5).

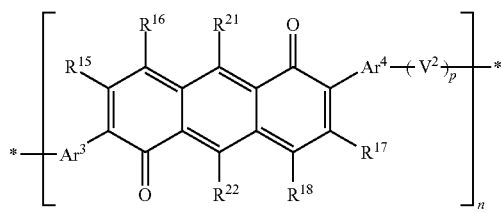

Formula (2-1)

-continued

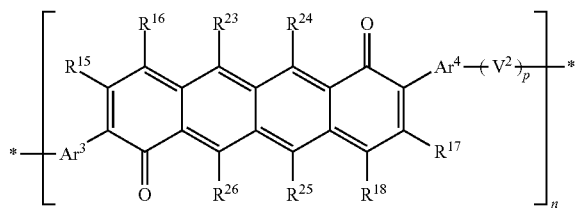
Formula (2-2)

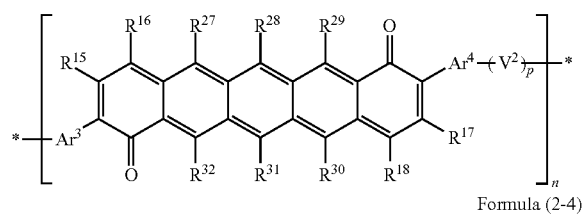
Formula (2-3)

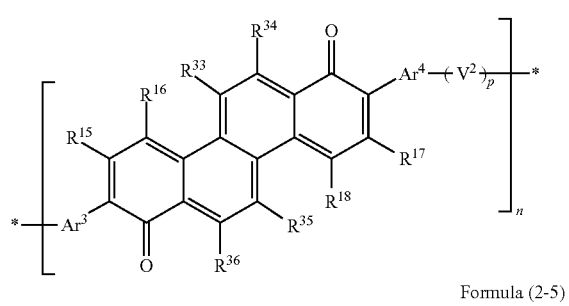
Formula (2-4)

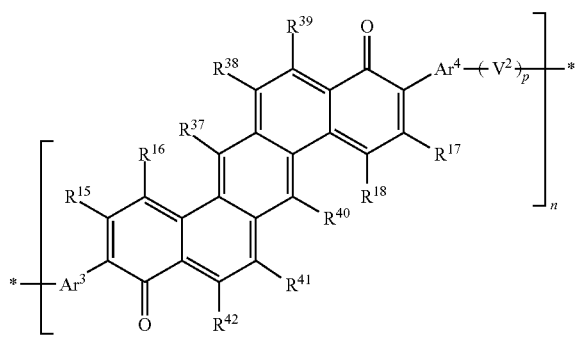
Formula (2-5)

(In Formulae (2-1) to (2-5), each of $R^{15}$ to $R^{18}$ and $R^{21}$ to $R^{42}$ independently represents a hydrogen atom or a substituent; each of $Ar^3$ and $Ar^4$ independently represents a heteroarylene group or an arylene group; $V^2$ represents a divalent linking group; p represents an integer of 0 to 6; when p is equal to or greater than 2, two or more groups represented by $V^2$ may be the same as or different from each other; and n is equal to or greater than 2.)

In Formulae (2-1) to (2-5), each of $R^{15}$ to $R^{18}$ and $R^{21}$ to $R^{42}$ independently represents a hydrogen atom or a substituent.

The substituent which can be adopted as $R^{15}$ to $R^{18}$ in Formulae (2-1) to (2-5) is the same as the substituent which can be adopted as $R^{15}$ to $R^{18}$ in Formula (1-2), and the preferred range thereof is also the same.

The substituent which can be adopted as $R^{21}$ to $R^{42}$ in Formulae (2-1) to (2-5) is the same as the substituent which can be adopted as $R^{12}$ and $R^{14}$ in Formula (1-1), and the preferred range thereof is also the same.

It is preferable that at least one of $R^{15}$ to $R^{18}$, $R^{21}$, and $R^{22}$ in Formula (2-1) is a group represented by Formula (W).

More preferably, at least two out of $R^{16}$, $R^{18}$, $R^{21}$, and $R^{22}$ are groups represented by Formula (W). Particularly preferably, both of $R^{21}$ and $R^{22}$ are groups represented by Formula (W).

It is preferable that at least one of $R^{15}$ to $R^{18}$ and $R^{23}$ to $R^{26}$ in Formula (2-2) is a group represented by Formula (W). More preferably, at least two out of $R^{16}$, $R^{18}$, $R^{23}$, $R^{24}$, $R^{25}$, and $R^{26}$ are groups represented by Formula (W). Particularly preferably, all of $R^{23}$, $R^{24}$, $R^{25}$, and $R^{26}$ are groups represented by Formula (W).

It is preferable that at least one of $R^{15}$ to $R^{18}$ and $R^{27}$ to $R^{32}$ in Formula (2-3) is a group represented by Formula (W). More preferably, at least two out of $R^{16}$, $R^{18}$, and $R^{27}$ to $R^{32}$ are groups represented by Formula (W). Particularly preferably, both of $R^{28}$ and $R^{31}$ are groups represented by Formula (W).

It is preferable that at least one of $R^{15}$ to $R^{18}$ and $R^{33}$ to $R^{36}$ in Formula (2-4) is a group represented by Formula (W). More preferably, zero to two out of $R^1$ to $R^{18}$ and two to four out of $R^{33}$ to $R^{36}$ are groups represented by Formula (W). Particularly preferably, two out of $R^{15}$ to $R^{18}$ and two out of $R^{33}$ to $R^{36}$ are groups represented by Formula (W).

It is preferable that at least one of $R^{15}$ to $R^{18}$ and $R^{37}$ to $R^{42}$ in Formula (2-5) is a group represented by Formula (W). More preferably, zero to two out of $R^{15}$ to $R^{18}$ and two to six out of $R^{37}$ to $R^{42}$ are groups represented by Formula (W). Particularly preferably, two out of $R^{15}$ to $R^{18}$ and two out of $R^{37}$ to $R^{42}$ are groups represented by Formula (W).

In Formulae (2-1) to (2-5), each of $Ar^3$ and $Ar^4$ independently represents a heterocyclic aromatic ring or an aromatic ring. The heteroarylene group or the arylene group which can be adopted as $Ar^3$ and $Ar^4$ is the same as the heteroarylene group or the arylene group which can be adopted as $Ar^3$ and $Ar^4$ in Formula (1-2), and the preferred range thereof is also the same.

In Formulae (2-1) to (2-5), $V^2$ represents a divalent linking group. The divalent linking group which can be adopted as $V^2$ is the same as the divalent linking group which can be adopted as $V^2$ in Formula (1-2), and the preferred range thereof is also the same.

In Formulae (2-1) to (2-5), p represents an integer of 0 to 6. When p is equal to or greater than 2, two or more groups represented by $V^2$ may be the same as or different from each other. p in Formulae (2-1) to (2-5) has the same definition as p in Formula (1-2), and the preferred range thereof is also the same.

In Formulae (2-1) to (2-5), n represents an integer of equal to or greater than 2. n has the same definition as n in Formula (1-2), and the preferred range thereof is also the same.

From the viewpoint of maintaining the balance between the extent of widening of a π plane and high solubility, the compound composed of n repeating units represented by Formula (1-2) is preferably a compound composed of n repeating units represented by Formula (2-1) or (2-2), and more preferably a compound composed of n repeating units represented by Formula (2-1).

Specific examples of the compound composed of n repeating units represented by Formula (1-1) or (1-2) include a compound composed of n repeating units represented by the following Formula (MV). However, the compound composed of n repeating units represented by Formula (1-1) or 1-2) that can be used in the present invention is not limited to the specific example.

$$*\!-\!\!\left[\!M^1\!-\!Vx\right]_{\overline{n}}\!\!-\!*$$

Formula (MV)

(In Formula (MV), $M^1$ represents a divalent linking group $M^1$ in the following table; Vx represents a divalent linking group Vx in the following table; and n represents an integer of equal to or greater than 2.)

TABLE 1

| Compound No. | $M^1$ | Vx |
|---|---|---|
| 1 | 1-1-1 | V1 |
| 2 | 1-1-1 | V8 |
| 3 | 1-1-1 | V21 |
| 4 | 1-1-2 | V3 |
| 5 | 1-1-2 | V7 |
| 6 | 1-1-2 | V23 |
| 7 | 1-1-3 | V25 |
| 8 | 1-1-3 | V26 |
| 9 | 1-1-3 | V28 |
| 10 | 1-1-4 | V15 |
| 11 | 1-1-4 | V27 |
| 12 | 1-1-4 | V33 |
| 13 | 1-1-5 | V17 |
| 14 | 1-1-5 | V31 |
| 15 | 1-1-5 | V33 |
| 16 | 1-1-6 | V14 |
| 17 | 1-1-6 | V37 |
| 18 | 1-1-6 | V40 |
| 19 | 1-1-7 | V8 |
| 20 | 1-1-7 | V44 |
| 21 | 1-1-8 | V45 |
| 22 | 1-1-8 | V46 |
| 23 | 1-1-9 | V5 |
| 24 | 1-1-9 | V48 |
| 25 | 1-1-10 | V4 |
| 26 | 1-1-10 | V18 |
| 27 | 1-1-10 | V50 |
| 28 | 1-1-11 | V14 |
| 29 | 1-1-11 | V17 |
| 30 | 1-1-12 | V18 |
| 31 | 1-1-12 | V20 |
| 32 | 1-1-13 | V16 |
| 33 | 1-1-13 | V22 |
| 34 | 1-1-13 | V41 |
| 35 | 1-1-14 | V49 |
| 36 | 1-1-14 | V47 |
| 37 | 1-1-15 | V22 |
| 38 | 1-1-15 | V23 |
| 39 | 1-1-16 | V24 |
| 40 | 1-1-16 | V27 |
| 41 | 1-1-17 | V32 |
| 42 | 1-1-17 | V36 |
| 43 | 1-1-18 | V42 |
| 44 | 1-1-18 | V47 |
| 45 | 1-1-19 | V50 |
| 46 | 1-1-19 | V10 |
| 47 | 1-1-20 | V1 |
| 48 | 1-1-20 | V3 |
| 49 | 1-1-20 | V16 |
| 50 | 1-1-21 | V4 |
| 51 | 1-1-21 | V5 |
| 52 | 1-1-22 | None |
| 53 | 1-1-22 | V19 |
| 54 | 1-1-23 | V18 |
| 55 | 1-1-23 | V4 |
| 56 | 1-1-24 | V2 |
| 57 | 1-1-24 | V8 |
| 58 | 1-1-25 | V3 |
| 59 | 1-1-25 | None |
| 60 | 1-1-26 | V1 |
| 61 | 1-1-26 | V2 |
| 62 | 1-1-27 | V3 |
| 63 | 1-1-27 | V4 |
| 64 | 1-1-27 | V36 |
| 65 | 1-1-28 | V9 |
| 66 | 1-1-28 | V13 |
| 67 | 1-1-28 | V27 |
| 68 | 1-1-29 | V2 |
| 69 | 1-1-29 | V3 |
| 70 | 1-1-30 | None |
| 71 | 1-1-30 | V11 |

TABLE 1-continued

| Compound No. | $M^1$ | Vx |
|---|---|---|
| 72 | 1-1-30 | V37 |
| 73 | 1-1-31 | V4 |
| 74 | 1-1-31 | V47 |
| 75 | 1-1-32 | V3 |
| 76 | 1-1-32 | V5 |
| 77 | 1-1-33 | V1 |
| 78 | 1-1-33 | V8 |
| 79 | 1-1-34 | V2 |
| 80 | 1-1-34 | V7 |
| 81 | 1-1-35 | V1 |
| 82 | 1-1-36 | V12 |
| 83 | 1-1-37 | V3 |
| 84 | 1-1-38 | V47 |
| 85 | 1-1-39 | V24 |
| 86 | 1-1-40 | V38 |
| 87 | 1-1-41 | V48 |
| 88 | 1-1-42 | V30 |
| 89 | 1-1-43 | V49 |
| 90 | 1-1-44 | V48 |
| 91 | 1-1-45 | V45 |
| 92 | 1-1-46 | V5 |
| 93 | 1-1-47 | V4 |
| 94 | 1-1-48 | V23 |
| 95 | 1-1-48 | V48 |
| 96 | 1-1-49 | V7 |
| 97 | 1-1-49 | V36 |
| 98 | 1-1-50 | V5 |
| 99 | 2-1-1 | V8 |
| 100 | 2-1-1 | V20 |
| 101 | 2-1-1 | V23 |
| 102 | 2-1-2 | V7 |
| 103 | 2-1-2 | V22 |
| 104 | 2-1-2 | V44 |
| 105 | 2-1-3 | V5 |
| 106 | 2-1-3 | V28 |
| 107 | 2-1-3 | V33 |
| 108 | 2-1-4 | V6 |
| 109 | 2-1-4 | V19 |
| 110 | 2-1-5 | V15 |
| 111 | 2-1-5 | V22 |
| 112 | 2-1-5 | V33 |
| 113 | 2-1-6 | V14 |
| 114 | 2-1-6 | V4 |
| 115 | 2-1-6 | V40 |
| 116 | 2-1-7 | V32 |
| 117 | 2-1-7 | V33 |
| 118 | 2-1-7 | V36 |
| 119 | 2-1-8 | V3 |
| 120 | 2-1-8 | V20 |

TABLE 2

| Compound No. | $M^1$ | Vx |
|---|---|---|
| 121 | 2-1-9 | V21 |
| 122 | 2-1-9 | V23 |
| 123 | 2-1-9 | V31 |
| 124 | 2-1-10 | V25 |
| 125 | 2-1-10 | V30 |
| 126 | 2-1-10 | V50 |
| 127 | 2-1-11 | V26 |
| 128 | 2-1-11 | V27 |
| 129 | 2-1-12 | V1 |
| 130 | 2-1-12 | V21 |
| 131 | 2-1-13 | V16 |
| 132 | 2-1-13 | V22 |
| 133 | 2-1-13 | V41 |
| 134 | 2-1-14 | V26 |
| 135 | 2-1-14 | V38 |
| 136 | 2-1-15 | V5 |
| 137 | 2-1-15 | V21 |
| 138 | 2-1-16 | V23 |
| 139 | 2-1-16 | V40 |

TABLE 2-continued

| Compound No. | M¹ | Vx |
|---|---|---|
| 140 | 2-1-17 | V43 |
| 141 | 2-1-17 | V46 |
| 142 | 2-1-18 | V32 |
| 143 | 2-1-18 | V34 |
| 144 | 2-1-19 | V5 |
| 145 | 2-1-19 | V11 |
| 146 | 2-1-20 | V4 |
| 147 | 2-1-20 | V11 |
| 148 | 2-1-21 | V3 |
| 149 | 2-1-21 | V13 |
| 150 | 2-1-22 | V1 |
| 151 | 2-1-22 | V50 |
| 152 | 2-1-23 | V19 |
| 153 | 2-1-23 | V24 |
| 154 | 2-1-24 | None |
| 155 | 2-1-24 | V4 |
| 156 | 2-1-25 | V2 |
| 157 | 2-1-25 | V8 |
| 158 | 2-1-26 | V1 |
| 159 | 2-1-26 | V10 |
| 160 | 2-1-27 | V6 |
| 161 | 2-1-27 | V48 |
| 162 | 2-1-28 | V3 |
| 163 | 2-1-28 | V13 |
| 164 | 2-1-28 | None |
| 165 | 2-1-29 | V4 |
| 166 | 2-1-29 | V38 |
| 167 | 2-1-30 | V11 |
| 168 | 2-1-30 | V24 |
| 169 | 2-1-30 | V45 |
| 170 | 2-1-31 | V1 |
| 171 | 2-1-32 | V5 |
| 172 | 2-1-33 | V8 |
| 173 | 2-1-34 | None |
| 174 | 2-1-35 | V12 |
| 175 | 2-1-36 | V4 |
| 176 | 2-1-37 | V3 |
| 177 | 2-1-38 | V39 |
| 178 | 2-1-39 | V49 |
| 179 | 2-1-40 | V19 |
| 180 | 2-1-41 | V3 |
| 181 | 2-1-42 | V5 |
| 182 | 2-1-43 | V2 |
| 183 | 2-1-44 | V10 |
| 184 | 2-1-45 | V3 |
| 185 | 2-1-46 | V4 |
| 186 | 2-1-47 | V5 |
| 187 | 2-1-48 | V22 |
| 188 | 2-1-48 | V30 |
| 189 | 2-1-49 | V4 |
| 190 | 2-1-49 | V42 |
| 191 | 2-1-50 | V23 |
| 192 | 2-2-1 | V22 |
| 193 | 2-2-2 | V21 |
| 194 | 2-2-3 | V5 |
| 195 | 2-2-4 | V6 |
| 196 | 2-2-5 | V3 |
| 197 | 2-2-6 | V15 |
| 198 | 2-2-7 | V43 |
| 199 | 2-2-8 | V41 |
| 200 | 2-2-9 | V33 |
| 201 | 2-2-10 | V3 |
| 202 | 2-2-11 | V13 |
| 203 | 2-2-12 | V4 |
| 204 | 2-2-13 | V2 |
| 205 | 2-2-14 | V4 |
| 206 | 2-2-15 | V38 |
| 207 | 2-2-16 | V45 |
| 208 | 2-2-17 | None |
| 209 | 2-2-18 | V9 |
| 210 | 2-2-19 | V21 |
| 211 | 2-2-20 | V31 |
| 212 | 2-3-1 | V20 |
| 213 | 2-3-2 | V15 |
| 214 | 2-3-3 | V35 |
| 215 | 2-3-4 | V42 |
| 216 | 2-3-5 | V29 |
| 217 | 2-3-6 | V5 |
| 218 | 2-3-7 | V22 |
| 219 | 2-3-8 | V34 |
| 220 | 2-3-9 | V40 |
| 221 | 2-3-10 | V3 |
| 222 | 2-3-11 | V13 |
| 223 | 2-3-12 | V4 |
| 224 | 2-3-13 | V12 |
| 225 | 2-3-14 | V4 |
| 226 | 2-3-15 | V3 |
| 227 | 2-3-16 | V50 |
| 228 | 2-3-17 | None |
| 229 | 2-3-18 | V9 |
| 230 | 2-3-19 | V20 |
| 231 | 2-3-20 | V26 |
| 232 | 2-4-1 | V22 |
| 233 | 2-4-2 | V15 |
| 234 | 2-4-3 | V34 |
| 235 | 2-4-4 | V42 |
| 236 | 2-4-5 | V29 |
| 237 | 2-4-6 | V5 |
| 238 | 2-4-7 | V20 |
| 239 | 2-4-8 | V35 |
| 240 | 2-4-9 | V41 |

TABLE 3

| Compound No. | M¹ | Vx |
|---|---|---|
| 241 | 2-4-10 | V3 |
| 242 | 2-4-11 | V13 |
| 243 | 2-4-12 | V4 |
| 244 | 2-4-13 | V12 |
| 245 | 2-4-14 | None |
| 246 | 2-4-15 | V3 |
| 247 | 2-4-16 | V49 |
| 248 | 2-4-17 | V2 |
| 249 | 2-4-18 | V9 |
| 250 | 2-4-19 | V21 |
| 251 | 2-4-20 | V25 |
| 252 | 2-5-1 | V20 |
| 253 | 2-5-2 | V15 |
| 254 | 2-5-3 | V35 |
| 255 | 2-5-4 | V42 |
| 256 | 2-5-5 | V29 |
| 257 | 2-5-6 | V5 |
| 258 | 2-5-7 | V22 |
| 259 | 2-5-8 | V34 |
| 260 | 2-5-9 | V40 |
| 261 | 2-5-10 | V3 |
| 262 | 2-5-11 | V13 |
| 263 | 2-5-12 | V4 |
| 264 | 2-5-13 | V12 |
| 265 | 2-5-14 | None |
| 266 | 2-5-15 | V3 |

TABLE 3-continued

| Compound No. | M¹ | Vx |
|---|---|---|
| 267 | 2-5-16 | V50 |
| 268 | 2-5-17 | V2 |
| 269 | 2-5-18 | V9 |
| 270 | 2-5-19 | V20 |
| 271 | 2-5-20 | V26 |

In the above tables, M¹ represents a linking group represented by the following Formula (1-1M), (2-1M), (2-2M), (2-3M), (2-4M), or (2-5M), and Vx represents linking groups V1 to V50 which will be described later.

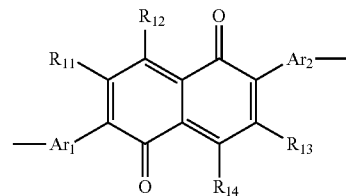

Formula (1-1M)

In Formula (1-1M), each of $Ar^1$, $Ar^2$, and $R^{11}$ to $R^{14}$ represents the following groups.

TABLE 4

| | Ar¹ | Ar² | R¹¹ | R¹² |
|---|---|---|---|---|
| 1-1-1 | *⟨S⟩* | *⟨S⟩* | H | H |
| 1-1-2 | *⟨S⟩* | *⟨S⟩* | H | *—N(C₆H₁₃)₂ |
| 1-1-3 | *⟨S⟩* | *⟨S⟩* | H | *—CH(C₁₂H₂₅)—C₁₀H₂₁ |
| 1-1-4 | *⟨S⟩* | *⟨S⟩* | *—CH₃ | *—CH(C₈H₁₇)—C₁₀H₂₁ |
| 1-1-5 | *⟨S⟩* | *⟨S⟩* | H | *—O—CH(C₈H₁₇)—C₁₀H₂₁ |
| 1-1-6 | *⟨S⟩* | *⟨S⟩* | H | *—OC₈H₁₃ |
| 1-1-7 | *⟨S⟩* | *⟨S⟩* | *—C₈H₁₇ | H |
| 1-1-8 | *⟨S⟩-C₆H₁₃ | *⟨S⟩-C₆H₁₃ | H | *—N(C₆H₁₃)₂ |
| 1-1-9 | *⟨S⟩-C₁₀H₂₁ | *⟨S⟩-C₁₀H₂₁ | H | *—CH(Et)—C₄H₉ |
| 1-1-10 | *⟨S⟩* | *⟨S⟩* | H | *—O—CH₂CH₂—CH(CH₃)—CH₂CH₂—CH(CH₃)—CH₃ |

TABLE 4-continued

|   | $R^{13}$ | $R^{14}$ |
|---|---|---|
| 1-1-1 | H | H |
| 1-1-2 | H | *—N(C$_6$H$_{13}$)$_2$ |
| 1-1-3 | H | *—CH$_2$—CH(C$_{12}$H$_{25}$)—C$_{10}$H$_{21}$ |
| 1-1-4 | *—CH$_3$ | *—CH$_2$—CH(C$_8$H$_{17}$)—C$_{10}$H$_{21}$ |
| 1-1-5 | H | *—O—CH$_2$—CH(C$_8$H$_{17}$)—C$_{10}$H$_{21}$ |
| 1-1-6 | H | *—OC$_8$H$_{13}$ |
| 1-1-7 | *—C$_8$H$_{17}$ | H |
| 1-1-8 | H | *—N(C$_6$H$_{13}$)$_2$ |
| 1-1-9 | H | *—CH$_2$—CH(Et)—C$_4$H$_9$ |
| 1-1-10 | H | *—O—CH$_2$CH$_2$—CH(CH$_3$)—CH$_2$CH$_2$CH$_2$—CH(CH$_3$)—CH$_3$ |

TABLE 5

|   | Ar$^1$ | Ar$^2$ | R$^{11}$ | R$^{12}$ |
|---|---|---|---|---|
| 1-1-11 | 2,5-thienyl | 2,5-thienyl | H | *—C≡C—Si(Et)$_3$ |
| 1-1-12 | 2,5-thienyl | 2,5-thienyl | *—OEt | *—CH$_2$—CH(C$_{12}$H$_{25}$)—C$_{10}$H$_{21}$ |
| 1-1-13 | 2,5-thienyl | 2,5-thienyl | H | *—OEt |
| 1-1-14 | 2,5-thienyl, 3-C$_6$H$_{13}$ | 2,5-thienyl, 3-C$_6$H$_{13}$ | H | *—SC$_6$H$_{13}$ |

TABLE 5-continued
| | | | R¹³ | R¹⁴ |
|---|---|---|---|---|
| 1-1-15 | 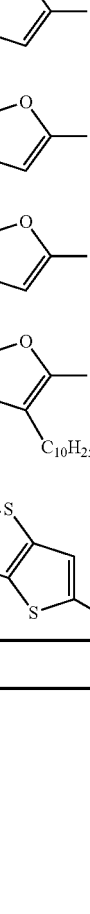 |  | H | H |
| 1-1-16 | 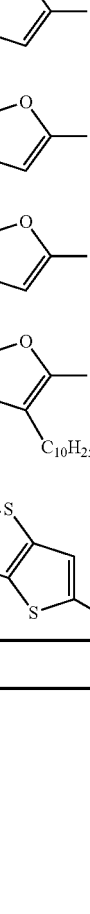 |  | H |  |
| 1-1-17 | 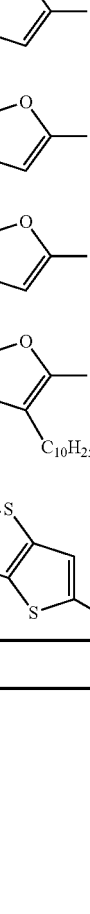 |  | H |  |
| 1-1-18 | 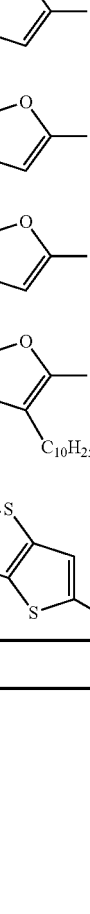 |  | *—CH₃ | 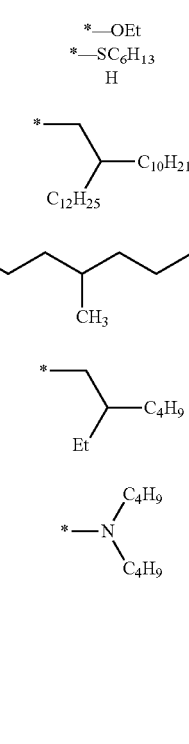 |
| 1-1-19 | 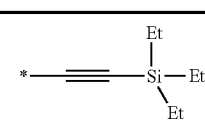 | 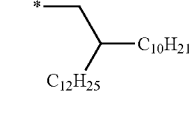 | H | 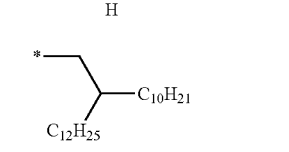 |
| 1-1-20 | 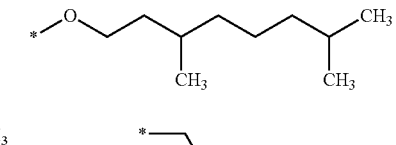 | 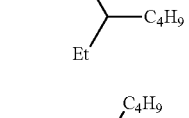 | H | 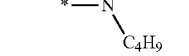 |
| | R¹³ | R¹⁴ |
|---|---|---|
| 1-1-11 | H | *—≡—Si(Et)₃ |
| 1-1-12 | *—OEt | branched alkyl with C₁₀H₂₁ and C₁₂H₂₅ |
| 1-1-13 | H | *—OEt |
| 1-1-14 | H | *—SC₆H₁₃ |
| 1-1-15 | H | H |
| 1-1-16 | H | branched alkyl with C₁₀H₂₁ and C₁₂H₂₅ |
| 1-1-17 | H | ether chain with CH₃ groups |
| 1-1-18 | *—CH₃ | branched alkyl with C₄H₉ and Et |
| 1-1-19 | H | *—N(C₄H₉)₂ |

TABLE 5-continued
| | | | |
|---|---|---|---|
| 1-1-20 | | H | 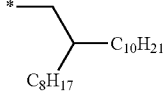 |
TABLE 6
| | Ar¹ | AR² | R¹¹ | R¹² |
|---|---|---|---|---|
| 1-1-21 | 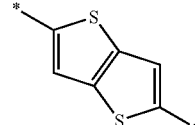 | 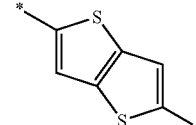 | H | 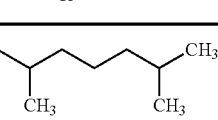 |
| 1-1-22 | 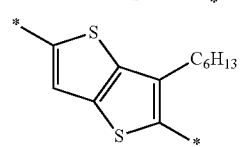 | 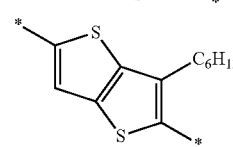 | H | H |
| 1-1-23 | 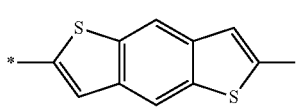 | 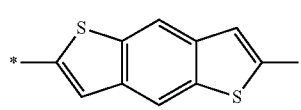 | H | 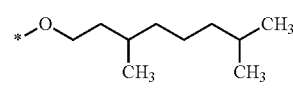 |
| 1-1-24 | 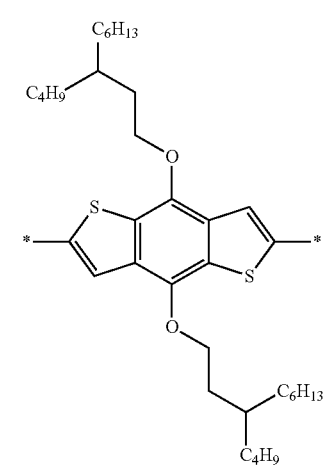 | 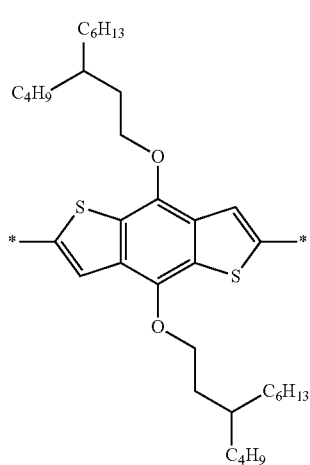 | H | *—C₆H₁₃ |
| 1-1-25 | 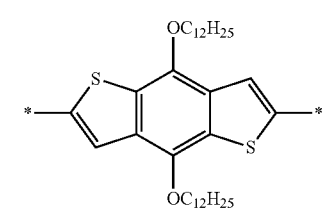 | 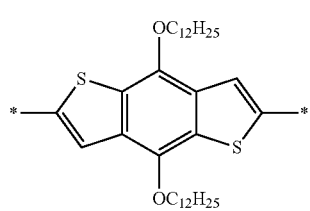 | *—C₆H₁₃ | *—OEt |
| 1-1-26 | 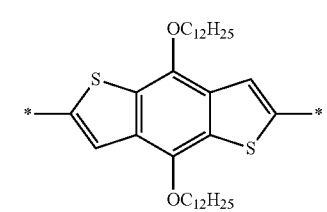 | 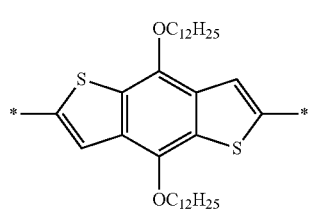 | H |  |

TABLE 6-continued

| | Ar¹ | Ar² | | |
|---|---|---|---|---|
| 1-1-27 | [benzodithiophene with OCH₂CH(C₈H₁₇)(C₆H₁₃) groups at 4,8 positions] | [benzodithiophene with OCH₂CH(C₈H₁₇)(C₆H₁₃) groups at 4,8 positions] | H | H |

| | | R¹³ | R¹⁴ |
|---|---|---|---|
| 1-1-21 | | H | *—CH₂CH₂CH(CH₃)CH₂CH₂CH₂CH(CH₃)CH₃ |
| 1-1-22 | | H | H |
| 1-1-23 | | H | *—O—CH₂CH₂CH(CH₃)CH₂CH₂CH₂CH(CH₃)CH₃ |
| 1-1-24 | | H | *—C₆H₁₃ |
| 1-1-25 | | *—C₆H₁₃ | *—OEt |
| 1-1-26 | | H | *—N(C₆H₁₃)₂ |
| 1-1-27 | | H | H |

TABLE 7

| | Ar¹ | Ar² |
|---|---|---|
| 1-1-28 | [benzodithiophene with O-CH₂CH₂CH(CH₃)CH₂CH₂CH₂CH(CH₃)₂ groups at 4,8 positions] | [benzodithiophene with O-CH₂CH₂CH(CH₃)CH₂CH₂CH₂CH(CH₃)₂ groups at 4,8 positions] |

TABLE 7-continued

| | R11 | R12 | R13 | R14 |
|---|---|---|---|---|
| 1-1-28 | H | *—C8H17 | H | *—C8H17 |
| 1-1-29 | H | *—OC6H13 | H | *—OC6H13 |
| 1-1-30 | *—CH3 | *—CH(C10H21)(C12H25) | *—CH3 | *—CH(C10H21)(C12H25) |

TABLE 7-continued
| | | | | | |
|---|---|---|---|---|---|
| 1-1-31 | H | 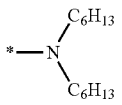 | H | 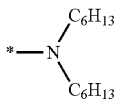 | |
| 1-1-32 | H | 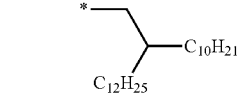 | H | 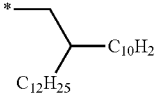 | |
| 1-1-33 | H | 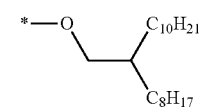 | H | 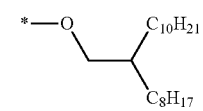 | |
| 1-1-34 | *—CH$_3$ | H | *—CH$_3$ | H | |
TABLE 8
| | Ar$^1$ | Ar$^2$ |
|---|---|---|
| 1-1-35 | 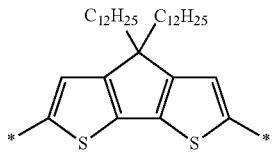 | 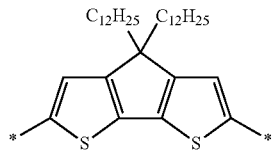 |
| 1-1-36 | 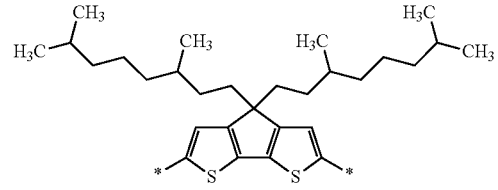 [SMILES: *c1cc2c(s1)-c1sc(*)cc1C2(CCC(C)CCCC(C)C)CCC(C)CCCC(C)C] | 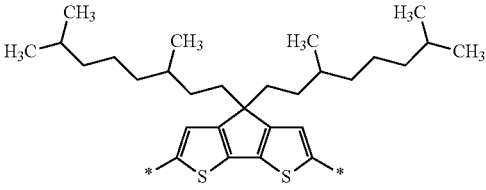 [SMILES: *c1cc2c(s1)-c1sc(*)cc1C2(CCC(C)CCCC(C)C)CCC(C)CCCC(C)C] |
| 1-1-37 | 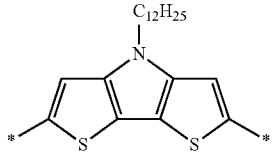 | 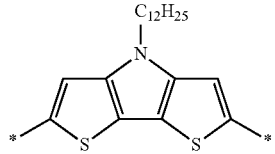 |
| 1-1-38 | 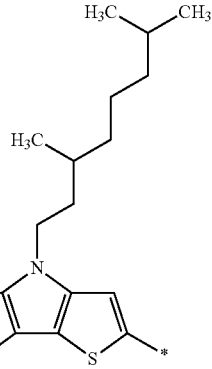 | 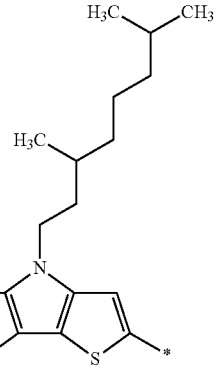 |

TABLE 8-continued

| | Structure (left) | Structure (right) |
|---|---|---|
| 1-1-39 | [N-substituted dithienopyrrole with 2-ethylhexyl group] | [N-substituted dithienopyrrole with 2-ethylhexyl group] |
| 1-1-40 | [N-C$_8$H$_{17}$ dithienopyrrole] | [N-C$_8$H$_{17}$ dithienopyrrole] |
| 1-1-41 | [dithienobenzene] | [dithienobenzene] |
| 1-1-42 | [dithienobenzene with two C$_6$H$_{13}$ groups] | [dithienobenzene with two C$_6$H$_{13}$ groups] |

| | $R^{11}$ | $R^{12}$ | $R^{13}$ | $R^{14}$ |
|---|---|---|---|---|
| 1-1-35 | H | H | H | H |
| 1-1-36 | H | *—OC$_6$H$_{13}$ | H | *—OC$_6$H$_{13}$ |
| 1-1-37 | H | [branched alkyl with CH$_3$ branches] | H | [branched alkyl with CH$_3$ branches] |
| 1-1-38 | H | H | H | H |
| 1-1-39 | H | *—O—CH$_2$CH(C$_{10}$H$_{21}$)(C$_{12}$H$_{25}$) | H | *—O—CH$_2$CH(C$_{10}$H$_{21}$)(C$_{12}$H$_{25}$) |
| 1-1-40 | *—CH$_3$ | *—CH$_2$CH(Et)(C$_4$H$_9$) | *—CH$_3$ | *—CH$_2$CH(Et)(C$_4$H$_9$) |
| 1-1-41 | *—C$_6$H$_{13}$ | Et | *—C$_6$H$_{13}$ | Et |
| 1-1-42 | H | *—C$_6$H$_{13}$ | H | *—C$_6$H$_{13}$ |

TABLE 9

| | Ar$^1$ |
|---|---|
| 1-1-43 | [selenophene ring, 2,5-connected] |
| 1-1-44 | [dithienothiophene] |

TABLE 9-continued
1-1-45 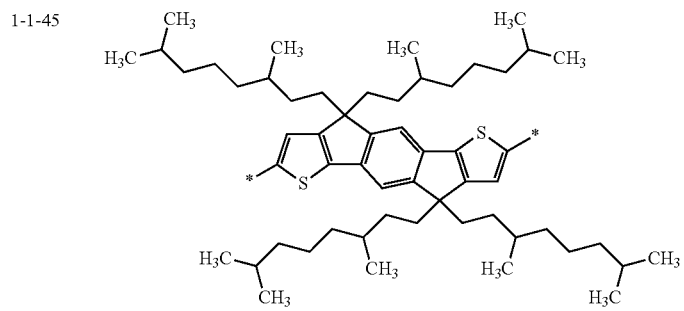
1-1-46 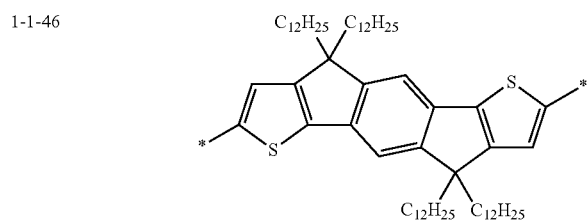
1-1-47 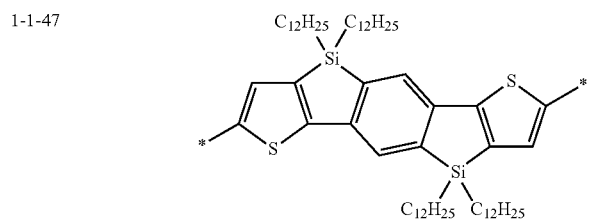
1-1-48 
1-1-49 
1-1-50 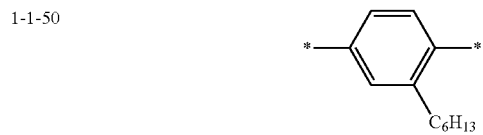
Ar²
1-1-43 
1-1-44 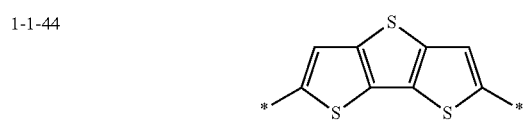

TABLE 9-continued
1-1-45 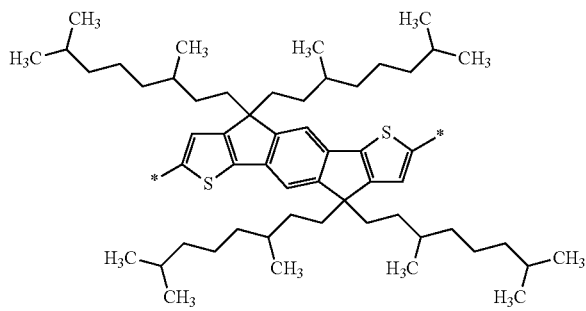 [SMILES: *c1cc2c(s1)-c1cc3c(cc1C2(CCC(C)CCCC(C)C)CCC(C)CCCC(C)C)-c1sc(*)cc1C3(CCC(C)CCCC(C)C)CCC(C)CCCC(C)C]
1-1-46 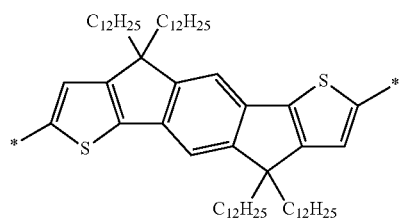
1-1-47 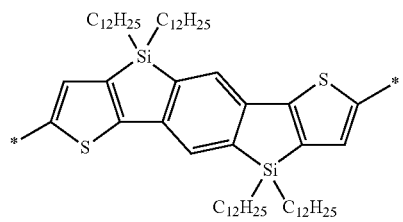
1-1-48 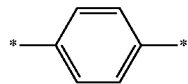 [SMILES: *c1ccc(*)cc1]
1-1-49 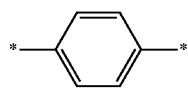 [SMILES: *c1ccc(*)cc1]
1-1-50 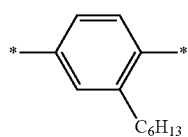
| | $R^{11}$ | $R^{12}$ | $R^{13}$ |
|---|---|---|---|
| 1-1-43 | H | *—OC$_6$H$_{13}$ | H |
| 1-1-44 | H | 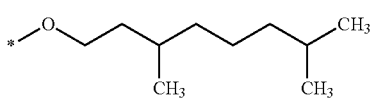 | H |
| 1-1-45 | H | *—C$_{12}$H$_{25}$ | H |
| 1-1-46 | H | H | H |
| 1-1-47 | H | 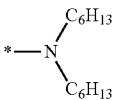 | H |
| 1-1-48 | H | 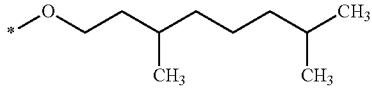 [SMILES: *OCCC(C)CCCC(C)C] | H |

TABLE 9-continued

| | | | |
|---|---|---|---|
| 1-1-49 | *—OEt | *—CH(Et)—C$_4$H$_9$ (structure) | *—OEt |
| 1-1-50 | H | *—N(C$_6$H$_{13}$)$_2$ | H |

| | R$^{14}$ |
|---|---|
| 1-1-43 | *—OC$_6$H$_{13}$ |
| 1-1-44 | *—O—CH$_2$CH$_2$—CH(CH$_3$)—CH$_2$CH$_2$CH$_2$—CH(CH$_3$)—CH$_3$ |
| 1-1-45 | *—C$_{12}$H$_{25}$ |
| 1-1-46 | H |
| 1-1-47 | *—N(C$_6$H$_{13}$)$_2$ |
| 1-1-48 | *—O—CH$_2$CH$_2$—CH(CH$_3$)—CH$_2$CH$_2$CH$_2$—CH(CH$_3$)—CH$_3$ |
| 1-1-49 | *—CH(Et)—C$_4$H$_9$ |
| 1-1-50 | *—N(C$_6$H$_{13}$)$_2$ |

Formula (2-1M)

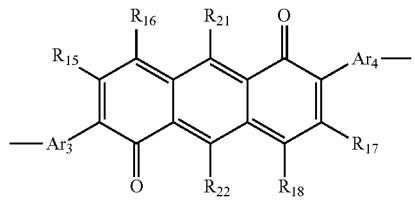

In Formula (2-1M), each of Ar$^3$, Ar$^4$, R$^{15}$ to R$^{18}$, R$^{21}$, and R$^{22}$ represents the following groups.

TABLE 10

| | Ar$^3$ | Ar$^4$ | R$^{15}$ | R$^{16}$ | R$^{17}$ |
|---|---|---|---|---|---|
| 2-1-1 | thiophene-2,5-diyl | thiophene-2,5-diyl | H | H | H |
| 2-1-2 | thiophene-2,5-diyl | thiophene-2,5-diyl | H | H | H |

TABLE 10-continued
| | | | | | |
|---|---|---|---|---|---|
| 2-1-3 | 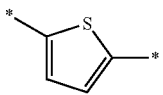 [SMILES: *c1ccc(*)s1] | 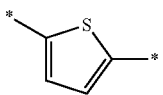 | H | 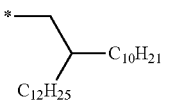 | H |
| 2-1-4 | 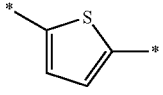 | 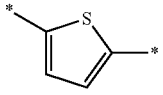 | *—CH$_3$ | Et | *—CH$_3$ |
| 2-1-5 | 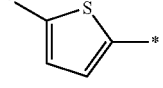 | 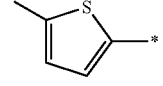 | H | H | H |
| 2-1-6 | 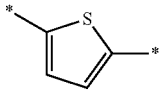 [SMILES: *c1ccc(*)s1] | 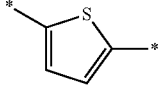 [SMILES: *c1ccc(*)s1] | H | 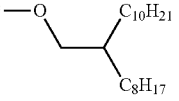 | H |
| 2-1-7 | 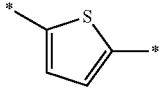 | 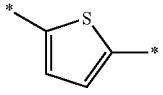 [SMILES: *c1ccc(*)s1] | H | *—OEt | H |
| 2-1-8 | 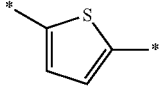 | 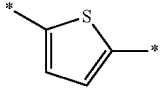 | H | 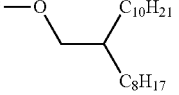 | H |
| 2-1-9 | 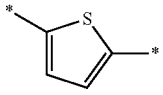 | 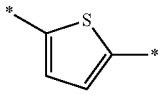 [SMILES: *c1ccc(*)s1] | H | 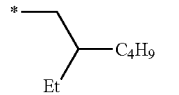 | H |
| 2-1-10 | 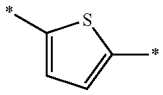 | 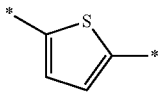 | H | 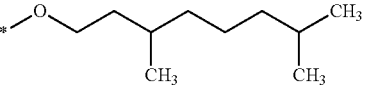 | H |
| | R$^{18}$ | R$^{21}$ | R$^{22}$ |
|---|---|---|---|
| 2-1-1 | H | 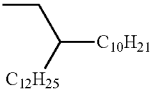 | 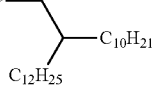 |
| 2-1-2 | H | 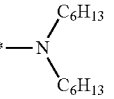 | 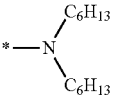 |
| 2-1-3 | 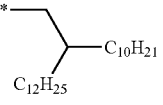 | H | H |
| 2-1-4 | Et | 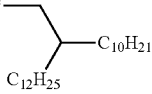 | 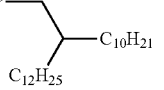 |
| 2-1-5 | H | 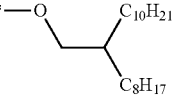 | 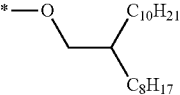 |
| 2-1-6 | 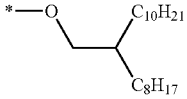 | H | H |

TABLE 10-continued
| | | | | |
|---|---|---|---|---|
| 2-1-7 | *—OEt | 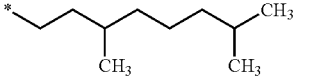 [SMILES: *CCC(C)CCCC(C)C] | 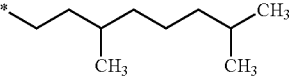 [SMILES: *CCC(C)CCCC(C)C] | |
| 2-1-8 | 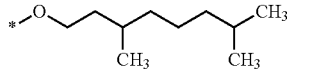 | 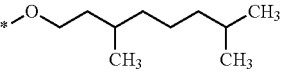 | 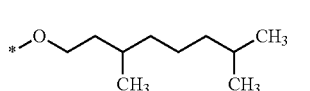 | |
| 2-1-9 | 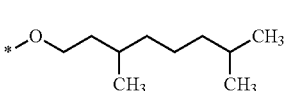 | 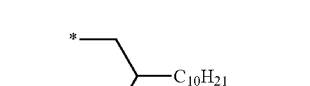 | 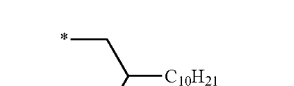 | |
| 2-1-10 | 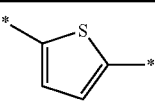 | 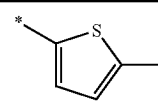 | 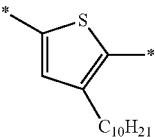 | |
TABLE 11
| | Ar³ | Ar⁴ | R¹⁵ | R¹⁶ | R¹⁷ |
|---|---|---|---|---|---|
| 2-1-11 | 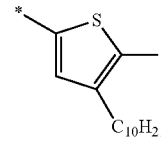 | 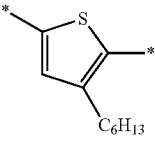 | H | H | H |
| 2-1-12 | 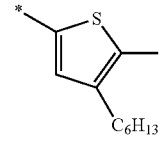 | 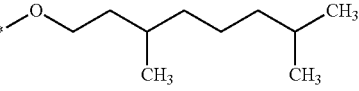 | H | H | H |
| 2-1-13 | 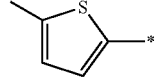 | 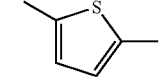 | H | 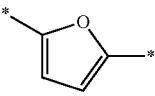 | H |
| 2-1-14 | 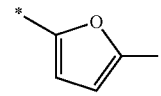 | 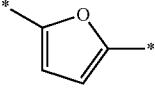 | H | *—SC₆H₁₃ | H |
| 2-1-15 | 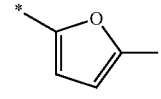 | 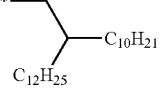 | H | H | H |
| 2-1-16 | 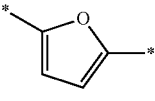 | 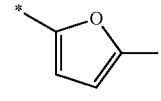 | H | 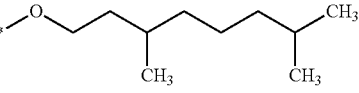 | H |
| 2-1-17 | 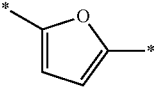 | 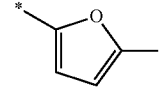 | H | 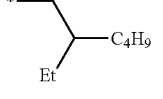 | H |
| 2-1-18 | 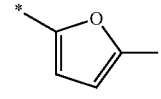 | 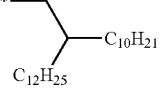 | *—CH₃ | 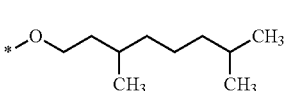 | *—CH₃ |

TABLE 11-continued

| | | | | |
|---|---|---|---|---|
| 2-1-19 | *-furan(C10H25)-* | *-furan(C10H25)-* | H | *—O—CH2CH(C8H17)C10H21 | H |
| 2-1-20 | *-thieno[3,2-b]thiophene-* | *-thieno[3,2-b]thiophene-* | H | *—CH2CH(C8H17)C10H21 | H |

| | $R^{18}$ | $R^{21}$ | $R^{22}$ |
|---|---|---|---|
| 2-1-11 | H | *—C≡C—C(Et)(Et)Et | *—C≡C—C(Et)(Et)Et |
| 2-1-12 | H | *—CH2CH(C12H25)C10H21 | *—CH2CH(C12H25)C10H21 |
| 2-1-13 | *—O—CH2CH2CH(CH3)CH2CH2CH2CH(CH3)CH3 | H | H |
| 2-1-14 | *—SC6H13 | H | H |
| 2-1-15 | H | *—O—CH2CH(C8H17)C10H21 | *—O—CH2CH(C8H17)C10H21 |
| 2-1-16 | *—CH2CH(C12H25)C10H21 | *—N(C6H13)C6H13 | *—N(C6H13)C6H13 |
| 2-1-17 | *—O—CH2CH2CH(CH3)CH2CH2CH2CH(CH3)CH3 | H | H |
| 2-1-18 | *—CH2CH(Et)C4H9 | *—C12H25 | *—C12H25 |
| 2-1-19 | *—O—CH2CH(C8H17)C10H21 | H | H |
| 2-1-20 | *—CH2CH(C8H17)C10H21 | H | H |

TABLE 12
| | Ar³ | Ar⁴ | R¹⁵ | R¹⁶ | R¹⁷ |
|---|---|---|---|---|---|
| 2-1-21 | 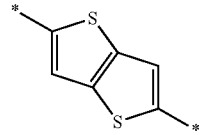 [SMILES: *c1cc2sc(*)cc2s1] | 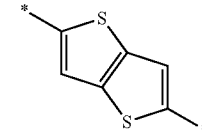 | H | H | H |
| 2-1-22 | 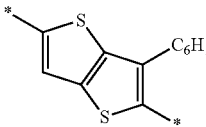 | 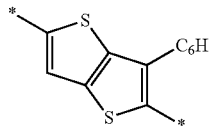 | H | 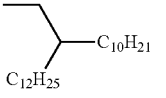 | H |
| 2-1-23 | 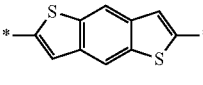 | 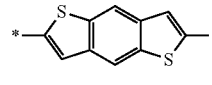 | H | 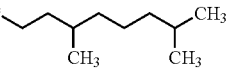 | H |
| 2-1-24 | 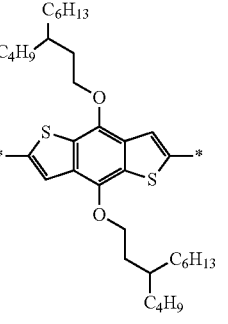 | 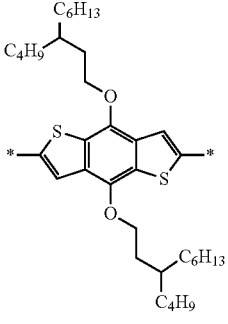 | H | *—C₆H₁₃ | H |
| 2-1-25 |  | 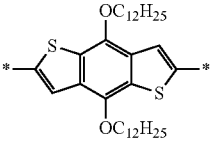 | H | H | H |
| 2-1-26 | 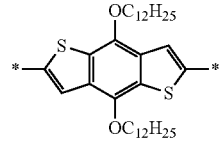 | 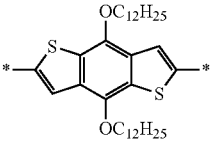 | *—CH₃ | 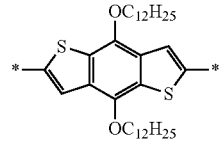 | *—CH₃ |
| 2-1-27 | 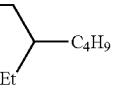 | 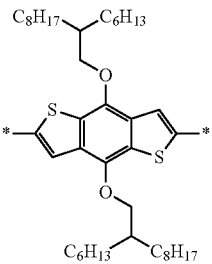 | H | H | H |
| | R¹⁸ | R²¹ | R²² |
|---|---|---|---|
| 2-1-21 | H | 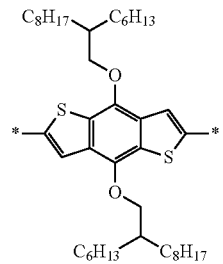 | 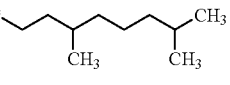 |
| 2-1-22 | 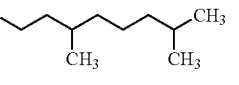 | 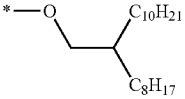 | 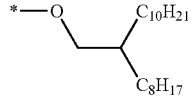 |

TABLE 12-continued

| | Ar³ | Ar⁴ | R¹⁵ |
|---|---|---|---|
| 2-1-23 | *−CH₂−CH(CH₃)−CH₂−CH₂−CH₂−CH(CH₃)−CH₃ | *−CH₂−CH(C₁₀H₂₁)(C₁₂H₂₅) | *−CH₂−CH(C₁₀H₂₁)(C₁₂H₂₅) |
| 2-1-24 | *−C₆H₁₃ | H | H |
| 2-1-25 | H | *−O−CH₂−CH₂−CH(CH₃)−CH₂−CH₂−CH(CH₃)−CH₃ | *−O−CH₂−CH₂−CH(CH₃)−CH₂−CH₂−CH(CH₃)−CH₃ |
| 2-1-26 | *−CH₂−CH(Et)(C₄H₉) | H | H |
| 2-1-27 | H | H | H |

TABLE 13

| | Ar³ | Ar⁴ | R¹⁵ |
|---|---|---|---|
| 2-1-28 | benzodithiophene with 4,8-bis(3,7-dimethyloctyloxy) substituents | benzodithiophene with 4,8-bis(3,7-dimethyloctyloxy) substituents | H |
| 2-1-29 | benzodithiophene with 4,8-bis(2-ethylhexyloxy) substituents | benzodithiophene with 4,8-bis(2-ethylhexyloxy) substituents | H |
| 2-1-30 | benzodithiophene with 4,8-bis(2-hexyldecyloxy) substituents | benzodithiophene with 4,8-bis(2-hexyldecyloxy) substituents | H |

TABLE 13-continued
| | Ar³ | Ar⁴ | R¹⁵ |
|---|---|---|---|
| 2-1-31 | 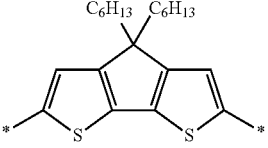 | 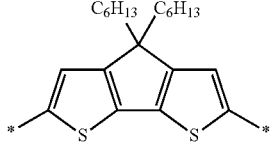 | H |
| 2-1-32 | 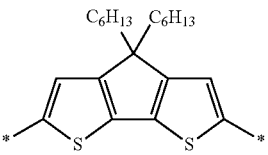 | 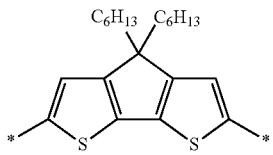 | H |
| 2-1-33 | 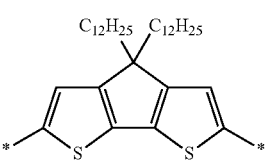 | 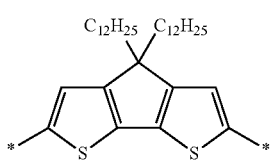 | H |
| 2-1-34 | 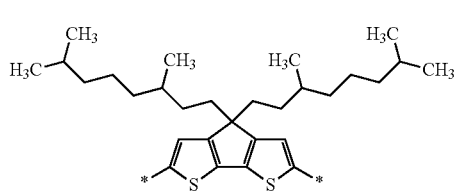 | 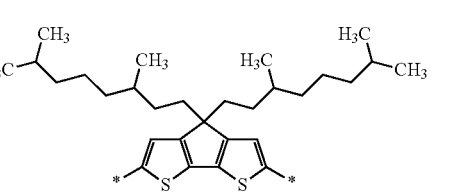 | H |
| | R¹⁶ | R¹⁷ | R¹⁸ | R²¹ | R²² |
|---|---|---|---|---|---|
| 2-1-28 | *—C₈H₁₇ | H | *—C₈H₁₇ | *—C₈H₁₇ | *—C₈H₁₇ |
| 2-1-29 | *—OC₆H₁₃ | H | *—OC₆H₁₃ | *—OC₆H₁₃ | *—OC₆H₁₃ |
| 2-1-30 | *—CH₂—CH(C₁₀H₂₁)(C₁₂H₂₅) | H | *—CH₂—CH(C₁₀H₂₁)(C₁₂H₂₅) | H | H |
| 2-1-31 | *—C₁₂H₂₅ | H | *—C₁₂H₂₅ | H | H |
| 2-1-32 | H | H | H | *—O—CH₂—CH(C₁₀H₂₁)(C₈H₁₇) | *—O—CH₂—CH(C₁₀H₂₁)(C₈H₁₇) |
| 2-1-33 | *—O—CH₂—CH(C₁₀H₂₁)(C₈H₁₇) | H | *—O—CH₂—CH(C₁₀H₂₁)(C₈H₁₇) | *—O—CH₂—CH(C₁₀H₂₁)(C₈H₁₇) | *—O—CH₂—CH(C₁₀H₂₁)(C₈H₁₇) |
| 2-1-34 | *—OC₆H₁₃ | H | *—OC₆H₁₃ | *—OC₆H₁₃ | *—OC₆H₁₃ |
TABLE 14
| | Ar³ | Ar⁴ | R¹⁵ |
|---|---|---|---|
| 2-1-35 | 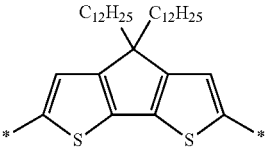 | 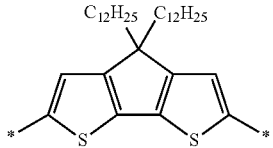 | *—CH₃ |

TABLE 14-continued

| | | | R¹⁶ | R¹⁷ | R¹⁸ |
|---|---|---|---|---|---|
| 2-1-35 | | | H | *—CH₃ | H |
| 2-1-36 | | | *–CH₂–CH(Et)–C₄H₉ | H | *–CH₂–CH(Et)–C₄H₉ |

TABLE 14-continued

| | | | |
|---|---|---|---|
| 2-1-37 | *-CH2-CH(CH3)-CH2-CH2-CH2-CH(CH3)-CH3 | H | *-CH2-CH(CH3)-CH2-CH2-CH2-CH(CH3)-CH3 |
| 2-1-38 | H | H | H |
| 2-1-39 | *-CH2-CH(C12H25)(C10H21) | H | *-CH2-CH(C12H25)(C10H21) |
| 2-1-40 | H | *—$C_6H_{13}$ | H |
| 2-1-41 | *—$OC_6H_{13}$ | H | *—$OC_6H_{13}$ |
| 2-1-42 | *—$C_6H_{13}$ | H | *—$C_6H_{13}$ |

| | | $R^{21}$ | $R^{22}$ |
|---|---|---|---|
| | 2-1-35 | *-CH2-CH(CH3)-CH2-CH2-CH2-CH(CH3)-CH3 | *-CH2-CH(CH3)-CH2-CH2-CH2-CH(CH3)-CH3 |
| | 2-1-36 | *-CH2-CH(Et)-$C_4H_9$ | *-CH2-CH(Et)-$C_4H_9$ |
| | 2-1-37 | *—$C_8H_{17}$ | *—$C_8H_{17}$ |
| | 2-1-38 | H | H |
| | 2-1-39 | *—$OC_6H_{13}$ | *—$OC_6H_{13}$ |
| | 2-1-40 | *—O—CH2-CH($C_8H_{17}$)-$C_{10}H_{21}$ | *—O—CH2-CH($C_8H_{17}$)-$C_{10}H_{21}$ |
| | 2-1-41 | *—N($C_8H_{17}$)$_2$ | *—N($C_8H_{17}$)$_2$ |
| | 2-1-42 | *-CH2-CH(CH3)-CH2-CH2-CH2-CH(CH3)-CH3 | *-CH2-CH(CH3)-CH2-CH2-CH2-CH(CH3)-CH3 |

TABLE 15

| | $Ar^3$ | $Ar^4$ |
|---|---|---|
| 2-1-43 | 2,5-selenophenediyl | 2,5-selenophenediyl |
| 2-1-44 | dithieno[3,2-b:2',3'-d]thiophene-2,6-diyl | dithieno[3,2-b:2',3'-d]thiophene-2,6-diyl |
| 2-1-45 | 4,4,8,8-tetrakis(3,7-dimethyloctyl)-4,8-dihydrobenzo[1,2-b:4,5-b']dithiophene-2,6-diyl | 4,4,8,8-tetrakis(3,7-dimethyloctyl)-4,8-dihydrobenzo[1,2-b:4,5-b']dithiophene-2,6-diyl |

TABLE 15-continued

| | | |
|---|---|---|
| 2-1-46 | [structure: dithiophene-fused indacene with four C₁₂H₂₅ groups, * on right S-thiophene] | [structure: similar, * on left S-thiophene] |
| 2-1-47 | [structure: disilole-fused with four C₁₂H₂₅ on Si atoms] | [structure: similar mirror] |
| 2-1-48 | *—C₆H₄—* (para-phenylene) | *—C₆H₄—* |
| 2-1-49 | *—C₆H₄—* | *—C₆H₄—* |
| 2-1-50 | *—C₆H₃(C₆H₁₃)—* | *—C₆H₃(C₆H₁₃)—* |

| | $R^{15}$ | $R^{16}$ | $R^{17}$ | $R^{18}$ | $R^{21}$ | $R^{22}$ |
|---|---|---|---|---|---|---|
| 2-1-43 | H | *—CH₂CH(C₁₂H₂₅)C₁₀H₂₁ | H | *—CH₂CH(C₁₂H₂₅)C₁₀H₂₁ | *—CH₂CH(C₁₂H₂₅)C₁₀H₂₁ | *—CH₂CH(C₁₂H₂₅)C₁₀H₂₁ |
| 2-1-44 | H | *—O—CH₂CH(CH₃)CH₂CH₂CH₂CH(CH₃)CH₃ | H | *—O—CH₂CH(CH₃)CH₂CH₂CH₂CH(CH₃)CH₃ | H | H |
| 2-1-45 | H | *—C₁₂H₂₅ | H | *—C₁₂H₂₅ | H | H |
| 2-1-46 | H | H | H | H | H | H |
| 2-1-47 | H | *—OC₆H₁₃ | H | *—OC₆H₁₃ | H | H |
| 2-1-48 | H | *—O—CH₂CH(CH₃)CH₂CH₂CH₂CH(CH₃)CH₃ | H | *—O—CH₂CH(CH₃)CH₂CH₂CH₂CH(CH₃)CH₃ | H | H |
| 2-1-49 | *—OEt | *—CH₂CH(Et)C₄H₉ | *—OEt | *—CH₂CH(Et)C₄H₉ | *—OEt | *—OEt |

TABLE 15-continued
| | | | | | | |
|---|---|---|---|---|---|---|
| 2-1-50 | H | 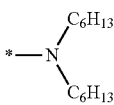 | H | 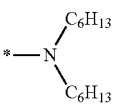 | H | H |
Formula (2-2M)
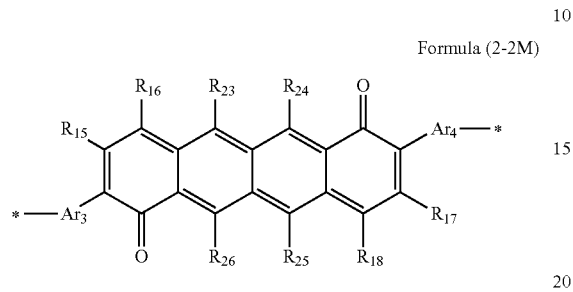
In Formula (2-2M), each of $Ar^3$, $Ar^4$, $R^{15}$ to $R^{18}$, and $R^{23}$ to $R^{26}$ represents the following groups.
TABLE 16
| | $Ar^3$ | $Ar^4$ | $R^{15}$ | $R^{16}$ | $R^{17}$ |
|---|---|---|---|---|---|
| 2-2-1 | 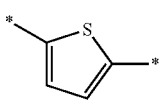 | 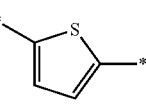 | H | H | H |
| 2-2-2 | 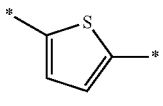 [SMILES: *c1ccc(*)s1] | 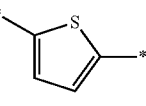 | H | 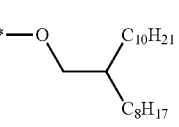 | H |
| 2-2-3 | 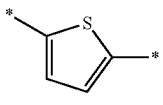 [SMILES: *c1ccc(*)s1] | 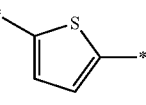 | H | 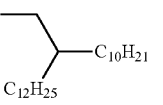 | H |
| 2-2-4 | 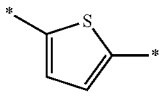 | 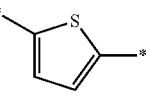 | H | *—OC$_8$H$_{17}$ | H |
| 2-2-5 | 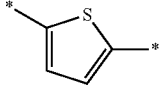 | 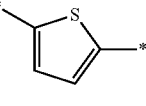 | *—CH$_3$ | 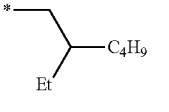 | *—CH$_3$ |
| 2-2-6 | 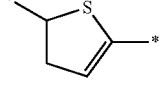 | 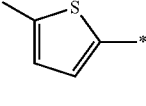 | H | 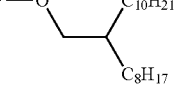 | H |
| 2-2-7 | 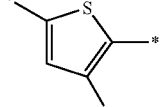 | 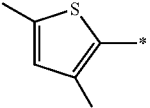 | H | 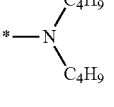 | H |
| 2-2-8 | 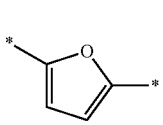 | 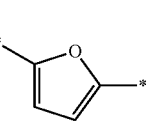 | H | *—OC$_6$H$_{13}$ | H |

TABLE 16-continued
| | | | | | |
|---|---|---|---|---|---|
| 2-2-9 | 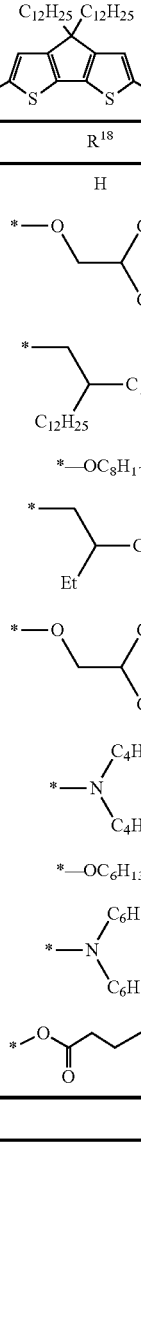 | 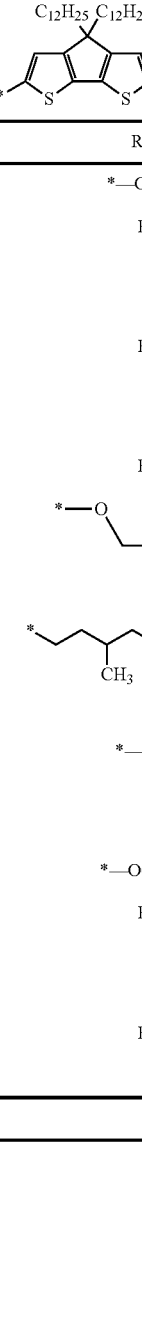 | H | 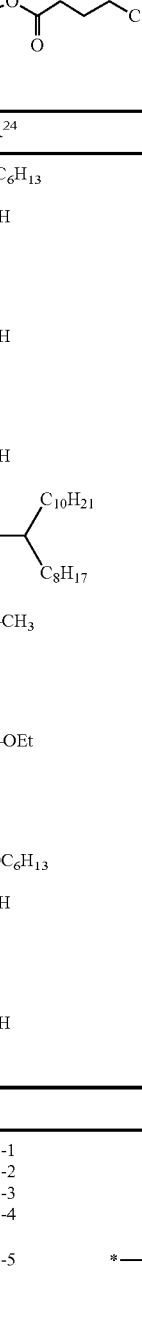 | H |
| 2-2-10 | 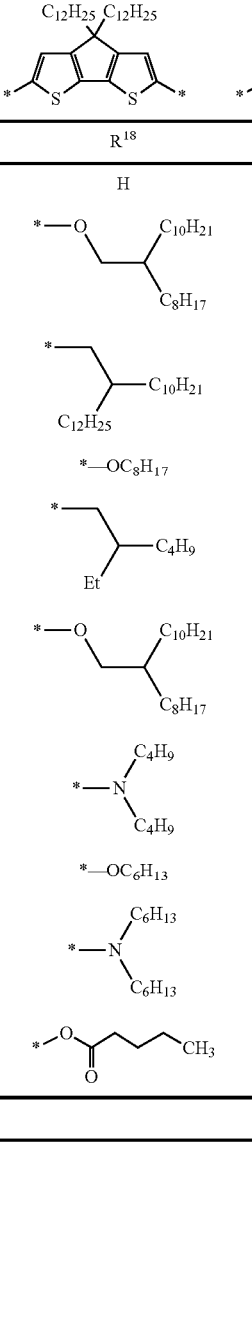 | 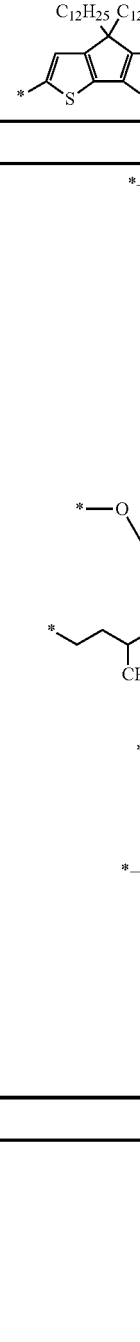 | H | 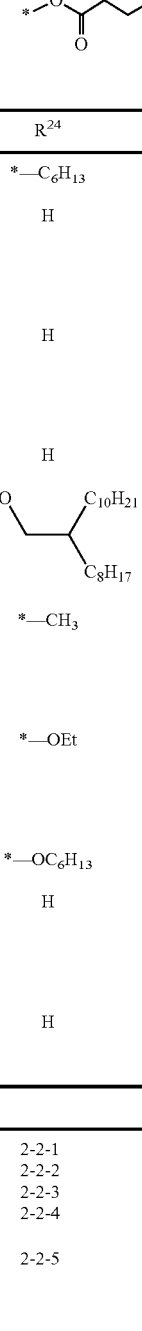 | H |
| | $R^{18}$ | $R^{23}$ | $R^{24}$ | $R^{25}$ |
|---|---|---|---|---|
| 2-2-1 | H | *—$C_6H_{13}$ | *—$C_6H_{13}$ | *—$C_6H_{13}$ |
| 2-2-2 | 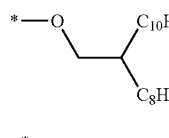 | H | H | H |
| 2-2-3 | 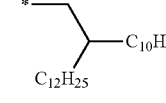 | H | H | H |
| 2-2-4 | *—$OC_8H_{17}$ | H | H | H |
| 2-2-5 | 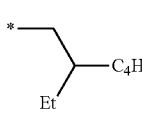 | 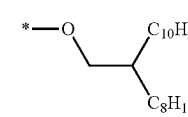 | 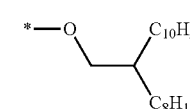 | 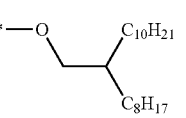 |
| 2-2-6 | 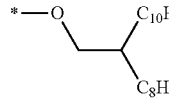 | 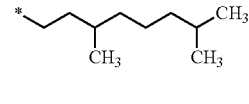 | *—$CH_3$ | *—$CH_3$ |
| 2-2-7 | 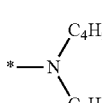 | *—OEt | *—OEt | *—OEt |
| 2-2-8 | *—$OC_6H_{13}$ | *—$OC_6H_{13}$ | *—$OC_6H_{13}$ | *—$OC_6H_{13}$ |
| 2-2-9 | 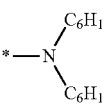 | H | H | H |
| 2-2-10 | 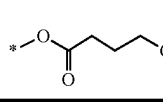 | H | H | H |
| | $R^{26}$ |
|---|---|
| 2-2-1 | *—$C_6H_{13}$ |
| 2-2-2 | H |
| 2-2-3 | H |
| 2-2-4 | H |
| 2-2-5 |  |
| 2-2-6 | 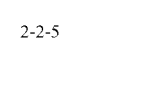 |
| 2-2-7 | *—OEt |
| 2-2-8 | *—$OC_6H_{13}$ |
| 2-2-9 | H |

TABLE 16-continued

| | 2-2-10 | H |

TABLE 17

| | Ar³ | Ar⁴ | R¹⁵ |
|---|---|---|---|
| 2-2-11 | | | H |
| 2-2-12 | | | H |
| 2-2-13 | | | H |
| 2-2-14 | | | H |
| 2-2-15 | | | H |
| 2-2-16 | | | H |
| 2-2-17 | | | H |
| 2-2-18 | | | H |

TABLE 17-continued

| | | | | | |
|---|---|---|---|---|---|
| 2-2-19 | *—⌬—* (para-phenylene) | | | *—⌬—* (para-phenylene) | H |
| 2-2-20 | *—⌬(C8H17)—* (phenylene with C8H17) | | | *—⌬(C8H17)—* (phenylene with C8H17) | H |

| | $R^{16}$ | $R^{17}$ | $R^{18}$ | $R^{23}$ | $R^{24}$ |
|---|---|---|---|---|---|
| 2-2-11 | H | H | H | *—OC6H13 | *—OC6H13 |
| 2-2-12 | H | H | H | *—CH(C12H25)—C10H21 | *—CH(C12H25)—C10H21 |
| 2-2-13 | *—O—CH(C8H17)—C10H21 | H | *—O—CH(C8H17)—C10H21 | H | H |
| 2-2-14 | H | H | H | *—OC8H17 | *—OC8H17 |
| 2-2-15 | H | H | H | *—O—CH(C8H17)—C10H21 | *—O—CH(C8H17)—C10H21 |
| 2-2-16 | *—CH(C12H25)—C10H21 | H | *—CH(C12H25)—C10H21 | *—N(C6H13)(C6H13) | *—N(C6H13)(C6H13) |
| 2-2-17 | H | H | H | *—C6H13 | *—C6H13 |
| 2-2-18 | *—CH(Et)—C4H9 | H | *—CH(Et)—C4H9 | H | H |
| 2-2-19 | *—O—CH(C8H17)—C10H21 | H | *—O—CH(C8H17)—C10H21 | H | H |
| 2-2-20 | *—CH(C8H17)—C10H21 | H | *—CH(C8H17)—C10H21 | H | H |

| | $R^{24}$ | $R^{25}$ | $R^{26}$ |
|---|---|---|---|
| 2-2-11 | *—OC6H13 | *—OC6H13 | *—OC6H13 |
| 2-2-12 | *—CH(C12H25)—C10H21 | *—CH(C12H25)—C10H21 | *—CH(C12H25)—C10H21 |
| 2-2-13 | H | H | H |
| 2-2-14 | *—OC8H17 | *—OC8H17 | *—OC8H17 |
| 2-2-15 | *—O—CH(C8H17)—C10H21 | *—O—CH(C8H17)—C10H21 | *—O—CH(C8H17)—C10H21 |

TABLE 17-continued

| | | | | |
|---|---|---|---|---|
| 2-2-16 | | *—N(C$_6$H$_{13}$)C$_6$H$_{13}$ | *—N(C$_6$H$_{13}$)C$_6$H$_{13}$ | *—N(C$_6$H$_{13}$)C$_6$H$_{13}$ |
| 2-2-17 | | *—C$_6$H$_{13}$ | *—C$_6$H$_{13}$ | *—C$_6$H$_{13}$ |
| 2-2-18 | | H | H | H |
| 2-2-19 | | H | H | H |
| 2-2-20 | | H | H | H |

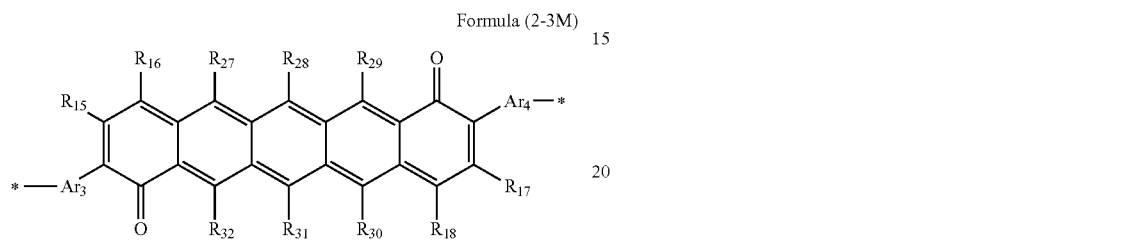

Formula (2-3M)

In Formula (2-3M), each of $Ar^3$, $Ar^4$, $R^{15}$ to $R^{18}$, and $R^{27}$ to $R^{32}$ represents the following groups.

TABLE 18

| | Ar$^3$ | Ar$^4$ | R$^{15}$ | R$^{16}$ |
|---|---|---|---|---|
| 2-3-1 | *–thienyl–* | *–thienyl–* | H | H |
| 2-3-2 | *–thienyl–* | *–thienyl–* | H | *—OC$_8$H$_{17}$ |
| 2-3-3 | *–thienyl–* | *–thienyl–* | H | *—CH$_2$CH(C$_{10}$H$_{21}$)C$_{12}$H$_{25}$ |
| 2-3-4 | *–thienyl–* | *–thienyl–* | H | *—O—CH$_2$CH(C$_{10}$H$_{21}$)C$_8$H$_{17}$ |
| 2-3-5 | *–thienyl–* | *–thienyl–* | *—CH$_3$ | *—CH$_2$CH(Et)C$_4$H$_9$ |
| 2-3-6 | *–thienyl–* | *–thienyl–* | H | *—O—CH$_2$CH(C$_{10}$H$_{21}$)C$_8$H$_{17}$ |
| 2-3-7 | *–(3-C$_6$H$_{13}$-thienyl)–* | *–(3-C$_6$H$_{13}$-thienyl)–* | H | H |
| 2-3-8 | *–furyl–* | *–furyl–* | H | H |

TABLE 18-continued

| | | | | | |
|---|---|---|---|---|---|
| 2-3-9 | 2,5-furan with C10H25 at 3-position | 2,5-furan with C10H25 at 3-position | H | *—N(C6H13)2 | |
| 2-3-10 | 4,4-di(C12H25)-cyclopenta[1,2-b:3,4-b']dithiophene-2,6-diyl | 4,4-di(C12H25)-cyclopenta[1,2-b:3,4-b']dithiophene-2,6-diyl | H | *—O—CH2—C(=O)—O—CH2CH3 | |

| | R¹⁷ | R¹⁸ | R²⁷ | R²⁸ | R²⁹ | R³⁰ |
|---|---|---|---|---|---|---|
| 2-3-1 | H | H | *—C6H13 | *—C6H13 | *—C6H13 | *—C6H13 |
| 2-3-2 | H | *—OC8H17 | H | *—O—CH2—CH(C10H21)(C8H17) | H | H |
| 2-3-3 | H | *—CH2—CH(C10H21)(C12H25) | H | *—OEt | H | H |
| 2-3-4 | H | *—O—CH2—CH(C10H21)(C8H17) | H | H | H | H |
| 2-3-5 | *—CH3 | *—CH2—CH(C4H9)(Et) | H | *—CH2—CH(C10H21)(C12H25) | H | H |
| 2-3-6 | H | *—O—CH2—CH(C10H21)(C8H17) | H | *—O—CH2—CH(C10H21)(C8H17) | H | H |
| 2-3-7 | H | H | *—OEt | *—N(C4H9)2 | *—OEt | *—OEt |
| 2-3-8 | H | H | *—OC6H13 | H | *—OC6H13 | *—OC6H13 |
| 2-3-9 | H | *—N(C6H13)2 | H | H | H | H |
| 2-3-10 | H | *—O—CH2—C(=O)—O—CH2CH3 | H | H | H | H |

| | R³¹ | R³² |
|---|---|---|
| 2-3-1 | *—C6H13 | *—C6H13 |
| 2-3-2 | *—O—CH2—CH(C10H21)(C8H17) | H |
| 2-3-3 | *—OEt | H |
| 2-3-4 | H | H |

TABLE 18-continued
| | | | |
|---|---|---|---|
| | 2-3-5 | 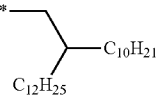 | H |
| | 2-3-6 | 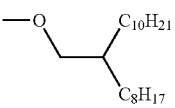 | H |
| | 2-3-7 | 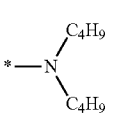 | *—OEt |
| | 2-3-8 | H | *—OC$_6$H$_{13}$ |
| | 2-3-9 | H | H |
| | 2-3-10 | H | H |
TABLE 19
| | Ar$^3$ | Ar$^4$ |
|---|---|---|
| 2-3-11 | 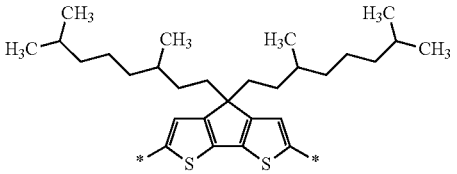 [SMILES: *c1cc2c(s1)-c1sc(*)cc1C2(CCC(C)CCCC(C)C)CCC(C)CCCC(C)C] | 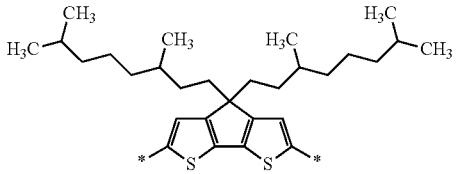 [SMILES: *c1cc2c(s1)-c1sc(*)cc1C2(CCC(C)CCCC(C)C)CCC(C)CCCC(C)C] |
| 2-3-12 | 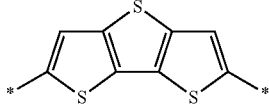 | 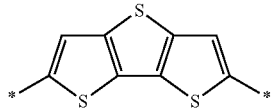 |
| 2-3-13 | 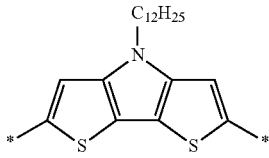 | 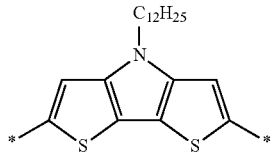 |
| 2-3-14 | 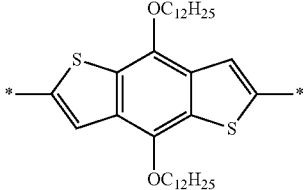 | 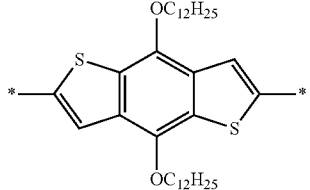 |
| 2-3-15 | 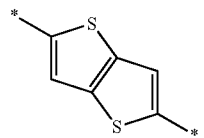 [SMILES: *c1cc2sc(*)cc2s1] | 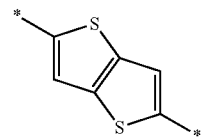 [SMILES: *c1cc2sc(*)cc2s1] |
| 2-3-16 | 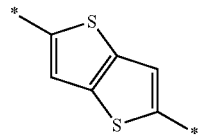 [SMILES: *c1cc2sc(*)cc2s1] | 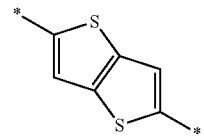 |

TABLE 19-continued

| | 103 | 104 |
|---|---|---|
| 2-3-17 | [structure: benzodithiophene with two (3,7-dimethyloctyloxy) groups] | [structure: benzodithiophene isomer with two (3,7-dimethyloctyloxy) groups] |
| 2-3-18 | [structure: dithienoindacene with four $C_{12}H_{25}$ substituents] | [structure: dithienoindacene isomer with four $C_{12}H_{25}$ substituents] |
| 2-3-19 | *—C$_6$H$_4$—* (1,4-phenylene) | *—C$_6$H$_4$—* (1,4-phenylene) |
| 2-3-20 | [1,2-phenylene with C$_8$H$_{17}$ substituent] | [1,2-phenylene with C$_8$H$_{17}$ substituent] |

| | $R^{15}$ | $R^{16}$ | $R^{17}$ | $R^{18}$ | $R^{27}$ | $R^{28}$ |
|---|---|---|---|---|---|---|
| 2-3-11 | H | H | H | H | *—OC$_6$H$_{13}$ | *—OC$_6$H$_{13}$ |
| 2-3-12 | H | *—CH$_3$ | H | *—CH$_3$ | H | *—O—CH(C$_{10}$H$_{21}$)(C$_8$H$_{17}$) |
| 2-3-13 | H | *—O—CH(C$_{10}$H$_{21}$)(C$_8$H$_{17}$) | H | *—O—CH(C$_{10}$H$_{21}$)(C$_8$H$_{17}$) | H | *—N(C$_6$H$_{13}$)$_2$ |
| 2-3-14 | H | H | H | H | *—OC$_8$H$_{17}$ | *—OC$_8$H$_{17}$ |
| 2-3-15 | H | H | H | H | *—C$_6$H$_{13}$ | H |
| 2-3-16 | H | *—CH$_2$—CH(C$_{10}$H$_{21}$)(C$_{12}$H$_{25}$) | H | *—CH$_2$—CH(C$_{10}$H$_{21}$)(C$_{12}$H$_{25}$) | H | *—O—CH$_2$CH$_2$CH(CH$_3$)CH$_2$CH$_2$CH$_2$CH(CH$_3$)$_2$ |
| 2-3-17 | H | H | H | H | H | H |
| 2-3-18 | H | *—CH$_2$—CH(Et)(C$_4$H$_9$) | H | *—CH$_2$—CH(Et)(C$_4$H$_9$) | H | *—CH$_3$ |
| 2-3-19 | *—C$_6$H$_{13}$ | H | *—C$_6$H$_{13}$ | H | H | *—O—CH(C$_{10}$H$_{21}$)(C$_{12}$H$_{25}$) |
| 2-3-20 | H | *—CH(C$_{10}$H$_{21}$)(C$_8$H$_{17}$) | H | *—CH(C$_{10}$H$_{21}$)(C$_8$H$_{17}$) | H | *—OEt |

TABLE 19-continued

|  | | $R^{29}$ | $R^{30}$ | $R^{31}$ | $R^{32}$ |
|---|---|---|---|---|---|
| | 2-3-11 | *—OC$_6$H$_{13}$ | *—OC$_6$H$_{13}$ | *—OC$_6$H$_{13}$ | *—OC$_6$H$_{13}$ |
| | 2-3-12 | H | H | *—O—CH$_2$—CH(C$_{10}$H$_{21}$)—C$_8$H$_{17}$ | H |
| | 2-3-13 | H | H | *—N(C$_6$H$_{13}$)$_2$ | H |
| | 2-3-14 | *—OC$_8$H$_{17}$ | *—OC$_8$H$_{17}$ | *—OC$_8$H$_{17}$ | *—OC$_8$H$_{17}$ |
| | 2-3-15 | *—C$_6$H$_{13}$ | *—C$_6$H$_{13}$ | H | *—C$_6$H$_{13}$ |
| | 2-3-16 | H | H | *—O—CH$_2$CH$_2$CH(CH$_3$)CH$_2$CH$_2$CH(CH$_3$)$_2$ | H |
| | 2-3-17 | H | H | H | H |
| | 2-3-18 | H | H | *—CH$_3$ | H |
| | 2-3-19 | H | H | *—O—CH$_2$—CH(C$_{10}$H$_{21}$)(C$_{12}$H$_{25}$) | H |
| | 2-3-20 | H | H | *—OEt | H |

Formula (2-4M)

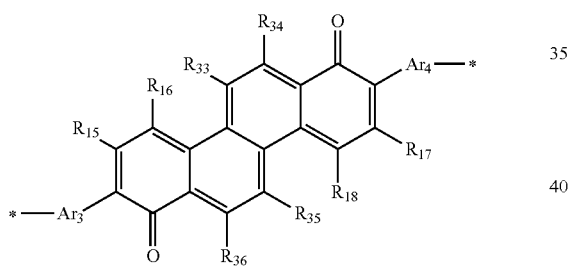

In Formula (2-4M), each of Ar$^3$, Ar$^4$, R$^{15}$ to R$^{18}$, and R$^{33}$ to R$^{36}$ represents the following groups.

TABLE 20

|  | Ar$^3$ | Ar$^4$ | R$^{15}$ | R$^{16}$ | R$^{17}$ |
|---|---|---|---|---|---|
| 2-4-1 | *-thienyl-* | *-thienyl-* | H | H | H |
| 2-4-2 | *-thienyl-* | *-thienyl-* | H | *—O—CH$_2$—CH(C$_{10}$H$_{21}$)—C$_8$H$_{17}$ | H |
| 2-4-3 | *-thienyl-* | *-thienyl-* | H | *—CH$_2$—CH(C$_{10}$H$_{21}$)(C$_{12}$H$_{25}$) | H |

TABLE 20-continued

| | | | R³² | R³⁷ | R³⁸ |
|---|---|---|---|---|---|
| 2-4-4 | 2,5-thienyl | 2,5-thienyl | H | *—OC₈H₁₇ | H |
| 2-4-5 | 2,5-thienyl | 2,5-thienyl | *—CH₃ | *—CH₂—CH(Et)(C₄H₉) | *—CH₃ |
| 2-4-6 | 2,5-thienyl | 2,5-thienyl | H | *—O—CH₂—CH(C₁₀H₂₁)(C₈H₁₇) | H |
| 2-4-7 | 3-C₆H₁₃-2,5-thienyl | 3-C₆H₁₃-2,5-thienyl | H | *—N(C₄H₉)₂ | H |
| 2-4-8 | 2,5-furyl | 2,5-furyl | H | *—OC₆H₁₃ | H |
| 2-4-9 | 3-C₁₀H₂₅-2,5-furyl | 3-C₁₀H₂₅-2,5-furyl | H | *—N(C₆H₁₃)₂ | H |
| 2-4-10 | 4,4-di(C₁₂H₂₅)-cyclopentadithiophene | 4,4-di(C₁₂H₂₅)-cyclopentadithiophene | H | *—O—C(=O)—CH₂CH₂CH₂—CH₃ | H |

| | R¹⁸ | R³³ | R³⁴ | R³⁵ | R³⁶ |
|---|---|---|---|---|---|
| 2-4-1 | H | *—C₆H₁₃ | *—C₆H₁₃ | *—C₆H₁₃ | *—C₆H₁₃ |
| 2-4-2 | *—O—CH₂—CH(C₁₀H₂₁)(C₈H₁₇) | H | H | H | H |
| 2-4-3 | *—CH₂—CH(C₁₀H₂₁)(C₁₂H₂₅) | H | H | H | H |
| 2-4-4 | *—OC₈H₁₇ | H | H | H | H |
| 2-4-5 | *—CH₂—CH(Et)(C₄H₉) | H | H | *—O—CH₂—CH(C₁₀H₂₁)(C₈H₁₇) | *—O—CH₂—CH(C₁₀H₂₁)(C₈H₁₇) |
| 2-4-6 | *—O—CH₂—CH(C₁₀H₂₁)(C₈H₁₇) | H | H | *—CH₃ | *—CH₂CH₂CH(CH₃)CH₂CH₂CH(CH₃)CH₃ |
| 2-4-7 | *—N(C₄H₉)₂ | H | H | *—OEt | *—OEt |
| 2-4-8 | *—OC₆H₁₃ | H | H | *—OC₆H₁₃ | *—OC₆H₁₃ |

TABLE 20-continued

| | | | | | |
|---|---|---|---|---|---|
| 2-4-9 | *—N(C6H13)(C6H13) | H | H | H | H |
| 2-4-10 | *—O—C(=O)—CH2CH2CH3 | H | H | H | H |

TABLE 21

| | Ar³ | Ar⁴ |
|---|---|---|
| 2-4-11 | [cyclopenta-dithiophene with two 3,7-dimethyloctyl groups at sp3 carbon] | [cyclopenta-dithiophene with two 3,7-dimethyloctyl groups at sp3 carbon] |
| 2-4-12 | [dithieno[3,2-b:2',3'-d]thiophene] | [dithieno[3,2-b:2',3'-d]thiophene] |
| 2-4-13 | [N-C12H25 dithienopyrrole] | [N-C12H25 dithienopyrrole] |
| 2-4-14 | [benzodithiophene with OC12H25 groups] | [benzodithiophene with OC12H25 groups] |
| 2-4-15 | [thieno[3,2-b]thiophene] | [thieno[3,2-b]thiophene] |
| 2-4-16 | [thieno[2,3-b]thiophene] | [thieno[2,3-b]thiophene] |
| 2-4-17 | [benzodithiophene with O-(3,7-dimethyloctyl) groups] | [benzodithiophene with O-(3,7-dimethyloctyl) groups] |

TABLE 21-continued

| | | | | | | |
|---|---|---|---|---|---|---|
| 2-4-18 | | | | | | |
| 2-4-19 | | | | | | |
| 2-4-20 | | | | | | |

| | $R^{15}$ | $R^{16}$ | $R^{17}$ | $R^{18}$ | $R^{33}$ | $R^{34}$ |
|---|---|---|---|---|---|---|
| 2-4-11 | H | H | H | H | *—OC$_6$H$_{13}$ | *—OC$_6$H$_{13}$ |
| 2-4-12 | H | H | H | H | *—CH(C$_{12}$H$_{25}$)C$_{10}$H$_{21}$ | *—CH(C$_{12}$H$_{25}$)C$_{10}$H$_{21}$ |
| 2-4-13 | H | *—OCH(C$_{10}$H$_{21}$)C$_8$H$_{17}$ | H | *—OCH(C$_{10}$H$_{21}$)C$_8$H$_{17}$ | H | H |
| 2-4-14 | H | H | H | H | *—OC$_8$H$_{17}$ | *—OC$_8$H$_{17}$ |
| 2-4-15 | H | H | H | H | *—OCH(C$_{10}$H$_{21}$)C$_8$H$_{17}$ | *—OCH(C$_{10}$H$_{21}$)C$_8$H$_{17}$ |
| 2-4-16 | H | *—CH(C$_{12}$H$_{25}$)C$_{10}$H$_{21}$ | H | *—CH(C$_{12}$H$_{25}$)C$_{10}$H$_{21}$ | H | H |
| 2-4-17 | H | H | H | H | *—C$_6$H$_{13}$ | *—C$_6$H$_{13}$ |
| 2-4-18 | H | *—CH(Et)C$_4$H$_9$ | H | *—CH(Et)C$_4$H$_9$ | H | H |
| 2-4-19 | H | *—OCH$_2$CH(C$_8$H$_{17}$)C$_{10}$H$_{21}$ | H | *—OCH$_2$CH(C$_8$H$_{17}$)C$_{10}$H$_{21}$ | H | H |
| 2-4-20 | H | *—CH(C$_8$H$_{17}$)C$_{10}$H$_{21}$ | H | *—CH(C$_8$H$_{17}$)C$_{10}$H$_{21}$ | H | H |

| | $R^{35}$ | $R^{36}$ |
|---|---|---|
| 2-4-11 | *—OC$_6$H$_{13}$ | *—OC$_6$H$_{13}$ |
| 2-4-12 | *—CH(C$_{12}$H$_{25}$)C$_{10}$H$_{21}$ | *—CH(C$_{12}$H$_{25}$)C$_{10}$H$_{21}$ |
| 2-4-13 | H | H |
| 2-4-14 | *—OC$_8$H$_{17}$ | *—OC$_8$H$_{17}$ |

TABLE 21-continued

| | | | |
|---|---|---|---|
| | 2-4-15 | *—O—CH(C₈H₁₇)—CH₂—C₁₀H₂₁ | *—O—CH(C₈H₁₇)—CH₂—C₁₀H₂₁ |
| | 2-4-16 | *—N(C₆H₁₃)₂ | *—N(C₆H₁₃)₂ |
| | 2-4-17 | *—C₆H₁₃ | *—C₆H₁₃ |
| | 2-4-18 | H | H |
| | 2-4-19 | H | H |
| | 2-4-20 | H | H |

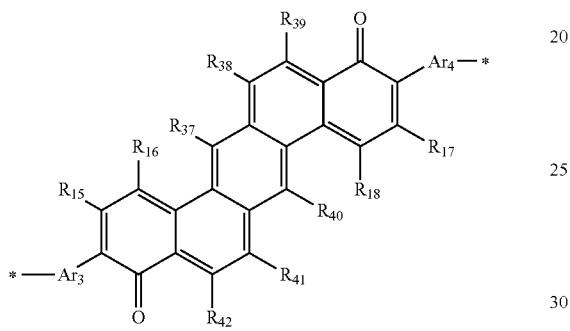

Formula (2-5M)

In Formula (2-5M), each of $Ar^3$, $Ar^4$, $R^{15}$ to $R^{18}$, and $R^{37}$ to $R^{42}$ represents the following groups,

TABLE 22

| | Ar³ | Ar⁴ | R¹⁵ | R¹⁶ | R¹⁷ |
|---|---|---|---|---|---|
| 2-5-1 | *-thienyl-* | *-thienyl-* | H | H | H |
| 2-5-2 | *-thienyl-* | *-thienyl-* | H | *—OC₈H₁₇ | H |
| 2-5-3 | *-thienyl-* | *-thienyl-* | H | *—CH₂—CH(C₁₂H₂₅)—C₁₀H₂₁ | H |
| 2-5-4 | *-thienyl-* | *-thienyl-* | H | *—O—CH₂—CH(C₈H₁₇)—C₁₀H₂₁ | H |
| 2-5-5 | *-thienyl-* | *-thienyl-* | *—CH₃ | *—CH₂—CH(Et)—C₄H₉ | *—CH₃ |
| 2-5-6 | *-thienyl-* | *-thienyl-* | H | *—O—CH₂—CH(C₈H₁₇)—C₁₀H₂₁ | H |

TABLE 22-continued

| | | | | | |
|---|---|---|---|---|---|
| 2-5-7 | *—[thiophene with C6H13]—* | *—[thiophene with C6H13]—* | H | H | H |
| 2-5-8 | *—[furan]—* | *—[furan]—* | H | H | H |
| 2-5-9 | *—[thiophene with C10H25]—* | *—[thiophene with C10H25]—* | H | *—N(C6H13)(C6H13) | H |
| 2-5-10 | [cyclopentadithiophene with C12H25, C12H25] | [cyclopentadithiophene with C12H25, C12H25] | H | *—O–CH2–C(=O)–O–CH3 (ethyl ester) | H |

| | R$^{18}$ | R$^{37}$ | R$^{38}$ | R$^{39}$ | R$^{40}$ |
|---|---|---|---|---|---|
| 2-5-1 | H | *—C$_6$H$_{13}$ | *—C$_6$H$_{13}$ | *—C$_6$H$_{13}$ | *—C$_6$H$_{13}$ |
| 2-5-2 | *—OC$_8$H$_{17}$ | H | H | *—O–CH$_2$–CH(C$_{10}$H$_{21}$)(C$_8$H$_{17}$) | H |
| 2-5-3 | *—CH$_2$–CH(C$_{10}$H$_{21}$)(C$_{12}$H$_{25}$) | H | H | *—OEt | H |
| 2-5-4 | *—O–CH$_2$–CH(C$_{10}$H$_{21}$)(C$_8$H$_{17}$) | H | H | H | H |
| 2-5-5 | *—CH$_2$–CH(C$_4$H$_9$)(Et) | H | H | *—CH$_2$–CH(C$_{10}$H$_{21}$)(C$_{12}$H$_{25}$) | H |
| 2-5-6 | *—O–CH$_2$–CH(C$_{10}$H$_{21}$)(C$_8$H$_{17}$) | H | H | *—O–CH$_2$–CH(C$_{10}$H$_{21}$)(C$_8$H$_{17}$) | H |
| 2-5-7 | H | *—OEt | *—OEt | *—N(C$_4$H$_9$)(C$_4$H$_9$) | *—OEt |
| 2-5-8 | H | *—OC$_6$H$_{13}$ | *—OC$_6$H$_{13}$ | H | *—OC$_6$H$_{13}$ |
| 2-5-9 | *—N(C$_6$H$_{13}$)(C$_6$H$_{13}$) | H | H | H | H |
| 2-5-10 | *—O–CH$_2$–C(=O)–O–CH$_3$ | H | H | H | H |

TABLE 22-continued

|  | $R^{41}$ | $R^{42}$ |
|---|---|---|
| 2-5-1 | *—C$_6$H$_{13}$ | *—C$_6$H$_{13}$ |
| 2-5-2 | H | *—O—CH(C$_{10}$H$_{21}$)(CH$_2$C$_8$H$_{17}$)... *—O—CH$_2$—CH(C$_{10}$H$_{21}$)(C$_8$H$_{17}$) |
| 2-5-3 | H | *—OEt |
| 2-5-4 | H | H |
| 2-5-5 | H | *—CH$_2$—CH(C$_{10}$H$_{21}$)(C$_{12}$H$_{25}$) |
| 2-5-6 | H | *—O—CH$_2$—CH(C$_{10}$H$_{21}$)(C$_8$H$_{17}$) |
| 2-5-7 | *—OEt | *—N(C$_4$H$_9$)(C$_4$H$_9$) |
| 2-5-8 | *—OC$_6$H$_{13}$ | H |
| 2-5-9 | H | H |
| 2-5-10 | H | H |

TABLE 23

| | Ar³ | Ar⁴ | R¹⁵ | R¹⁶ | R¹⁷ | R¹⁸ |
|---|---|---|---|---|---|---|
| 2-5-11 | (cyclopenta-dithiophene with branched alkyl substituents) | (cyclopenta-dithiophene with branched alkyl substituents) | H | H | H | H |
| 2-5-12 | (dithienothiophene) | (dithienothiophene) | H | *—CH₃ | H | *—CH₃ |
| 2-5-13 | (dithienopyrrole with C₁₂H₂₅ on N) | (dithienopyrrole with C₁₂H₂₅ on N) | H | *—O—CH₂—CH(C₁₀H₂₁)(C₈H₁₇) | H | *—O—CH₂—CH(C₁₀H₂₁)(C₈H₁₇) |
| 2-5-14 | (benzodithiophene with OC₁₂H₂₅) | (benzodithiophene with OC₁₂H₂₅) | H | H | H | H |
| 2-5-15 | (thienothiophene) | (thienothiophene) | H | H | H | H |
| 2-5-16 | (thienothiophene) | (thienothiophene) | H | *—CH₂—CH(C₁₀H₂₁)(C₁₂H₂₅) | H | *—CH₂—CH(C₁₀H₂₁)(C₁₂H₂₅) |

TABLE 23-continued

| | | | | | | | |
|---|---|---|---|---|---|---|---|
| 2-5-17 | (benzodithiophene with branched alkoxy chains) | H | H | H | H | | H |
| 2-5-18 | (cyclopenta-fused dithiophene with C12H25 groups) | H | *–CH2CH(Et)C4H9 | H | *–CH2CH(Et)C4H9 | H | |
| 2-5-19 | (1,4-phenylene) | H | H | H | *–OC6H13 | H | |
| 2-5-20 | (2,5-phenylene with C8H17) | H | *–CH2CH(C8H17)C10H21 | H | *–CH2CH(C8H17)C10H21 | H | |

TABLE 23-continued

| | $R^{37}$ | $R^{38}$ | $R^{39}$ | $R^{40}$ | $R^{41}$ | $R^{42}$ |
|---|---|---|---|---|---|---|
| 2-5-11 | *—OC$_6$H$_{13}$ | *—OC$_6$H$_{13}$ | *—OC$_6$H$_{13}$ | *—OC$_6$H$_{13}$ | *—OC$_6$H$_{13}$ | *—OC$_6$H$_{13}$ |
| 2-5-12 | H | H | *—O—CH$_2$—CH(C$_{10}$H$_{21}$)—C$_8$H$_{17}$ | H | H | *—O—CH$_2$—CH(C$_{10}$H$_{21}$)—C$_8$H$_{17}$ |
| 2-5-13 | H | H | *—N(C$_6$H$_{13}$)$_2$ | H | H | *—N(C$_6$H$_{13}$)$_2$ |
| 2-5-14 | *—OC$_8$H$_{17}$ | *—OC$_8$H$_{17}$ | *—OC$_8$H$_{17}$ | *—OC$_8$H$_{17}$ | *—OC$_8$H$_{17}$ | *—OC$_8$H$_{17}$ |
| 2-5-15 | *—C$_6$H$_{13}$ | *—C$_6$H$_{13}$ | H | *—C$_6$H$_{13}$ | *—C$_6$H$_{13}$ | H |
| 2-5-16 | H | H | *—O—CH$_2$CH$_2$—CH(CH$_3$)—CH$_2$CH$_2$CH$_2$—CH(CH$_3$)$_2$ | H | H | *—O—CH$_2$CH$_2$—CH(CH$_3$)—CH$_2$CH$_2$CH$_2$—CH(CH$_3$)$_2$ |
| 2-5-17 | H | H | H | H | H | *—CH(Et)(H) |
| 2-5-18 | H | H | *—CH(Et)(H) | H | H | *—CH(Et)(H) |
| 2-5-19 | H | H | *—O—CH$_2$—CH(C$_{10}$H$_{21}$)—C$_{12}$H$_{25}$ | H | H | *—O—CH$_2$—CH(C$_{10}$H$_{21}$)—C$_{12}$H$_{25}$ |
| 2-5-20 | H | H | *—OEt | H | H | *—OEt |

Linking groups V1 to V50
TABLE 24
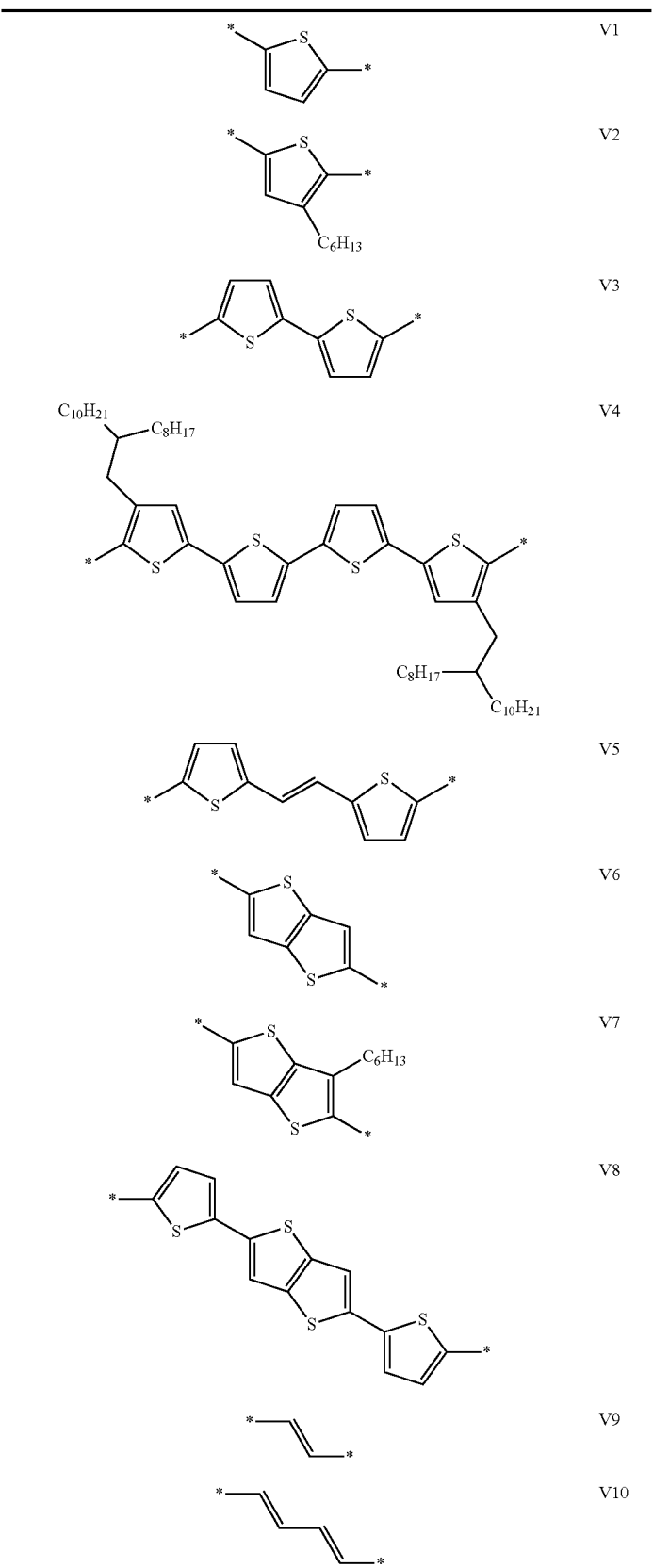

TABLE 24-continued
TABLE 25
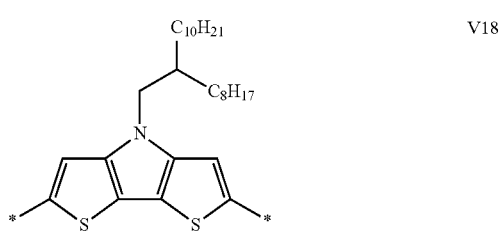

TABLE 25-continued
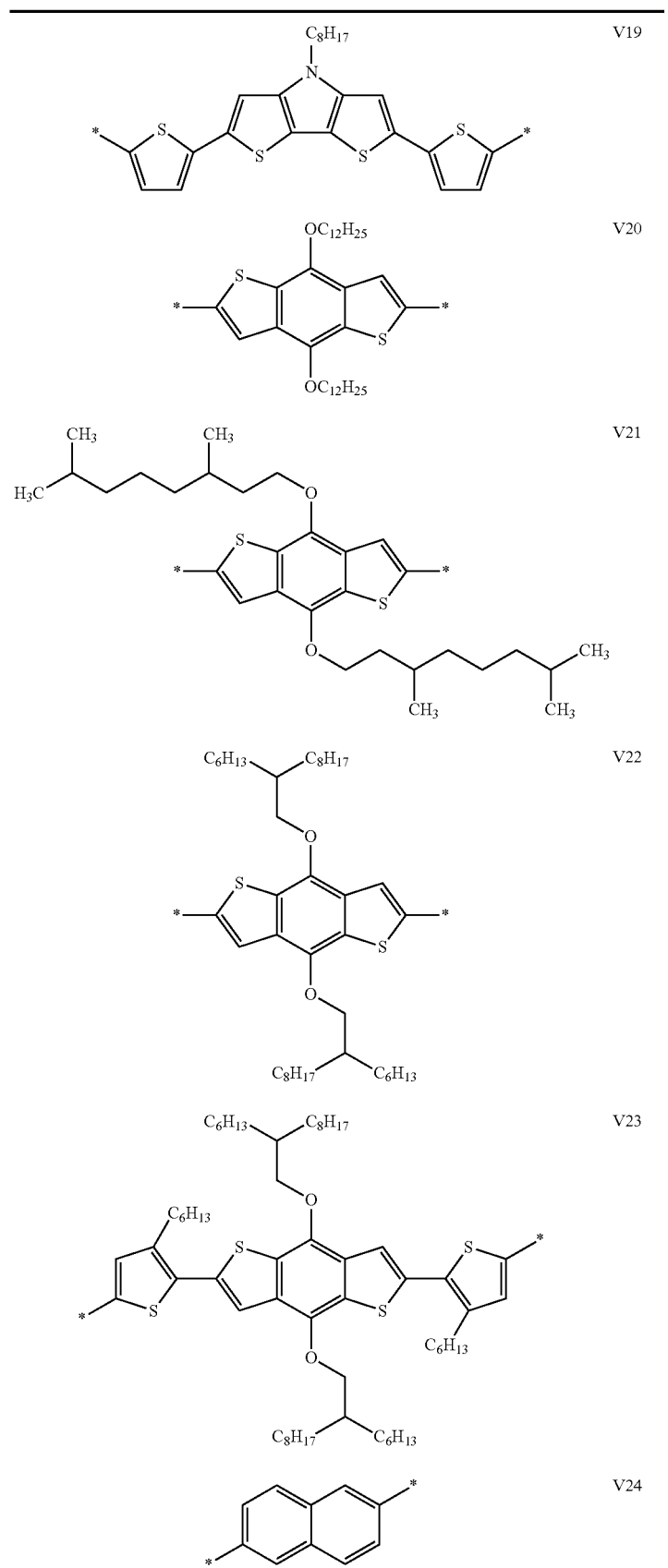

TABLE 25-continued
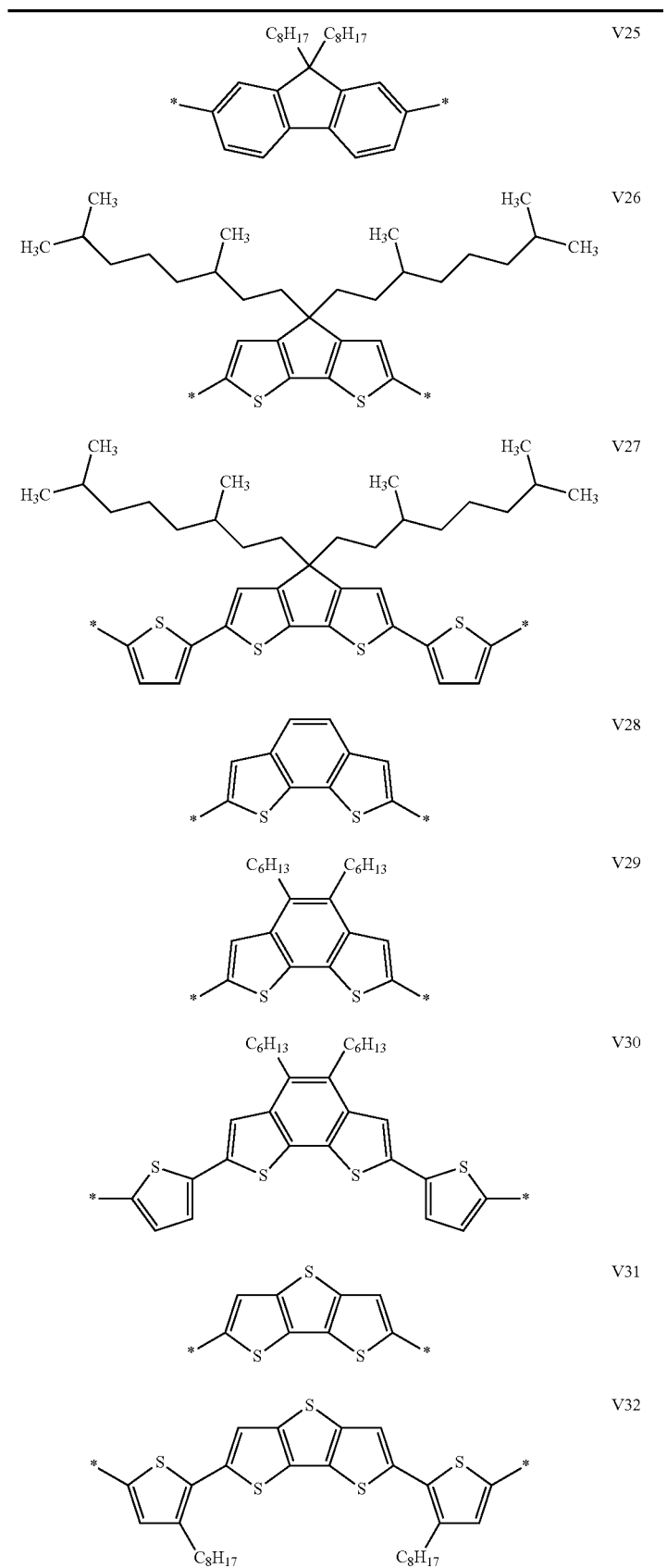

TABLE 25-continued

[Structure V33: indacenodithiophene with C6H13 groups]

[Structure V34: indacenodithiophene with C12H25 groups]

TABLE 26

[Structure V35: indacenodithiophene with 3,7-dimethyloctyl (isooctyl-type) side chains]

[Structure V36: bis-thienyl indacenodithiophene with C12H25 groups]

[Structure V37: furan-2,5-diyl]

[Structure V38: bifuran-5,5'-diyl]

[Structure V39: selenophene-2,5-diyl]

TABLE 26-continued
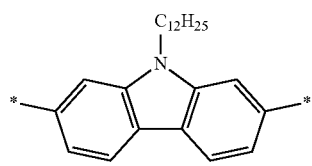 V40
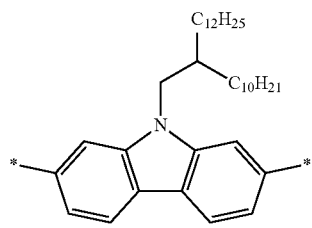 V41
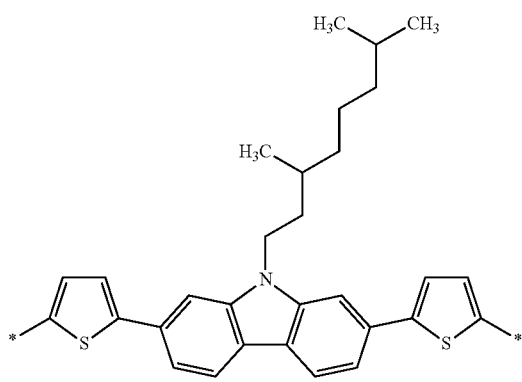 [SMILES: *c1ccc(-c2ccc3c4ccc(-c5ccc(*)s5)cc4n(CCC(C)CCCC(C)C)c3c2)s1] V42
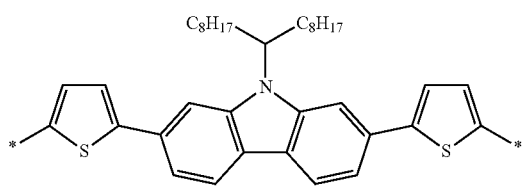 V43
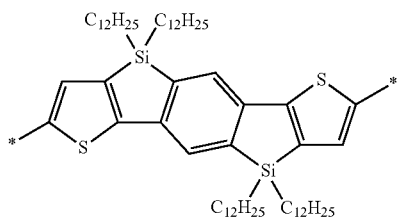 V44
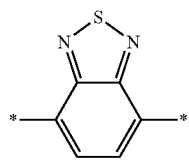 [SMILES: *c1ccc(*)c2nsnc12] V45
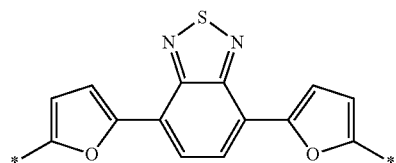 [SMILES: *c1ccc(-c2ccc(-c3ccc(*)o3)c3nsnc23)o1] V46

TABLE 26-continued

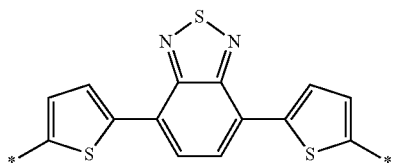 [SMILES: *c1ccc(-c2ccc(-c3ccc(*)s3)c3nsnc23)s1]

V47

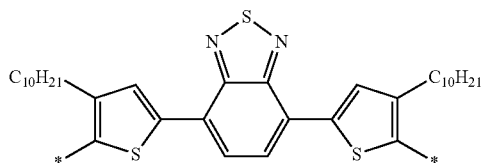

V48

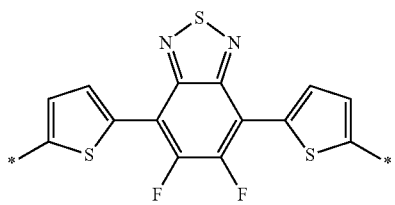 [SMILES: *c1ccc(-c2c(F)c(F)c(-c3ccc(*)s3)c3nsnc23)s1]

V49

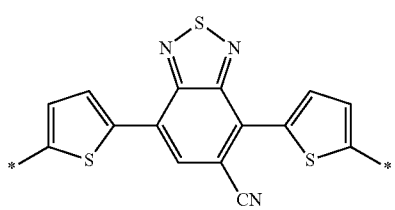 [SMILES: *c1ccc(-c2cc(C#N)c(-c3ccc(*)s3)c3nsnc23)s1]

V50

<<Compound Composed of n Repeating Units Represented by Formula (101-1)>>

The compound composed of n repeating units represented by Formula (101-1) is represented by the following formula.

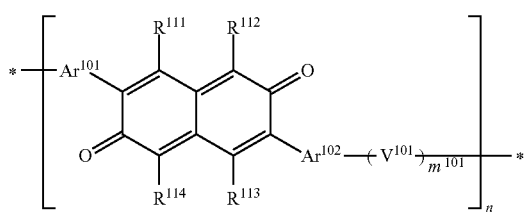

Formula (101-1)

In Formula (101-1), each of $R^{111}$ to $R^{114}$ independently represents a hydrogen atom or a substituent; each of $Ar^{101}$ and $Ar^{102}$ independently represents a heteroarylene group or an arylene group; $V^{101}$ represents a divalent linking group; $m^{101}$ represents an integer of 0 to 6; when $m^{101}$ is equal to or greater than 2, two or more groups represented by $V^{101}$ may be the same as or different from each other; and n is equal to or greater than 2.

In Formula (101-1), each of $R^{111}$ to $R^{114}$ independently represents a hydrogen atom or a substituent. Examples of the substituent that each of $R^{111}$ to $R^{114}$ can independently adopt include a halogen atom, an alkyl group (including an alkyl group having 1 to 40 carbon atoms such as a methyl group, an ethyl group, a propyl group, a butyl group, a pentyl group, a hexyl group, a heptyl group, an octyl group, a nonyl group, a decyl group, an undecyl group, a dodecyl group, a tridecyl group, a tetradecyl group, or a pentadecyl group (preferably an alkyl group having 3 to 40 carbon atoms and more preferably an alkyl group having 10 to 30 carbon atoms), a 2,6-dimethyloctyl group, a 2-decyltetradecyl group, a 2-hexyldodecyl group, a 2-ethyloctyl group, a 2-decyltetradecyl group, a 2-butyldecyl group, a 1-octylnonyl group, a 2-ethyloctyl group, a 2-octyltetradecyl group, and the like), an alkenyl group (including a 1-pentenyl group, a cycloalkenyl group, a bicycloalkenyl group, and the like), an alkynyl group (including a 1-pentynyl group, a trimethylsilylethynyl group, a triethylsilylethynyl group, a tri-i-propylsilylethynyl group, a 2-p-propylphenylethynyl group, and the like), an aryl group (including an aryl group having 6 to 20 carbon atoms such as a phenyl group, a naphthyl group, a p-pentylphenyl group, a 3,4-dipentylphenyl group, a p-heptoxyphenyl group, a 3,4-diheptoxyphenyl group, and the like), a hetero ring group (may also be referred to as a heterocyclic group, including a 2-hexylfuranyl group and the like), a cyano group, a hydroxyl group, a nitro group, an acyl group (including a hexanoyl group, a benzoyl group, and the like), an aryloxy group, a silyloxy group, a heterocyclic oxy group, an acyloxy group, a carbamoyloxy group, an amino group (including an anilino group), an acylamino group, an aminocarbonylamino group (including a ureide group), an alkoxy group (including an alkoxy group having 1 to 40 carbon atoms such as a methoxy group, an ethoxy group, a propoxy group, a butoxy group, a pentoxy group, a hexyloxy group, a heptoxy group, an octoxy group, a nonyloxy group, a decyloxy group, a 2-hexyldecyloxy group, an undecyloxy group, a dodecyloxy group, a tridecyloxy group, a tetradecyloxy group, and a pentadecyloxy group (preferably an alkoxy group having 3 to 40 carbon atoms and more preferably an alkoxy group having 10 to 30 carbon atoms)), an aryloxycarbonylamino group, alkyl and aryl sulfonylamino groups, a mercapto group, alkyl and arylthio groups (including a methylthio group, an octylthio group, and the like), a heterocyclic thio group, a sulfamoyl group, a sulfo group, alkyl and aryl sulfinyl groups, alkyl and aryl sulfonyl groups, alkyloxy and aryloxy carbonyl groups, a carbamoyl group, an arylazo group, a heterocyclic azo group, an imide group, a phosphino group, a phosphinyl group, a phosphinyloxy group, a phosphinylamino group, a phosphono group, a silyl group (a ditrimethylsiloxy methylbutoxy group), a hydrazino group, a group represented by Formula (W) which will be described later, and other known substituents.

These substituents may further have a substituent.

In addition, these substituents may have a group derived from a polymerizable group.

Each of $R^{111}$ and $R^{113}$ is independently preferably any of a hydrogen atom, an alkyl group, an aryl group, an alkenyl group, an alkynyl group, a heterocyclic group, an alkoxy group, an amino group, an alkylthio group, and a group represented by Formula (W) which will be described later, more preferably any of a hydrogen atom, an alkyl group having 1 to 12 carbon atoms, an alkoxy group having 1 to 12 carbon atoms, an amino group substituted with an alkyl group having 1 to 12 carbon atoms, and a group represented by Formula (W) which will be described later, and particularly preferably any of a hydrogen atom, an alkyl group having 1 to 6 carbon atoms, an alkoxy group having 1 to 6 carbon atoms, and a group represented by Formula (W) which will be described later. From the viewpoint of making it possible to easily form an intramolecular hydrogen bond by keeping a cyclohexadienone skeleton and arylene groups or heteroarylene groups ($Ar^{101}$ or $Ar^{102}$) on both sides of the cyclohexadienone skeleton within a plane by means of suppressing the bulkiness of $R^{111}$ and $R^{113}$, each of $R^{111}$ and $R^{113}$ is more particularly preferably a hydrogen atom, an alkyl group having 1 to 4 carbon atoms, or an alkoxy group having 1 to 4 carbon atoms, more particularly preferably any of a hydrogen atom and an ethoxy group, and most preferably a hydrogen atom. In contrast, when none of $R^{112}$ and $R^{114}$, which will be described later, contain a group represented by Formula (W) which will be described later, from the viewpoint of securing the solubility of the compound and from the viewpoint of not hindering the intramolecular hydrogen bonding as much as possible, each of $R^{111}$ and $R^{113}$ is preferably any of an amino group substituted with an alkyl group having 2 to 12 carbon atoms and a group represented by Formula (W) which will be described later, and most preferably a group represented by Formula (W) which will be described later that has 4 to 8 carbon atoms.

Each of $R^{112}$ and $R^{114}$ is independently preferably any of a hydrogen atom, an alkyl group, an aryl group, an alkenyl group, an alkynyl group, an alkoxy group, a heterocyclic group, an alkylthio group, an amino group, and a group represented by Formula (W) which will be described later, more preferably any of a hydrogen atom, an alkyl group having 3 to 40 carbon atoms, an aryl group having 6 to 20 carbon atoms, an alkenyl group having 2 to 12 carbon atoms, an alkynyl group having 2 to 12 carbon atoms, an alkoxy group having 3 to 40 carbon atoms, a heterocyclic group having 5 to 12 carbon atoms, an alkylthio group having 1 to 12 carbon atoms, an amino group substituted with an alkyl group having 1 to 12 carbon atoms, and a group represented by Formula (W) which will be described later, and particularly preferably a group represented by Formula (W) which will be described later. Furthermore, each of $R^{112}$ and $R^{114}$ is preferably a branched substituent in which a linear substituent further has a substituent.

The alkyl group which can be adopted as $R^{112}$ and $R^{114}$ is more preferably an alkyl group having 3 to 40 carbon atoms, even more preferably an alkyl group having 10 to 30 carbon atoms from the viewpoint of the chemical stability and the carrier transport properties, and particularly preferably an alkyl group having 15 to 30 carbon atoms. Furthermore, the alkyl group which can be adopted as $R^{112}$ and $R^{114}$ is preferably a linear or branched alkyl group, and more preferably a branched alkyl group from the viewpoint of improving the carrier mobility and the solubility without deteriorating the intramolecular hydrogen bonding properties.

The alkoxy group which can be adopted as $R^{112}$ and $R^{114}$ is more preferably an alkoxy having 1 to 40 carbon atoms, even more preferably an alkoxy group having 1 to 30 carbon atoms from the viewpoint of the chemical stability and the carrier mobility, and particularly preferably an alkoxy group having 2 to 30 carbon atoms. Furthermore, the alkoxy group which can be adopted as $R^{112}$ and $R^{114}$ is preferably a linear or branched alkoxy group, and more preferably a branched alkoxy group from the viewpoint of improving the carrier mobility and the solubility without deteriorating the intramolecular hydrogen bonding properties.

$R^{111}$ and $R^{112}$ may form a condensed ring by being bonded to each other, and $R^{113}$ and $R^{114}$ may form a condensed ring by being bonded to each other.

It is preferable that at least one of $R^{111}$ to $R^{114}$ is a group represented by the following Formula (W).

$$-L-R \qquad \text{Formula (W)}$$

(In Formula (W), L represents a divalent linking group represented by any of the following Formulae (L-1) to (L-12) or a divalent linking group formed by bonding of two or more divalent linking groups represented by any of the following Formulae (L-1) to (L-12); R represents a substituted or unsubstituted alkyl group, an oligo-oxyethylene group in which a repetition number v of an oxyethylene unit is equal to or greater than 2, an oligosiloxane group having two or more silicon atoms, or a substituted or unsubstituted silyl group; and R represents a substituted or unsubstituted silyl group only when L adjacent to R is a divalent linking group represented by any of the following Formulae (L-1) to (L-3).)

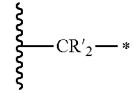
(L-1)

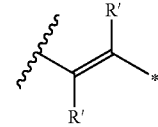
(L-2)

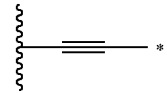
(L-3)

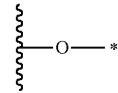
(L-4)

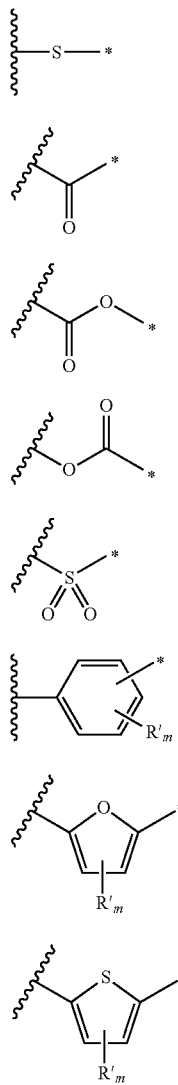

(In Formulae (L-1) to (L-12), the portion of a wavy line represents a position where the divalent linking group is bonded to a cyclohexadienone skeleton; * represents a position where the divalent linking group is bonded to any of the divalent linking groups represented by Formulae (L-1) to (L-12) and R; m in Formula (L-10) is 4; m in Formulae (L-11) and (L-12) is 2; and each R' in Formulae (L-1), (L-2), (L-10), (L-11), and (L-12) independently represents a hydrogen atom or a substituent.)

In Formula (W), L represents a divalent linking group represented by any of the following Formulae (L-1) to (L-12) or a divalent linking group formed by bonding of two or more divalent linking groups represented by any of Formulae (L-1) to (L-12). When L forms a linking group in which divalent linking groups represented by any of Formula (L-1) to (L-12) are bonded to each other, the number of the bonded divalent linking groups represented by any of Formula (L-1) to (L-12) is preferably 2 to 4, and more preferably 2 or 3.

Each substituent R' in Formulae (L-1), (L-2), (L-10), (L-11), and (L-12) independently represents a hydrogen atom or a substituent. Examples of the substituent which can be adopted as R' include an alkyl group having 5 to 15 carbon atoms (preferably an alkyl group having 6 to 15 carbon atoms) and an alkoxy group having 5 to 15 carbon atoms (preferably an alkoxy group having 6 to 15 carbon atoms).

m in Formula (L-10) represents 4, and m in Formulae (L-11) and (L-12) represents 2.

L is preferably a divalent linking group represented by any of Formulae (L-1), (L-4), and (L-8) or a divalent linking group formed by bonding of two or more divalent linking groups described above, more preferably a divalent linking group represented by any of Formula (L-1) and (L-4) or a divalent linking group formed by bonding of two or more divalent linking groups described above, and particularly preferably a divalent linking group represented by Formula (L-1) or a divalent linking group formed by bonding of two or more divalent linking groups described above.

In Formula (W), R represents a hydrogen atom, a substituted or unsubstituted alkyl group, an oligo-oxyethylene group in which a repetition number of an oxyethylene unit is equal to or greater than 2, an oligosiloxane group having two or more silicon atoms, or a substituted or unsubstituted silyl group. Here, R represents a substituted or unsubstituted silyl group only when L adjacent to R is a divalent linking group represented by the following Formula (L-3), and represents a hydrogen atom only when L adjacent to R is a divalent linking group represented by any of the following Formulae (L-1) to (L-3).

When L is represented by Formula (L-1), the substituted or unsubstituted alkyl group which can be adopted as R is preferably an alkyl group having 3 or more carbon atoms, more preferably an alkyl group having 3 to 40 carbon atoms, even more preferably an alkyl group having 10 to 30 carbon atoms from the viewpoint of the chemical stability and the carrier transport properties, and particularly preferably an alkyl group having 15 to 30 carbon atoms. Furthermore, when L is represented by Formula (L-1), the substituted or unsubstituted alkyl group which can be adopted as R is preferably a linear or branched alkyl group, and more preferably a branched alkyl group from the viewpoint of improving the carrier mobility and the solubility without deteriorating the intramolecular hydrogen bonding properties.

When L is represented by any of Formulae (L-2) and (L-3), the alkyl group which can be adopted as R is preferably an alkyl group having 2 or more carbon atoms, more preferably an alkyl group having 3 to 18 carbon atoms, even more preferably an alkyl group having 3 to 12 carbon atoms, and particularly preferably an alkyl group having 4 to 10 carbon atoms.

When L is represented by Formula (L-4), the alkyl group which can be adopted as R is preferably an alkyl group having 4 or more carbon atoms, more preferably an alkyl group having 4 to 40 carbon atoms, even more preferably an alkyl group having 4 to 30 carbon atoms, and particularly preferably an alkyl group having 4 to 20 carbon atoms.

When L is represented by any of Formulae (L-5) to (L-12), the alkyl group which can be adopted as R is preferably an alkyl group having 4 or more carbon atoms, preferably an alkyl group having 4 to 18 carbon atoms, even more preferably an alkyl group having 4 to 12 carbon atoms, and particularly preferably an alkyl group having 4 to 10 carbon atoms.

When -L-R in Formula (W) contains an alkyl group, if the alkyl group represented by R is equal to or greater than the lower limit of the aforementioned range, the carrier mobility is improved. Furthermore, when L contains Formula (L-1) adjacent to R, if the number of carbon atoms of the alkyl group formed by bonding of the alkylene group represented by Formula (L-1) and the alkyl group represented by R is equal to or greater than the lower limit of the aforementioned range, the carrier mobility is improved.

When R is an alkyl group having a substituent, examples of the substituent include a halogen atom and the like, and as the halogen atom, a fluorine atom is preferable. When R is an alkyl group having a fluorine-atom, a perfluoroalkyl group may be formed by substituting all the hydrogen atoms of the alkyl group with fluorine atoms.

In the present specification, when R is an oligo-oxyethylene group in which a repetition number v of an oxyethylene group is equal to or greater than 2, the "oxyethylene group" represented by R is a group represented by —(CH$_2$CH$_2$)$_v$OY (the repetition number v of an oxyethylene unit represents an integer of equal to or greater than 2, and Y on the terminal represents a hydrogen atom or a substituent). When Y on the terminal of the oligo-oxyethylene group is a hydrogen atom, the terminal becomes a hydroxy group. The repetition number v of an oxyethylene unit is preferably 2 to 4, and more preferably 2 or 3. It is preferable that the hydroxy group on the terminal of the oligo-oxyethylene group is blocked. That is, Y preferably represents a substituent. In this case, the hydroxy group is preferably blocked by an alkyl group having 1 to 3 carbon atoms. That is, Y is preferably an alkyl group having 1 to 3 carbon atoms, more preferably a methyl group or an ethyl group, and particularly preferably a methyl group.

When R is an oligosiloxane group having 2 or more silicon atoms, the repetition number of the siloxane unit is preferably 2 to 4, and more preferably 2 or 3. Furthermore, the Si atom is preferably bonded to a hydrogen atom or an alkyl group. When the Si atom is bonded to an alkyl group, the number of carbon atoms of the alkyl group is preferably 1 to 3. For example, the Si atom is preferably bonded to a methyl group or an ethyl group. The Si atom may be bonded to the same alkyl groups or may be bonded to different alkyl groups or hydrogen atoms. The siloxane units constituting the oligosiloxane group may be the same as or different from each other, but it is preferable that they are the same as each other. When R is a substituted or unsubstituted silyl group, as the silyl group which can be adopted as R, a trialkylsilyl group having 3 to 15 carbon atoms is preferable.

Examples of the group represented by Formula (W) include a 2,6-dimethyloctyl group, a 3,7-dimethyloctyl group, a 2-decyltetradecyl group, a 2-hexyldecyl group, a 2-hexyldodecyl group, a 2-ethyloctyl group, a 2-decyltetradecyl group, a 2-butyldecyl group, a 2-octylnonyl group, a 2-octyldodecyl group, a 2-octyltetradecyl group, a 2-ethylhexyl group, a 2-butylnonyl group, a 2-hexyldecyloxy group, a ditrimethylsiloxy methylbutoxy group, a butoxy group, a hexyl group, a heptyl group, an octyl group, a nonyl group, a decyl group, an undecyl group, a dodecyl group, a tridecyl group, a tetradecyl group, a pentadecyl group, a 3,7-dimethyloctyloxy group, a 2-decyltetradecyloxy group, a 2-hexyldecyloxy group, a 2-hexyldodecyloxy group, a 2-ethyloctyloxy group, a 2-decyltetradecyloxy group, a 2-butyldecyloxy group, a 2-octyldodecyloxy group, a 2-octyltetradecyloxy group, a 2-ethylhexyloxy group, a hexyloxy group, a heptyloxy group, an octyloxy group, a nonyloxy group, a decyloxy group, an undecyloxy group, a dodecyloxy group, a tridecyloxy group, a tetradecyloxy group, a pentadecyloxy group, and the like.

Each of Ar$^{101}$ and Ar$^{102}$ independently represents a heteroarylene group or an arylene group. From the viewpoint of accomplishing both the carrier mobility and the solubility by improving the intramolecular hydrogen bonding properties, it is preferable that Ar$^{101}$ and R$^{111}$ do not form a condensed ring by being bonded to each other. Furthermore, from the viewpoint of accomplishing both the carrier mobility and the solubility by improving the intramolecular hydrogen bonding properties, it is preferable that Ar$^{102}$ and R$^{113}$ do not form a condensed ring by being bonded to each other. The heteroarylene group or the arylene group which can be adopted as Ar$^{101}$ and Ar$^{102}$ is not particularly limited, and examples thereof include a heteroarylene group having 4 to 30 carbon atoms and an arylene group having 6 to 30 carbon atoms. The heteroarylene group or the arylene group which can be adopted as Ar$^{101}$ and Ar$^{102}$ is preferably a divalent linking group represented by the following Formula (4-1), (4-2), or (4-3), and more preferably a divalent group represented by the following Formula (4-1) or (4-2). Furthermore, it is preferable that Ar$^{101}$ and Ar$^{102}$ represent the same heteroarylene groups or arylene groups.

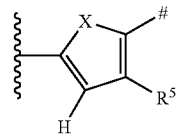

Formula (4-1)

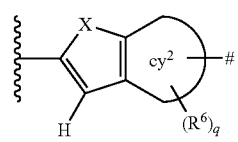

Formula (4-2)

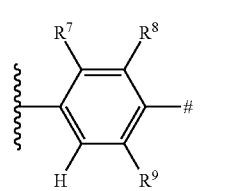

Formula (4-3)

(In Formulae (4-1) to (4-3), X represents a S atom, an O atom, or a Se atom; Cy$^2$ represents a structure in which 1 to 4 rings are condensed; each of R$^5$ to R$^9$ independently represents a hydrogen atom or a substituent; q represents an integer of 0 to 6; when q is equal to or greater than 2, two or more groups represented by R$^6$ may be the same as or different from each other; the portion of a wavy line represents a position where the divalent linking group is bonded to a cyclohexadienone ring-condensed site; and #represents a position where the divalent linking group is bonded to V$^{101}$ or V$^{102}$.)

In Formulae (4-1) to (4-3), X represents a S atom, an O atom, or a Se atom. X is preferably a S atom or a Se atom, and more preferably a S atom.

In Formulae (4-1) to (4-3), each of R$^5$ to R$^9$ independently represents a hydrogen atom or a substituent. The substituent which can be adopted as R$^5$ to R$^9$ is not particularly limited, and examples thereof include the same substituents as the substituents which can be adopted as R$^{111}$ to R$^{114}$. Among the substituents, as the substituents which can be adopted as R$^5$ to R$^9$, an alkyl group and an alkoxy group are preferable.

The alkyl group which can be adopted as R$^5$ to R$^9$ is more preferably an alkyl group having 3 to 40 carbon atoms, even more preferably an alkyl group having 10 to 30 carbon atoms from the viewpoint of the chemical stability and the carrier transport properties, and particularly preferably an alkyl group having 15 to 30 carbon atoms. Furthermore, the alkyl group which can be adopted as $R^5$ to $R^9$ is preferably a linear or branched alkyl group, and more preferably a branched alkyl group from the view point of improving the carrier mobility and the solubility without deteriorating the intramolecular hydrogen bonding properties.

The alkoxy group which can be adopted as $R^5$ to $R^9$ is more preferably an alkoxy group having 3 to 40 carbon atoms, even more preferably an alkoxy group having 10 to 30 carbon atoms from the viewpoint of the chemical stability and the carrier transport properties, and particularly preferably an alkoxy group having 15 to 30 carbon atoms. Furthermore, the alkoxy group which can be adopted as $R^5$ to $R^9$ is preferably a linear or branched alkoxy group, and more preferably a branched alkoxy group from the viewpoint of improving the carrier mobility and the solubility without deteriorating the intramolecular hydrogen bonding properties.

These substituents may further have a substituent.

In addition, these substituents may have a group derived from a polymerizable group.

In Formula (4-2), q represents an integer of 0 to 6. q is preferably an integer of 0 to 3, more preferably an integer of 0 to 2, and even more preferably an integer of 0 or 1.

In Formula (4-2), $Cy^2$ represents a structure in which 1 to 4 rings are condensed. $Cy^2$ is preferably a structure in which 1 to 4 aromatic rings or heterocyclic aromatic rings are condensed, more preferably a structure in which 1 to 4 aromatic rings having 6 to 10 carbon atoms or 1 to 4 heterocyclic aromatic rings having 4 to 6 carbon atoms are condensed, and particularly preferably a structure in which 1 to 4 benzene rings or thiophene rings are condensed.

The divalent linking group represented by Formula (4-2) is preferably a divalent linking group represented by any of the following Formulae (5-1) to (5-8), and more preferably a divalent linking group represented by Formula (5-1).

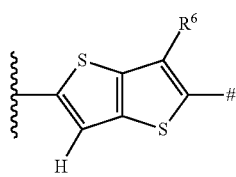

Formula (5-1)

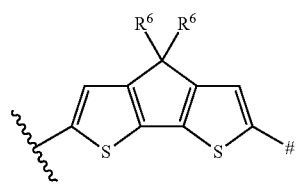

Formula (5-2)

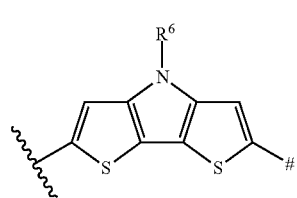

Formula (5-3)

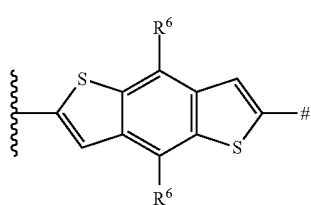

Formula (5-4)

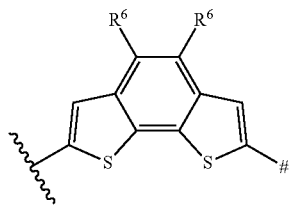

Formula (5-5)

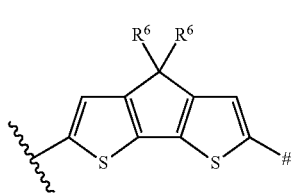

Formula (5-6)

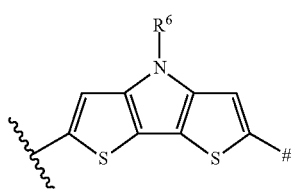

Formula (5-7)

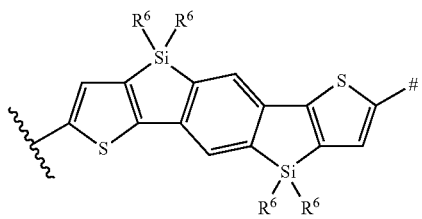

Formula (5-8)

(In Formulae (5-1) to (5-8), each $R^6$ independently represents a hydrogen atom or a substituent; two or more groups represented by $R^6$ may be the same as or different from each other; the wavy line represents a position where the divalent linking group is bonded to a cyclohexadienone ring-condensed site; and # represents a position where the divalent linking group is bonded to $V^{101}$ or $V^{102}$.)

In Formulae (5-1) to (5-8), each $R^6$ independently represents a hydrogen atom or a substituent, and two or more groups represented by $R^6$ may be the same as or different from each other. Examples of the substituent which can be adopted as $R^6$ include those exemplified above as substituents which can be adopted as $R^5$ to $R^9$ in Formulae (4-1) to (4-3), and the preferred range thereof is also the same.

In Formula (101-1), $V^{101}$ represents a divalent linking group. From the viewpoint of improving the solubility, it is preferable that $V^{101}$ does not form a condensed ring by being bonded to $Ar^{101}$ or $Ar^{102}$. The divalent linking group which can be adopted as $V^{101}$ is not particularly limited, but is preferably represented by any of the following Formulae (V-1) to (V-17).

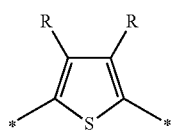

(V-1)

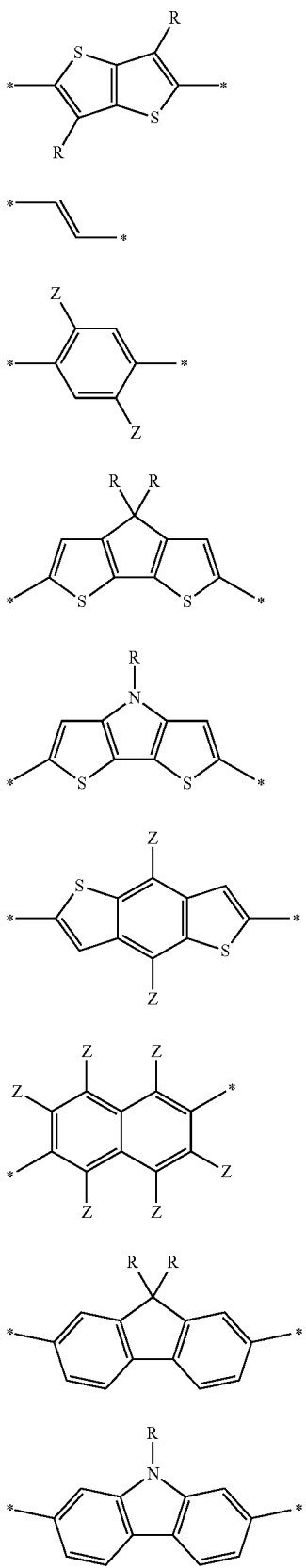
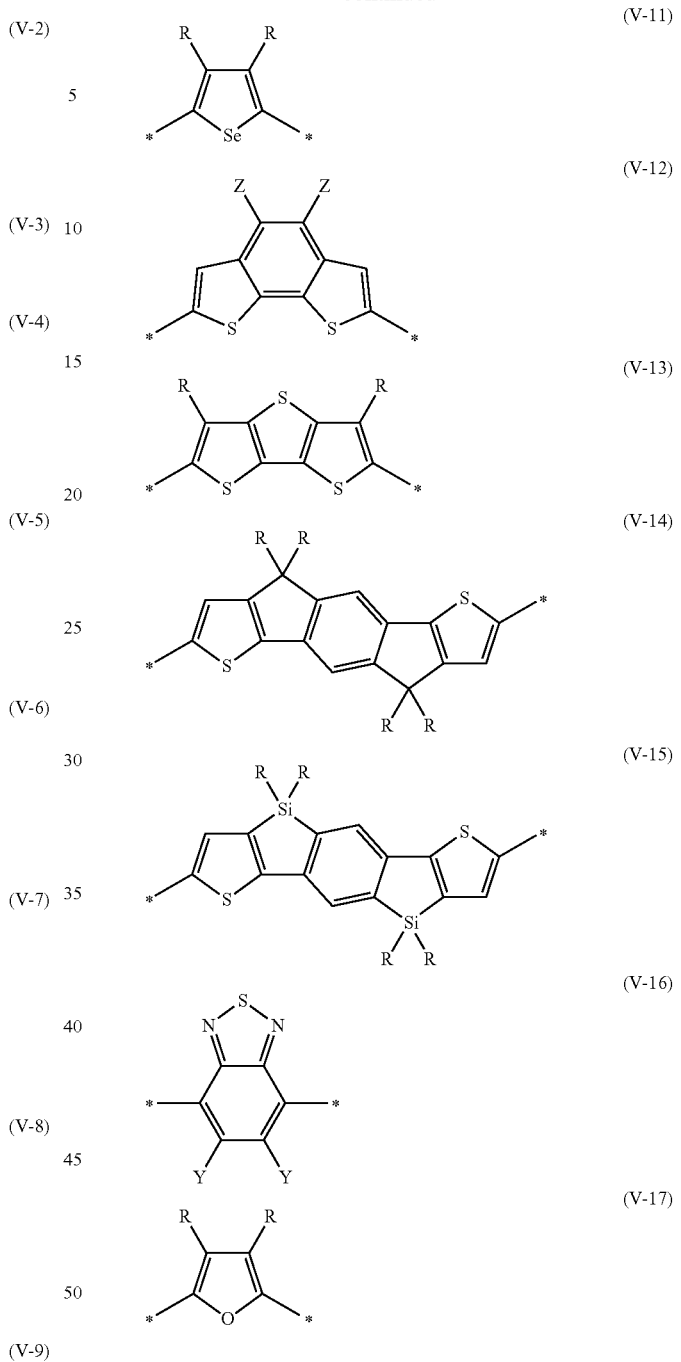

(In Formulae (V-1) to (V-17), * represents a position where the divalent linking group is bonded to any $Ar^{101}$ to $Ar^{104}$ when m or p is 1, and represents a position where the divalent linking group is bonded to any of $Ar^{101}$ to $Ar^{104}$ and the divalent linking groups represented by Formulae (V-1) to (V-17) when m or p is equal to or greater than 2; each R in Formulae (V-1), (V-2), (V-5), (V-6), (V-9) to (V-11), (V-13) to (V-15), and (V-17) independently represents a hydrogen atom or an alkyl group; the groups adjacent to each other represented by R may form a ring by being bonded to each other; each Z in Formulae (V-4), (V-7), (V-8), and (V-12) independently represents a hydrogen atom, an alkyl group, or an alkoxy group; the groups adjacent to each other represented by Z may form a ring by being bonded to each other; each Y in Formula (V-16) independently represents a hydrogen atom, an alkyl group, an alkoxy group, a CN group, or a F atom; and the groups adjacent to each other represented by Y may form a ring by being bonded to each other.)

Each R in Formulae (V-1), (V-2), (V-5), (V-6), (V-9) to (V-11), (V-13) to (V-15), and (V-17) independently represents a hydrogen atom or an alkyl group, and the groups adjacent to each other represented by R may form a ring by being bonded to each other. Examples of the alkyl group which can be adopted as R include the alkyl group which can be adopted as $R^5$ to $R^9$ in Formulae (4-1) to (4-3). Furthermore, the preferred range of the alkyl group which can be adopted as R is the same as the preferred range of the alkyl group which can be adopted as $R^5$ to $R^9$.

Each Z in Formulae (V-4), (V-7), (V-8), and (V-12) independently represents a hydrogen atom, an alkyl group, or an alkoxy group, and the groups adjacent to each other represented by Z may form a ring by being bonded to each other. Examples of the alkyl group or the alkoxy group which can be adopted as Z include the alkyl group and the alkoxy group which can be adopted as $R^5$ to $R^9$ in Formulae (4-1) to (4-3). Furthermore, the preferred range of the alkyl group and the alkoxy group which can be adopted as Z is the same as the preferred range of the alkyl group and the alkoxy group which can be adopted as $R^5$ to $R^9$.

Each Y in Formula (V-16) independently represents a hydrogen atom, an alkyl group, an alkoxy group, a CN group, or a F atom, and the groups adjacent to each other represented by Y may form a ring by being bonded to each other. Y is preferably an alkyl group or an alkoxy group. Examples of the alkyl group or the alkoxy group which can be adopted as Y include the alkyl group and the alkoxy group exemplified above as the substituent which can be adopted as $R^5$ to $R^9$ in Formulae (4-1) to (4-3), and the preferred range thereof is also the same.

Among the divalent linking groups represented by Formulae (V-1) to (V-17), the divalent linking groups represented by Formulae (V-1) to (V-15) are preferable, the divalent linking groups represented by Formulae (V-1) to (V-8) and (V-11) to (V-15) are more preferable, and the divalent linking groups represented by Formulae (V-1) to (V-3) and (V-7) are particularly preferable.

In Formula (101-1), $m^{101}$ represents an integer of 0 to 6. When $m^{101}$ is equal to or greater than 2, two or more groups represented by $V^1$ may be the same as or different from each other. $m^{101}$ is preferably an integer of 0 to 5, and more preferably 0 to 3.

In Formula (101-1), n represents an integer of equal to or greater than 2. n is preferably equal to or greater than 5, more preferably equal to or greater than 10, and particularly preferably equal to or greater than 30. The greater the value of n, the further the interaction between n-conjugated polymer chains can be improved, and thus the carrier mobility can be improved. The upper limit of n is not particularly limited, but it is preferably equal to or less than 2,000 and more preferably equal to or less than 1,000.

<<Compound Composed of n Repeating Units Represented by Formula (101-2)>>

The compound composed of n repeating units represented by Formula (101-2) is represented by the following Formula (101-2).

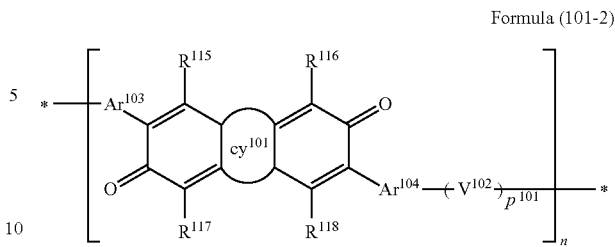

Formula (101-2)

In Formula (101-2), $Cy^{101}$ represents a benzene ring, a naphthalene ring, or an anthracene ring; each of $R^{115}$ to $R^{118}$ independently represents a hydrogen atom or a substituent; each of $Ar^{103}$ and $Ar^{104}$ independently represents a heteroarylene group or an arylene group; $V^{102}$ represents a divalent linking group; $p^{101}$ represents an integer of 0 to 6; when $p^{101}$ is equal to or greater than 2, two or more groups represented by $V^{102}$ may be the same as or different from each other; and n is equal to or greater than 2.

In Formula (101-2), each of $R^{115}$ to $R^{11}$ independently represents a hydrogen atom or a substituent. The substituent which can be adopted as $R^{115}$ and $R^{118}$ is the same as the substituent which can be adopted as $R^{111}$ and $R^{113}$ in Formula (101-1), and the preferred range thereof is also the same. The substituent which can be adopted as $R^{116}$ and $R^{17}$ is the same as the substituent which can be adopted as $R^{112}$ and $R^{114}$ in Formula (101-1), and the preferred range thereof is also the same.

In Formula (101-2), each of $Ar^{103}$ and $Ar^{104}$ independently represents a heteroarylene group or an arylene group. From the viewpoint of accomplishing both the carrier mobility and the solubility by improving the intramolecular hydrogen bonding properties, it is preferable that $Ar^{103}$ and $R^{115}$ do not form a condensed ring by being bonded to each other. Furthermore, from the viewpoint of accomplishing both the carrier mobility and the solubility by improving the intramolecular hydrogen bonding properties, it is preferable that $Ar^{104}$ and $R^{118}$ do not form a condensed ring by being bonded to each other. The heteroarylene group or the arylene group which can be adopted as $Ar^{103}$ and $Ar^{104}$ is the same as the heteroarylene group or the arylene group which can be adopted as $Ar^{101}$ and $Ar^{102}$ in Formula (101-1), and the preferred range thereof is also the same.

In Formula (101-2), $V^{102}$ represents a divalent linking group. From the viewpoint of improving the solubility, it is preferable that $V^{102}$ does not form a condensed ring together with $Ar^{103}$ and $Ar^{104}$. The divalent linking group which can be adopted as $V^{102}$ is the same as the divalent linking group which can be adopted as $V^{11}1$ in Formula (101-1), and the preferred range thereof is also the same. Here, when $m^{101}$ or $p^{101}$ is 1, * in Formulae (V-1) to (V-17) represents a position where the divalent linking group is bonded to any of $Ar^{103}$ and $Ar^{104}$, and when m or p is equal to or greater than 2, * in Formulae (V-1) to (V-17) represents a position where the divalent linking group is bonded to any of $Ar^{103}$, $Ar^{104}$, and the divalent linking groups represented by Formulae (V-1) to (V-17).

In Formula (101-2), $p^{101}$ represents an integer of 0 to 6. When $p^{101}$ is equal to or greater than 2, two or more groups represented by $V^{102}$ may be the same as or different from each other. $p^{101}$ has the same definition as $m^{101}$ in Formula (101-1), and the preferred range thereof is also the same.

In Formula (101-2), n represents an integer of equal to or greater than 2. n has the same definition as n in Formula (101-1), and the preferred range thereof is also the same.

In Formula (101-2), $Cy^{101}$ represents a benzene ring, a naphthalene ring, or an anthracene ring. The benzene ring, the naphthalene ring, or the anthracene ring represented by $Cy^{101}$ may have a substituent, and the substituent is not particularly limited. The substituent is the same as the substituent which can be adopted as $R^{112}$ and $R^{114}$ in Formula (101-1), and the preferred range thereof is also the same. Here, from the viewpoint of improving the long-term stability of the compound, it is preferable that a hydroxyl group (—OH group) is not substituted.

The site where the benzene ring, the naphthalene ring, and the anthracene ring represented by $Cy^{101}$ are condensed with a cyclohexadienone ring is not particularly limited. Specifically, it is preferable that the benzene ring, the naphthalene ring, or the anthracene ring is condensed such that the compound composed of n repeating units represented by Formula (101-2) becomes a compound having a rotationally symmetric skeleton. It is more preferable that the benzene ring, the naphthalene ring, or the anthracene ring is condensed so as to form a compound composed of n repeating units represented by the following Formula (102-1), (102-2), (102-3), (102-4), or (102-5).

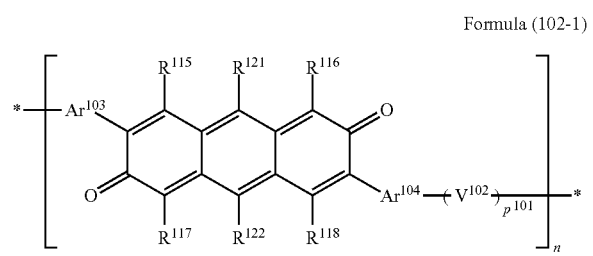

Formula (102-1)

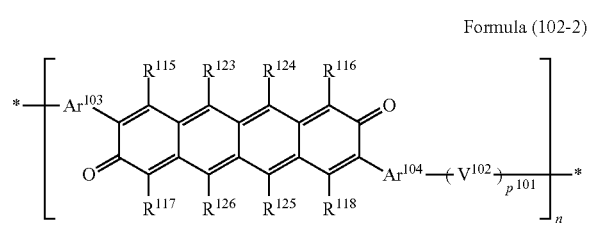

Formula (102-2)

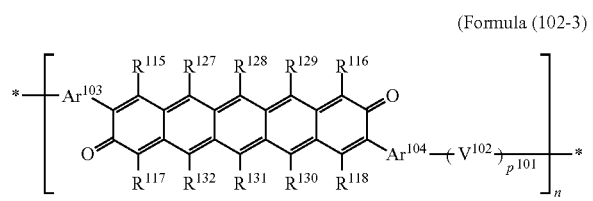

(Formula (102-3))

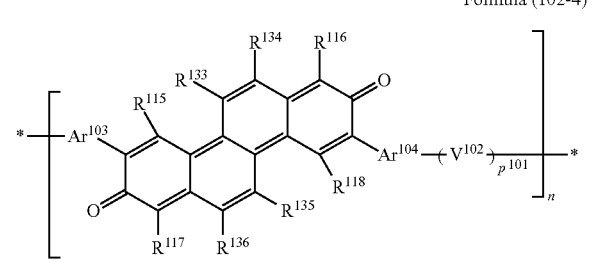

Formula (102-4)

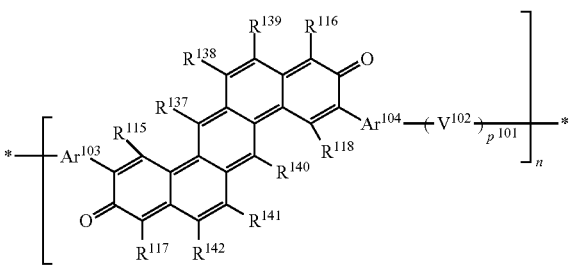

Formula (102-5)

In Formulae (102-1) to (102-5), each of $R^{115}$ to $R^{118}$ and $R^{121}$ to $R^{142}$ independently represents a hydrogen atom or a substituent; each of $Ar^{103}$ and $Ar^{104}$ independently represents a heteroarylene group or an arylene group; $V^{102}$ represents a divalent linking group; $p^{101}$ represents an integer of 0 to 6; when $p^{101}$ is equal to or greater than 2, two or more groups represented by $V^{102}$ may be the same as or different from each other; and n is equal to or greater than 2.

In Formulae (102-1) to (102-5), each of $R^{115}$ to $R^{118}$ and $R^{121}$ to $R^{142}$ independently represents a hydrogen atom or a substituent.

The substituent which can be adopted as $R^{115}$ to $R^{118}$ in Formulae (102-1) to (102-5) is the same as the substituent which can be adopted as $R^{115}$ to $R^{118}$ in Formula (101-2), and the preferred range thereof is also the same.

The substituent which can be adopted as $R^{121}$ to $R^{142}$ in Formulae (102-1) to (102-5) is the same as the substituent which can be adopted as $R^{112}$ and $R^{114}$ in Formula (101-1), and the preferred range thereof is also the same.

It is preferable that at least one of $R^{115}$ to $R^{118}$, $R^{121}$, and $R^{122}$ in Formula (102-1) is a group represented by Formula (W). More preferably, at least two out of $R^{116}$, $R^{117}$, $R^{121}$, and $R^{122}$ are groups represented by Formula (W). Particularly preferably, both of $R^{121}$ and $R^{122}$ are groups represented by Formula (W).

It is preferable that at least one of $R^{115}$ to $R^{118}$ and $R^{123}$ to $R^{126}$ in Formula (102-2) is a group represented by Formula (W). More preferably, at least two out of $R^{116}$, $R^{117}$, $R^{123}$, $R^{124}$, $R^{125}$, and $R^{126}$ are groups represented by Formula (W). Particularly preferably, all of $R^{123}$, $R^{124}$, $R^{125}$, and $R^{126}$ are groups represented by Formula (W).

It is preferable that at least one of $R^{115}$ to $R^{118}$ and $R^{127}$ to $R^{132}$ in Formula (102-3) is a group represented by Formula (W). More preferably, at least two out of $R^{116}$, $R^{117}$, and $R^{127}$ to $R^{132}$ are groups represented by Formula (W). Particularly preferably, both of $R^{128}$ and $R^{131}$ are groups represented by Formula (W).

It is preferable that at least one of $R^{115}$ to $R^{118}$ and $R^{133}$ to $R^{136}$ in Formula (102-4) is a group represented by Formula (W). More preferably, zero to two out of $R^{115}$ to $R^{118}$ and two to four out of $R^{133}$ to $R^{136}$ are groups represented by Formula (W). Particularly preferably, two out of $R^{115}$ to $R^{118}$ and two out of $R^{133}$ to $R^{136}$ are groups represented by Formula (W).

It is preferable that at least one of $R^{115}$ to $R^{118}$ and $R^{137}$ to $R^{142}$ in Formula (102-5) is a group represented by Formula (W). More preferably, zero to two out of $R^{115}$ to $R^{118}$ and two to six out of $R^{137}$ to $R^{142}$ are groups represented by Formula (W). Particularly preferably, two out of $R^{115}$ to $R^{118}$ and two out of $R^{137}$ to $R^{142}$ are groups represented by Formula (W).

In Formulae (102-1) to (102-5), each of $Ar^{103}$ and $Ar^{104}$ independently represents a heterocyclic aromatic ring or an aromatic ring. The heteroarylene group or the arylene group which can be adopted as $Ar^{103}$ and $Ar^{104}$ is the same as the heteroarylene group or the arylene group which can be adopted as $Ar^{103}$ and $Ar^{104}$ in Formula (101-2), and the preferred range thereof is also the same.

In Formulae (102-1) to (102-5), $V^{102}$ represents a divalent linking group. The divalent linking group which can be adopted as $V^{102}$ is the same as the divalent linking group which can be adopted as $V^2$ in Formula (101-2), and the preferred range thereof is also the same.

In Formulae (102-1) to (102-5), $p^{101}$ represents an integer of 0 to 6. When $p^{101}$ is equal to or greater than 2, two or more groups represented by $V^2$ may be the same as or different from each other. $p^{101}$ in Formulae (102-1) to (102-5) has the same definition as $p^{101}$ in Formula (101-2), and the preferred range thereof is also the same.

In Formulae (102-1) to (102-5), n represents an integer of equal to or greater than 2. n has the same definition as n in Formula (101-2), and the preferred range thereof is also the same.

From the viewpoint of maintaining the balance between the extent of widening of a π plane and high solubility, the compound composed of n repeating units represented by Formula (101-2) is preferably a compound composed of n repeating units represented by Formula (102-1) or (102-2), and more preferably a compound composed of n repeating units represented by Formula (102-1).

Specific examples of the compound composed of n repeating units represented by Formula (101-1) or (101-2) include a compound composed of n repeating units represented by the following Formula (100MV). However, the compound composed of n repeating units represented by Formula (101-1) or (101-2) that can be used in the present invention is not limited to the specific example.

Formula (100MV)

$$*-[M^1-Vx]_n-*$$

(In Formula (100MV), $M^1$ represents a divalent linking group $M^1$ in the following table; Vx represents a divalent linking group Vx in the following table, and n represents an integer of equal to or greater than 2.)

TABLE 27

| Compound No. | $M^1$ | Vx |
|---|---|---|
| 1001 | 1-1-1 | V1 |
| 1002 | 1-1-1 | V8 |
| 1003 | 1-1-1 | V21 |
| 1004 | 1-1-2 | V3 |
| 1005 | 1-1-2 | V7 |
| 1006 | 1-1-2 | V23 |
| 1007 | 1-1-3 | V25 |
| 1008 | 1-1-3 | V26 |
| 1009 | 1-1-3 | V28 |
| 1010 | 1-1-4 | V15 |
| 1011 | 1-1-4 | V27 |
| 1012 | 1-1-4 | V33 |
| 1013 | 1-1-5 | V17 |
| 1014 | 1-1-5 | V31 |
| 1015 | 1-1-5 | V33 |
| 1016 | 1-1-6 | V14 |
| 1017 | 1-1-6 | V37 |
| 1018 | 1-1-6 | V40 |
| 1019 | 1-1-7 | V8 |
| 1020 | 1-1-7 | V44 |

TABLE 27-continued

| Compound No. | $M^1$ | Vx |
|---|---|---|
| 1021 | 1-1-8 | V45 |
| 1022 | 1-1-8 | V46 |
| 1023 | 1-1-9 | V5 |
| 1024 | 1-1-9 | V48 |
| 1025 | 1-1-10 | V4 |
| 1026 | 1-1-10 | V18 |
| 1027 | 1-1-10 | V50 |
| 1028 | 1-1-11 | V14 |
| 1029 | 1-1-11 | V17 |
| 1030 | 1-1-12 | V18 |
| 1031 | 1-1-12 | V20 |
| 1032 | 1-1-13 | V16 |
| 1033 | 1-1-13 | V22 |
| 1034 | 1-1-13 | V41 |
| 1035 | 1-1-14 | V49 |
| 1036 | 1-1-14 | V47 |
| 1037 | 1-1-15 | V22 |
| 1038 | 1-1-15 | V23 |
| 1039 | 1-1-16 | V24 |
| 1040 | 1-1-16 | V27 |
| 1041 | 1-1-17 | V32 |
| 1042 | 1-1-17 | V36 |
| 1043 | 1-1-18 | V42 |
| 1044 | 1-1-18 | V47 |
| 1045 | 1-1-19 | V50 |
| 1046 | 1-1-19 | V10 |
| 1047 | 1-1-20 | V1 |
| 1048 | 1-1-20 | V3 |
| 1049 | 1-1-20 | V16 |
| 1050 | 1-1-21 | V4 |
| 1051 | 1-1-21 | V5 |
| 1052 | 1-1-22 | None |
| 1053 | 1-1-22 | V19 |
| 1054 | 1-1-23 | V18 |
| 1055 | 1-1-23 | V4 |
| 1056 | 1-1-24 | V2 |
| 1057 | 1-1-24 | V8 |
| 1058 | 1-1-25 | V3 |
| 1059 | 1-1-25 | None |
| 1060 | 1-1-26 | V1 |
| 1061 | 1-1-26 | V2 |
| 1062 | 1-1-27 | V3 |
| 1063 | 1-1-27 | V4 |
| 1064 | 1-1-27 | V36 |
| 1065 | 1-1-28 | V9 |
| 1066 | 1-1-28 | V13 |
| 1067 | 1-1-28 | V27 |
| 1068 | 1-1-29 | V2 |
| 1069 | 1-1-29 | V3 |
| 1070 | 1-1-30 | None |
| 1071 | 1-1-30 | V11 |
| 1072 | 1-1-30 | V37 |
| 1073 | 1-1-31 | V4 |
| 1074 | 1-1-31 | V47 |
| 1075 | 1-1-32 | V3 |
| 1076 | 1-1-32 | V5 |
| 1077 | 1-1-33 | V1 |
| 1078 | 1-1-33 | V8 |
| 1079 | 1-1-34 | V2 |
| 1080 | 1-1-34 | V7 |
| 1081 | 1-1-35 | V1 |
| 1082 | 1-1-36 | V12 |
| 1083 | 1-1-37 | V3 |
| 1084 | 1-1-38 | V47 |
| 1085 | 1-1-39 | V24 |
| 1086 | 1-1-40 | V38 |
| 1087 | 1-1-41 | V48 |
| 1088 | 1-1-42 | V30 |
| 1089 | 1-1-43 | V49 |
| 1090 | 1-1-44 | V48 |
| 1091 | 1-1-45 | V45 |
| 1092 | 1-1-46 | V5 |
| 1093 | 1-1-47 | V4 |
| 1094 | 1-1-48 | V23 |
| 1095 | 1-1-48 | V48 |
| 1096 | 1-1-49 | V7 |
| 1097 | 1-1-49 | V36 |
| 1098 | 1-1-50 | V5 |

TABLE 27-continued

| Compound No. | M¹ | Vx |
|---|---|---|
| 1099 | 2-1-1 | V8 |
| 1100 | 2-1-1 | V20 |
| 1101 | 2-1-1 | V23 |
| 1102 | 2-1-2 | V7 |
| 1103 | 2-1-2 | V22 |
| 1104 | 2-1-2 | V44 |
| 1105 | 2-1-3 | V5 |
| 1106 | 2-1-3 | V28 |
| 1107 | 2-1-3 | V33 |
| 1108 | 2-1-4 | V6 |
| 1109 | 2-1-4 | V19 |
| 1110 | 2-1-5 | V15 |
| 1111 | 2-1-5 | V22 |
| 1112 | 2-1-5 | V33 |
| 1113 | 2-1-6 | V14 |
| 1114 | 2-1-6 | V4 |
| 1115 | 2-1-6 | V40 |
| 1116 | 2-1-7 | V32 |
| 1117 | 2-1-7 | V33 |
| 1118 | 2-1-7 | V36 |
| 1119 | 2-1-8 | V3 |
| 1120 | 2-1-8 | V20 |

TABLE 28

| Compound No. | M¹ | Vx |
|---|---|---|
| 1121 | 2-1-9 | V21 |
| 1122 | 2-1-9 | V23 |
| 1123 | 2-1-9 | V31 |
| 1124 | 2-1-10 | V25 |
| 1125 | 2-1-10 | V30 |
| 1126 | 2-1-10 | V50 |
| 1127 | 2-1-11 | V26 |
| 1128 | 2-1-11 | V27 |
| 1129 | 2-1-12 | V1 |
| 1130 | 2-1-12 | V21 |
| 1131 | 2-1-13 | V16 |
| 1132 | 2-1-13 | V22 |
| 1133 | 2-1-13 | V41 |
| 1134 | 2-1-14 | V26 |
| 1135 | 2-1-14 | V38 |
| 1136 | 2-1-15 | V5 |
| 1137 | 2-1-15 | V21 |
| 1138 | 2-1-16 | V23 |
| 1139 | 2-1-16 | V40 |
| 1140 | 2-1-17 | V43 |
| 1141 | 2-1-17 | V46 |
| 1142 | 2-1-18 | V32 |
| 1143 | 2-1-18 | V34 |
| 1144 | 2-1-19 | V5 |
| 1145 | 2-1-19 | V11 |
| 1146 | 2-1-20 | V4 |
| 1147 | 2-1-20 | V11 |
| 1148 | 2-1-21 | V3 |
| 1149 | 2-1-21 | V13 |
| 1150 | 2-1-22 | V1 |
| 1151 | 2-1-22 | V50 |
| 1152 | 2-1-23 | V19 |
| 1153 | 2-1-23 | V24 |
| 1154 | 2-1-24 | None |
| 1155 | 2-1-24 | V4 |
| 1156 | 2-1-25 | V2 |
| 1157 | 2-1-25 | V8 |
| 1158 | 2-1-26 | V1 |
| 1159 | 2-1-26 | V10 |
| 1160 | 2-1-27 | V6 |
| 1161 | 2-1-27 | V48 |
| 1162 | 2-1-28 | V3 |
| 1163 | 2-1-28 | V13 |
| 1164 | 2-1-28 | None |
| 1165 | 2-1-29 | V4 |
| 1166 | 2-1-29 | V38 |
| 1167 | 2-1-30 | V11 |
| 1168 | 2-1-30 | V24 |

TABLE 28-continued

| Compound No. | M¹ | Vx |
|---|---|---|
| 1169 | 2-1-30 | V45 |
| 1170 | 2-1-31 | V1 |
| 1171 | 2-1-32 | V5 |
| 1172 | 2-1-33 | V8 |
| 1173 | 2-1-34 | None |
| 1174 | 2-1-35 | V12 |
| 1175 | 2-1-36 | V4 |
| 1176 | 2-1-37 | V3 |
| 1177 | 2-1-38 | V39 |
| 1178 | 2-1-39 | V49 |
| 1179 | 2-1-40 | V19 |
| 1180 | 2-1-41 | V3 |
| 1181 | 2-1-42 | V5 |
| 1182 | 2-143 | V2 |
| 1183 | 2-1-44 | V10 |
| 1184 | 2-1-45 | V3 |
| 1185 | 2-1-46 | V4 |
| 1186 | 2-1-47 | V5 |
| 1187 | 2-1-48 | V22 |
| 1188 | 2-1-48 | V30 |
| 1189 | 2-1-49 | V4 |
| 1190 | 2-1-49 | V42 |
| 1191 | 2-1-50 | V23 |
| 1192 | 2-2-1 | V22 |
| 1193 | 2-2-2 | V21 |
| 1194 | 2-2-3 | V5 |
| 1195 | 2-2-4 | V6 |
| 1196 | 2-2-5 | V3 |
| 1197 | 2-2-6 | V15 |
| 1198 | 2-2-7 | V43 |
| 1199 | 2-2-8 | V41 |
| 1200 | 2-2-9 | V33 |
| 1201 | 2-2-10 | V3 |
| 1202 | 2-2-11 | V13 |
| 1203 | 2-2-12 | V4 |
| 1204 | 2-2-13 | V2 |
| 1205 | 2-2-14 | V4 |
| 1206 | 2-2-15 | V38 |
| 1207 | 2-2-16 | V45 |
| 1208 | 2-2-17 | None |
| 1209 | 2-2-18 | V9 |
| 1210 | 2-2-19 | V21 |
| 1211 | 2-2-20 | V31 |
| 1212 | 2-3-1 | V20 |
| 1213 | 2-3-2 | V15 |
| 1214 | 2-3-3 | V35 |
| 1215 | 2-3-4 | V42 |
| 1216 | 2-3-5 | V29 |
| 1217 | 2-3-6 | V5 |
| 1218 | 2-3-7 | V22 |
| 1219 | 2-3-8 | V34 |
| 1220 | 2-3-9 | V40 |
| 1221 | 2-3-10 | V3 |
| 1222 | 2-3-11 | V13 |
| 1223 | 2-3-12 | V4 |
| 1224 | 2-3-13 | V12 |
| 1225 | 2-3-14 | V4 |
| 1226 | 2-3-15 | V3 |
| 1227 | 2-3-16 | V50 |
| 1228 | 2-3-17 | None |
| 1229 | 2-3-18 | V9 |
| 1230 | 2-3-19 | V20 |
| 1231 | 2-3-20 | V26 |
| 1232 | 2-4-1 | V22 |
| 1233 | 2-4-2 | V15 |
| 1234 | 2-4-3 | V34 |
| 1235 | 2-4-4 | V42 |
| 1236 | 2-4-5 | V29 |
| 1237 | 2-4-6 | V5 |
| 1238 | 2-4-7 | V20 |
| 1239 | 2-4-8 | V35 |
| 1240 | 2-4-9 | V41 |

TABLE 29

| Compound No. | M¹ | Vx |
|---|---|---|
| 1241 | 2-4-10 | V3 |
| 1242 | 2-4-11 | V13 |
| 1243 | 2-4-12 | V4 |
| 1244 | 2-4-13 | V12 |
| 1245 | 2-4-14 | None |
| 1246 | 2-4-15 | V3 |
| 1247 | 2-4-16 | V49 |
| 1248 | 2-4-17 | V2 |
| 1249 | 2-4-18 | V9 |
| 1250 | 2-4-19 | V21 |
| 1251 | 2-4-20 | V25 |
| 1252 | 2-5-1 | V20 |
| 1253 | 2-5-2 | V15 |
| 1254 | 2-5-3 | V35 |
| 1255 | 2-5-4 | V42 |
| 1256 | 2-5-5 | V29 |
| 1257 | 2-5-6 | V5 |
| 1258 | 2-5-7 | V22 |
| 1259 | 2-5-8 | V34 |
| 1260 | 2-5-9 | V40 |
| 1261 | 2-5-10 | V3 |
| 1262 | 2-5-11 | V13 |
| 1263 | 2-5-12 | V4 |
| 1264 | 2-5-13 | V12 |
| 1265 | 2-5-14 | None |
| 1266 | 2-5-15 | V3 |
| 1267 | 2-5-16 | V50 |

TABLE 29-continued

| Compound No. | M¹ | Vx |
|---|---|---|
| 1268 | 2-5-17 | V2 |
| 1269 | 2-5-18 | V9 |
| 1270 | 2-5-19 | V20 |
| 1271 | 2-5-20 | V26 |

In the above tables, $M^1$ represents a linking group represented by the following Formula (101-1M), (102-1M), (102-2M), (102-3M), (102-4M), or (102-5M), and Vx represents the linking groups V1 to V50 described above.

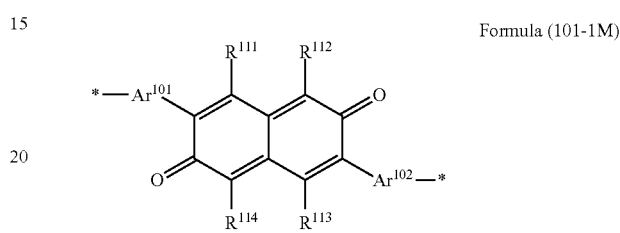

Formula (101-1M)

In Formula (101-1M), each of $Ar^{101}$, $Ar^{102}$, and $R^{111}$ to $R^{114}$ represents the following groups.

TABLE 30

| | Ar¹⁰¹ | Ar¹⁰² | R¹¹¹ |
|---|---|---|---|
| 1-1-1 | thienyl | thienyl | H |
| 1-1-2 | thienyl | thienyl | H |
| 1-1-3 | thienyl | thienyl | H |
| 1-1-4 | thienyl | thienyl | *–CH₂CH(C₈H₁₇)C₁₀H₂₁ |
| 1-1-5 | thienyl | thienyl | H |
| 1-1-6 | thienyl | thienyl | *–OC₆H₁₃ |
| 1-1-7 | thienyl | thienyl | *–C₈H₁₇ |

TABLE 30-continued

| | | | |
|---|---|---|---|
| 1-1-8 | 2,5-thienyl-3-C6H13 | 2,5-thienyl-3-C6H13 | *—N(C6H13)2 |
| 1-1-9 | 2,5-thienyl-3-C6H13 | 2,5-thienyl-3-C10H21 | H |
| 1-1-10 | 2,5-thienyl | 2,5-thienyl | H |

| | R[112] | R[113] | R[114] |
|---|---|---|---|
| 1-1-1 | H | H | H |
| 1-1-2 | *—N(C6H13)2 | H | *—N(C6H13)2 |
| 1-1-3 | *—CH2—CH(C12H25)(C10H21) | H | *—CH2—CH(C12H25)(C10H21) |
| 1-1-4 | *—CH2—CH(C8H17)(C10H21) | *—CH2—CH(C8H17)(C10H21) | *—CH2—CH(C8H17)(C10H21) |
| 1-1-5 | *—O—CH2—CH(C8H17)(C10H21) | *—O—CH2—CH(C8H17)(C10H21) | H |
| 1-1-6 | *—OC6H13 | *—OC6H13 | *—OC6H13 |
| 1-1-7 | H | *—C8H17 | H |
| 1-1-8 | *—N(C6H13)2 | *—N(C6H13)2 | *—N(C6H13)2 |
| 1-1-9 | H | H | H |
| 1-1-10 | *—O—CH2CH2—CH(CH3)—CH2CH2CH2—CH(CH3)2 | H | *—O—CH2CH2—CH(CH3)—CH2CH2CH2—CH(CH3)2 |

TABLE 31

| | Ar¹⁰¹ | Ar¹⁰² | R¹¹¹ |
|---|---|---|---|
| 1-1-11 | 2,5-thienyl | 2,5-thienyl | H |
| 1-1-12 | 2,5-thienyl | 2,5-thienyl | *—OEt |
| 1-1-13 | 2,5-thienyl | 2,5-thienyl | H |
| 1-1-14 | 3-C₆H₁₃-2,5-thienyl | 3-C₆H₁₃-2,5-thienyl | H |
| 1-1-15 | 2,5-furyl | 2,5-furyl | H |
| 1-1-16 | 2,5-furyl | 2,5-furyl | H |
| 1-1-17 | 2,5-furyl | 2,5-furyl | H |
| 1-1-18 | 2,5-furyl | 2,5-furyl | *—CH₂—CH(Et)—C₄H₉ |
| 1-1-19 | 3-C₁₀H₂₅-2,5-furyl | 3-C₁₀H₂₅-2,5-furyl | H |
| 1-1-20 | thieno[3,2-b]thiophene-2,5-diyl | thieno[3,2-b]thiophene-2,5-diyl | H |

| | R¹¹² | R¹¹³ | R¹¹⁴ |
|---|---|---|---|
| 1-1-11 | *—C≡C—Si(Et)₃ | H | *—C≡C—Si(Et)₃ |

TABLE 31-continued

| | | | |
|---|---|---|---|
| 1-1-12 | *–CH₂–CH(C₁₀H₂₁)–C₁₂H₂₅ | *—OEt | *–CH₂–CH(C₁₀H₂₁)–C₁₂H₂₅ |
| 1-1-13 | *—OEt | H | *—OEt |
| 1-1-14 | *—SC₆H₁₃ | H | *—SC₆H₁₃ |
| 1-1-15 | H | H | H |
| 1-1-16 | *–CH₂–CH(C₁₀H₂₁)–C₁₂H₂₅ | H | *–CH₂–CH(C₁₀H₂₁)–C₁₂H₂₅ |
| 1-1-17 | *–O–CH₂CH₂–CH(CH₃)–CH₂CH₂CH₂–CH(CH₃)–CH₃ | H | *–O–CH₂CH₂–CH(CH₃)–CH₂CH₂CH₂–CH(CH₃)–CH₃ |
| 1-1-18 | *–CH₂–CH(Et)–C₄H₉ | *–CH₂–CH(Et)–C₄H₉ | *–CH₂–CH(Et)–C₄H₉ |
| 1-1-19 | H | H | H |
| 1-1-20 | *–CH₂–CH(C₈H₁₇)–C₁₀H₂₁ | H | *–CH₂–CH(C₈H₁₇)–C₁₀H₂₁ |

TABLE 32

| | Ar¹⁰¹ | Ar¹⁰² | R¹¹¹ |
|---|---|---|---|
| 1-1-21 | thieno[3,2-b]thiophene-2,5-diyl | thieno[3,2-b]thiophene-2,5-diyl | H |
| 1-1-22 | 3-hexyl-thieno[3,2-b]thiophene-2,5-diyl | 3-hexyl-thieno[3,2-b]thiophene-2,5-diyl | H |
| 1-1-23 | benzo[1,2-b:4,5-b']dithiophene-2,6-diyl | benzo[1,2-b:4,5-b']dithiophene-2,6-diyl | H |

TABLE 32-continued

| | R112 | R113 | R114 |
|---|---|---|---|
| 1-1-24 | benzodithiophene with OCH2CH2CH(C4H9)(C6H13) groups at 4,8-positions | benzodithiophene with OCH2CH2CH(C4H9)(C6H13) groups at 4,8-positions | H |
| 1-1-25 | benzodithiophene with OC12H25 groups at 4,8-positions | benzodithiophene with OC12H25 groups at 4,8-positions | *—OEt |
| 1-1-26 | benzodithiophene with OC12H25 groups at 4,8-positions | benzodithiophene with OC12H25 groups at 4,8-positions | H |
| 1-1-27 | benzodithiophene with OCH2CH(C6H13)(C8H17) groups at 4,8-positions | benzodithiophene with OCH2CH(C6H13)(C8H17) groups at 4,8-positions | H |
| 1-1-21 | *-CH2CH2CH(CH3)CH2CH2CH2CH(CH3)CH3 | H | *-CH2CH2CH(CH3)CH2CH2CH2CH(CH3)CH3 |
| 1-1-22 | H | H | H |
| 1-1-23 | *-OCH2CH2CH(CH3)CH2CH2CH2CH(CH3)CH3 | H | *-OCH2CH2CH(CH3)CH2CH2CH2CH(CH3)CH3 |

TABLE 32-continued

| | | | |
|---|---|---|---|
| 1-1-24 | *—$C_6H_{13}$ | H | *—$C_6H_{13}$ |
| 1-1-25 | *—OEt | *—OEt | *—OEt |
| 1-1-26 | H | H | H |
| 1-1-27 | H | H | H |

TABLE 33

$Ar^{101}$ 1-1-28

1-1-29

1-1-30

1-1-31

TABLE 33-continued
| | | Ar¹⁰² | R¹¹¹ |
|---|---|---|---|
| 1-1-32 | 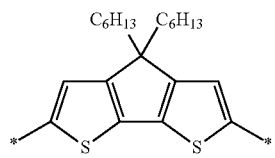 | | |
| 1-1-33 | 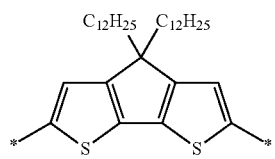 | | |
| 1-1-34 | 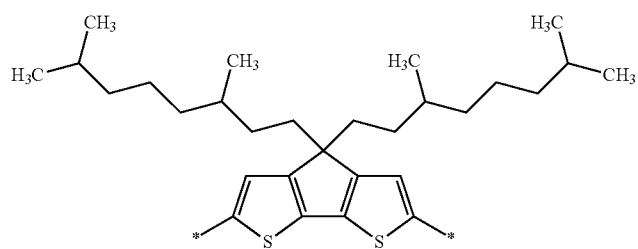 | | |
| 1-1-28 | | 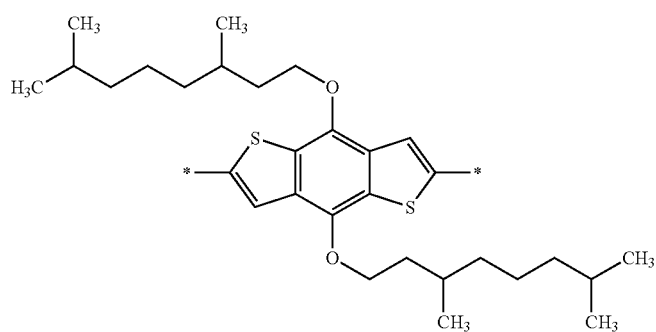 | H |
| 1-1-29 | | 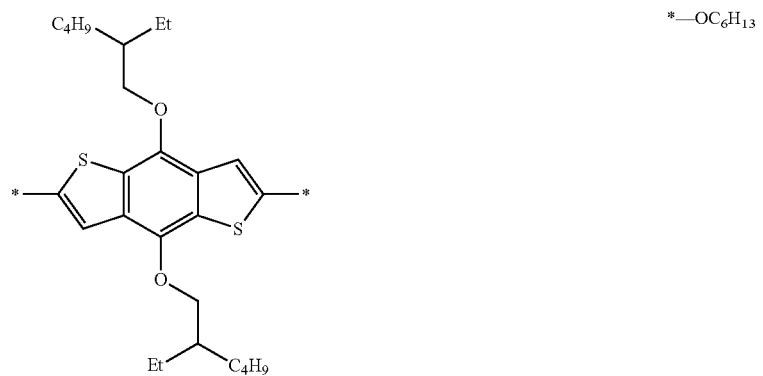 | *—OC₆H₁₃ |

TABLE 33-continued

| | | R[112] | R[113] | R[114] |
|---|---|---|---|---|
| 1-1-30 | (structure: benzodithiophene with two O-CH2-CH(C6H13)(C8H17) groups at 4,8-positions) | | | H |
| 1-1-31 | (structure: 4,4-dihexyl-cyclopenta[2,1-b:3,4-b']dithiophene) | | | H |
| 1-1-32 | (structure: 4,4-dihexyl-cyclopenta[1,2-b:3,4-b']dithiophene isomer) | | | H |
| 1-1-33 | (structure: 4,4-didodecyl-cyclopentadithiophene) | | | H |
| 1-1-34 | (structure: cyclopentadithiophene with two 3,7-dimethyloctyl groups at 4-position) | | | H |
| 1-1-28 | | *—C$_8$H$_{17}$ | H | *—C$_8$H$_{17}$ |
| 1-1-29 | | *—OC$_6$H$_{13}$ | *—OC$_6$H$_{13}$ | *—OC$_6$H$_{13}$ |
| 1-1-30 | | *—CH$_2$—CH(C$_{12}$H$_{25}$)(C$_{10}$H$_{21}$) | H | *—CH$_2$—CH(C$_{12}$H$_{25}$)(C$_{10}$H$_{21}$) |
| 1-1-31 | | H | H | H |
| 1-1-32 | | *—CH$_2$—CH(C$_{12}$H$_{25}$)(C$_{10}$H$_{21}$) | H | *—CH$_2$—CH(C$_{12}$H$_{25}$)(C$_{10}$H$_{21}$) |

TABLE 33-continued

| | | | | |
|---|---|---|---|---|
| 1-1-33 | *—O—CH₂—CH(C₈H₁₇)—C₁₀H₂₁ | H | | *—O—CH₂—CH(C₈H₁₇)—C₁₀H₂₁ |
| 1-1-34 | H | H | | H |

10

TABLE 34

Ar¹⁰¹

1-1-35: 4,4-didodecyl-4H-cyclopenta[2,1-b:3,4-b']dithiophene-2,6-diyl (with C₁₂H₂₅ groups)

1-1-36: 4,4-bis(3,7-dimethyloctyl)-4H-cyclopenta[2,1-b:3,4-b']dithiophene-2,6-diyl 1-1-37: 4-dodecyl-4H-dithieno[3,2-b:2',3'-d]pyrrole-2,6-diyl (N-C₁₂H₂₅)

1-1-38: 4-(3,7-dimethyloctyl)-4H-dithieno[3,2-b:2',3'-d]pyrrole-2,6-diyl 1-1-39: 4-(2-ethylhexyl)-4H-dithieno[3,2-b:2',3'-d]pyrrole-2,6-diyl (N-CH₂-CH(Et)-C₄H₉)

TABLE 34-continued
| | | |
|---|---|---|
| 1-1-40 | 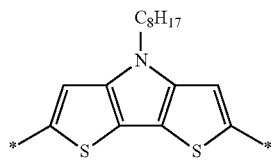 | |
| 1-1-41 | 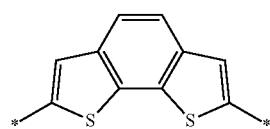 | |
| 1-1-42 | 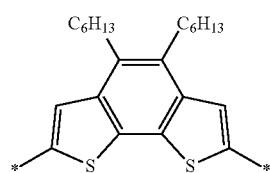 | |
| | Ar[102] | R[111] |
|---|---|---|
| 1-1-35 | 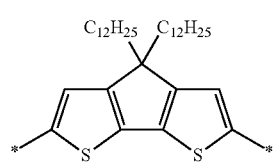 | *—OC$_6$H$_{13}$ |
| 1-1-36 | 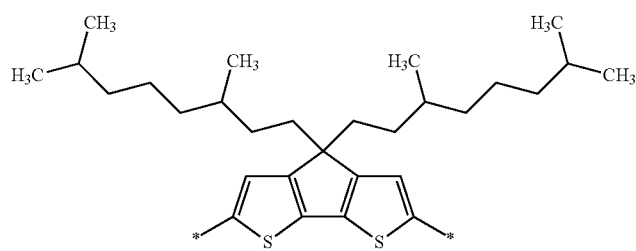 | H |
| 1-1-37 | 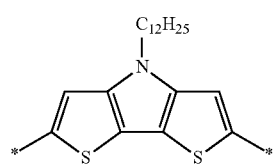 | H |
| 1-1-38 | 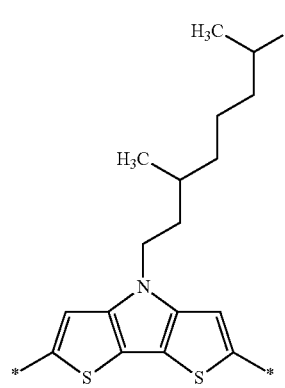 | H |

TABLE 34-continued

| | | | |
|---|---|---|---|
| 1-1-39 | [structure: N-substituted dithienopyrrole with CH2-CH(Et)(C4H9) on N] | | *—O—CH2—CH(C10H21)(C10H21) |
| 1-1-40 | [structure: N-C8H17 dithienopyrrole] | | H |
| 1-1-41 | [structure: dithienobenzene fused ring] | | H |
| 1-1-42 | [structure: dithienobenzene with two C6H13 groups] | | H |

| | R$^{112}$ | R$^{113}$ | R$^{114}$ |
|---|---|---|---|
| 1-1-35 | *—OC$_6$H$_{13}$ | *—OC$_6$H$_{13}$ | *—OC$_6$H$_{13}$ |
| 1-1-36 | H | H | H |
| 1-1-37 | *—CH2CH2CH(CH3)CH2CH2CH2CH(CH3)CH3 | H | *—CH2CH2CH(CH3)CH2CH2CH2CH(CH3)CH3 |
| 1-1-38 | H | H | H |
| 1-1-39 | H | H | *—O—CH2—CH(C10H21)(C12H25) |
| 1-1-40 | *—CH2—CH(Et)(C4H9) | H | *—CH2—CH(Et)(C4H9) |
| 1-1-41 | *—C$_6$H$_{13}$ | *—C$_6$H$_{13}$ | H |
| 1-1-42 | *—C$_6$H$_{13}$ | H | *—C$_6$H$_{13}$ |

TABLE 35

| | Ar$^{101}$ |
|---|---|
| 1-1-43 | [structure: 2,5-selenophene diyl] |

TABLE 35-continued
1-1-44 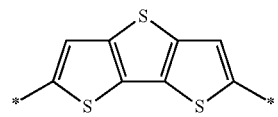
1-1-45 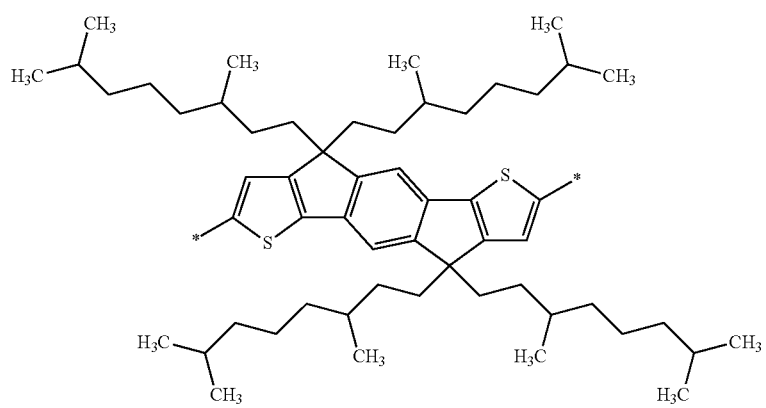
1-1-46 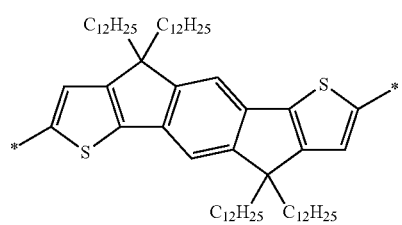
1-1-47 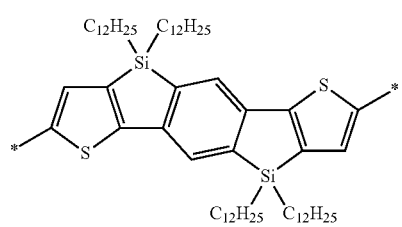
1-1-48 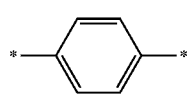
1-1-49 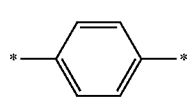
1-1-50 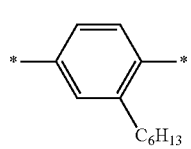
Ar¹⁰²
1-1-43 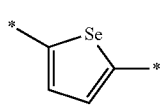

TABLE 35-continued
1-1-44 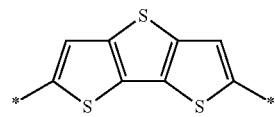
1-1-45 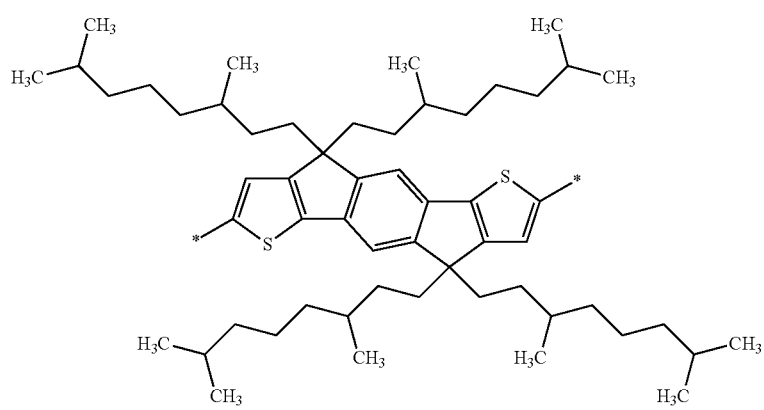
1-1-46 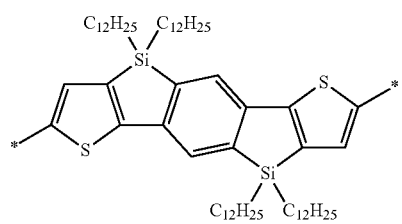
1-1-47 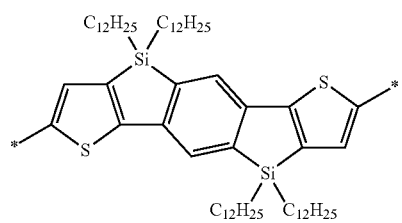
1-1-48 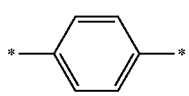
1-1-49 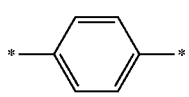
1-1-50 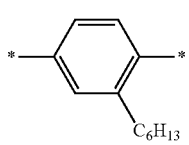
| | $R^{111}$ | $R^{112}$ | $R^{113}$ | $R^{114}$ |
|---|---|---|---|---|
| 1-1-43 | H | *—OC$_6$H$_{13}$ | H | *—OC$_6$H$_{13}$ |
| 1-1-44 | H | 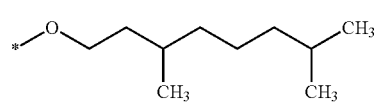 | H | 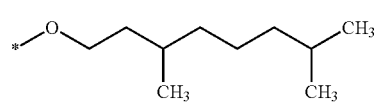 |
| 1-1-45 | H | H | H | H |
| 1-1-46 | H | H | H | H |

TABLE 35-continued
| 1-1-47 | H | *—N(C6H13)2 | H | *—N(C6H13)2 |
| 1-1-48 | H | *—N(C6H13)2 | H | *—O-CH2CH2-CH(CH3)-CH2CH2CH2-CH(CH3)2 |
| 1-1-49 | H | *—N(C6H13)2 | H | *—N(C6H13)2 |
| 1-1-50 | *—OEt | *—OEt | *—OEt | *—OEt |
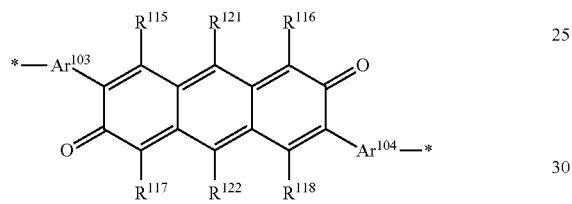
Formula (102-1M)
In Formula (102-1M), each of $Ar^{103}$, $Ar^{104}$, $R^{115}$ to $R^{118}$, $R^{121}$, and $R^{122}$ represents the following groups.

TABLE 36

| | Ar$^{103}$ | Ar$^{104}$ | R$^{115}$ | R$^{116}$ |
|---|---|---|---|---|
| 2-1-1 | thiophene-2,5-diyl | thiophene-2,5-diyl | H | H |
| 2-1-2 | thiophene-2,5-diyl | thiophene-2,5-diyl | H | H |
| 2-1-3 | thiophene-2,5-diyl | thiophene-2,5-diyl | H | *—CH$_2$—CH(C$_{10}$H$_{21}$)(C$_{12}$H$_{25}$) |
| 2-1-4 | thiophene-2,5-diyl | thiophene-2,5-diyl | H | *—CH$_3$ |
| 2-1-5 | thiophene-2,5-diyl | thiophene-2,5-diyl | H | H |
| 2-1-6 | thiophene-2,5-diyl | thiophene-2,5-diyl | H | *—O—CH$_2$—CH(C$_{10}$H$_{21}$)(C$_8$H$_{17}$) |

TABLE 36-continued

| | | | | | |
|---|---|---|---|---|---|
| 2-1-7 | [2,5-thienyl] | [2,5-thienyl] | H | H | *—OEt | *—OEt |
| 2-1-8 | [2,5-thienyl] | [2,5-thienyl] | H | H | *—O—CH₂—CH(C₁₀H₂₁)—C₈H₁₇ | H |
| 2-1-9 | [2,5-thienyl] | [2,5-thienyl] | H | H | H | H |
| 2-1-10 | [2,5-thienyl] | [2,5-thienyl] | H | H | *—O—CH₂—CH₂—CH(CH₃)—CH₂—CH₂—CH₂—CH(CH₃)—CH₃ | H |

| | R¹¹⁷ | R¹¹⁸ | R¹²¹ | R¹²² |
|---|---|---|---|---|
| 2-1-1 | H | H | *—CH₂—CH(C₁₀H₂₁)(C₁₂H₂₅) | *—CH₂—CH(C₁₀H₂₁)(C₁₂H₂₅) |
| 2-1-2 | H | H | *—N(C₆H₁₃)(C₆H₁₃) | *—N(C₆H₁₃)(C₆H₁₃) |
| 2-1-3 | H | *—CH₂—CH(C₁₀H₂₁)(C₁₂H₂₅) | H | H |
| 2-1-4 | *—CH₃ | H | *—CH₂—CH(C₁₀H₂₁)(C₁₂H₂₅) | *—CH₂—CH(C₁₀H₂₁)(C₁₂H₂₅) |

TABLE 36-continued

TABLE 37

| | Ar¹⁰³ | Ar¹⁰⁴ | R¹¹⁵ | R¹¹⁶ |
|---|---|---|---|---|
| 2-1-11 | thiophene | thiophene | H | H |
| 2-1-12 | thiophene-C₁₀H₂₁ | thiophene-C₁₀H₂₁ | H | H |
| 2-1-13 | thiophene-C₆H₁₃ | thiophene-C₆H₁₃ | *—C₆H₁₃ | *—OC₆H₁₃ |
| 2-1-14 | thiophene | thiophene | H | *—SC₆H₁₃ |
| 2-1-15 | furan | furan | H | H |
| 2-1-16 | furan | furan | H | *—CH₂CH(C₁₂H₂₅)C₁₀H₂₁ |
| 2-1-17 | furan | furan | *—OC₆H₁₃ | *—OC₆H₁₃ |
| 2-1-18 | furan | furan | H | *—CH₂CH(Et)C₄H₉ |
| 2-1-19 | furan-C₁₀H₂₅ | furan-C₁₀H₂₅ | H | *—O—CH₂CH(C₈H₁₇)C₁₀H₂₁ |
| 2-1-20 | thienothiophene | thienothiophene | H | *—CH₂CH(C₈H₁₇)C₁₀H₂₁ |

| | R¹¹⁷ | R¹¹⁸ | R¹²¹ | R¹²² |
|---|---|---|---|---|
| 2-1-11 | H | H | *—≡—Si(Et)₃ | *—≡—Si(Et)₃ |

TABLE 37-continued

| | | | | |
|---|---|---|---|---|
| 2-1-12 | H | H | *—CH₂—CH(C₁₀H₂₁)(C₁₂H₂₅) | *—CH₂—CH(C₁₀H₂₁)(C₁₂H₂₅) |
| 2-1-13 | *—OC₆H₁₃  H | *—OC₆H₁₃  *—SC₆H₁₃ | H  H | H  H |
| 2-1-14 | | | | |
| 2-1-15 | H | H | *—O—CH₂—CH(C₁₀H₂₁)(C₈H₁₇) | *—O—CH₂—CH(C₁₀H₂₁)(C₈H₁₇) |
| 2-1-16 | H | *—CH₂—CH(C₁₀H₂₁)(C₁₂H₂₅) | *—N(C₆H₁₃)(C₆H₁₃) | *—N(C₆H₁₃)(C₆H₁₃) |
| 2-1-17 | *—OC₆H₁₃ | *—OC₆H₁₃ | H | H |
| 2-1-18 | *—CH₂—CH(C₄H₉)(Et) | H | *—C₁₂H₂₅ | *—C₁₂H₂₅ |
| 2-1-19 | *—O—CH₂—CH(C₁₀H₂₁)(C₈H₁₇) | H | H | H |
| 2-1-20 | *—CH₂—CH(C₁₀H₂₁)(C₈H₁₇) | H | H | H |

TABLE 38

| | Ar¹⁰³ | Ar¹⁰⁴ | R¹¹⁵ | R¹¹⁶ |
|---|---|---|---|---|
| 2-1-21 | thienothiophene | thienothiophene | H | H |
| 2-1-22 | thienothiophene-C₆H₁₃ | thienothiophene-C₆H₁₃ | H | *—CH₂—CH(C₁₀H₂₁)(C₁₂H₂₅) |
| 2-1-23 | benzodithiophene | benzodithiophene | H | H |

TABLE 38-continued

| | | | | |
|---|---|---|---|---|
| 2-1-24 | [structure: benzodithiophene with 2-butyl-3-hexyl-propoxy groups at 4,8-positions] | [structure: benzodithiophene with 2-butyl-3-hexyl-propoxy groups at 4,8-positions] | *—C₆H₁₃ | *—C₆H₁₃ |
| 2-1-25 | [structure: benzodithiophene with OC₁₂H₂₅ groups at 4,8-positions] | [structure: benzodithiophene with OC₁₂H₂₅ groups at 4,8-positions] | H | H |
| 2-1-26 | [structure: benzodithiophene with OC₁₂H₂₅ groups at 4,8-positions] | [structure: benzodithiophene with OC₁₂H₂₅ groups at 4,8-positions] | *—CH₂—CH(Et)—C₄H₉ | H |
| 2-1-27 | [structure: benzodithiophene with 2-hexyl-3-octyl-propoxy groups at 4,8-positions] | [structure: benzodithiophene with 2-hexyl-3-octyl-propoxy groups at 4,8-positions] | H | H |

| | $R^{117}$ | $R^{118}$ | $R^{121}$ | $R^{122}$ |
|---|---|---|---|---|
| 2-1-21 | H | H | *—CH₂CH₂CH(CH₃)CH₂CH₂CH₂CH(CH₃)CH₃ | *—CH₂CH₂CH(CH₃)CH₂CH₂CH₂CH(CH₃)CH₃ |
| 2-1-22 | H | *—CH₂—CH(C₁₂H₂₅)—C₁₀H₂₁ | *—O—CH₂—CH(C₈H₁₇)—C₁₀H₂₁ | *—O—CH₂—CH(C₈H₁₇)—C₁₀H₂₁ |

TABLE 38-continued
| | | | | |
|---|---|---|---|---|
| 2-1-23 | H | H | 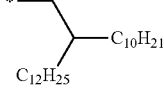 | 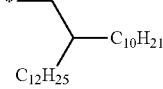 |
| 2-1-24 | *—C$_6$H$_{13}$ | *—C$_6$H$_{13}$ | H | H |
| 2-1-25 | H | H | 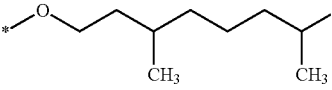 | 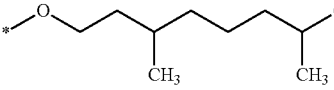 |
| 2-1-26 | H | 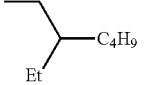 | H | H |
| 2-1-27 | H | H | H | H |
TABLE 39
Ar$^{103}$
2-1-28
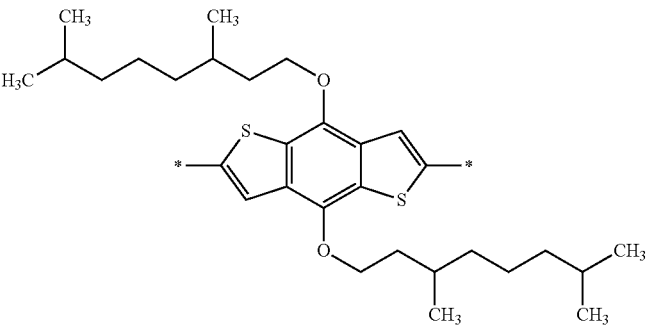
2-1-29
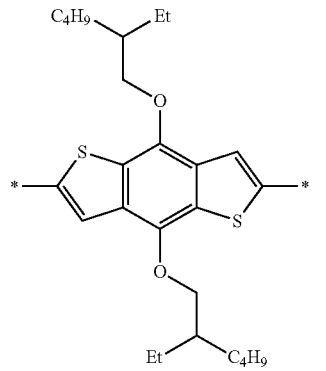

TABLE 39-continued
| | | |
|---|---|---|
| 2-1-30 | 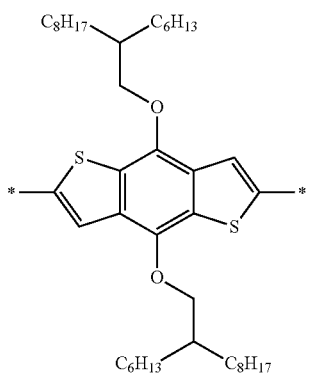 | |
| 2-1-31 | 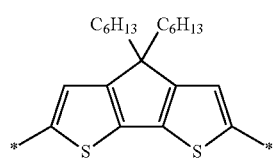 | |
| 2-1-32 | 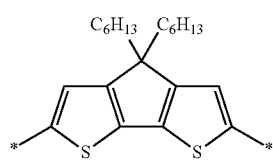 | |
| 2-1-33 | 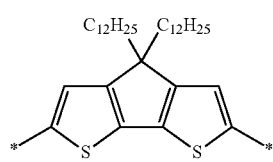 | |
| 2-1-34 | 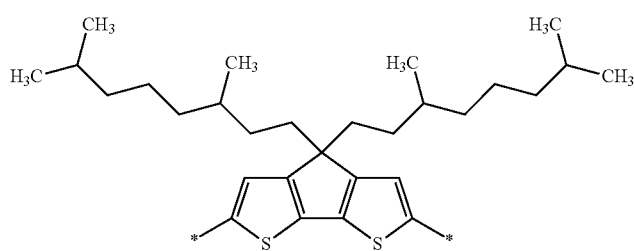 | |
| | $Ar^{104}$ | $R^{115}$ |
|---|---|---|
| 2-1-28 | 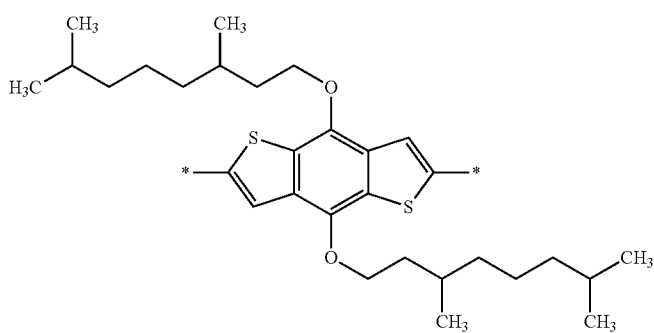 | *—$C_8H_{17}$ |

TABLE 39-continued
| | 201 | 202 |
|---|---|---|
| 2-1-29 | 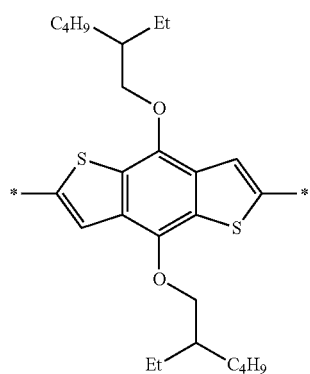 | *—OC$_6$H$_{13}$ |
| 2-1-30 | 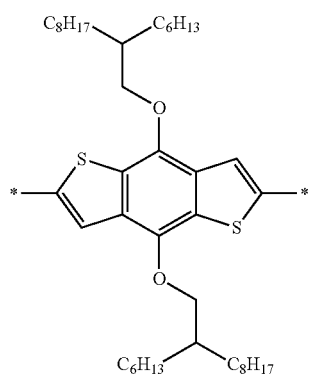 | H |
| 2-1-31 | 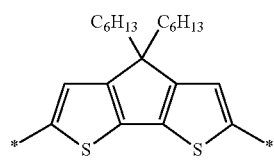 | H |
| 2-1-32 | 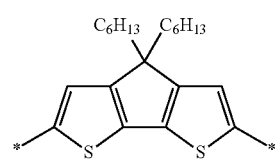 | H |
| 2-1-33 | 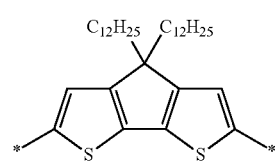 | H |
| 2-1-34 | 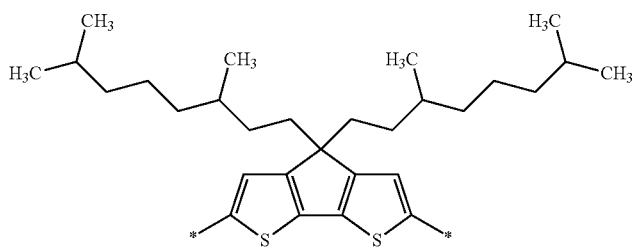 | H |

TABLE 39-continued
|  | R^116 | R^117 | R^118 | R^121 | R^122 |
|---|---|---|---|---|---|
| 2-1-28 | *—C_8H_17 | *—C_8H_17 | *—C_8H_17 | *—C_8H_17 | *—C_8H_17 |
| 2-1-29 | *—OC_6H_13 | *—OC_6H_13 | *—OC_6H_13 | *—OC_6H_13 | *—OC_6H_13 |
| 2-1-30 | H | H | H | H | H |
| 2-1-31 | H | H | H | *—C_12H_25 | *—C_12H_25 |
| 2-1-32 | H | H | H | *—O—CH_2—CH(C_8H_17)—C_10H_21 | *—O—CH_2—CH(C_8H_17)—C_10H_21 |
| 2-1-33 | *—O—CH_2—CH(C_8H_17)—C_10H_21 | *—O—CH_2—CH(C_8H_17)—C_10H_21 | H | *—O—CH_2—CH(C_8H_17)—C_10H_21 | *—O—CH_2—CH(C_8H_17)—C_10H_21 |
| 2-1-34 | H | H | H | *—OC_6H_13 | *—OC_6H_13 |
TABLE 40
| Ar^103 |
|---|
2-1-35
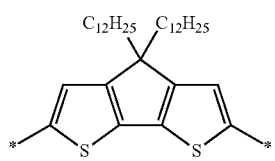
2-1-36
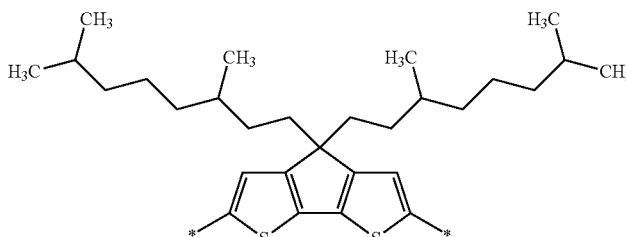
2-1-37
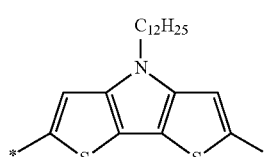

TABLE 40-continued

| | | |
|---|---|---|
| 2-1-38 | (structure: N-substituted dithienopyrrole with 3,7-dimethyloctyl group; *—S—...—S—*) | |
| 2-1-39 | (structure: N-substituted dithienopyrrole with 2-ethylhexyl group (C₄H₉, Et); *—S—...—S—*) | |
| 2-1-40 | (structure: N-substituted dithienopyrrole with C₈H₁₇; *—S—...—S—*) | |
| 2-1-41 | (structure: benzodithiophene; *—S—...—S—*) | |
| 2-1-42 | (structure: benzodithiophene with two C₆H₁₃ groups; *—S—...—S—*) | |

| | Ar¹⁰⁴ | R¹¹⁵ |
|---|---|---|
| 2-1-35 | (cyclopentadithiophene with two C₁₂H₂₅ groups) | H |
| 2-1-36 | (cyclopentadithiophene with two 3,7-dimethyloctyl groups) | H |

TABLE 40-continued
| | | |
|---|---|---|
| 2-1-37 | 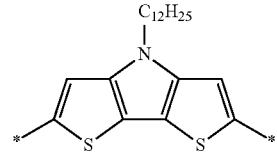 | H |
| 2-1-38 | 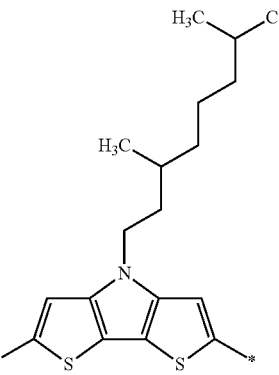 | H |
| 2-1-39 | 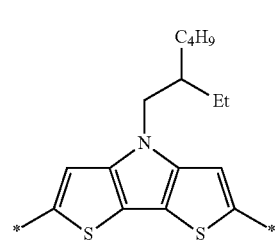 | H |
| 2-1-40 | 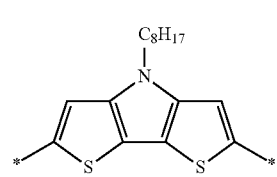 | *—C$_6$H$_{13}$ |
| 2-1-41 | 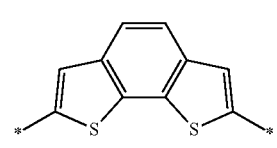 | H |
| 2-1-42 | 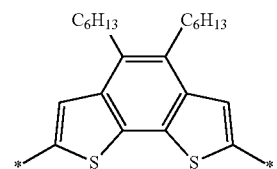 | *—C$_6$H$_{13}$ |
| | $R^{116}$ | $R^{117}$ | $R^{118}$ |
|---|---|---|---|
| 2-1-35 | H | H | H |
| 2-1-36 | 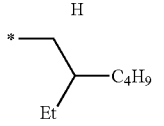 | 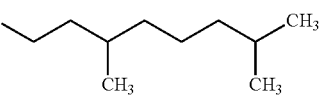 | H |
| 2-1-37 |  | H |  |

TABLE 40-continued

| | | | |
|---|---|---|---|
| 2-1-38 | H | H | H |
| 2-1-39 | H | H | H |
| 2-1-40 | H | *—C$_6$H$_{13}$ | H |
| 2-1-41 | H | H | H |
| 2-1-42 | *—C$_6$H$_{13}$ | *—C$_6$H$_{13}$ | *—C$_6$H$_{13}$ |

| | R$^{121}$ | R$^{122}$ |
|---|---|---|
| 2-1-35 | *—CH$_2$—CH(CH$_3$)—(CH$_2$)$_3$—CH(CH$_3$)—CH$_3$ | *—CH$_2$—CH(CH$_3$)—(CH$_2$)$_3$—CH(CH$_3$)—CH$_3$ |
| 2-1-36 | *—CH$_2$—CH(Et)—C$_4$H$_9$ | *—CH$_2$—CH(Et)—C$_4$H$_9$ |
| 2-1-37 | *—C$_8$H$_{17}$ | *—C$_8$H$_{17}$ |
| 2-1-38 | H | H |
| 2-1-39 | *—OC$_6$H$_{13}$ | *—OC$_6$H$_{13}$ |
| 2-1-40 | *—O—CH$_2$—CH(C$_8$H$_{17}$)—C$_{10}$H$_{21}$ | *—O—CH$_2$—CH(C$_8$H$_{17}$)—C$_{10}$H$_{21}$ |
| 2-1-41 | *—N(C$_8$H$_{17}$)$_2$ | *—N(C$_8$H$_{17}$)$_2$ |
| 2-1-42 | *—CH$_2$CH$_2$—CH(CH$_3$)—(CH$_2$)$_3$—CH(CH$_3$)—CH$_3$ | *—CH$_2$CH$_2$—CH(CH$_3$)—(CH$_2$)$_3$—CH(CH$_3$)—CH$_3$ |

TABLE 41

| | Ar$^{103}$ |
|---|---|
| 2-1-43 | 2,5-selenophenediyl |
| 2-1-44 | dithieno[3,2-b:2',3'-d]thiophene-2,6-diyl |
| 2-1-45 | 4,4,8,8-tetrakis(3,7-dimethyloctyl)-4,8-dihydrobenzo[1,2-b:4,5-b']bis[cyclopenta[b]thiophene]-2,6-diyl |

TABLE 41-continued
| | | |
|---|---|---|
| 2-1-46 | 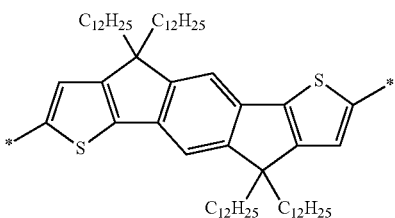 | |
| 2-1-47 | 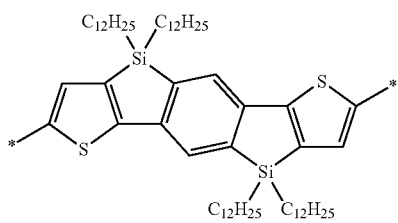 | |
| 2-1-48 | 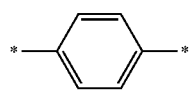 | |
| 2-1-49 | 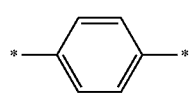 | |
| 2-1-50 | 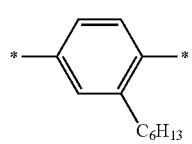 | |
| | Ar$^{104}$ | R$^{115}$ |
|---|---|---|
| 2-1-43 | 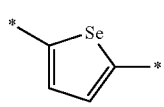 | H |
| 2-1-44 | 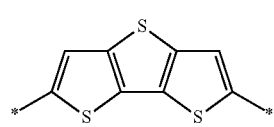 | H |
| 2-1-45 | 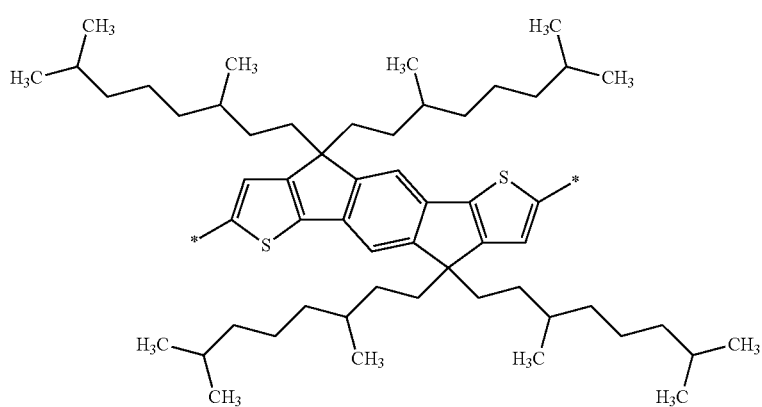 | H |

TABLE 41-continued
| | | R117 |
|---|---|---|
| 2-1-46 | 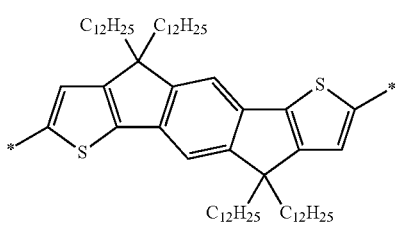 | H |
| 2-1-47 | 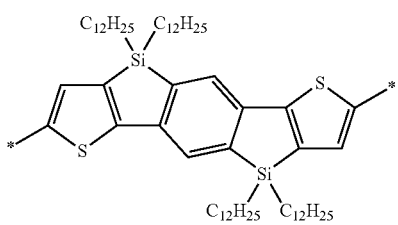 | H |
| 2-1-48 |  | H |
| 2-1-49 | 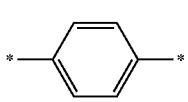 | H |
| 2-1-50 | 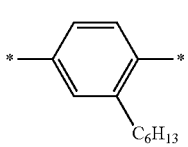 | H |
| | R116 | R117 |
|---|---|---|
| 2-1-43 | 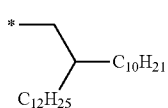 | H |
| 2-1-44 | 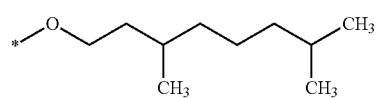 | H |
| 2-1-45 | *—C12H25 | *—C12H25 |
| 2-1-46 | H | H |
| 2-1-47 | H | H |
| 2-1-48 | 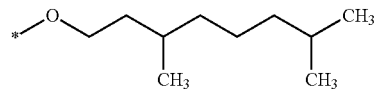 | H |
| 2-1-49 | 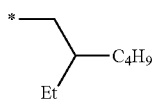 | 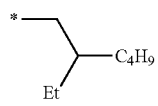 |
| 2-1-50 | 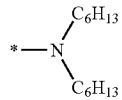 | 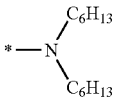 |

TABLE 41-continued
|   | R^{118} | R^{121} | R^{122} |
|---|---------|---------|---------|
| 2-1-43 | *-CH2-CH(C12H25)-C10H21 | *-CH2-CH(C12H25)-C10H21 | *-CH2-CH(C12H25)-C10H21 |
| 2-1-44 | *-O-CH2CH2-CH(CH3)-CH2CH2-CH(CH3)2 | H | H |
| 2-1-45 | H | H | H |
| 2-1-46 | H | H | H |
| 2-1-47 | H | *—OC6H13 | *—OC6H13 |
| 2-1-48 | *-O-CH2CH2-CH(CH3)-CH2CH2-CH(CH3)2 | H | H |
| 2-1-49 | H | *—OEt | *—OEt |
| 2-1-50 | H | H | H |
Formula (102-2M)
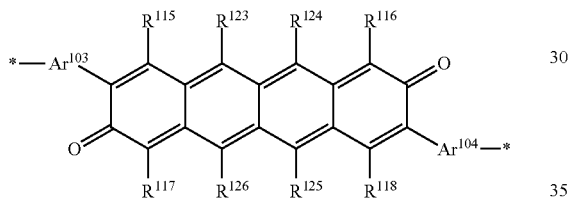
In Formula (102-2M), each of $Ar^{103}$, $Ar^{104}$, $R^{115}$ to $R^{118}$, and $R^{123}$ to $R^{126}$ represents the following groups.
TABLE 42
|   | Ar^{103} | Ar^{104} | R^{115} |
|---|----------|----------|---------|
| 2-2-1 | 2,5-thienyl | 2,5-thienyl | H |
| 2-2-2 | 2,5-thienyl | 2,5-thienyl | *-O-CH2-CH(C8H17)-C10H21 |
| 2-2-3 | 2,5-thienyl | 2,5-thienyl | *-CH2-CH(C12H25)-C10H21 |
| 2-2-4 | 2,5-thienyl | 2,5-thienyl | *—OC8H17 |

TABLE 42-continued

| | | | |
|---|---|---|---|
| 2-2-5 | [2,5-thienyl] | [2,5-thienyl] | *—CH₂—CH(Et)—C₄H₉ |
| 2-2-6 | [2,5-thienyl] | [2,5-thienyl] | H |
| 2-2-7 | [2,5-thienyl, 3-C₆H₁₃] | [2,5-thienyl, 3-C₆H₁₃] | H |
| 2-2-8 | [2,5-furyl] | [2,5-furyl] | *—OC₆H₁₃ |
| 2-2-9 | [2,5-furyl, 3-C₁₀H₂₅] | [2,5-furyl, 3-C₁₂H₂₅] | H |
| 2-2-10 | [4,4-di-C₁₂H₂₅ cyclopenta-dithiophene] | [4,4-di-C₁₂H₂₅ cyclopenta-dithiophene] | H |

| | R¹¹⁶ | R¹¹⁷ |
|---|---|---|
| 2-2-1 | H | H |
| 2-2-2 | H | H |
| 2-2-3 | H | H |
| 2-2-4 | H | H |
| 2-2-5 | *—CH₃ | *—CH₃ |
| 2-2-6 | *—O—CH₂—CH(C₈H₁₇)—C₁₀H₂₁ | *—O—CH₂—CH(C₈H₁₇)—C₁₀H₂₁ |
| 2-2-7 | *—N(C₄H₉)₂ | *—N(C₄H₉)₂ |
| 2-2-8 | *—OC₆H₁₃ | *—OC₆H₁₃ |
| 2-2-9 | H | H |
| 2-2-10 | *—O—C(=O)—CH₂—CH₂—CH₃ | *—O—C(=O)—CH₂—CH₂—CH₃ |

TABLE 42-continued
| | $R^{118}$ | $R^{123}$ | $R^{124}$ |
|---|---|---|---|
| 2-2-1 | H | *—$C_6H_{13}$ | *—$C_6H_{13}$ |
| 2-2-2 | 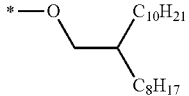 | H | H |
| 2-2-3 | 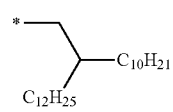 | H | H |
| 2-2-4 | *—$OC_8H_{17}$ | H | H |
| 2-2-5 | 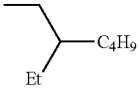 | 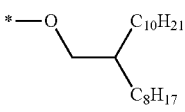 | 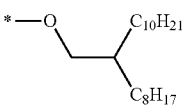 |
| 2-2-6 | H | 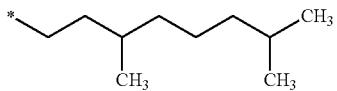 | H |
| 2-2-7 | H | *—OEt | *—OEt |
| 2-2-8 | *—$OC_6H_{13}$ | *—$OC_6H_{13}$ | *—$OC_6H_{13}$ |
| 2-2-9 | H | H | H |
| 2-2-10 | H | H | H |
| | $R^{125}$ | $R^{126}$ |
|---|---|---|
| 2-2-1 | *—$C_6H_{13}$ | *—$C_6H_{13}$ |
| 2-2-2 | H | H |
| 2-2-3 | H | H |
| 2-2-4 | H | H |
| 2-2-5 | 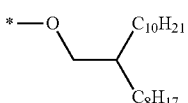 | 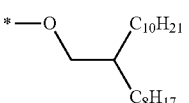 |
| 2-2-6 | 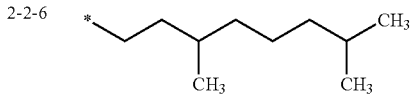 | H |
| 2-2-7 | —OEt | *—OEt |
| 2-2-8 | *—$OC_6H_{13}$ | *—$OC_6H_{13}$ |
| 2-2-9 | H | H |
| 2-2-10 | H | H |
TABLE 43
| | $Ar^{103}$ |
|---|---|
| 2-2-11 | 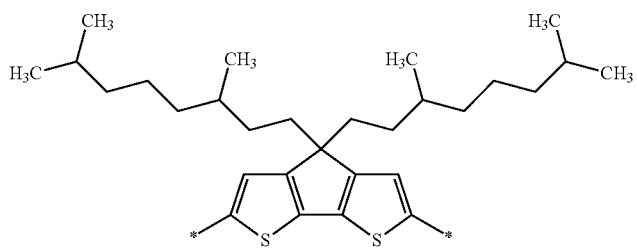 |

TABLE 43-continued
2-2-12 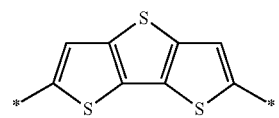
2-2-13 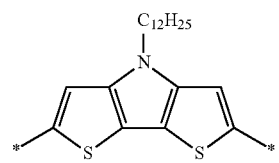
2-2-14 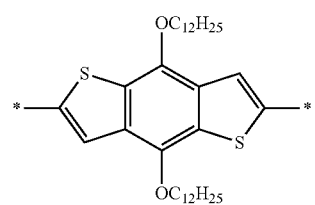
2-2-15 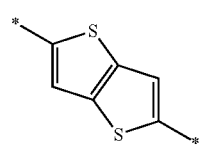
2-2-16 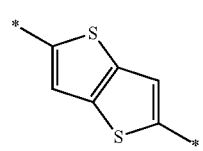
2-2-17 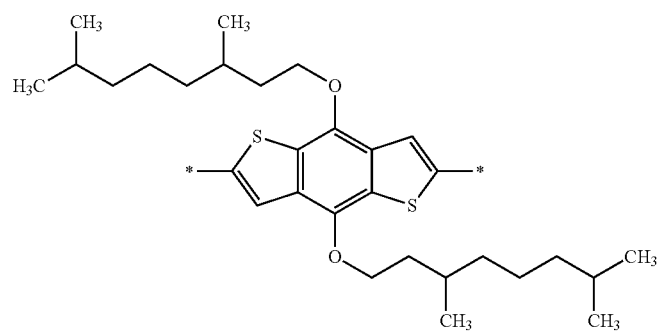
2-2-18 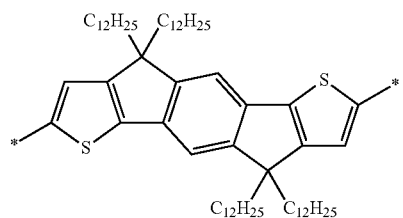
2-2-19 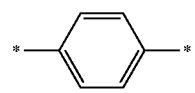

TABLE 43-continued
| 2-2-20 | 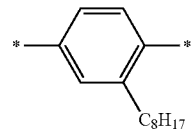 |
|---|---|
| | Ar<sup>104</sup> | R<sup>115</sup> |
|---|---|---|
| 2-2-11 | 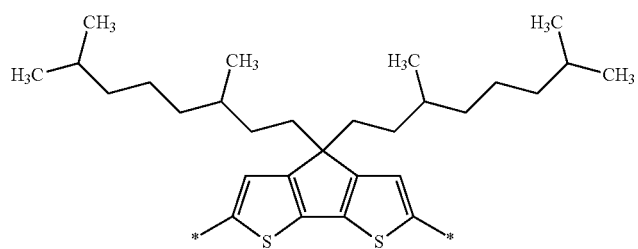 | H |
| 2-2-12 | 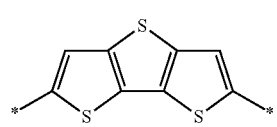 | H |
| 2-2-13 | 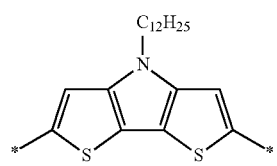 | H |
| 2-2-14 | 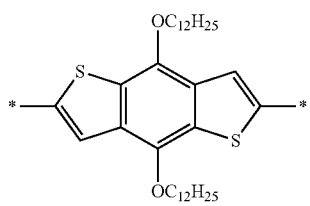 | H |
| 2-2-15 | 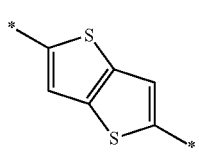 | 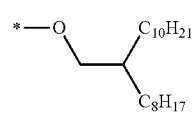 |
| 2-2-16 | 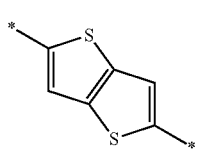 | H |

TABLE 43-continued

| | | |
|---|---|---|
| 2-2-17 | [structure: benzodithiophene with two branched alkoxy (3,7-dimethyloctyloxy-type) groups at 4,8-positions, * at 2,6] | H |
| 2-2-18 | [structure: indacenodithiophene with four C₁₂H₂₅ groups on sp3 carbons, * at thiophene α-positions] | *—CH₂—CH(Et)—C₄H₉ |
| 2-2-19 | *—C₆H₄—* (1,4-phenylene) | H |
| 2-2-20 | *—C₆H₃(C₈H₁₇)—* (2-octyl-1,4-phenylene) | H |

| | $R^{116}$ | $R^{117}$ | $R^{118}$ |
|---|---|---|---|
| 2-2-11 | H | H | H |
| 2-2-12 | H | H | H |
| 2-2-13 | *—O—CH₂—CH(C₈H₁₇)—C₁₀H₂₁ | *—O—CH₂—CH(C₈H₁₇)—C₁₀H₂₁ | H |
| 2-2-14 | H | H | H |
| 2-2-15 | *—O—CH₂—CH(C₈H₁₇)—C₁₀H₂₁ | *—O—CH₂—CH(C₈H₁₇)—C₁₀H₂₁ | *—O—CH₂—CH(C₈H₁₇)—C₁₀H₂₁ |
| 2-2-16 | H | H | H |
| 2-2-17 | H | H | H |
| 2-2-18 | *—CH₂—CH(Et)—C₄H₉ | *—CH₂—CH(Et)—C₄H₉ | *—CH₂—CH(Et)—C₄H₉ |
| 2-2-19 | *—O—CH₂—CH(C₈H₁₇)—C₁₀H₂₁ | *—O—CH₂—CH(C₈H₁₇)—C₁₀H₂₁ | H |
| 2-2-20 | H | H | H |

TABLE 43-continued

| | $R^{223}$ | $R^{224}$ | $R^{225}$ | $R^{226}$ |
|---|---|---|---|---|
| 2-2-11 | *—OC$_6$H$_{13}$ | *—OC$_6$H$_{13}$ | *—OC$_6$H$_{13}$ | *—OC$_6$H$_{13}$ |
| 2-2-12 | *—CH$_2$CH(C$_{12}$H$_{25}$)C$_{10}$H$_{21}$ | *—CH$_2$CH(C$_{12}$H$_{25}$)C$_{10}$H$_{21}$ | *—CH$_2$CH(C$_{12}$H$_{25}$)C$_{10}$H$_{21}$ | *—CH$_2$CH(C$_{12}$H$_{25}$)C$_{10}$H$_{21}$ |
| 2-2-13 | H | H | H | H |
| 2-2-14 | *—OC$_8$H$_{17}$ | *—OC$_8$H$_{17}$ | *—OC$_8$H$_{19}$ | *—OC$_8$H$_{17}$ |
| 2-2-15 | H | H | H | H |
| 2-2-16 | *—N(C$_6$H$_{13}$)$_2$ | *—N(C$_6$H$_{13}$)$_2$ | *—N(C$_6$H$_{13}$)$_2$ | *—N(C$_6$H$_{13}$)$_2$ |
| 2-2-17 | *—C$_6$H$_{13}$ | *—C$_6$H$_{13}$ | *—C$_6$H$_{13}$ | *—C$_6$H$_{13}$ |
| 2-2-18 | H | H | H | H |
| 2-2-19 | H | H | H | H |
| 2-2-20 | H | H | H | H |

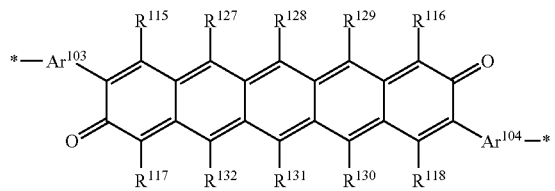

Formula (102-3M)

In Formula (102-3M), each of $Ar^{103}$, $Ar^{104}$, $R^{115}$ to $R^{118}$, and $R^{127}$ to $R^{132}$ represents the following groups.

TABLE 44

| | $Ar^{103}$ | $Ar^{104}$ |
|---|---|---|
| 2-3-1 | thiophene-2,5-diyl | thiophene-2,5-diyl |
| 2-3-2 | thiophene-2,5-diyl | thiophene-2,5-diyl |
| 2-3-3 | thiophene-2,5-diyl | thiophene-2,5-diyl |
| 2-3-4 | thiophene-2,5-diyl | thiophene-2,5-diyl |
| 2-3-5 | thiophene-2,5-diyl | thiophene-2,5-diyl |

TABLE 44-continued

| | | | |
|---|---|---|---|
| 2-3-6 | (thiophene, 2,5-linked) | | (thiophene, 2,5-linked) |
| 2-3-7 | (thiophene with C₆H₁₃ at 3-position) | | (thiophene with C₆H₁₃ at 3-position) |
| 2-3-8 | (furan, 2,5-linked) | | (furan, 2,5-linked) |
| 2-3-9 | (furan with C₁₀H₂₅ at 3-position) | | (furan with C₁₀H₂₅ at 3-position) |
| 2-3-10 | (cyclopenta-dithiophene with C₁₂H₂₅, C₁₂H₂₅) | | (cyclopenta-dithiophene with C₁₂H₂₅, C₁₂H₂₅) |

| | $R^{115}$ | $R^{116}$ | $R^{117}$ |
|---|---|---|---|
| 2-3-1 | H | H | H |
| 2-3-2 | *—OC₈H₁₇ | H | H |
| 2-3-3 | *—CH₂—CH(C₁₀H₂₁)(C₁₂H₂₅) | H | H |
| 2-3-4 | *—O—CH₂—CH(C₁₀H₂₁)(C₈H₁₇) | H | H |
| 2-3-5 | *—CH₂—CH(C₄H₉)(Et) | *—CH₂—CH(C₄H₉)(Et) | *—CH₂—CH(C₄H₉)(Et) |
| 2-3-6 | H | *—O—CH₂—CH(C₁₀H₂₁)(C₈H₁₇) | H |
| 2-3-7 | H | H | H |
| 2-3-8 | *—OC₆H₁₃ | *—OC₆H₁₃ | *—OC₆H₁₃ |
| 2-3-9 | H | H | H |
| 2-3-10 | *—O—CH₂—C(=O)—O—CH₂—CH₃ | H | H |

TABLE 44-continued
| | $R^{118}$ | $R^{127}$ | $R^{128}$ |
|---|---|---|---|
| 2-3-1 | H | *—C₆H₁₃ | *—C₆H₁₃ |
| 2-3-2 | *—OC₆H₁₃ | H | 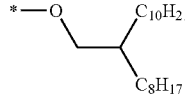 |
| 2-3-3 | 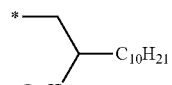 | H | *—OEt |
| 2-3-4 | 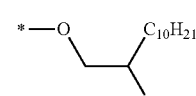 | H | H |
| 2-3-5 | 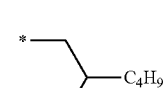 | H | 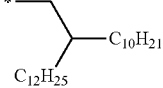 |
| 2-3-6 | 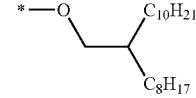 | H | 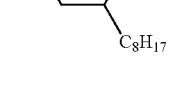 |
| 2-3-7 | H | *—OEt | 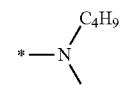 |
| 2-3-8 | *—OC₆H₁₃ | —OC₆H₁₃ | H |
| 2-3-9 | H | H | H |
| 2-3-10 | 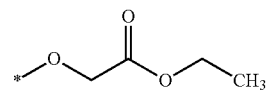 | H | H |
| | $R^{129}$ | $R^{130}$ | $R^{131}$ | $R^{132}$ |
|---|---|---|---|---|
| 2-3-1 | *—OC₆H₁₃ | *—C₆H₁₃ | *—C₆H₁₃ | *—C₆H₁₃ |
| 2-3-2 | H | H | 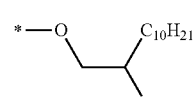 | H |
| 2-3-3 | H | H | *—OEt | H |
| 2-3-4 | H | H | H | H |
| 2-3-5 | H | H | 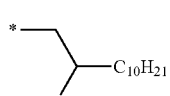 | H |
| 2-3-6 | H | H | 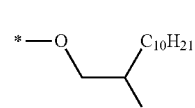 | H |

TABLE 44-continued
| | | | | |
|---|---|---|---|---|
| 2-3-7 | —OEt | —OEt |  | *—OEt |
| 2-3-8 | —OC$_6$H$_{13}$ | *—OC$_6$H$_{13}$ | H | *—OC$_6$H$_{13}$ |
| 2-3-9 | H | H | H | H |
| 2-3-10 | H | H | H | H |
TABLE 45
Ar$^{103}$
2-3-11
2-3-12
2-3-13
2-3-14
2-3-15
2-3-16

TABLE 45-continued
| | |
|---|---|
| 2-3-17 | 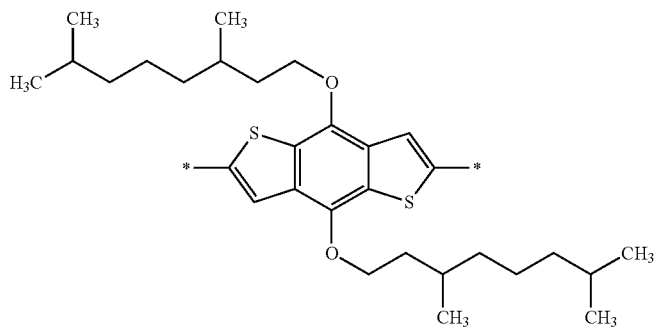 |
| 2-3-18 | 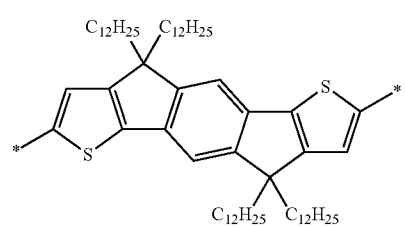 |
| 2-3-19 | 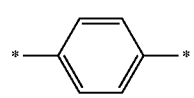 |
| 2-3-20 | 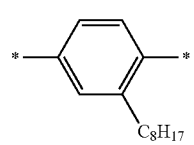 |
| | Ar$^{104}$ | R$^{115}$ |
|---|---|---|
| 2-3-11 | 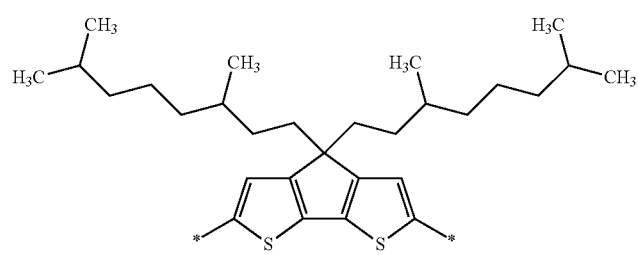 | H |
| 2-3-12 | 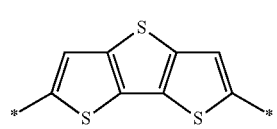 | *—CH$_3$ |
| 2-3-13 | 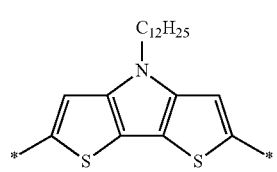 | 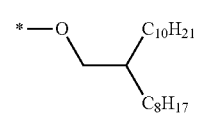 |

TABLE 45-continued

| | | | |
|---|---|---|---|
| 2-3-14 | benzodithiophene with OC₁₂H₂₅ groups at 4,8-positions, * at 2,6-positions | | H |
| 2-3-15 | thieno[3,2-b]thiophene with * at 2,5-positions | | H |
| 2-3-16 | thieno[3,2-b]thiophene with * at 2,5-positions | | *–CH₂–CH(C₁₂H₂₅)–C₁₀H₂₁ |
| 2-3-17 | benzodithiophene with 3,7-dimethyloctyloxy groups at 4,8-positions, * at 2,6-positions | | H |
| 2-3-18 | indacenodithiophene with C₁₂H₂₅ substituents, * at terminal thiophenes | | *–CH₂–CH(Et)–C₄H₉ |
| 2-3-19 | 1,4-phenylene (*,*) | | *–C₆H₁₃ |
| 2-3-20 | 2,5-phenylene with C₈H₁₇ at 3-position | | *–CH₂–CH(C₈H₁₇)–C₁₀H₂₁ |

| | R¹¹⁶ | R¹¹⁷ | R¹¹⁸ | R¹²⁷ |
|---|---|---|---|---|
| 2-3-11 | H | H | H | *—OC₆H₁₃ |
| 2-3-12 | H | H | *—CH₃ | H |
| 2-3-13 | H | H | *—O—CH₂—CH(C₈H₁₇)—C₁₀H₂₁ | H |

TABLE 45-continued
| | | | | |
|---|---|---|---|---|
| 2-3-14 | H | H | H | *—OC$_8$H$_7$ |
| 2-3-15 | H | H | H | *—C$_6$H$_{13}$ |
| 2-3-16 | H | H | 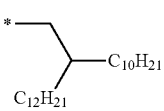 | H |
| 2-3-17 | H | H | H | H |
| 2-3-18 | H | H | 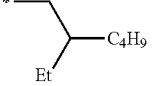 | H |
| 2-3-19 | *—C$_6$H$_{13}$ | *—C$_6$H$_{13}$ | *—C$_6$H$_{13}$ | H |
| 2-3-20 | H | H | 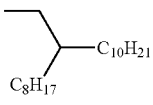 | H |
| | R$^{128}$ | R$^{129}$ | R$^{130}$ |
|---|---|---|---|
| 2-3-11 | *—OC$_6$H$_{13}$ | *—OC$_6$H$_{13}$ | *—OC$_6$H$_{13}$ |
| 2-3-12 | 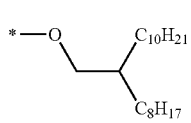 | H | H |
| 2-3-13 | 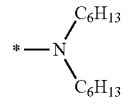 | H | H |
| 2-3-14 | *—OC$_8$H$_{17}$ | *—OC$_8$H$_{17}$ | *—OC$_8$H$_{17}$ |
| 2-3-15 | H | *—C$_6$H$_{13}$ | *—C$_6$H$_{13}$ |
| 2-3-16 | 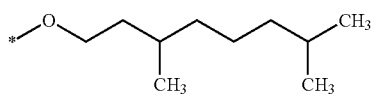 | H | H |
| 2-3-17 | H | H | H |
| 2-3-18 | *—CH$_3$ | H | H |
| 2-3-19 | 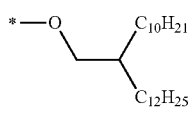 | H | H |
| 2-3-20 | *—OEt | H | H |
| | R$^{131}$ | R$^{132}$ |
|---|---|---|
| 2-3-11 | *—OC$_6$H$_{13}$ | *—OC$_6$H$_{13}$ |
| 2-3-12 |  | H |

TABLE 45-continued
| | | | |
|---|---|---|---|
| 2-3-13 | 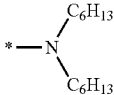 | | H |
| 2-3-14 | *—OC$_8$H$_{17}$ | | *—OC$_8$H$_{17}$ |
| 2-3-15 | H | | *—C$_6$H$_{13}$ |
| 2-3-16 | 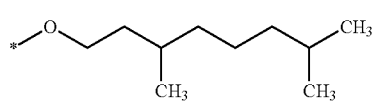 | | H |
| 2-3-17 | H | | H |
| 2-3-18 | *—CH$_3$ | | H |
| 2-3-19 | 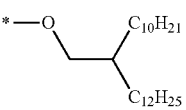 | | H |
| 2-3-20 | *—OEt | | H |
Formula (102-4M)
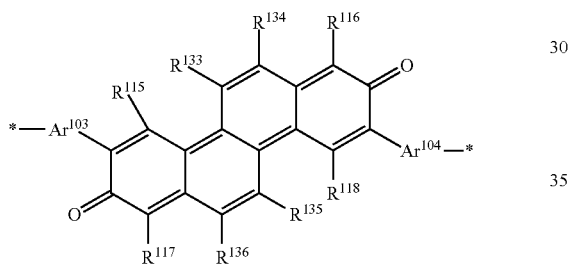
In Formula (102-4M), each of Ar$^{103}$, Ar$^{104}$, R$^{115}$ to R$^{118}$, and R$^{133}$ to R$^{136}$ represents the following groups.
TABLE 46
| | Ar$^{103}$ | Ar$^{104}$ | R$^{115}$ |
|---|---|---|---|
| 2-4-1 | 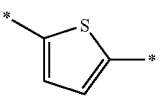 | 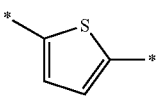 | H |
| 2-4-2 | 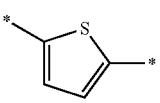 | 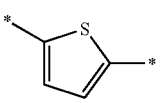 | 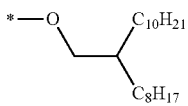 |
| 2-4-3 | 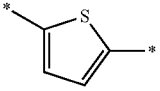 | 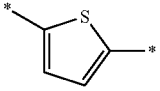 | 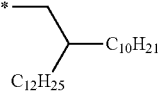 |
| 2-4-4 | 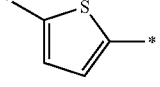 | 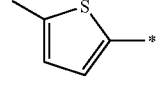 | *—OC$_8$H$_{17}$ |

TABLE 46-continued

| | | | |
|---|---|---|---|
| 2-4-5 | 2,5-thienyl | 2,5-thienyl | *-CH2-CH(Et)-C4H9 |
| 2-4-6 | 2,5-thienyl | 2,5-thienyl | *-O-CH2-CH(C8H17)-C10H21 |
| 2-4-7 | 3-C6H13-2,5-thienyl | 3-C6H13-2,5-thienyl | *-N(C4H9)2 |
| 2-4-8 | 2,5-furyl | 2,5-furyl | *-OC6H13 |
| 2-4-9 | 3-C10H25-2,5-furyl | 3-C10H25-2,5-furyl | *-N(C4H9)2 |
| 2-4-10 | 4,4-di(C12H25)-cyclopenta[2,1-b:3,4-b']dithiophene-2,6-diyl | 4,4-di(C12H25)-cyclopenta[2,1-b:3,4-b']dithiophene-2,6-diyl | *-O-C(=O)-CH2CH2CH3 |

| | $R^{116}$ | $R^{117}$ | $R^{118}$ |
|---|---|---|---|
| 2-4-1 | H | H | H |
| 2-4-2 | H | H | *-O-CH2-CH(C8H17)-C10H21 |
| 2-4-3 | H | H | *-CH2-CH(C12H25)-C10H21 |
| 2-4-4 | H | H | *-OC8H17 |
| 2-4-5 | H | H | *-CH2-CH(Et)-C4H9 |
| 2-4-6 | *-O-CH2-CH(C8H17)-C10H21 | *-O-CH2-CH(C8H17)-C10H21 | *-O-CH2-CH(C8H17)-C10H21 |
| 2-4-7 | H | H | *-N(C4H9)2 |

TABLE 46-continued
| | | | |
|---|---|---|---|
| 2-4-8 | H | H | *—OC$_6$H$_{13}$ |
| 2-4-9 | H | H | *—N(C$_6$H$_{13}$)$_2$ |
| 2-4-10 | H | H | *—O—C(=O)—C$_3$H$_7$ |
| | | R$^{133}$ | R$^{134}$ | R$^{135}$ | R$^{136}$ |
|---|---|---|---|---|---|
| | 2-4-1 | H | *—C$_6$H$_{13}$ | H | *—C$_6$H$_{13}$ |
| | 2-4-2 | H | H | H | H |
| | 2-4-3 | H | *—O—CH$_2$CH(C$_8$H$_{17}$)C$_{10}$H$_{21}$ | H | *—O—CH$_2$CH(C$_8$H$_{17}$)C$_{10}$H$_{21}$ |
| | 2-4-4 | H | H | H | H |
| | 2-4-5 | H | *—O—CH$_2$CH(C$_8$H$_{17}$)C$_{10}$H$_{21}$ | H | *—O—CH$_2$CH(C$_8$H$_{17}$)C$_{10}$H$_{21}$ |
| | 2-4-6 | H | H | H | H |
| | 2-4-7 | H | *—OEt | H | *—OEt |
| | 2-4-8 | H | *—OC$_6$H$_{13}$ | H | *—OC$_6$H$_{13}$ |
| | 2-4-9 | H | H | H | H |
| | 2-4-10 | H | H | H | H |
TABLE 47
Ar$^{103}$
2-4-11
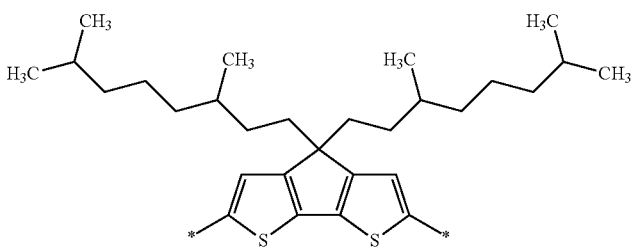
2-4-12
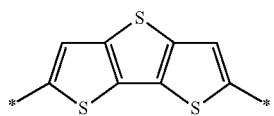
2-4-13
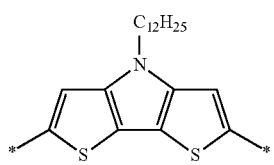

TABLE 47-continued
| | |
|---|---|
| 2-4-14 | 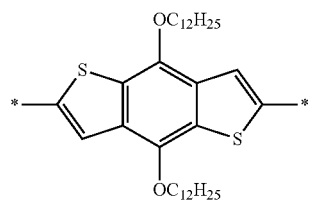 |
| 2-4-15 | 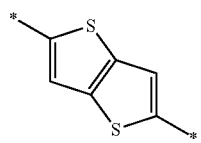 |
| 2-4-16 | 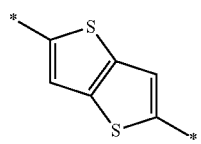 |
| 2-4-17 | 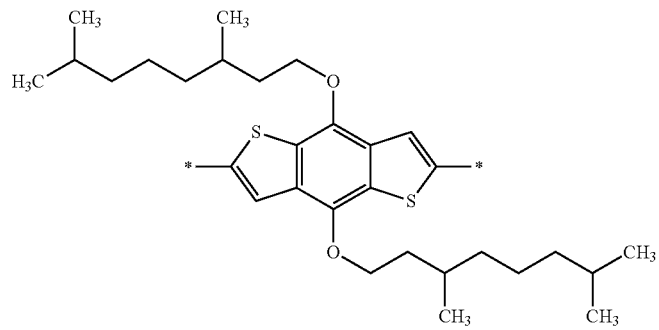 |
| 2-4-18 | 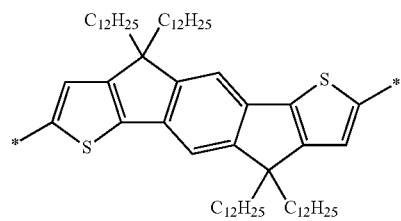 |
| 2-4-19 | 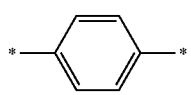 |
| 2-4-20 | 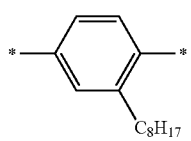 |

TABLE 47-continued
| | Ar$^{104}$ | R$^{115}$ |
|---|---|---|
| 2-4-11 | 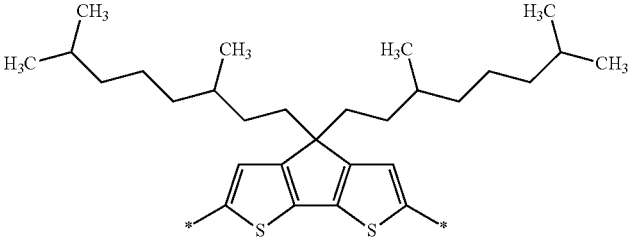 | H |
| 2-4-12 | 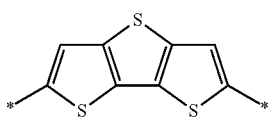 | H |
| 2-4-13 | 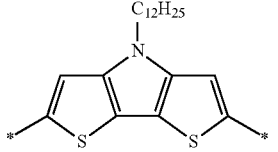 | 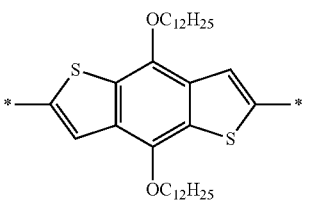 |
| 2-4-14 | 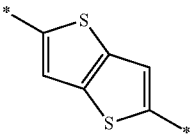 | *—OC$_8$H$_{17}$ |
| 2-4-15 | 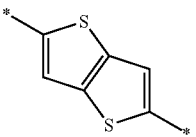 | H |
| 2-4-16 | 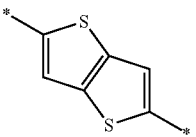 | 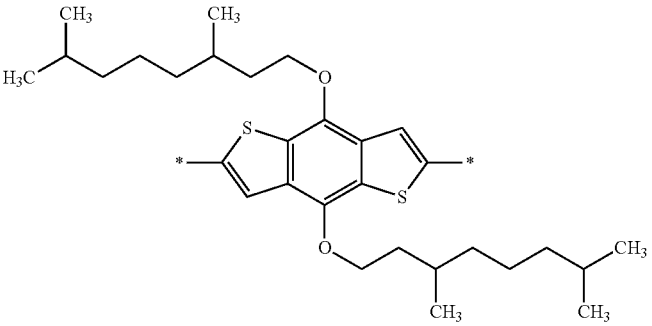 |
| 2-4-17 |  | H |

TABLE 47-continued
| | | | |
|---|---|---|---|
| 2-4-18 | 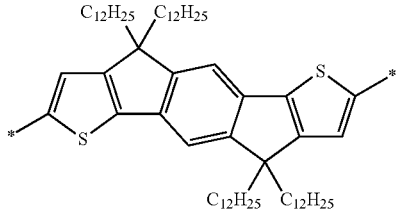 | | 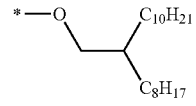 |
| 2-4-19 | 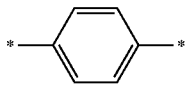 | | 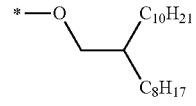 |
| 2-4-20 | 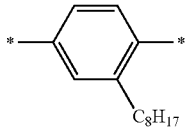 | | 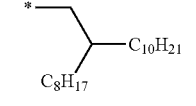 |
| | $R^{116}$ | $R^{117}$ | $R^{118}$ | $R^{133}$ |
|---|---|---|---|---|
| 2-4-11 | H | H | H | *—OC$_6$H$_{13}$ |
| 2-4-12 | H | H | H | H |
| 2-4-13 | H | H | 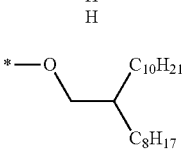 | H |
| 2-4-14 | H | H | *—OC$_8$H$_{17}$ | H |
| 2-4-15 | H | H | H | H |
| 2-4-16 | H | H | 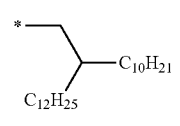 | H |
| 2-4-17 | H | H | H | *—C$_6$H$_{13}$ |
| 2-4-18 | H | H | 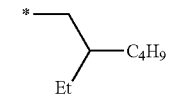 | H |
| 2-4-19 | H | H | 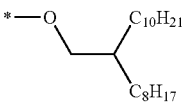 | H |
| 2-4-20 | H | H | 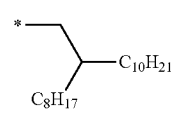 | H |
| | $R^{134}$ | $R^{135}$ | $R^{136}$ |
|---|---|---|---|
| 2-4-11 | H | *—OC$_6$H$_{13}$ | H |
| 2-4-12 | 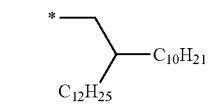 | H | 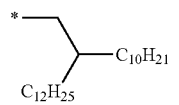 |
| 2-4-13 | H | H | H |
| 2-4-14 | *—OC$_8$H$_{17}$ | H | *—OC$_8$H$_{17}$ |

TABLE 47-continued
| | | | | |
|---|---|---|---|---|
| 2-4-15 | 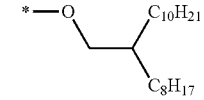 | H | 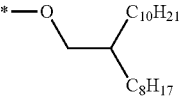 | |
| 2-4-16 | 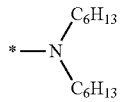 | H | 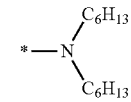 | |
| 2-4-17 | H | *—C$_6$H$_{13}$ | H | |
| 2-4-18 | H | H | H | |
| 2-4-19 | H | H | H | |
| 2-4-20 | H | H | H | |
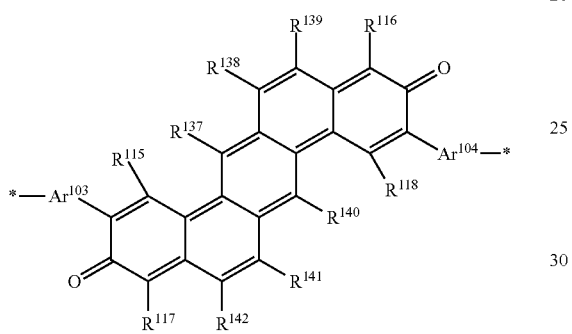
Formula (102-5M)
In Formula (102-5M), each of $Ar^{103}$, $Ar^{104}$, $R^{115}$ to $R^{118}$, and $R^{137}$ to $R^{142}$ represents the following groups.
TABLE 48
| | $Ar^{103}$ | $Ar^{104}$ | $R^{115}$ |
|---|---|---|---|
| 2-5-1 | 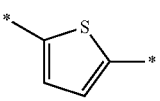 | 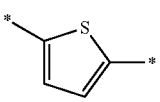 | H |
| 2-5-2 | 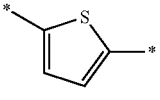 | 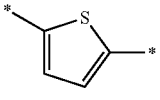 | *—OC$_8$H$_{17}$ |
| 2-5-3 | 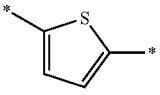 | 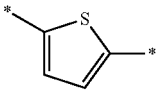 | 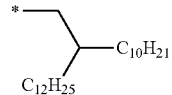 |
| 2-5-4 | 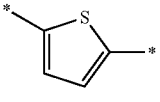 | 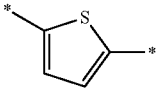 | 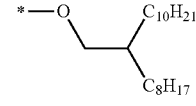 |
| 2-5-5 | 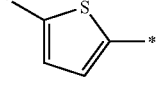 | 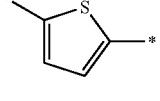 | 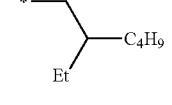 |

TABLE 48-continued

| | | | |
|---|---|---|---|
| 2-5-6 | thiophene-2,5-diyl | thiophene-2,5-diyl | *—O—CH₂—CH(C₈H₁₇)—C₁₀H₂₁ |
| 2-5-7 | 3-C₆H₁₃-thiophene-2,5-diyl | 3-C₆H₁₃-thiophene-2,5-diyl | H |
| 2-5-8 | furan-2,5-diyl | furan-2,5-diyl | H |
| 2-5-9 | 3-C₁₀H₂₅-furan-2,5-diyl | 3-C₁₀H₂₅-furan-2,5-diyl | *—N(C₆H₁₃)₂ |
| 2-5-10 | 4,4-di(C₁₂H₂₅)-cyclopenta[2,1-b:3,4-b']dithiophene-2,6-diyl | 4,4-di(C₁₂H₂₅)-cyclopenta[2,1-b:3,4-b']dithiophene-2,6-diyl | *—O—CH₂—C(=O)—O—CH₂CH₃ |

| | $R^{116}$ | $R^{117}$ | $R^{118}$ | $R^{137}$ |
|---|---|---|---|---|
| 2-5-1 | H | H | H | *—C₆H₁₃ |
| 2-5-2 | H | H | *—OC₈H₁₇ | H |
| 2-5-3 | H | H | *—CH₂—CH(C₁₂H₂₅)—C₁₀H₂₁ | H |
| 2-5-4 | H | H | *—O—CH₂—CH(C₈H₁₇)—C₁₀H₂₁ | H |
| 2-5-5 | *—CH₂—CH(Et)—C₄H₉ | *—CH₂—CH(Et)—C₄H₉ | *—CH₂—CH(Et)—C₄H₉ | H |
| 2-5-6 | H | H | *—O—CH₂—CH(C₈H₁₇)—C₁₂H₂₁ | H |
| 2-5-7 | H | H | H | H |
| 2-5-8 | H | H | H | *—OC₆H₁₃ |
| 2-5-9 | H | H | *—N(C₆H₁₃)₂ | H |

TABLE 48-continued

| | | | | |
|---|---|---|---|---|
| 2-5-10 | H | H | *−O−CH$_2$−C(=O)−O−CH$_3$ (ethyl ester of glycolate: *−OCH$_2$C(O)OEt) | H |

| | R$^{138}$ | R$^{139}$ | R$^{140}$ | R$^{141}$ | R$^{142}$ |
|---|---|---|---|---|---|
| 2-5-1 | *−C$_6$H$_{13}$ | *−C$_6$H$_{13}$ | *−C$_6$H$_{13}$ | *−C$_6$H$_{13}$ | *−C$_6$H$_{13}$ |
| 2-5-2 | H | *−O−CH$_2$−CH(C$_{10}$H$_{21}$)(C$_8$H$_{17}$) | H | H | *−O−CH$_2$−CH(C$_{10}$H$_{21}$)(C$_8$H$_{17}$) |
| 2-5-3 | H | *−OEt | H | H | *−OEt |
| 2-5-4 | H | H | H | H | H |
| 2-5-5 | H | *−CH$_2$−CH(C$_{10}$H$_{21}$)(C$_{12}$H$_{25}$) | H | H | *−CH$_2$−CH(C$_{10}$H$_{21}$)(C$_{12}$H$_{25}$) |
| 2-5-6 | H | *−O−CH$_2$−CH(C$_{10}$H$_{21}$)(C$_8$H$_{17}$) | H | H | *−O−CH$_2$−CH(C$_{10}$H$_{21}$)(C$_8$H$_{17}$) |
| 2-5-7 | *−OEt | *−N(C$_4$H$_9$)$_2$ | H | *−OEt | *−N(C$_4$H$_9$)$_2$ |
| 2-5-8 | H | H | *−OC$_6$H$_{13}$ | H | H |
| 2-5-9 | H | H | H | H | H |
| 2-5-10 | H | H | H | H | H |

TABLE 49

| | Ar$^{103}$ |
|---|---|
| 2-5-11 | 4,4-bis(3,7-dimethyloctyl)-4H-cyclopenta[2,1-b:3,4-b']dithiophene-2,6-diyl |
| 2-5-12 | dithieno[3,2-b:2',3'-d]thiophene-2,6-diyl |
| 2-5-13 | 4-dodecyl-4H-dithieno[3,2-b:2',3'-d]pyrrole-2,6-diyl |

TABLE 49-continued
2-5-14 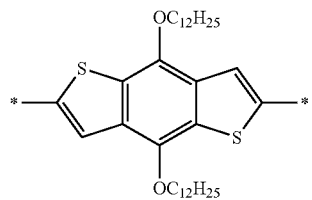
2-5-15 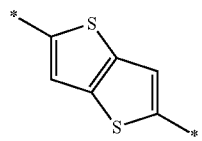
2-5-16 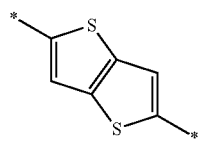
2-5-17 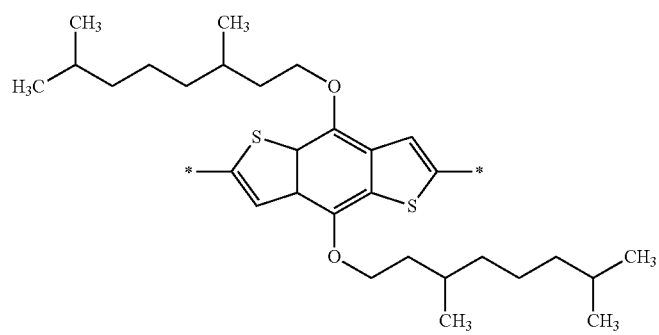
2-5-18 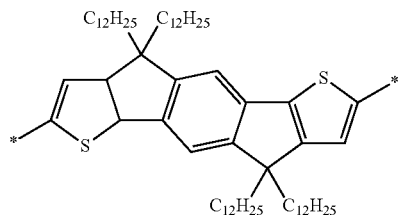
2-5-19 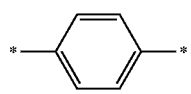
2-5-20 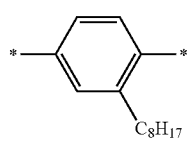

TABLE 49-continued

| | Ar$^{104}$ | R$^{115}$ | R$^{116}$ |
|---|---|---|---|
| 2-5-11 | (structure) | H | H |
| 2-5-12 | (structure) | *—CH$_3$ | *—CH$_3$ |
| 2-5-13 | (structure) | (structure with OC$_{10}$H$_{21}$ and C$_8$H$_{17}$) | H |
| 2-5-14 | (structure) | H | H |
| 2-5-15 | (structure) | H | H |
| 2-5-16 | (structure) | (structure with C$_{10}$H$_{21}$ and C$_{12}$H$_{25}$) | H |
| 2-5-17 | (structure) | H | H |

TABLE 49-continued
| | | | | | |
|---|---|---|---|---|---|
| 2-5-18 |  | | | 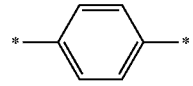 | H |
| 2-5-19 | 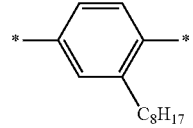 | | | H | *—C$_6$H$_{13}$ |
| 2-5-20 | 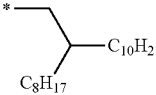 | | | 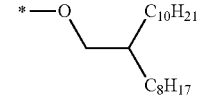 | H |
| | R$^{117}$ | R$^{118}$ | R$^{137}$ | R$^{138}$ | R$^{139}$ |
|---|---|---|---|---|---|
| 2-5-11 | H | H | *—OC$_6$H$_{13}$ | H | *—OC$_6$H$_{13}$ |
| 2-5-12 | *—CH$_3$ | *—CH$_3$ | H | H | 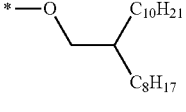 |
| 2-5-13 | H | 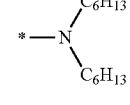 | H | H | 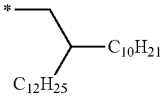 |
| 2-5-14 | H | H | H | *—OC$_8$H$_{17}$ | H |
| 2-5-15 | H | H | H | *—C$_6$H$_{13}$ | H |
| 2-5-16 | H | 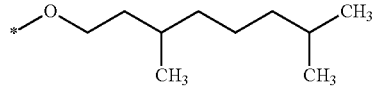 | H | H | 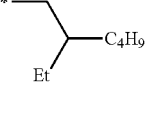 |
| 2-5-17 | H | H | H | H | H |
| 2-5-18 | H | 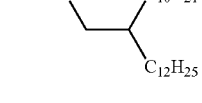 | H | H | *—Et |
| 2-5-19 | *—C$_6$H$_{13}$ | H | H | H | 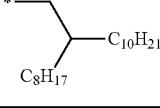 |
| 2-5-20 | H | 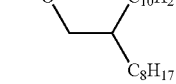 | H | H | *—OEt |
| | R$^{140}$ | R$^{141}$ | R$^{142}$ |
|---|---|---|---|
| 2-5-11 | *—OC$_6$H$_{13}$ | H | *—OC$_6$H$_{13}$ |
| 2-5-12 | H | H | *—O—CH$_2$CH(C$_{10}$H$_{21}$)(C$_8$H$_{17}$) |

TABLE 49-continued

| | | | |
|---|---|---|---|
| 2-5-13 | H | H | 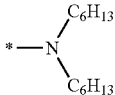 |
| 2-5-14 | H | *—OC$_8$H$_{17}$ | H |
| 2-5-15 | H | *—C$_6$H$_{13}$ | H |
| 2-5-16 | H | H | 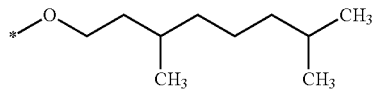 |
| 2-5-17 | H | H | H |
| 2-5-18 | H | H | *—Et |
| 2-5-19 | H | H | 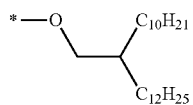 |
| 2-5-20 | H | H | *—OEt |

The compound composed of n repeating units represented by Formula (1-1), (1-2), (101-1), or (101-2) is a compound having two or more repeating units. The compound may be an oligomer in which the number n of the repeating units is 2 to 9 or a polymer in which the number n of the repeating units is equal to or greater than 10.

When the compound composed of n repeating units represented by Formula (1-1), (1-2), (101-1), or (101-2) is an oligomer having 2 to 9 repeating units, the molecular weight thereof is preferably equal to or greater than 1,500 and more preferably equal to or greater than 2,000.

When the compound composed of n repeating units represented by Formula (1-1), (1-2), (101-1), or (101-2) is a polymer compound, the weight average molecular weight thereof is preferably equal to or greater than 10,000, more preferably equal to or greater than 30,000, and particularly preferably equal to or greater than 50,000. The upper limit of the weight average molecular weight is not particularly limited, but it is preferably equal to or less than 2,000,000 and more preferably equal to or less than 1,000,000. It is preferable that the molecular weight is equal to or less than the upper limit described above, because the intermolecular interaction can be improved, the improved intermolecular interaction favors the transport of carriers, and the solubility in a solvent can also be maintained.

In the present invention, the weight average molecular weight is a value measured by gel permeation chromatography (GPC) using high-performance GPC (HLC-8220GPC) manufactured by TOSOH CORPORATION by means of dissolving a polymer in tetrahydrofuran (THF). In the present invention, the weight average molecular weight is a value expressed by using polystyrene as a standard substance.

The compound composed of n repeating units represented by Formula (1-1), (1-2), (101-1), or (101-2) can be synthesized by, for example, the coupling reaction described in "Chemical Reviews, 2011, vol. 111, p. 1493".

For synthesizing the compound of the present invention, any reaction condition may be used. As a reaction solvent, any solvent may be used. Furthermore, in order to accelerate a ring-forming reaction, an acid or a base is preferably used, and a base is particularly preferably used. The optimal reaction condition varies with the intended structure of the cyclohexadienone derivative, but can be set with reference to the specific reaction conditions described in the aforementioned document.

The synthetic intermediate having various substituents can be synthesized by using known reactions in combination. Furthermore, various substituents may be introduced at any stage of the intermediate. After the intermediate is synthesized, it is preferable to purify the intermediate by column chromatography, recrystallization, and the like.

<Structure of Organic Film Transistor>

The organic film transistor of the present invention has a semiconductor active layer containing the compound composed of n repeating units represented by Formula (1-1), (1-2), (101-1), or (101-2).

The organic film transistor of the present invention may further have layers other than the semiconductor active layer.

The organic film transistor of the present invention is preferably used as an organic field effect transistor (FET), and is more preferably used as an insulated gate-type FET in which gate channels are insulated from each other.

Hereinafter, preferred structural embodiments of the organic film transistor of the present invention will be specifically described by using drawings, but the present invention is not limited to the embodiments.

(Lamination Structure)

The lamination structure of the organic field effect transistor is not particularly limited, and various known structures can be adopted.

For example, the organic film transistor of the present invention can adopt a structure (bottom gate-top contact type) in which an electrode, an insulating layer, a semiconductor active layer (organic semiconductor layer), and two electrodes are arranged in this order on the upper surface of a substrate as a lower most layer. In this structure, the electrode on the upper surface of the substrate as the lower most layer is provided in a portion of the substrate, and the insulating layer is disposed to come into contact with the substrate in a portion other than the electrode. The two electrodes provided on the upper surface of the semiconductor active layer are arranged in a state of being separated from each other.

FIG. 1 shows the constitution of a bottom gate-top contact-type element. FIG. 1 is a schematic view showing the cross-section of an exemplary structure of the organic film transistor of the present invention. In the organic film transistor shown in FIG. 1, a substrate 11 is disposed as a lower most layer, an electrode 12 is provided in a portion of the upper surface thereof, and an insulating layer 13 is provided such that it covers the electrode 12 and comes into contact with the substrate 11 in a portion other than the electrode 12. On the upper surface of the insulating layer 13, a semiconductor active layer 14 is provided, and in a portion of the upper surface thereof, two electrodes 15a and 15b separated from each other are arranged.

In the organic film transistor shown in FIG. 1, the electrode 12 is a gate, and the electrode 15a and the electrode 15b are a drain and a source respectively. The organic film transistor shown in FIG. 1 is an insulated gate-type FET in which a channel as a path of electric currents between the drain and the source is insulated from the gate.

As an example of the structure of the organic film transistor of the present invention, a bottom gate-bottom contact-type element can be exemplified.

Figure 2:
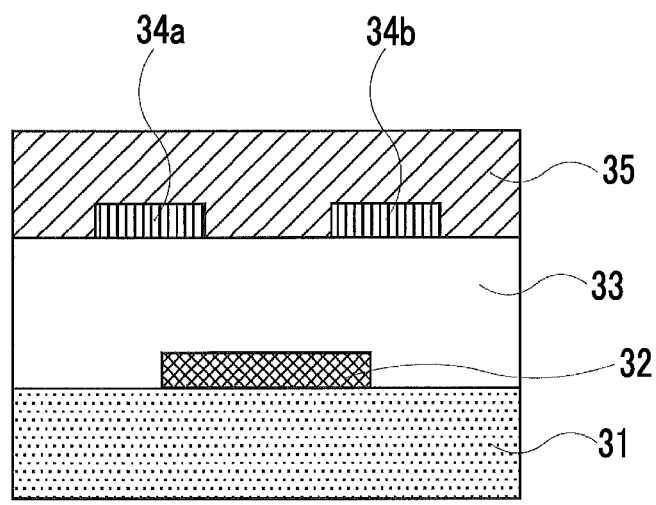
FIG. 2 is a schematic view showing the cross-section of a structure of an organic film transistor manufactured as a substrate for measuring FET characteristics in examples of the present invention.

FIG. 2 shows the constitution of the bottom gate-bottom contact-type element. FIG. 2 is a schematic view showing the cross-section of the structure of an organic film transistor manufactured as a substrate for measuring FET characteristics in examples of the present invention. In the organic film transistor of FIG. 2, a substrate 31 is disposed as a lower most layer, an electrode 32 is provided in a portion of the upper surface thereof, and an insulating layer 33 is provided such that it covers the electrode 32 and comes into contact with the substrate 31 in a portion other than the electrode 32. Furthermore, a semiconductor active layer 35 is provided on the upper surface of the insulating layer 33, and electrodes 34a and 34b are in a lower portion of the semiconductor active layer 35.

In the organic film transistor shown in FIG. 2, the electrode 32 is a gate, and the electrode 34a and the electrode 34b are a drain and a source respectively. The organic film transistor shown in FIG. 2 is an insulated gate-type FET in which a channel as a path of electric currents between the drain and the source is insulated from the gate.

As the structure of the organic film transistor of the present invention, a top gate-top contact-type element in which an insulator and a gate electrode are in the upper portion of a semiconductor active layer or a top gate-bottom contact-type element can also be preferably used.

(Thickness)

When the organic film transistor of the present invention needs to be a thinner transistor, the total thickness of the transistor is preferably, for example, within a range of 0.1 m to 0.5 m.

(Sealing)

In order to improve the storage stability of the organic film transistor element by blocking the organic film transistor element from the atmosphere or moisture, the entirety of the organic film transistor element may be sealed with a metal sealing can, glass, an inorganic material such as silicon nitride, a polymer material such as parylene, a low-molecular weight material, or the like.

Hereinafter, preferred embodiments of the respective layers of the organic film transistor of the present invention will be described, but the present invention is not limited to the embodiments.

<Substrate>

(Material)

The organic film transistor of the present invention preferably includes a substrate.

The material of the substrate is not particularly limited, and known materials can be used. Examples of the material include a polyester film such as polyethylene naphthalate (PEN) or polyethylene terephthalate (PET), a cycloolefin polymer film, a polycarbonate film, a triacetylcellulose (TAC) film, a polyimide film, a material obtained by bonding these polymer films to extremely thin glass, ceramics, silicon, quartz, glass, and the like. Among these, silicon is preferable.

<Electrode>

(Material)

The organic film transistor of the present invention preferably includes an electrode.

As the material constituting the electrode, known conductive materials such as a metal material like Cr, Al, Ta, Mo, Nb, Cu, Ag, Au, Pt, Pd, In, Ni, or Nd, an alloy material of these, a carbon material, and a conductive polymer can be used without particular limitation.

(Thickness)

The thickness of the electrode is not particularly limited, but is preferably within a range of 10 nm to 50 nm.

A gate width (or a channel width) W and a gate length (or a channel length) L are not particularly limited. However, a ratio of W/L is preferably equal to or greater than 10, and more preferably equal to or greater than 20.

<Insulating Layer>

(Material)

The material constituting the insulating layer is not particularly limited as long as an insulating effect is obtained as required. Examples of the material include silicon dioxide, silicon nitride, a fluorine polymer-based insulating material such as PTFE or CYTOP, a polyester insulating material, a polycarbonate insulating material, an acrylic polymer-based insulating material, an epoxy resin-based insulating material, a polyimide insulating material, a polyvinyl phenol resin-based insulating material, a poly p-xylylene resin-based insulating material, and the like.

A surface treatment may be performed on the upper surface of the insulating layer. For example, it is possible to preferably use an insulating layer in which the silicon dioxide surface thereof is subjected to the surface treatment by being coated with hexamethyldisilazane (HMDS) or octadecyltrichlorosilane (OTS).

(Thickness)

The thickness of the insulating layer is not particularly limited. However, when the thickness of the film is required to be reduced, the thickness of the insulating layer is preferably within a range of 10 nm to 400 nm, more preferably within a range of 20 nm to 200 nm, and particularly preferably within a range of 50 nm to 200 nm.

<Semiconductor Active Layer>

(Material)

In the organic film transistor of the present invention, the semiconductor active layer contains a compound which is composed of n repeating units represented by Formula (1-1), (1-2), (101-1), or (101-2) described above. That is, the organic film transistor contains the compound of the present invention.

The semiconductor active layer may be a layer composed of the compound of the present invention or a layer further containing a polymer binder, which will be described later, in addition to the compound of the present invention. Furthermore, the semiconductor active layer may contain a residual solvent used at the time of forming a film.

The content of the polymer binder in the semiconductor active layer is not particularly limited. However, the content of the polymer binder used is preferably within a range of 0% by mass to 95% by mass, more preferably within a range of 10% by mass to 90% by mass, even more preferably within a range of 20% by mass to 80% by mass, and particularly preferably within a range of 30% by mass to 70% by mass.

(Thickness)

The thickness of the semiconductor active layer is not particularly limited. However, when the thickness of the film is required to be reduced, the thickness of the semiconductor active layer is preferably within a range of 10 nm to 400 nm, more preferably within a range of 10 nm to 200 nm, and particularly preferably within a range of 10 nm to 100 nm.

[Organic Semiconductor Material for Non-Light-Emitting Organic Semiconductor Device]

The present invention also relates to an organic semiconductor material for a non-light-emitting organic semiconductor device containing the compound composed of n repeating units represented by Formula (1-1), (1-2), (101-1) or (101-2) described above, that is, an organic semiconductor material for a non-light-emitting organic semiconductor device containing the compound of the present invention.

(Non-Light-Emitting Organic Semiconductor Device)

In the present specification, a "non-light-emitting organic semiconductor device" refers to a device which is not used for the purpose of emitting light. The non-light-emitting organic semiconductor device preferably uses an electronic element having a structure composed of thin films layered on each other. The non-light-emitting organic semiconductor device includes an organic film transistor (also referred to as an organic thin film transistor), an organic photoelectric conversion element (a solid-state imaging element used for a photosensor, a solar cell used for energy conversion, or the like), a gas sensor, an organic rectifying element, an organic inverter, an information recording element, and the like. The organic photoelectric conversion element can be used for a photosensor (solid-state imaging element) and for energy conversion (a solar cell). Among these, an organic photoelectric conversion element and an organic film transistor are preferable, and an organic film transistor is more preferable. That is, the organic semiconductor material for a non-light-emitting organic semiconductor device of the present invention is preferably a material for an organic film transistor as described above.

(Organic Semiconductor Material)

In the present specification, the "organic semiconductor material" is an organic material showing characteristics of a semiconductor. Just like the semiconductor composed of an inorganic material, the organic semiconductor is classified into a p-type (hole-transporting) organic semiconductor conducting holes as carriers and an n-type (electron transporting) organic semiconductor conducting electrons as carriers.

The compound of the present invention may be used as any of the p-type organic semiconductor material and the n-type organic semiconductor material, but is preferably used as the p-type. The ease with which the carriers flow in the organic semiconductor is represented by a carrier mobility $\mu$. The higher the carrier mobility $\mu$, the more preferable. The carrier mobility $\mu$ is preferably equal to or greater than $1 \times 10^{-3}$ cm$^2$N/Vs, more preferably equal to or greater than $5 \times 10^{-3}$ cm$^2$/Vs, particularly preferably equal to or greater than $1 \times 10^{-2}$ cm$^2$/Vs, more particularly preferably equal to or greater than $1 \times 10^{-1}$ cm$^2$/Vs, and even more particularly preferably equal to or greater than 1 cm$^2$/Vs. The carrier mobility h can be determined by the characteristics of the prepared field effect transistor (FET) element or by a time-of-flight (TOF) measurement method.

[Organic Semiconductor Film for Non-Light-Emitting Organic Semiconductor Device]

(Material)

The present invention also relates to an organic semiconductor film for a non-light-emitting organic semiconductor device containing the compound composed of n repeating units represented by Formula (1-1), (1-2), (101-1) or (101-2), that is, the present invention also relates to an organic semiconductor film for a non-light-emitting organic semiconductor device containing the compound of the present invention.

As the organic semiconductor film for a non-light-emitting organic semiconductor device of the present invention, an embodiment is preferable in which the organic semiconductor film contains the compound composed of n repeating units represented by Formula (1-1), (1-2), (101-1) or (101-2), that is, the compound of the present invention, and does not contain a polymer binder.

Furthermore, the organic semiconductor film for a non-light-emitting organic semiconductor device of the present invention may contain the compound composed of n repeating units represented by Formula (1-1), (1-2), (101-1) or (101-2), that is, the compound of the present invention, and a polymer binder.

Examples of the polymer binder include an insulating polymer such as polystyrene, polycarbonate, polyarylate, polyester, polyamide, polyimide, polyurethane, polysiloxane, polysulfone, polymethyl methacrylate, polymethyl acrylate, cellulose, polyethylene, or polypropylene, a copolymer of these, a photoconductive polymer such as polyvinylcarbazole or polysilane, a conductive polymer such as polythiophene, polypyrrole, polyaniline, or poly p-phenylenevinylene, and a semiconductor polymer.

One kind of the aforementioned polymer binder may be used singly, or plural kinds thereof may be used concurrently.

The organic semiconductor material may be uniformly mixed with the polymer binder. Alternatively, the organic semiconductor material and the polymer binder may be totally or partially in a phase separation state. From the viewpoint of the charge mobility, a structure, in which the organic semiconductor and the binder are in a phase separation state in the film thickness direction within the film, is the most preferable because the binder does not hinder the organic semiconductor from moving a charge.

Considering the mechanical strength of the film, a polymer binder having a high glass transition temperature is preferable. Furthermore, considering the charge mobility, a polymer binder having a structure not containing a polar group, a photoconductive polymer, and a conductive polymer are preferable.

The amount of the polymer binder used is not particularly limited. However, in the organic semiconductor film for a non-light-emitting organic semiconductor device of the present invention, the amount of the polymer binder used is preferably within a range of 0% by mass to 95% by mass, more preferably within a range of 10% by mass to 90% by mass, even more preferably within a range of 20% by mass to 80% by mass, and particularly preferably within a range of 30% by mass to 70% by mass.

If the compound of the present invention has the structure described above, an organic film having excellent quality can be obtained. Specifically, because the compound obtained in the present invention has excellent crystallinity, a sufficient film thickness can be obtained, and the obtained organic semiconductor film for a non-light-emitting organic semiconductor device of the present invention has excellent quality.

(Film Forming Method)

The compound of the present invention may be formed into a film on a substrate by any method.

At the time of forming the film, the substrate may be heated or cooled. By changing the temperature of the substrate, it is possible to control the film quality or the packing of molecules in the film. The temperature of the substrate is not particularly limited. However, it is preferably between 0° C. to 200° C., more preferably between 15° C. to 100° C., and particularly preferably between 20° C. to 95° C.

The compound of the present invention can be formed into a film on a substrate by a vacuum process or a solution process, and both the processes are preferable.

Specific examples of the film forming method by a vacuum process include a physical vapor deposition method such as a vacuum vapor deposition method, a sputtering method, an ion plating method, or a molecular beam epitaxy (MBE) method and a chemical vapor deposition (CVD) method such as plasma polymerization, and it is particularly preferable to use a vacuum vapor deposition method.

Herein, the film forming method by a solution process refers to a method of dissolving an organic compound in a solvent which can dissolve the compound and forming a film by using the solution. Specifically, a substrate is coated with the composition of the present invention containing the compound, which is composed of n repeating units represented by Formula (1-1), (1-2), (101-1), or (101-2) and an organic solvent. Concretely, it is possible to use general methods like a coating method such as a casting method, a dip coating method, a die coating method, a roll coating method, a bar coating method, or a spin coating method, various printing methods such as an inkjet method, a screen printing method, a gravure printing method, a flexographic printing method, an offset printing method, or a micro-contact printing method, and a Langmuir-Blodgett (LB) method. It is particularly preferable to use a casting method, a spin coating method, an inkjet method, a gravure printing method, a flexographic printing method, an offset printing method, or a micro-contact printing method.

The organic semiconductor film for a non-light-emitting organic semiconductor device of the present invention is preferably prepared by a solution coating method. When the organic semiconductor film for a non-light-emitting organic semiconductor device of the present invention contains a polymer binder, it is preferable to prepare a coating solution by dissolving or dispersing a material, which will be formed into a layer, and a polymer binder in an appropriate solvent and to form the organic semiconductor film by various coating methods.

Hereinafter, a coating solution for a non-light-emitting organic semiconductor device of the present invention that can be used for forming a film by a solution process will be described.

[Composition and Coating Solution for Non-Light-Emitting Organic Semiconductor Device]

The present invention also relates to a composition containing the compound composed of n repeating units represented by Formula (1-1), (1-2), (101-1), or (101-2), that is, a composition containing the compound of the present invention and a coating solution for a non-light-emitting organic semiconductor device.

When a film is formed on a substrate by using a solution process, a material which will be formed into a layer is dissolved or dispersed in either or both of an appropriate organic solvent (for example, a hydrocarbon-based solvent such as hexane, octane, decane, toluene, xylene, mesitylene, ethylbenzene, decalin, or 1-methylnaphthalene, a ketone-based solvent such as acetone, methyl ethyl ketone, methyl isobutyl ketone, or cyclohexanone, a halogenated hydrocarbon-based solvent such as dichloromethane, chloroform, tetrachloromethane, dichloroethane, trichloroethane, tetrachloroethane, chlorobenzene, dichlorobenzene, or chlorotoluene, an ester-based solvent such as ethyl acetate, butyl acetate, or amyl acetate, an alcohol-based solvent such as methanol, propanol, butanol, pentanol, hexanol, cyclohexanol, methyl cellosolve, ethyl cellosolve, or ethylene glycol, an ether-based solvent such as dibutylether, tetrahydrofuran, dioxane, or anisole, an amide•imide-based solvent such as N,N-dimethylformamide, N,N-dimethylacetamide, 1-methyl-2-pyrrolidone, or 1-methyl-2-imidazolidinone, a sulfoxide-based solvent such as dimethyl sulfoxide, or a nitril-based solvent such as acetonitrile) and/or water so as to obtain a coating solution, and a film can be formed by various coating methods by using the coating solution. One kind of the solvent may be used singly, or plural kinds thereof may be used in combination. Among these, an aromatic hydrocarbon-based solvent, a halogenated hydrocarbon-based solvent, an ether-based solvent, or a ketone-based solvent is preferable, and an aromatic hydrocarbon-based solvent, an ether-based solvent, or a ketone-based solvent is more preferable. Specifically, toluene, xylene, mesitylene, tetralin, chlorobenzene, dichlorobenzene, anisole, isophorone, diisopropylbenzene, and s-butylbenzene are more preferable, and toluene, xylene, tetralin, diisopropylbenzene, and s-butylbenzene are particularly preferable. The concentration of the compound, which is composed of n repeating units represented by Formula (1-1), (1-2), (101-1), or (101-2), in the coating solution is preferably 0.1% by mass to 80% by mass, more preferably 0.1% by mass to 10% by mass, and particularly preferably 0.5% by mass to 10% by mass. The thickness of the formed film can be arbitrarily set.

Among the above solvents, from the viewpoint of improving the solubility of the compound, which is composed of n repeating units represented by Formula (1-1), (1-2), (101-1), or (101-2), and the carrier mobility, an active hydrogen-free aromatic solvent having a boiling point of equal to or greater than 150° C. is preferable as the organic solvent. Examples of such a solvent include tetralin, dichlorobenzene, anisole, isophorone, diisopropylbenzene, s-butylbenzene, and the like. As the organic solvent used in the present invention, dichlorobenzene, tetralin, diisopropylbenzene, and s-butylbenzene are preferable, and tetralin, diisopropylbenzene, and s-butylbenzene are more preferable.

In order to form a film by a solution process, the material needs to dissolve in the solvent exemplified above, but simply dissolving in a solvent is not good enough. Generally, even the material formed into a film by a vacuum process can dissolve in a solvent to some extent. The solution process includes a step of coating a substrate with a material by dissolving the material in a solvent and then forming a film by evaporating the solvent, and many of the materials not suitable for being formed into a film by the solution process have high crystallinity. Therefore, the material is inappropriately crystallized (aggregated) in the step, and hence it is difficult to form an excellent film. The compound composed of n repeating units represented by Formula (1-1), (1-2), (101-1), or (101-2) is also excellent in the respect that it is not easily crystallized (aggregated).

As the coating solution for a non-light-emitting organic semiconductor device of the present invention, an embodiment is also preferable in which the coating solution contains the compound composed of n repeating units represented by Formula (1-1), (1-2), (101-1), or (101-2), that is, the compound of the present invention, and does not contain a polymer binder.

Furthermore, the coating solution for a non-light-emitting organic semiconductor device of the present invention may contain the compound composed of n repeating units represented by Formula (1-1), (1-2), (101-1), or (101-2), that is, the compound of the present invention, and a polymer binder. In this case, a material, which will be formed into a layer, and a polymer binder are dissolved or dispersed in an appropriate solvent described above so as to prepare a coating solution, and by using the coating solution, a film can be formed by various coating methods. The polymer binder can be selected from those described above.

EXAMPLES

Hereinafter, the characteristics of the present invention will be more specifically explained by describing examples and comparative examples. The materials, the amount thereof used, the proportion thereof, the content of treatment, the treatment procedure, and the like described in the following examples can be appropriately modified within a range that does not depart from the gist of the present invention. Accordingly, the scope of the present invention is not limited to the following specific examples.

Example 1

Synthesis Example 1

Synthesis of Compound 3

According to a specific synthesis procedure shown in the following scheme, a compound composed of n repeating units represented by Formula (1-1) was synthesized as Compound 3. An intermediate 5 was synthesized with reference to the method described in "Journal of the American Chemical Society, 2013, vol. 135, p. 4656".

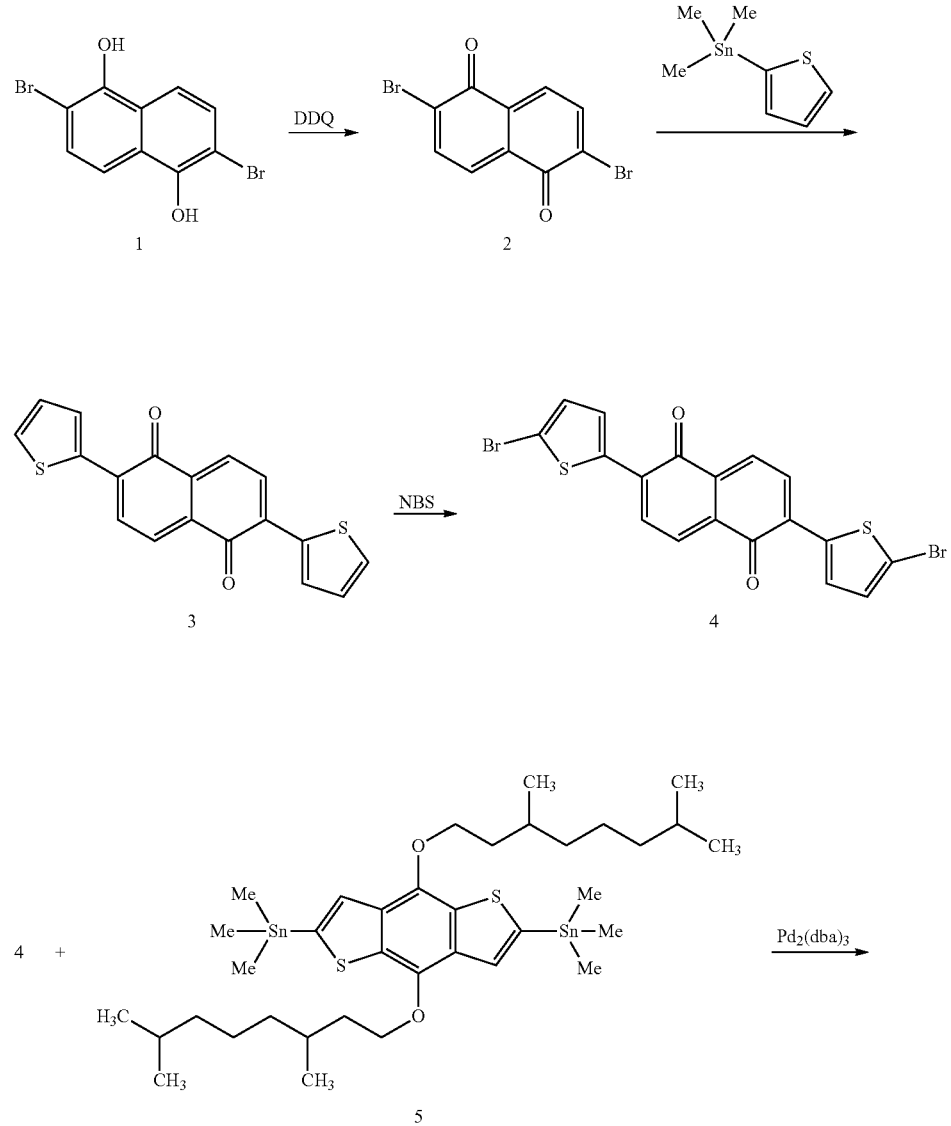

-continued

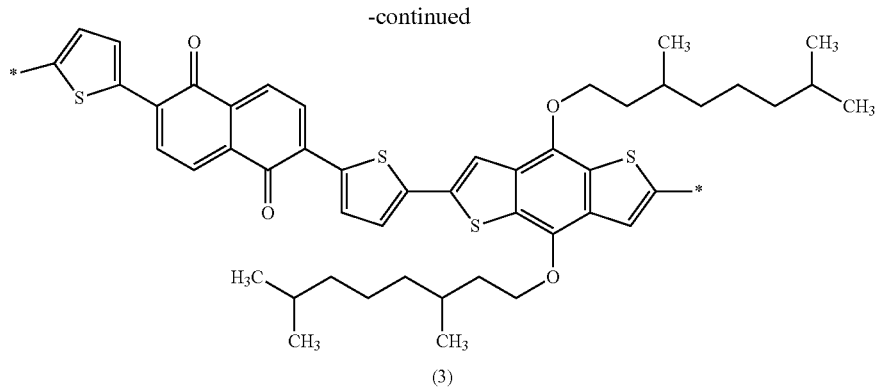

(3)

The obtained compound was identified by elemental analysis and NMR spectroscopy.

The compound composed of n repeating units represented by Formula (1-1) that was used in other examples was synthesized in the same manner as Compound 3.

Example 2

Synthesis Example 2

Synthesis of Compound 111

According to a specific synthesis procedure shown in the following scheme, a compound composed of n repeating units represented by Formula (1-2) was synthesized as Compound 111. In the following scheme, an intermediate 1 was synthesized with reference to the method described in EP1916279A2. An intermediate 9 was synthesized in substantially the same manner as the intermediate 5 in Example 1.

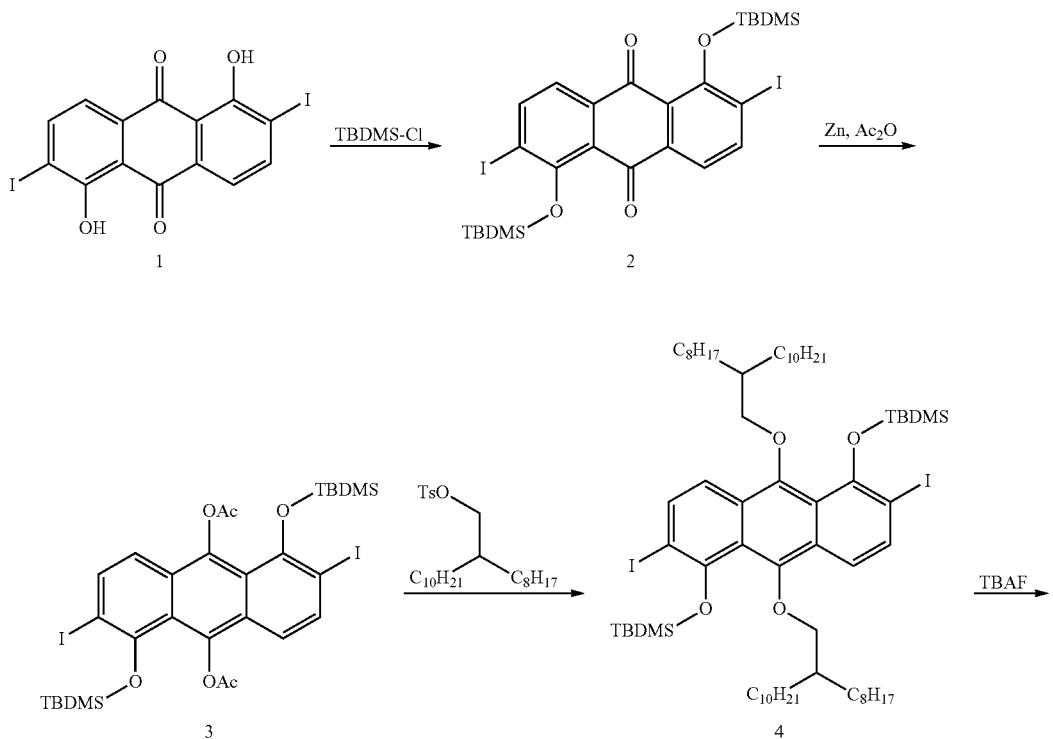

-continued
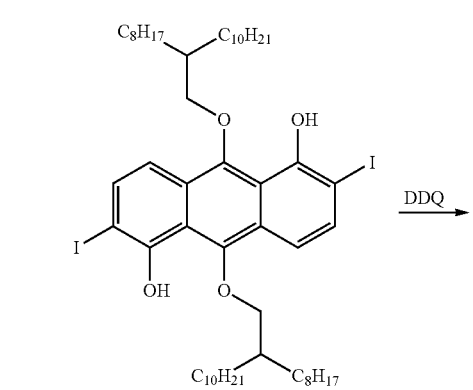
5
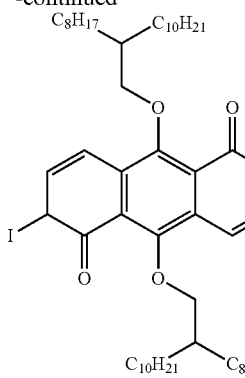
6
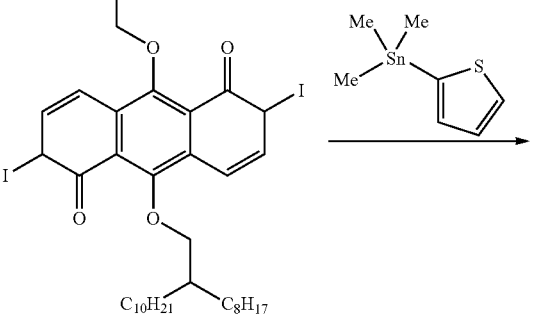
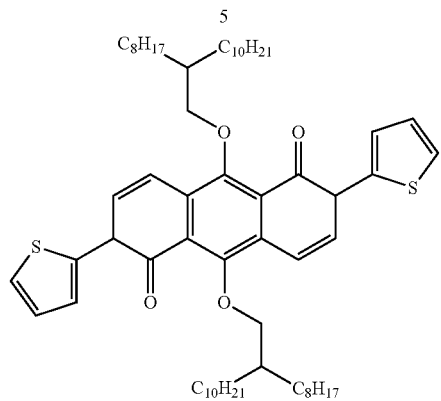
7
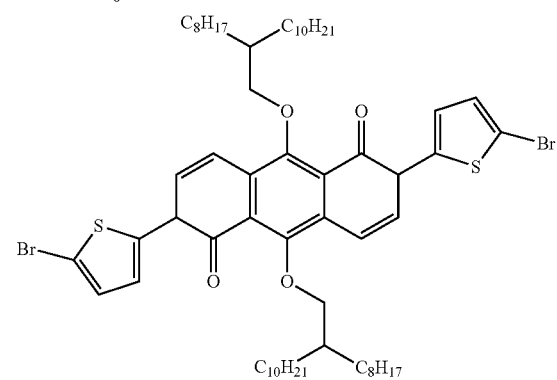
8
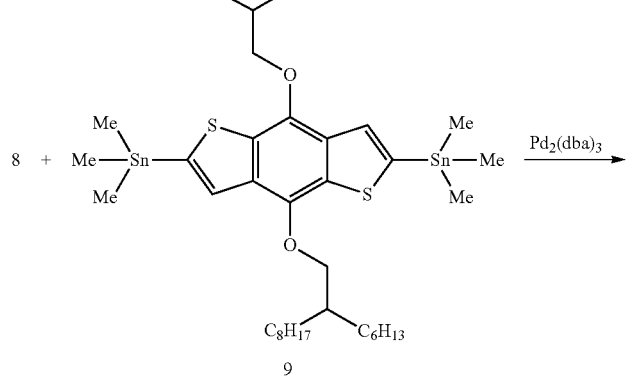
9
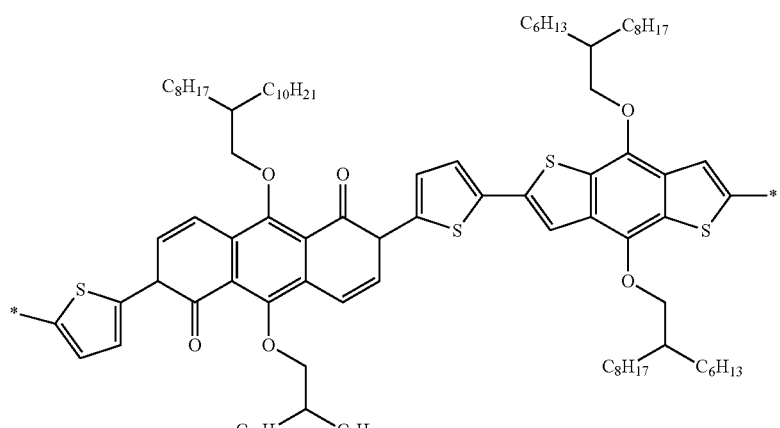
(111)

The obtained compound was identified by elemental analysis and NMR spectroscopy.

As a result of measuring the molecular weight of each compound by the method described in the present specification, it was found that the weight average molecular weight of each compound was within a range of 50,000 to 200,000. That is, it was found that the number n of the repeating unit of each compound represented by Formula (1-1) or (1-2) was within a range of 50 to 200.

The compound composed of n repeating units represented by Formula (1-2) that was used in other examples was synthesized in the same manner as Compound 111.

Comparative compounds 1 and 2 used in a semiconductor active layer (organic semiconductor layer) of a comparative element were synthesized according to the method described in the respective documents. The structures of Comparative Compounds 1 and 2 are shown below.

Comparative Compound 1: a compound PBDN described in Chem. Mater., 2009, 21, 5499

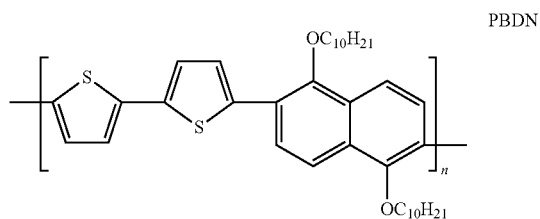

Comparative Compound 2: a compound described in US2004/116700A1

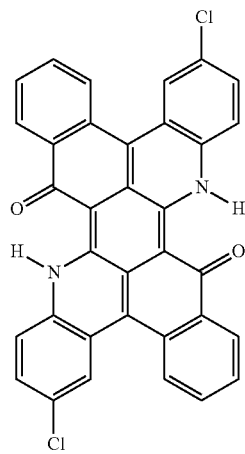 [SMILES: O=c1c2ccccc2c2c3cc(Cl)ccc3[nH]c3c4c(=O)c5ccccc5c5c6cc(Cl)ccc6[nH]c(c1c32)c45]

Preparation Evaluation of Element

Example 3

Preparation of Coating Solution for Non-Light-Emitting Organic Semiconductor Device The compound of the present invention or the comparative compound (10 mg each) was mixed with toluene (1 mL), and the mixture was heated to 100° C., thereby preparing a composition. The composition was used as a coating solution for a non-light-emitting organic semiconductor device of Example 2. The coating solution in which the compound was not completely dissolved was filtered through a 0.2 μm filter.

<Formation of Semiconductor Active Layer (Organic Semiconductor Layer) by Using Compound Alone>

By performing spin coating of the coating solution for a non-light-emitting organic semiconductor device in a nitrogen atmosphere, an organic semiconductor film for a non-light-emitting organic semiconductor device was formed, thereby obtaining an organic film transistor element of Example 3 that was for measuring FET characteristics. As a substrate for measuring FET characteristics, a silicon substrate having a bottom gate-bottom contact structure was used which included chromium/gold (gate width W=100 mm, gate length L=100 μm) arranged to form a comb pattern as source and drain electrodes and included $SiO_2$ (film thickness: 200 nm) as an insulating layer (the structure is schematically shown in FIG. 2).

By using a semiconductor parameter analyzer (4156C manufactured by Agilent Technologies) connected to a semiautomatic prober (AX-2000 manufactured by Vector Semiconductor Co., Ltd.), the FET characteristics of the organic film transistor element of Example 3 were evaluated in a normal pressure-nitrogen atmosphere, from the viewpoint of the carrier mobility, the threshold voltage shift after repeated driving, and the film formability.

Furthermore, the coating solution for a non-light-emitting organic semiconductor device of Example 3 was evaluated from the viewpoint of the solubility.

The obtained results are shown in the following Table 50.

(a) Solubility Evaluation

The compound of the present invention or the comparative compound (10 mg each) was mixed with toluene (1 mL), and the mixture was heated to 100° C. Thereafter, the mixture was left for 30 minutes at room temperature. From the amount of the precipitated solid, the degree of solubility was evaluated into 3 levels as below.

A: No solid precipitated.

B: The amount of the precipitated solid was less than 30%.

C: The amount of the precipitated solid was equal to or greater than 30%.

(b) Carrier Mobility

Between the source electrode and the drain electrode of each organic film transistor element (FET element), a voltage of −50 V was applied, and the gate voltage was varied within a range of 20 V to −100 V. In this way, by using Equation $I_d=(w/2L)\mu C_i(V_g-V_{th})^2$, a carrier mobility μ was calculated (in the equation, $I_d$ represents a drain current; L represents a gate length; W represents a gate width; $C_i$ represents a capacity of the insulating layer per unit area; $V_g$ represents a gate voltage; and $V_{th}$ represents a threshold voltage). Herein, because the characteristics of the element having a carrier mobility of less than $1\times10^{-5}$ cm²/Vs were too poor, the element was not subjected to the evaluation of (c) Threshold voltage shift after repeated driving described below.

(c) Threshold Voltage Shift after Repeated Driving

Between the source electrode and the drain electrode of each organic film transistor element (FET element), a voltage of −80 V was applied, and the element was repeatedly driven 100 times by varying the gate voltage within a range of +20 V to −100 V. In this way, the element was measured in the same manner as in the section (a), and a difference between a threshold voltage $V_{before}$ before the repeated driving and a threshold voltage $V_{after}$ after the repeated driving ($|V_{after}-V_{before}|$) was evaluated into 3 levels as below. The smaller the difference, the higher the stability of the element against repeated driving. Therefore, the smaller the difference, the more preferable.

A: $|V_{after}-V_{before}| \leq 5$ V
B: $5$ V$<|V_{after}-V_{before}| \leq 10$ V
C: $|V_{after}-V_{before}| > 10$ V (d) Film Formability Evaluation Each of the obtained organic film transistor elements was observed with unaided eyes and with an optical microscope. By the method described above, 10 elements were prepared, and the ratio of film cissing that occurred on the source and drain electrodes was evaluated.

The results were evaluated into 3 levels as below.
A: Less than 10%
B: Equal to or greater than 10% and less than 30%
C: Equal to or greater than 30%

(e) Element Variation

The mobility of the prepared 30 elements was measured, and a coefficient of variation was calculated. The results were evaluated into 3 levels as below.
A: Less than 30%
B: Equal to or greater than 30% and less than 50%
C: Equal to or greater than 50% organic film transistor elements using Comparative Compounds 1 and 2, the threshold voltage shift occurred to a great extent after the repeated driving. Furthermore, it was understood that in all of the organic film transistor elements using the compound of the present invention, the smoothness homogeneity of the film are extremely high, and the film formability is excellent.

Example 4

Formation of Semiconductor Active Layer (Organic Semiconductor Layer)

The surface of a silicon wafer, which contained $SiO_2$ (film thickness: 370 nm) as a gate insulating film, was treated with octyltrichlorosilane.

The compound of the present invention or the comparative compound (1 mg each) was mixed with toluene (1 mL), and the mixture was heated to 100° C., thereby preparing a coating solution for a non-light-emitting organic semiconductor device. In a nitrogen atmosphere, the coating solution was cast onto the silicon wafer which had been heated to 90° C. and undergone surface treatment with octylsilane, thereby

TABLE 50

| Element No. | Organic semiconductor material | Solubility | Carrier mobility (cm²/Vs) | Threshold voltage shift after repeated driving | Film formability | Element variation |
|---|---|---|---|---|---|---|
| Element 1 | Compound 3 | A | 0.16 | A | A | A |
| Element 2 | Compound 13 | A | 0.14 | A | A | A |
| Element 3 | Compound 23 | A | 0.20 | A | A | A |
| Element 4 | Compound 95 | B | 0.12 | A | A | A |
| Element 5 | Compound 110 | A | 0.22 | A | A | A |
| Element 6 | Compound 111 | A | 0.23 | A | A | A |
| Element 7 | Compound 160 | A | 0.15 | A | A | A |
| Element 8 | Compound 192 | A | 0.08 | A | A | A |
| Element 9 | Compound 212 | A | 0.09 | A | A | A |
| Element 10 | Compound 233 | A | 0.08 | A | A | A |
| Comparative Element 1 | Comparative Compound 1 | A | 0.02 | C | A | B |
| Comparative Element 2 | Comparative Compound 2 | C | Unevaluable | | C | Unevaluable |

From the above Table 50, it was understood that the compound of the present invention exhibits excellent solubility in an organic solvent, and the organic film transistor element using the compound of the present invention has high carrier mobility. It was also understood that accordingly, the compound of the present invention can be preferably used as an organic semiconductor material for a non-light-emitting organic semiconductor device.

In contrast, the organic film transistor element using Comparative Compound 1 exhibited low carrier mobility. Furthermore, the organic semiconductor material for a non-light-emitting organic semiconductor device using Comparative Compound 2 exhibited low solubility in an organic solvent.

In the organic film transistor element using the compound of the present invention, the threshold voltage shift occurred to a small extent after the repeated driving, and in the forming an organic semiconductor film for a non-light-emitting organic semiconductor device.

Furthermore, gold was deposited onto the surface of the film through a mask so as to prepare source and drain electrodes, thereby obtaining an organic film transistor element having a bottom gate-top contact structure with a gate width W=5 mm and a gate length L=80 µm (the structure is schematically shown in FIG. 1).

By using a semiconductor parameter analyzer (4156C manufactured by Agilent Technologies) connected to a semi-automatic prober (AX-2000 manufactured by Vector Semiconductor Co., Ltd.), the FET characteristics of the organic film transistor element of Example 4 were evaluated in a normal pressure-nitrogen atmosphere, from the viewpoint of the carrier mobility, the threshold voltage shift after repeated driving, and the film formability.

Furthermore, the coating solution for a non-light-emitting organic semiconductor device of Example 4 was evaluated from the viewpoint of the solubility.

The obtained results are shown in the following Table 51.

understood that in all of the organic film transistor elements using the compound of the present invention, the smoothness-homogeneity of the film is extremely high, and the film formability is excellent.

TABLE 51

| Element No. | Organic semiconductor material | Solubility | Carrier mobility (cm²/Vs) | Threshold voltage shift after repeated driving | Film formability | Element variation |
|---|---|---|---|---|---|---|
| Element 101 | Compound 3 | A | 0.21 | A | A | A |
| Element 102 | Compound 23 | A | 0.26 | A | A | A |
| Element 103 | Compound 95 | B | 0.16 | A | A | A |
| Element 104 | Compound 110 | A | 0.29 | A | A | A |
| Element 105 | Compound 111 | A | 0.28 | A | A | A |
| Element 106 | Compound 160 | A | 0.19 | A | A | A |
| Comparative Element 101 | Comparative Compound 1 | A | 0.04 | C | A | B |
| Comparative Element 102 | Comparative Compound 2 | C | Unevaluable | | C | Unevaluable |

From the above Table 51, it was understood that the compound of the present invention exhibits excellent solubility in an organic solvent, and the organic film transistor element using the compound of the present invention has high carrier mobility. It was also understood that accordingly, the compound of the present invention can be preferably used as an organic semiconductor material for a non-light-emitting organic semiconductor device.

In contrast, the organic film transistor element using Comparative Compound 1 exhibited low carrier mobility. Furthermore, the organic semiconductor material for a non-light-emitting organic semiconductor device using Comparative Compound 2 exhibited low solubility in an organic solvent.

Example 5

Formation of Semiconductor Active Layer (Organic Semiconductor Layer) Using Compound with Binder An organic film transistor element for measuring FET characteristics was prepared in the same manner as in Example 3, except that a coating solution was used which was obtained by mixing the compound of the present invention or the comparative compound (1 mg each), 1 mg of PαMS (poly(α-methylstyrene), Mw=300,000), manufactured by Sigma-Aldrich Co. LLC.), and toluene (1 mL) together and heating the mixture at a temperature of 100° C. The element was evaluated in the same manner as in Example 3.

The obtained results are shown in the following Table 52.

TABLE 52

| Element No. | Organic semiconductor material | Solubility | Carrier mobility (cm²/Vs) | Threshold voltage shift after repeated driving | Film formability | Element variation |
|---|---|---|---|---|---|---|
| Element 201 | Compound 3 | A | 0.19 | A | A | A |
| Element 202 | Compound 23 | A | 0.18 | A | A | A |
| Element 203 | Compound 111 | A | 0.25 | A | A | A |
| Comparative Element 201 | Comparative Compound 1 | A | 0.03 | C | A | B |
| Comparative Element 202 | Comparative Compound 2 | C | Unevaluable | | C | Unevaluable |

In the organic film transistor element using the compound of the present invention, the threshold voltage shift occurred to a small extent after the repeated driving, and in the organic film transistor elements using Comparative Compounds 1 and 2, the threshold voltage shift occurred to a great extent after the repeated driving. Furthermore, it was From the above Table 52, it was understood that the compound of the present invention exhibits excellent solubility in an organic solvent, and the organic film transistor element using the compound of the present invention has high carrier mobility. It was also understood that accordingly, the compound of the present invention can be preferably used as an organic semiconductor material for a non-light-emitting organic semiconductor device.

In contrast, the organic film transistor element using Comparative Compound 1 exhibited low carrier mobility. Furthermore, the organic semiconductor material for a non-light-emitting organic semiconductor device using Comparative Compound 2 exhibited low solubility in an organic solvent.

In the organic film transistor element using the compound of the present invention, the threshold voltage shift occurred to a small extent after the repeated driving, and in the organic film transistor elements using Comparative Compounds 1 and 2, the threshold voltage shift occurred to a great extent after the repeated driving. Furthermore, it was understood that in all of the organic film transistor elements using the compound of the present invention, the smoothness-homogeneity of the film are extremely high, and the film formability is excellent.

From the above results, it was understood that while the carrier mobility is extremely low when the semiconductor active layer is formed of a combination of binder-PαMS and the comparative compound in the comparative element, the carrier mobility is excellent even when the semiconductor active layer is formed by using the compound of the present invention with binder-PαMS in the organic film transistor element of the present invention.

Example 1001

Synthesis Example 1001

Synthesis of Compound 1003

According to a specific synthesis procedure shown in the following scheme, a compound composed of n repeating units represented by Formula (101-1) was synthesized as Compound 1003. An intermediate 1 was synthesized with reference to the method described in "Journal of the American Chemical Society, 1991, vol. 113, p. 1862", and an intermediate 4 was synthesized with reference to the method described in "Journal of the American Chemical Society, 2013, vol. 135, p. 4656".

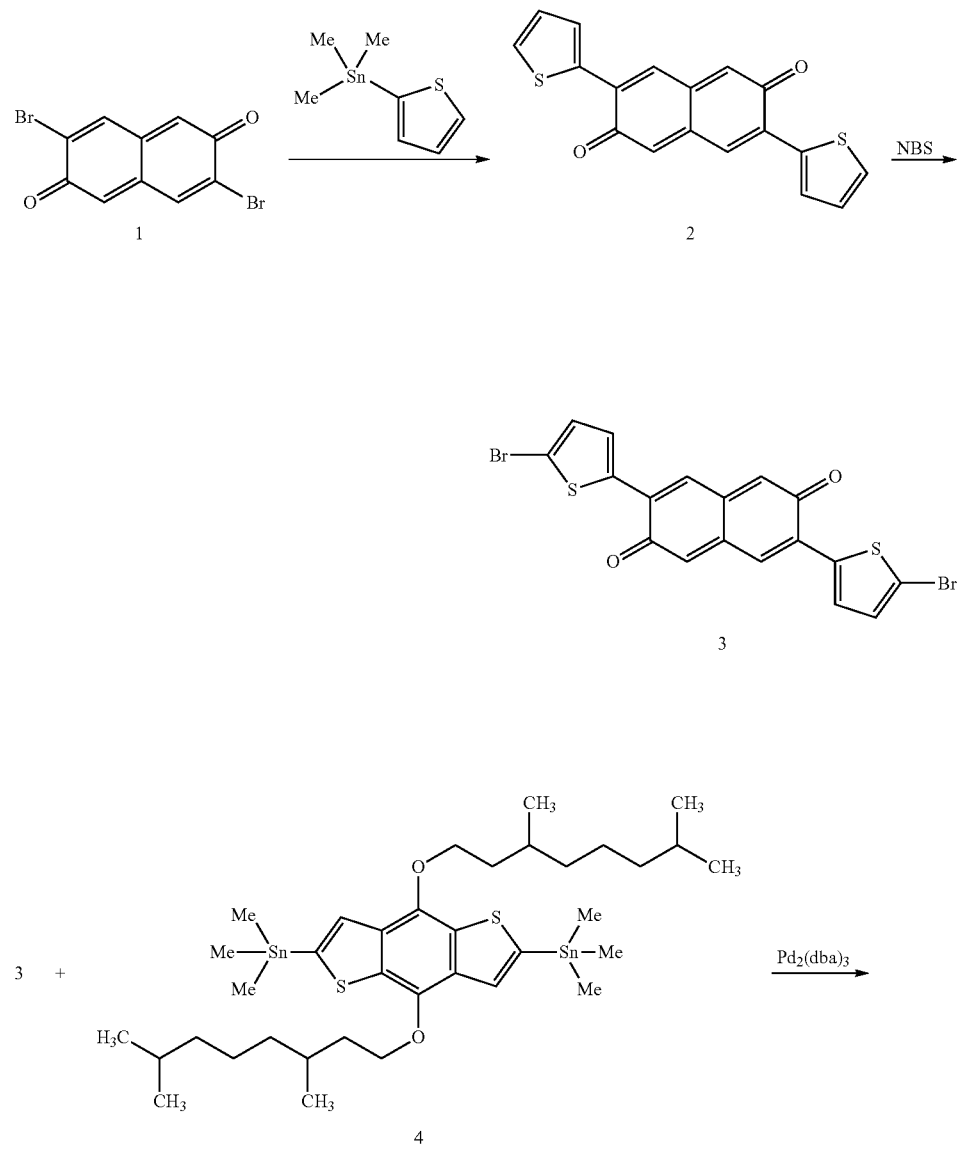

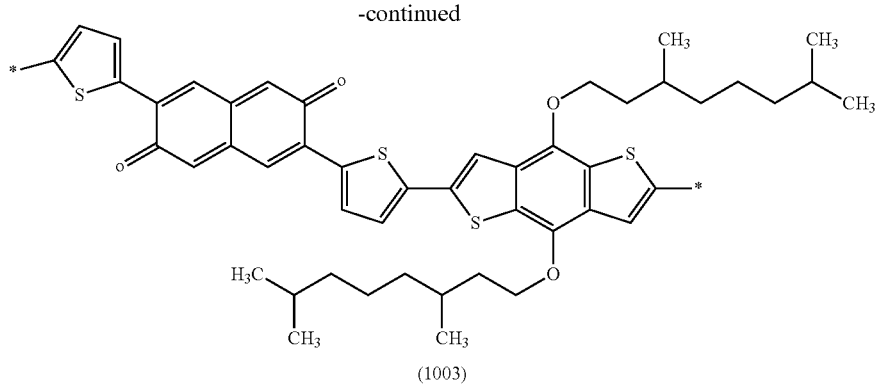

(1003)

The obtained compound was identified by elemental analysis and NMR spectroscopy.

The compound composed of n repeating units represented by Formula (101-1) that was used in other examples was synthesized in the same manner as Compound 1003.

Example 1002

Synthesis Example 1002

Synthesis of Compound 1110

According to a specific synthesis procedure shown in the following scheme, a compound composed of n repeating units represented by Formula (101-2) was synthesized as Compound 1110. An intermediate 9 was synthesized with reference to the method described in U.S. Pat. No. 7,772,485B.

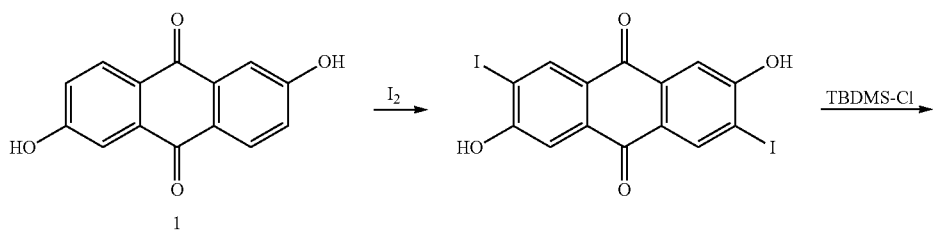

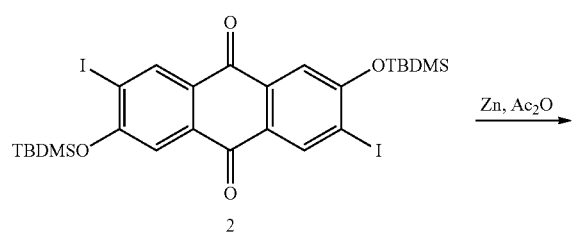

289
290
-continued
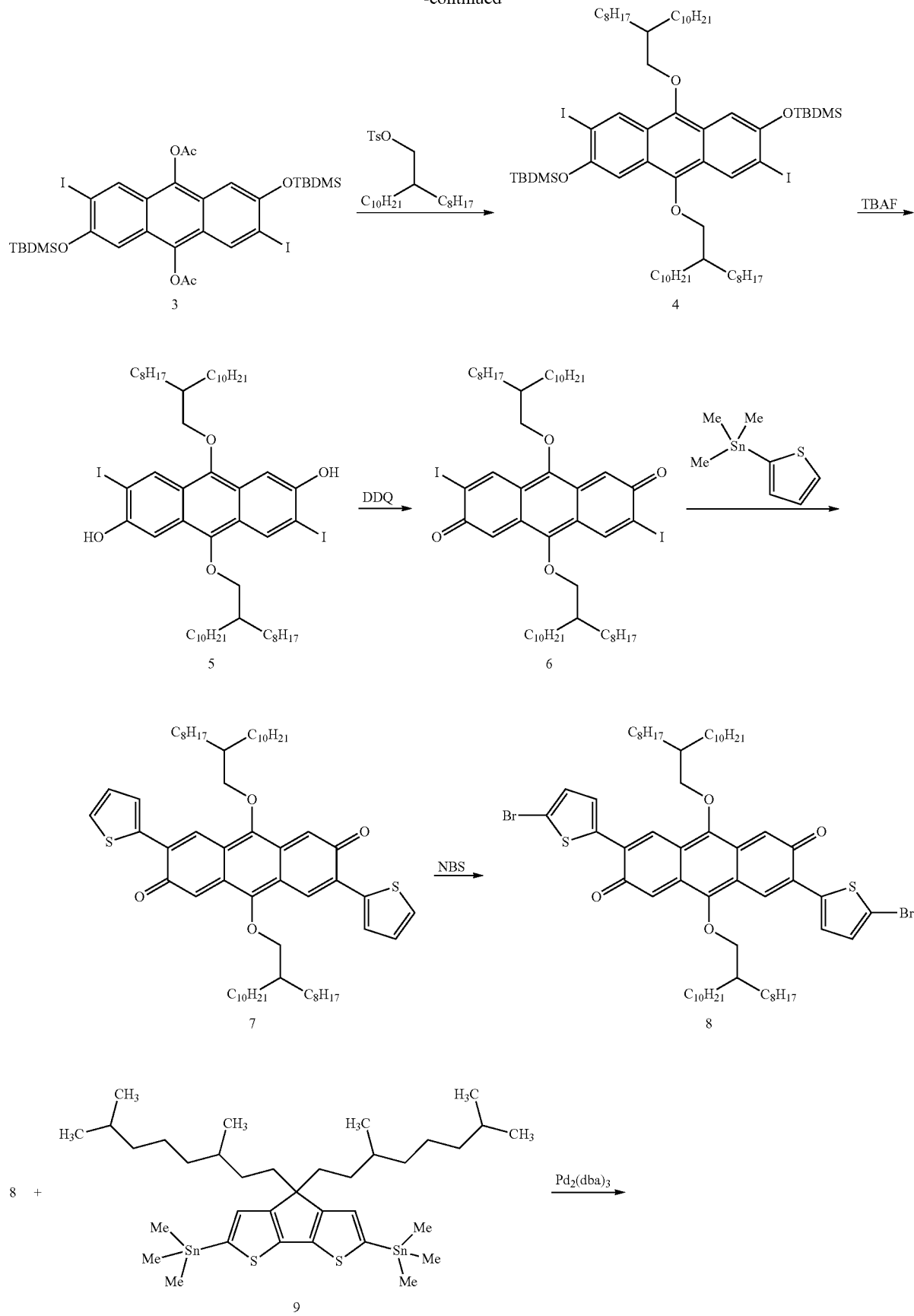

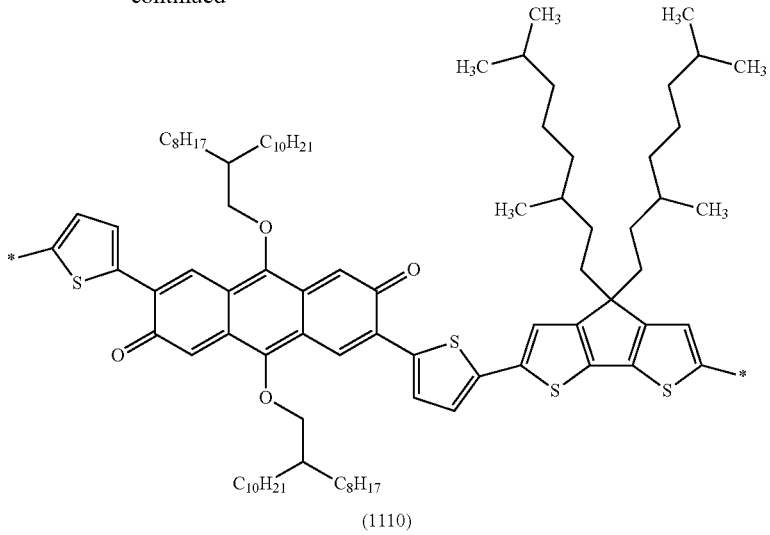

(1110)

The obtained compound was identified by elemental analysis and NMR spectroscopy.

As a result of measuring the molecular weight of each compound by the method described in the present specification, it was found that the weight average molecular weight of each compound was within a range of 50,000 to 200,000. That is, it was found that the number n of the repeating unit of each compound represented by Formula (101-1) or (101-2) was within a range of 50 to 200.

The compound composed of n repeating units represented by Formula (101-2) that was used in other examples was synthesized in the same manner as Compound 1110.

Comparative Compound 1001 used in the semiconductor active layer (organic semiconductor layer) of the comparative element was synthesized according to the method described in the respective documents. The structure of Comparative Compound 1001 is shown below.

Comparative Compound 1001: Compound 3 described in "Chemistry—A European Journal (2013), 19(1), 372-381"

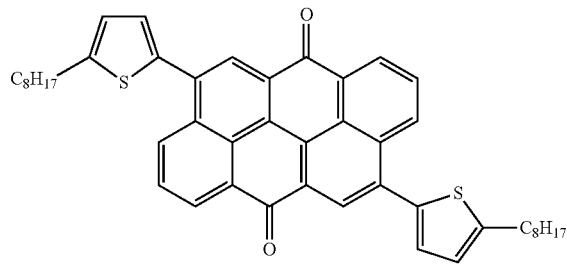

Preparation Evaluation of Element

Example 1003

Preparation of Coating Solution for Non-Light-Emitting Organic Semiconductor Device The compound of the present invention or the comparative compound (10 mg each) was mixed with toluene (1 mL), and the mixture was heated to 100° C., thereby preparing a composition. The composition was used as a coating solution for a non-light-emitting organic semiconductor device of Example 1003. The coating solution in which the compound was not completely dissolved was filtered through a 0.2 m filter.

<Formation of Semiconductor Active Layer (Organic Semiconductor Layer) by Using Compound Alone>

By performing spin coating of the coating solution for a non-light-emitting organic semiconductor device in a nitrogen atmosphere, an organic semiconductor film for a non-light-emitting organic semiconductor device was formed, thereby obtaining an organic film transistor element of Example 1003 that was for measuring FET characteristics. As a substrate for measuring FET characteristics, a silicon substrate having a bottom gate-bottom contact structure was used which included chromium/gold (gate width W=100 mm, gate length L=100 μm) arranged to form a comb pattern as source and drain electrodes and included $SiO_2$ (film thickness: 200 nm) as an insulating layer (the structure is schematically shown in FIG. 2).

By using a semiconductor parameter analyzer (4156C manufactured by Agilent Technologies) connected to a semi-automatic prober (AX-2000 manufactured by Vector Semiconductor Co., Ltd.), the FET characteristics of the organic film transistor element of Example 3 were evaluated in a normal pressure-nitrogen atmosphere, from the viewpoint of the carrier mobility, the threshold voltage shift after repeated driving, and the film formability.

Furthermore, the coating solution for a non-light-emitting organic semiconductor device of Example 1003 was evaluated from the viewpoint of the solubility.

The obtained results are shown in the following Table 53.

(a) Solubility Evaluation

The compound of the present invention or the comparative compound (10 mg each) was mixed with toluene (1 mL), and the mixture was heated to 100° C. Thereafter, the mixture was left for 30 minutes at room temperature. From the amount of the precipitated solid, the solubility was evaluated into 3 levels as below.

A: No solid precipitated.

B: The amount of the precipitated solid was less than 30%.

C: The amount of the precipitated solid was equal to or greater than 30%.

(e) Element Variation

The mobility of the prepared 30 elements was measured, and a coefficient of variation was calculated. The results were evaluated into 3 levels as below.

A: Less than 30%

B: Equal to or greater than 30% and less than 50%

C: Equal to or greater than 50%

TABLE 53

| Element No. | Organic semiconductor material | Solubility | Carrier mobility (cm$^2$/Vs) | Threshold voltage shift after repeated driving | Film formability | Element variation |
|---|---|---|---|---|---|---|
| Element 1001 | Compound 1003 | A | 0.17 | A | A | A |
| Element 1002 | Compound 1023 | A | 0.21 | A | A | A |
| Element 1003 | Compound 1032 | A | 0.22 | A | A | A |
| Element 1004 | Compound 1095 | B | 0.12 | A | A | A |
| Element 1005 | Compound 1110 | A | 0.22 | A | A | A |
| Element 1006 | Compound 1111 | A | 0.19 | A | A | A |
| Element 1007 | Compound 1122 | A | 0.15 | A | A | A |
| Element 1008 | Compound 1196 | A | 0.08 | A | A | A |
| Element 1009 | Compound 1217 | A | 0.11 | A | A | A |
| Element 1010 | Compound 1236 | A | 0.07 | A | A | A |
| Comparative Element 1001 | Comparative Compound 1001 | C | 0.05 | B | C | C |

(b) Carrier Mobility

Between the source electrode and the drain electrode of each organic film transistor element (FET element), a voltage of −50 V was applied, and the gate voltage was varied within a range of 20 V to −100 V. In this way, by using Equation $I_d=(w/2L)\mu C_i(V_g-V_{th})^2$, a carrier mobility μ was calculated (in the equation, $I_d$ represents a drain current; L represents a gate length; W represents a gate width; $C_i$ represents a capacity of the insulating layer per unit area; $V_g$ represents a gate voltage; and $V_{th}$ represents a threshold voltage). Herein, because the characteristics of the element having a carrier mobility of less than $1\times10^{-5}$ cm$^2$/Vs were too poor, the element was not subjected to the evaluation of (c) Threshold voltage shift after repeated driving described below.

(c) Threshold Voltage Shift after Repeated Driving

Between the source electrode and the drain electrode of each organic film transistor element (FET element), a voltage of −80 V was applied, and the element was repeatedly driven 100 times by varying the gate voltage within a range of +20 V to −100 V. In this way, the element was measured in the same manner as in the section (a), and a difference between a threshold voltage $V_{before}$ before the repeated driving and a threshold voltage $V_{after}$ after the repeated driving ($|V_{after}-V_{before}|$) was evaluated into 3 levels as below. The smaller the difference, the higher the stability of the element against repeated driving. Therefore, the smaller the difference, the more preferable.

A: $|V_{after}-V_{before}|\leq 5$ V

B: $5$ V$<|V_{after}-V_{before}|\leq 10$ V

C: $|V_{after}-V_{before}|>10$ V (d) Film Formability Evaluation

Each of the obtained organic film transistor elements was observed with unaided eyes and with an optical microscope. By the method described above, 10 elements were prepared, and the ratio of film cissing that occurred on the source and drain electrodes was evaluated.

The results were evaluated into 3 levels as below.

A: Less than 10%.

B: Equal to or greater than 10% and less than 30%

C: Equal to or greater than 30%

From the above Table 53, it was understood that the compound of the present invention exhibits excellent solubility in an organic solvent, and the organic film transistor element using the compound of the present invention has high carrier mobility. It was also understood that accordingly, the compound of the present invention can be preferably used as an organic semiconductor material for a non-light-emitting organic semiconductor device.

In contrast, the organic film transistor element using Comparative Compound 1001 exhibited low carrier mobility In the organic film transistor element using the compound of the present invention, the threshold voltage shift occurred to a small extent after the repeated driving, and in the organic film transistor element using Comparative Compound 1001, the threshold voltage shift occurred to a great extent after the repeated driving. Furthermore, it was understood that in all of the organic film transistor elements using the compound of the present invention, the smoothness•homogeneity of the film are extremely high, and the film formability is excellent.

Example 1004

Formation of Semiconductor Active Layer (Organic Semiconductor Layer)

The surface of a silicon wafer, which contained SiO$_2$ (film thickness: 370 nm) as a gate insulating film, was treated with octyltrichlorosilane.

The compound of the present invention or the comparative compound (1 mg each) was mixed with toluene (1 mL), and the mixture was heated to 100° C., thereby preparing a coating solution for a non-light-emitting organic semiconductor device. In a nitrogen atmosphere, the coating solution was cast onto the silicon wafer which had been heated to 90° C. and undergone surface treatment with octylsilane, thereby forming an organic semiconductor film for a non-light-emitting organic semiconductor device.

Furthermore, gold was deposited onto the surface of the film through a mask so as to prepare source and drain electrodes, thereby obtaining an organic film transistor element having a bottom gate•top contact structure with a gate width W=5 mm and a gate length L=80 μm (the structure is schematically shown in FIG. 1).

By using a semiconductor parameter analyzer (4156C manufactured by Agilent Technologies) connected to a semi-automatic prober (AX-2000 manufactured by Vector Semiconductor Co., Ltd.), the FET characteristics of the organic film transistor element of Example 1004 were evaluated in a normal pressure-nitrogen atmosphere, from the viewpoint of the carrier mobility, the threshold voltage shift after repeated driving, and the film formability.

Furthermore, the coating solution for a non-light-emitting organic semiconductor device of Example 1004 was evaluated from the viewpoint of the solubility.

The obtained results are shown in the following Table 54.

TABLE 54

| Element No. | Organic semiconductor material | Solubility | Carrier mobility (cm²/Vs) | Threshold voltage shift after repeated driving | Film formability | Element variation |
|---|---|---|---|---|---|---|
| Element 1101 | Compound 1003 | A | 0.22 | A | A | A |
| Element 1102 | Compound 1023 | A | 0.27 | A | A | A |
| Element 1103 | Compound 1032 | A | 0.29 | A | A | A |
| Element 1104 | Compound 1095 | B | 0.16 | A | A | A |
| Element 1105 | Compound 1110 | A | 0.28 | A | A | A |
| Element 1106 | Compound 1111 | A | 0.24 | A | A | A |
| Comparative Element 1101 | Comparative Compound 1001 | C | 0.08 | B | C | C |

From the above Table 54, it was understood that the compound of the present invention exhibits excellent solubility in an organic solvent, and the organic film transistor element using the compound of the present invention has high carrier mobility. It was also understood that accordingly, the compound of the present invention can be preferably used as an organic semiconductor material for a non-light-emitting organic semiconductor device.

In contrast, the organic film transistor element using Comparative Compound 1001 exhibited low carrier mobility In the organic film transistor element using the compound of the present invention, the threshold voltage shift occurred to a small extent after the repeated driving, and in the organic film transistor element using Comparative Compound 1001, the threshold voltage shift occurred to a great extent after the repeated driving. Furthermore, it was understood that in all of the organic film transistor elements using the compound of the present invention, the smoothness-homogeneity of the film are extremely high, and the film formability is excellent.

Example 1005

Formation of Semiconductor Active Layer (Organic Semiconductor Layer) Using Compound with Binder An organic film transistor element for measuring FET characteristics was prepared in the same manner as in Example 1003, except that a coating solution was used which was obtained by mixing the compound of the present invention or the comparative compound (1 mg each), 1 mg of PαMS (poly(α-methylstyrene), Mw=300,000), manufactured by Sigma-Aldrich Co. LLC.), and toluene (1 mL) together and heating the mixture at a temperature of 100° C. The element was evaluated in the same manner as in Example 1003.

The obtained results are shown in the following Table 55.

TABLE 55

| Element No. | Organic semiconductor material | Solubility | Carrier mobility (cm²/Vs) | Threshold voltage shift after repeated driving | Film formability | Element variation |
|---|---|---|---|---|---|---|
| Element 1201 | Compound 1003 | A | 0.19 | A | A | A |
| Element 1202 | Compound 1032 | A | 0.24 | A | A | A |
| Element 1203 | Compound 1110 | A | 0.23 | A | A | A |
| Comparative Element 1201 | Comparative Compound 1001 | C | 0.06 | B | C | C |

From the above Table 55, it was understood that the compound of the present invention exhibits excellent solubility in an organic solvent, and the organic film transistor element using the compound of the present invention has high carrier mobility. It was also understood that accordingly, the compound of the present invention can be preferably used as an organic semiconductor material for a non-light-emitting organic semiconductor device.

In contrast, the organic film transistor element using Comparative Compound 1001 exhibited low carrier mobility.

In the organic film transistor element using the compound of the present invention, the threshold voltage shift occurred to a small extent after the repeated driving, and in the organic film transistor element using Comparative Compound 1001, the threshold voltage shift occurred to a great extent after the repeated driving. Furthermore, it was understood that in all of the organic film transistor elements using the compound of the present invention, the smoothness•homogeneity of the film are extremely high, and the film formability is excellent.

From the above results, it was understood that while the carrier mobility is extremely low when the semiconductor active layer is formed of a combination of binder-PαMS and the comparative compound in the comparative element, the carrier mobility is excellent even when the semiconductor active layer is formed by using the compound of the present invention with binder-PαMS in the organic film transistor element of the present invention.

EXPLANATION OF REFERENCES

11: substrate
12: electrode
13: insulating layer
14: semiconductor active layer (organic substance layer, organic semiconductor layer)
15a, 15b: electrode
31: substrate
32: electrode
33: insulating layer
34a, 34b: electrode
35: semiconductor active layer (organic substance layer, organic semiconductor layer)

What is claimed is:

1. An organic film transistor comprising a compound, which is composed of n repeating units represented by the following Formula (1-1), (1-2), (101-1), or (101-2), in a semiconductor active layer;

Formula (1-1)

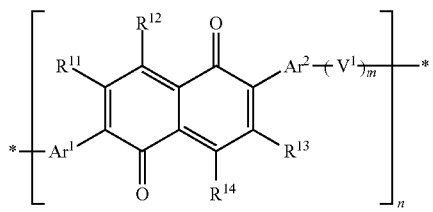

in Formula (1-1), each of $R^{11}$ to $R^{14}$ independently represents a hydrogen atom or a substituent; each of $Ar^1$ and $Ar^2$ independently represents a heteroarylene group or an arylene group; $V^1$ represents a divalent linking group; m represents an integer of 0 to 6; when m is equal to or greater than 2, two or more groups represented by $V^1$ may be the same as or different from each other; and n is equal to or greater than 2;

Formula (1-2)

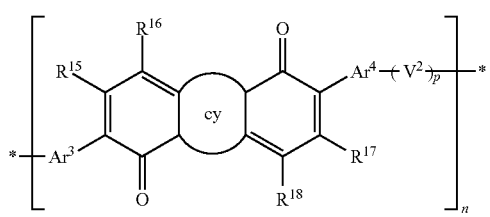

in Formula (1-2), Cy represents a benzene ring, a naphthalene ring, or an anthracene ring; each of $R^{15}$ to $R^{18}$ independently represents a hydrogen atom or a substituent; each of $Ar^3$ and $Ar^4$ independently represents a heteroarylene group or an arylene group; $V^2$ represents a divalent linking group; p represents an integer of 0 to 6; when p is equal to or greater than 2, two or more groups represented by $V^2$ may be the same as or different from each other; and n is equal to or greater than 2;

Formula (101-1)

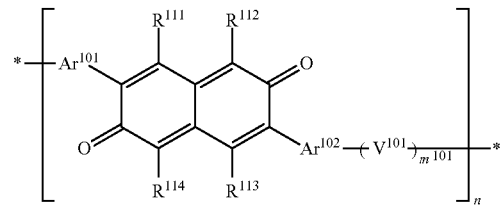

in Formula (101-1), each of $R^{111}$ to $R^{114}$ independently represents a hydrogen atom or a substituent; each of $Ar^{101}$ and $Ar^{102}$ independently represents a heteroarylene group or an arylene group; $V^{101}$ represents a divalent linking group; $m^{101}$ represents an integer of 0 to 6; when $m^{101}$ is equal to or greater than 2, two or more groups represented by $V^{101}$ may be the same as or different from each other; and n is equal to or greater than 2; and Formula (101-2)

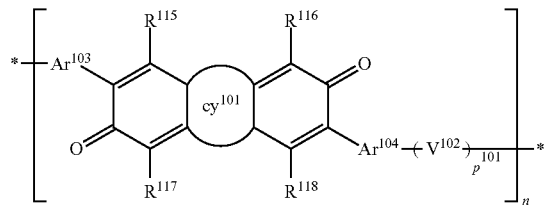

in Formula (101-2), $Cy^{101}$ represents a benzene ring, a naphthalene ring, or an anthracene ring; each of $R^{115}$ to $R^{118}$ independently represents a hydrogen atom or a substituent; each of $Ar^{103}$ and $Ar^{104}$ independently represents a heteroarylene group or an arylene group; $V^{102}$ represents a divalent linking group; $p^{101}$ represents an integer of 0 to 6; when $p^{101}$ is equal to or greater than 2, two or more groups represented by $V^{102}$ may be the same as or different from each other; and n is equal to or greater than 2.

2. The organic film transistor according to claim 1, comprising a compound, which is composed of n repeating units represented by the following Formula (1-1) or (1-2), in the semiconductor active layer;

Formula (1-1)

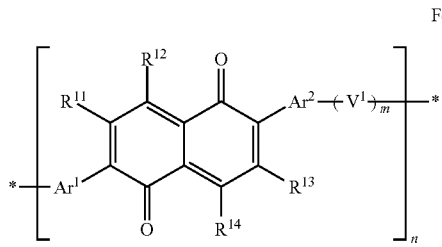

In Formula (1-1), each of $R^{11}$ to $R^{14}$ independently represents a hydrogen atom or a substituent; each of $Ar^1$ and $Ar^2$ independently represents a heteroarylene group or an arylene group; $V^1$ represents a divalent linking group; m represents an integer of 0 to 6; when m is equal to or greater than 2, two or more groups represented by $V^1$ may be the same as or different from each other; and n is equal to or greater than 2; and Formula (1-2)

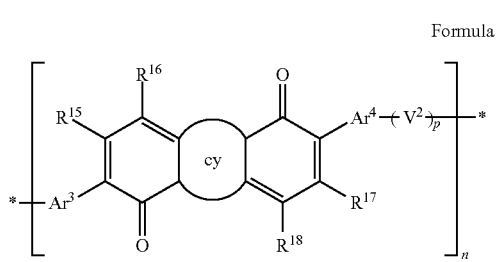

in Formula (1-2), Cy represents a benzene ring, a naphthalene ring, or an anthracene ring; each of $R^{15}$ to $R^{18}$ independently represents a hydrogen atom or a substituent; each of $Ar^3$ and $Ar^4$ independently represents a heteroarylene group or an arylene group; $V^2$ represents a divalent linking group; p represents an integer of 0 to 6; when p is equal to or greater than 2, two or more groups represented by $V^2$ may be the same as or different from each other; and n is equal to or greater than 2.

3. The organic film transistor according to claim 1, wherein the compound composed of n repeating units represented by Formula (1-2) is a compound composed of n repeating units represented by the following Formula (2-1), (2-2), (2-3), (2-4), or (2-5);

Formula (2-1)

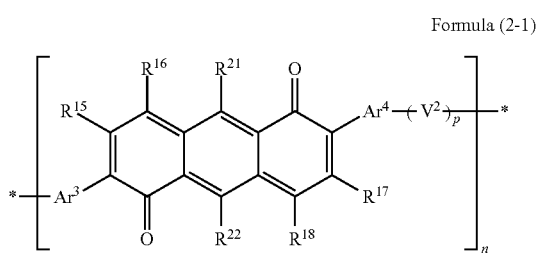

Formula (2-2)

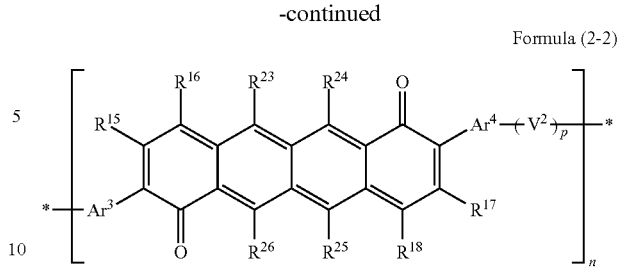

Formula (2-3)

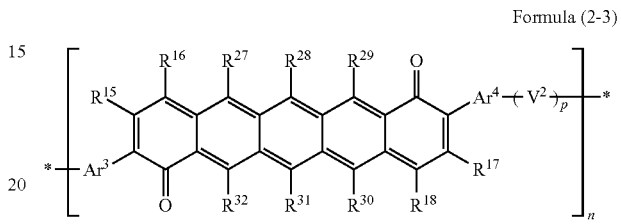

Formula (2-4)

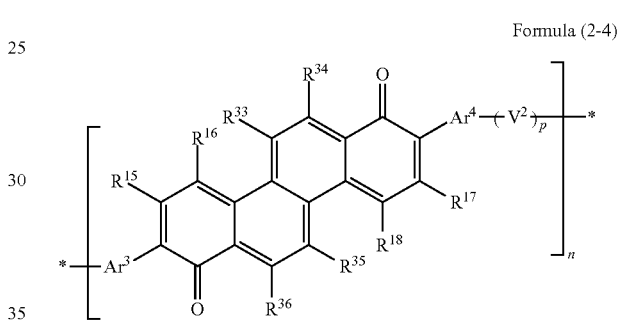

Formula (2-5)

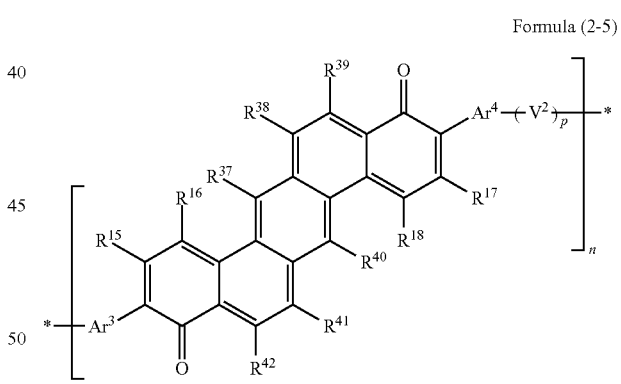

in Formulae (2-1) to (2-5), each of $R^{15}$ to $R^{18}$ and $R^{21}$ to $R^{42}$ independently represents a hydrogen atom or a substituent; each of $Ar^3$ and $Ar^4$ independently represents a heteroarylene group or an arylene group; $V^2$ represents a divalent linking group; p represents an integer of 0 to 6; when p is equal to or greater than 2, two or more groups represented by $V^2$ may be the same as or different from each other; and n is equal to or greater than 2.

4. The organic film transistor according to claim 1, comprising a compound, which is composed of n repeating units represented by the following Formula (101-1) or (101-2), in the semiconductor active layer;

Formula (101-1)

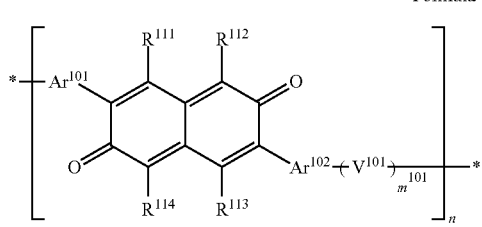

in Formula (101-1), each of $R^{111}$ to $R^{114}$ independently represents a hydrogen atom or a substituent; each of $Ar^{101}$ and $Ar^{102}$ independently represents a heteroarylene group or an arylene group; $V^{101}$ represents a divalent linking group; $m^{101}$ represents an integer of 0 to 6; when $m^{101}$ is equal to or greater than 2, two or more groups represented by $V^{101}$ may be the same as or different from each other; and n is equal to or greater than 2; and Formula (101-2)

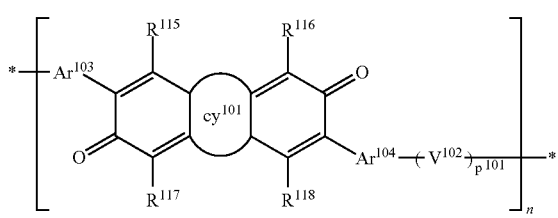

in Formula (101-2), $Cy^{101}$ represents a benzene ring, a naphthalene ring, or an anthracene ring; each of $R^{115}$ to $R^{118}$ independently represents a hydrogen atom or a substituent; each of $Ar^{103}$ and $Ar^{104}$ independently represents a heteroarylene group or an arylene group; $V^{102}$ represents a divalent linking group; $p^{101}$ represents an integer of 0 to 6; when $p^{101}$ is equal to or greater than 2, two or more groups represented by $V^{102}$ may be the same as or different from each other; and n is equal to or greater than 2.

5. The organic film transistor according to claim 1, wherein the compound composed of n repeating units represented by Formula (101-2) is a compound composed of n repeating units represented by the following Formula (102-1), (102-2), (102-3), (102-4), or (102-5);

Formula (102-1)

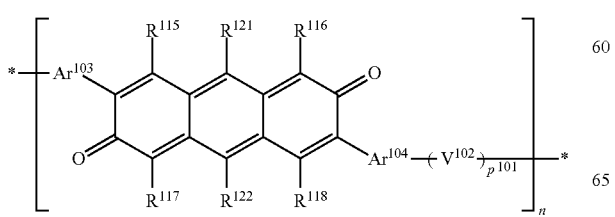

Formula (102-2)

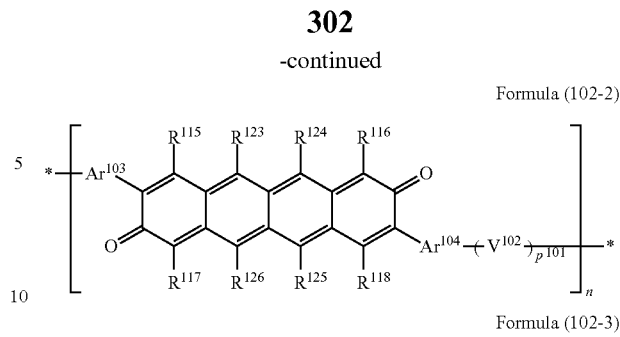

Formula (102-3)

Formula (102-4)

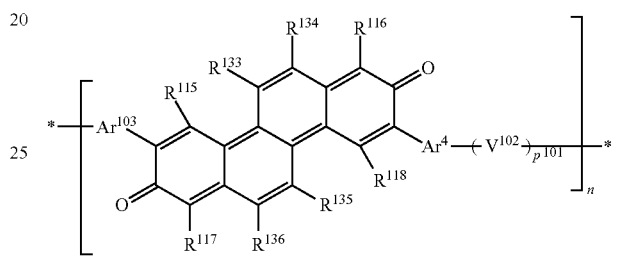

Formula (102-5)

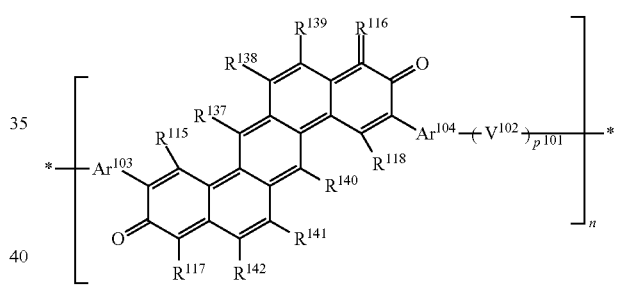

in Formulae (102-1) to (102-5), each of $R^{115}$ to $R^{118}$ and $R^{121}$ to $R^{142}$ independently represents a hydrogen atom or a substituent; each of $Ar^{103}$ and $Ar^{104}$ independently represents a heteroarylene group or an arylene group; $V^{102}$ represents a divalent linking group; $p^{101}$ represents an integer of 0 to 6; when $p^{101}$ is equal to or greater than 2, two or more groups represented by $V^{102}$ may be the same as or different from each other; and n is equal to or greater than 2.

6. The organic film transistor according to claim 1, wherein in Formulae (1-1), (1-2), (101-1), (101-2), and (102-1) to (102-5), each of $V^1$, $V^2$, $V^{101}$, and $V^{102}$ is independently a divalent linking group represented by any of the following Formulae (V-1) to (V-17);

(V-1)

-continued

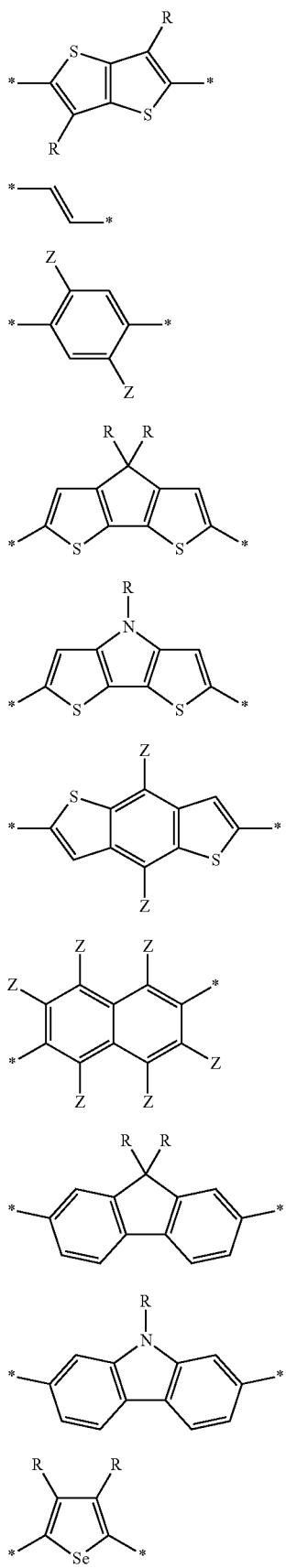

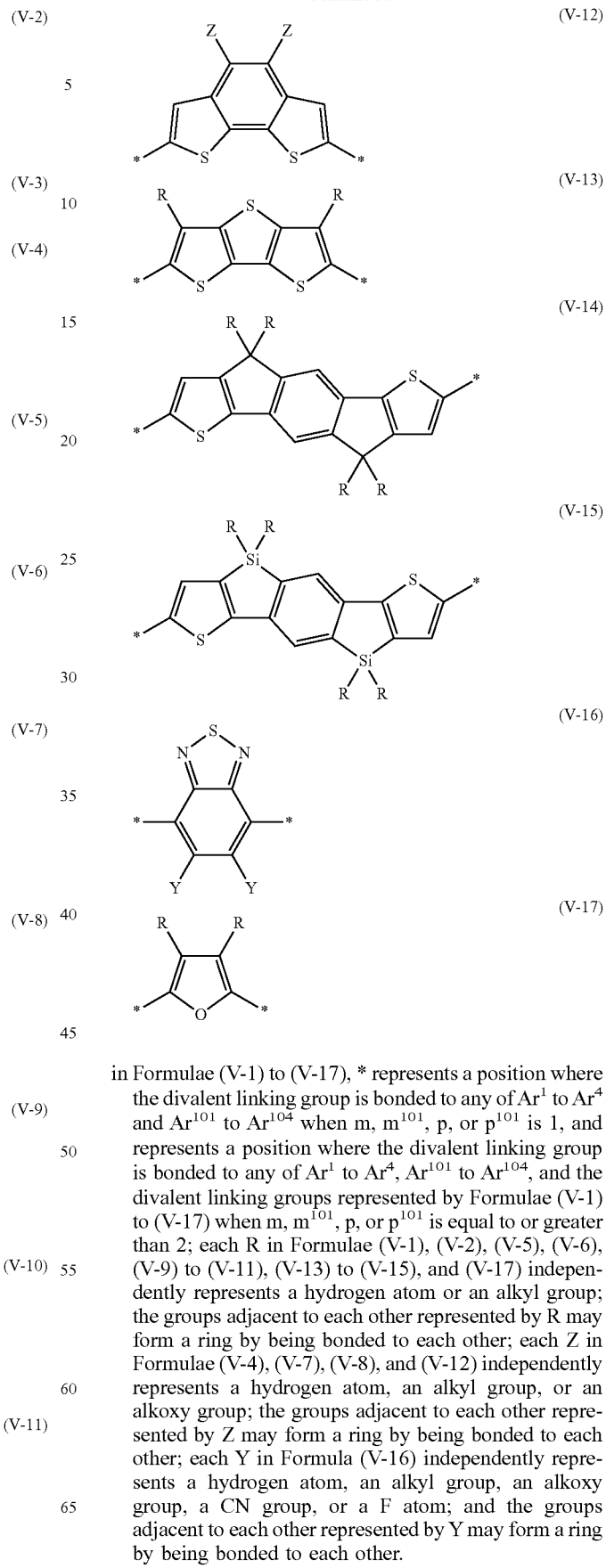

in Formulae (V-1) to (V-17), * represents a position where the divalent linking group is bonded to any of $Ar^1$ to $Ar^4$ and $Ar^{101}$ to $Ar^{104}$ when m, $m^{101}$, p, or $p^{101}$ is 1, and represents a position where the divalent linking group is bonded to any of $Ar^1$ to $Ar^4$, $Ar^{101}$ to $Ar^{104}$, and the divalent linking groups represented by Formulae (V-1) to (V-17) when m, $m^{101}$, p, or $p^{101}$ is equal to or greater than 2; each R in Formulae (V-1), (V-2), (V-5), (V-6), (V-9) to (V-11), (V-13) to (V-15), and (V-17) independently represents a hydrogen atom or an alkyl group; the groups adjacent to each other represented by R may form a ring by being bonded to each other; each Z in Formulae (V-4), (V-7), (V-8), and (V-12) independently represents a hydrogen atom, an alkyl group, or an alkoxy group; the groups adjacent to each other represented by Z may form a ring by being bonded to each other; each Y in Formula (V-16) independently represents a hydrogen atom, an alkyl group, an alkoxy group, a CN group, or a F atom; and the groups adjacent to each other represented by Y may form a ring by being bonded to each other.

7. The organic film transistor according to claim 6, wherein in Formulae (1-1), (1-2), (101-1) and (101-2), each of $V^1$, $V^2$, $V^{101}$, and $V^{102}$ is independently a divalent linking group represented by any of Formulae (V-1) to (V-8) and (V-11) to (V-15).

8. The organic film transistor according to claim 1, wherein in Formulae (1-1), (1-2), (101-1) and (101-2), each of $Ar^1$ to $Ar^4$ and $Ar^{101}$ to $Ar^{104}$ is independently a divalent linking group represented by the following Formula (4-1), (4-2) or (4-3);

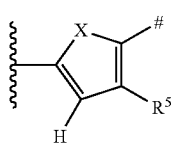

Formula (4-1)

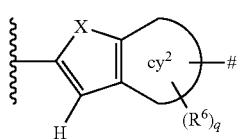

Formula (4-2)

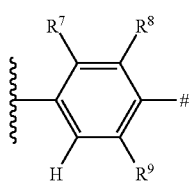

Formula (4-3)

in Formulae (4-1) to (4-3), X represents a S atom, an O atom, or a Se atom; $Cy^2$ represents a structure in which 1 to 4 rings are condensed; each of $R^5$ to $R^9$ independently represents a hydrogen atom or a substituent; q represents an integer of 0 to 6; when q is equal to or greater than 2, two or more groups represented by $R^6$ may be the same as or different from each other; the wavy line represents a position where the divalent linking group is bonded to a cyclohexadienone ring-condensed site; and # represents a position where the divalent linking group is bonded to $V^1$, $V^2$, $V^{101}$, or $V^{102}$.

9. The organic film transistor according to claim 8, wherein in Formulae (1-1), (1-2), (101-1) and (101-2), each of $Ar^1$ to $Ar^4$ and $Ar^{101}$ to $Ar^{104}$ is independently a divalent linking group represented by Formula (4-1) or (4-2).

10. The organic film transistor according to claim 8, wherein the divalent linking group represented by Formula (4-2) is a divalent linking group represented by any of the following Formulae (5-1) to (5-8);

Formula (5-1)

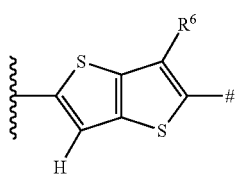

Formula (5-2)

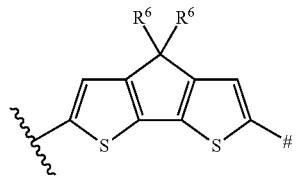

Formula (5-3)

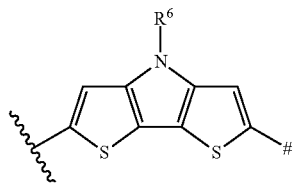

Formula (5-4)

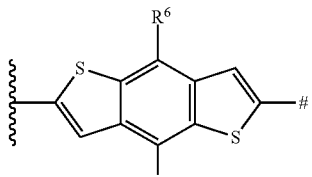

Formula (5-5)

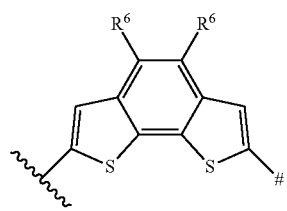

Formula (5-6)

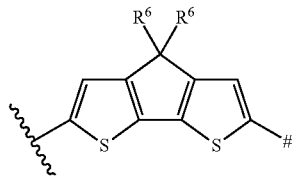

Formula (5-7)

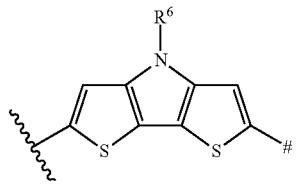

Formula (5-8)

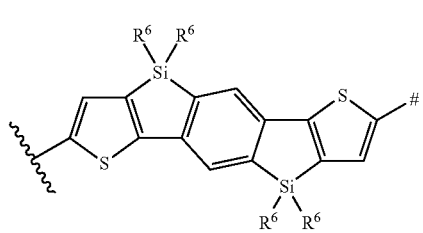

in Formulae (5-1) to (5-8), $R^6$ represents a hydrogen atom or a substituent; two or more groups represented by $R^6$ may be the same as or different from each other; the wavy line represents a position where the divalent linking group is bonded to a cyclohexadienone ring-condensed site; and # represents a position where the divalent linking group is bonded to $V^1$, $V^2$, $V^{101}$, or $V^{102}$.

11. The organic film transistor according to claim 1,
wherein each of at least one of $R^{11}$ to $R^{14}$ in Formula (1-1), at least one of $R^{15}$ to $R^{18}$ in Formula (1-2), at least one of $R^{111}$ to $R^{114}$ in Formula (101-1) and at least one of $R^{115}$ to $R^{118}$ in Formula (101-2) is a group represented by the following Formula (W);

-L-R           Formula (W)

in Formula (W), L represents a divalent linking group represented by any of the following Formulae (L-1) to (L-12) or a divalent linking group formed by bonding of two or more divalent linking groups represented by any of the following Formulae (L-1) to (L-12); R represents a substituted or unsubstituted alkyl group, an oligo-oxyethylene group in which a repetition number v of an oxyethylene unit is equal to or greater than 2, an oligosiloxane group having two or more silicon atoms, or a substituted or unsubstituted silyl group; and R represents a substituted or unsubstituted silyl group only when L adjacent to R is a divalent linking group represented by any of the following Formulae (L-1) to (L-3); and

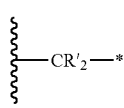
(L-1)

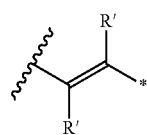
(L-2)

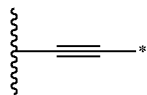
(L-3)

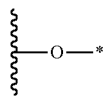
(L-4)

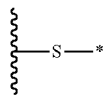
(L-5)

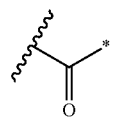
(L-6)

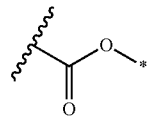
(L-7)

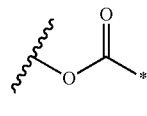
(L-8)

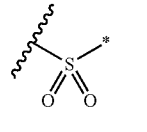
(L-9)

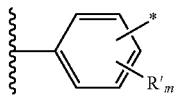
(L-10)

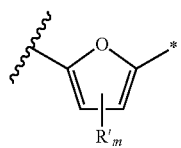
(L-11)

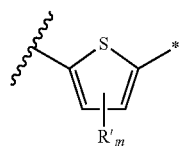
(L-12)

in Formulae (L-1) to (L-12), the portion of a wavy line represents a position where the divalent linking group is bonded to a cyclohexadienone skeleton; * represents a position where the divalent linking group is bonded to any of the divalent linking groups represented by Formulae (L-1) to (L-12) and R; m in Formula (L-10) is 4; m in Formulae (L-11) and (L-12) is 2; and each R' in Formulae (L-1), (L-2), (L-10), (L-11), and (L-12) independently represents a hydrogen atom or a substituent.

12. The organic film transistor according to claim 11,
wherein in Formula (W), L is a divalent linking group represented by any of Formulae (L-1), (L-4), and (L-8) or a divalent linking group formed by bonding of two or more divalent linking groups described above.

13. The organic film transistor according to claim 1,
wherein in Formulae (1-1), (1-2), (101-1) and (101-2), each n is independently equal to or greater than 10.

14. A compound composed of n repeating units represented by the following Formula (1-1), (1-2), (101-1), or (101-2);

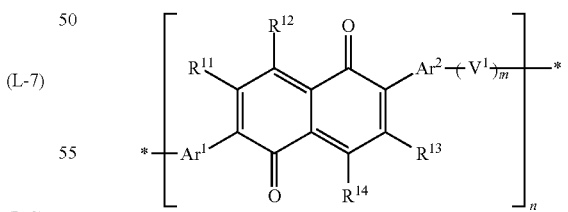
Formula (1-1)

in Formula (1-1), each of $R^{111}$ to $R^{14}$ independently represents a hydrogen atom or a substituent; each of $Ar^1$ and $Ar^2$ independently represents a heteroarylene group or an arylene group; $V^1$ represents a divalent linking group; m represents an integer of 0 to 6; when m is equal to or greater than 2, two or more groups represented by $V^1$ may be the same as or different from each other; and n is equal to or greater than 2;

15. The compound according to claim 14 that is a compound composed of n repeating units represented by the following Formula (1-1) or (1-2);

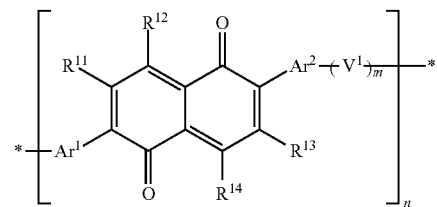

Formula (1-1)

in Formula (1-1), each of $R^{11}$ to $R^{14}$ independently represents a hydrogen atom or a substituent; each of $Ar^1$ and $Ar^2$ independently represents a heteroarylene group or an arylene group; $V^1$ represents a divalent linking group; m represents an integer of 0 to 6; when m is equal to or greater than 2, two or more groups represented by $V^1$ may be the same as or different from each other; and n is equal to or greater than 2; and

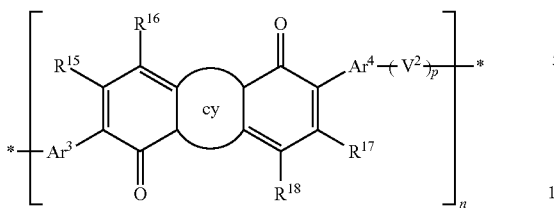

Formula (1-2)

in Formula (1-2), Cy represents a benzene ring, a naphthalene ring, or an anthracene ring; each of $R^{15}$ to $R^{18}$ independently represents a hydrogen atom or a substituent; each of $Ar^3$ and $Ar^4$ independently represents a heteroarylene group or an arylene group; $V^2$ represents a divalent linking group; p represents an integer of 0 to 6; when p is equal to or greater than 2, two or more groups represented by $V^2$ may be the same as or different from each other; and n is equal to or greater than 2.

16. The compound according to claim 14,
wherein the compound composed of n repeating units represented by Formula (1-2) is a compound composed of n repeating units represented by the following Formula (2-1), (2-2), (2-3), (2-4), or (2-5);

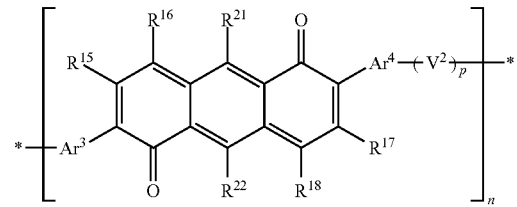

Formula (2-1)

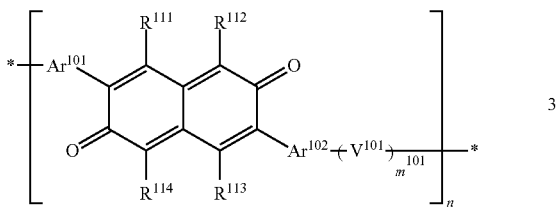

Formula (101-1)

in Formula (101-1), each of $R^{111}$ to $R^{114}$ independently represents a hydrogen atom or a substituent; each of $Ar^{101}$ and $Ar^{102}$ independently represents a heteroarylene group or an arylene group; $V^{101}$ represents a divalent linking group; $m^{101}$ represents an integer of 0 to 6; when $m^{101}$ is equal to or greater than 2, two or more groups represented by $V^{101}$ may be the same as or different from each other; and n is equal to or greater than 2; and

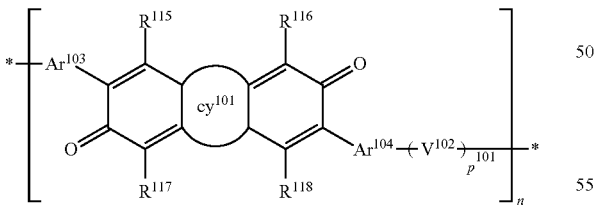

Formula (101-2)

in Formula (101-2), $Cy^{101}$ represents a benzene ring, a naphthalene ring, or an anthracene ring; each of $R^{115}$ to $R^{118}$ independently represents a hydrogen atom or a substituent; each of $Ar^{103}$ and $Ar^{104}$ independently represents a heteroarylene group or an arylene group; $V^{102}$ represents a divalent linking group; $p^{101}$ represents an integer of 0 to 6; when $p^{101}$ is equal to or greater than 2, two or more groups represented by $V^{102}$ may be the same as or different from each other; and n is equal to or greater than 2.

-continued

Formula (2-2)

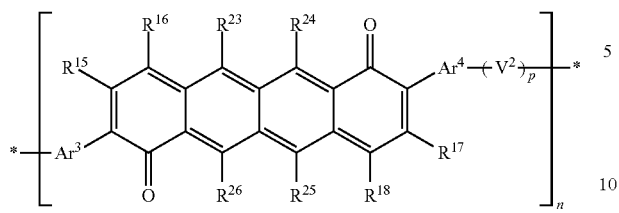

Formula (2-3)

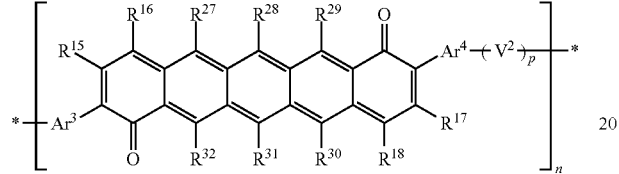

Formula (2-4)

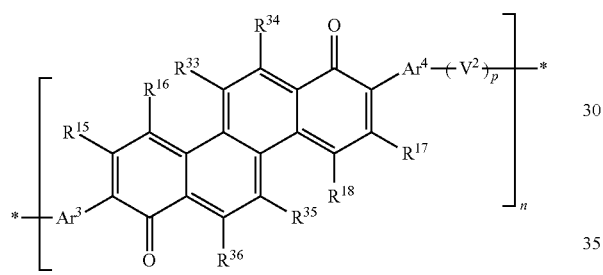

Formula (2-5)

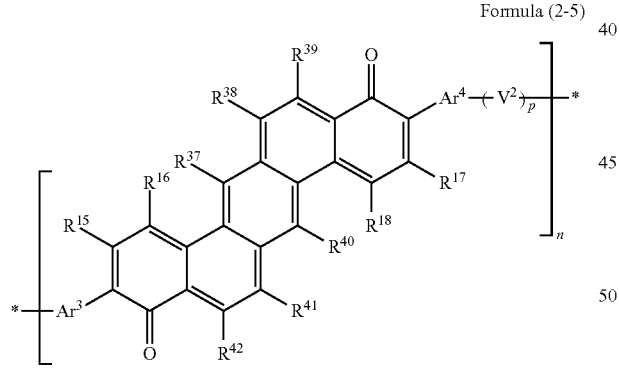

in Formulae (2-1) to (2-5), each of $R^{15}$ to $R^{18}$ and $R^{21}$ to $R^{42}$ independently represents a hydrogen atom or a substituent; each of $Ar^3$ and $Ar^4$ independently represents a heteroarylene group or an arylene group; $V^2$ represents a divalent linking group; p represents an integer of 0 to 6; when p is equal to or greater than 2, two or more groups represented by $V^2$ may be the same as or different from each other; and n is equal to or greater than 2.

17. The compound according to claim 14 that is a compound composed of n repeating units represented by the following Formula (101-1) or (101-2);

Formula (101-1)

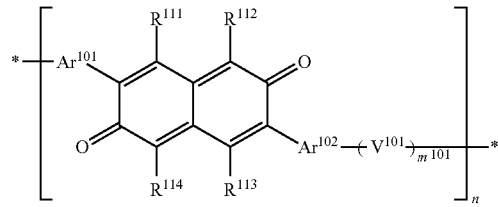

in Formula (101-1), each of $R^{111}$ to $R^{114}$ independently represents a hydrogen atom or a substituent; each of $Ar^{101}$ and $Ar^{102}$ independently represents a heteroarylene group or an arylene group; $V^{101}$ represents a divalent linking group; $m^{101}$ represents an integer of 0 to 6; when $m^{101}$ is equal to or greater than 2, two or more groups represented by $V^{101}$ may be the same as or different from each other; and n is equal to or greater than 2; and Formula (101-2)

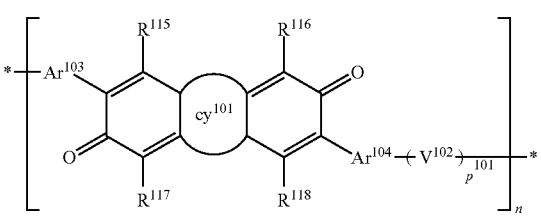

in Formula (101-2), $Cy^{101}$ represents a benzene ring, a naphthalene ring, or an anthracene ring; each of $R^{115}$ to $R^{118}$ independently represents a hydrogen atom or a substituent; each of $Ar^{103}$ and $Ar^{104}$ independently represents a heteroarylene group or an arylene group; $V^{102}$ represents a divalent linking group; $p^{101}$ represents an integer of 0 to 6; when $p^{101}$ is equal to or greater than 2, two or more groups represented by $V^{102}$ may be the same as or different from each other; and n is equal to or greater than 2.

18. The compound according to claim 14, wherein the compound composed of n repeating units represented by Formula (101-2) is a compound composed of n repeating units represented by the following Formula (102-1), (102-2), (102-3), (102-4), or (102-5);

Formula (102-1)

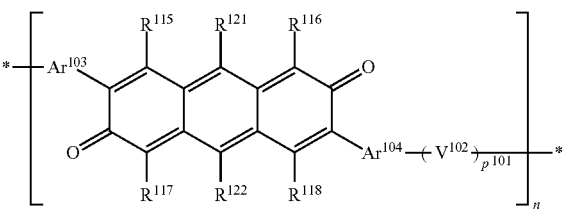

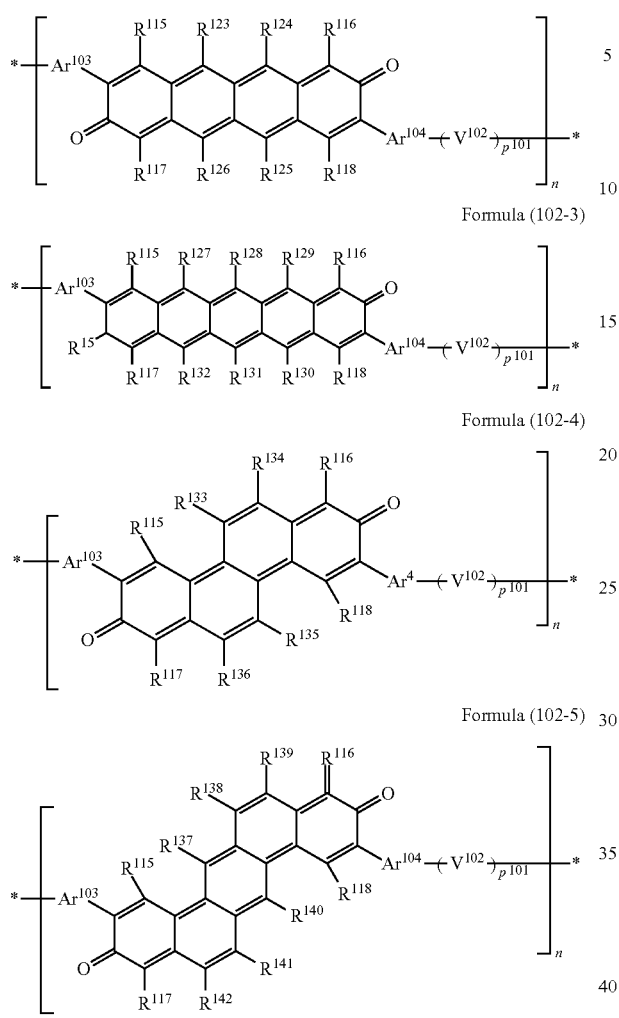

Formula (102-2)

Formula (102-3)

Formula (102-4)

Formula (102-5)

in Formulae (102-1) to (102-5), each of $R^{115}$ to $R^{118}$ and $R^{121}$ to $R^{142}$ independently represents a hydrogen atom or a substituent; each of $Ar^{103}$ and $Ar^{104}$ independently represents a heteroarylene group or an arylene group; $V^{102}$ represents a divalent linking group; $p^{101}$ represents an integer of 0 to 6; when $p^{101}$ is equal to or greater than 2, two or more groups represented by $V^{102}$ may be the same as or different from each other; and n is equal to or greater than 2.

19. The compound according to claim 14, wherein in Formulae (1-1), (1-2), (101-1) and (101-2), each of $V^1$, $V^2$, $V^{101}$, and $V^{102}$ is independently a divalent linking group represented by any of the following Formulae (V-1) to (V-17);

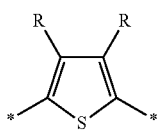
(V-1)

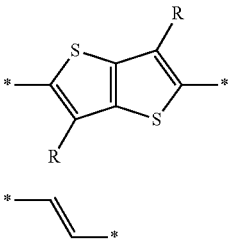
(V-2)

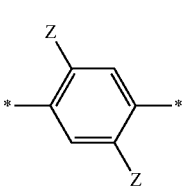
(V-3)

(V-4)

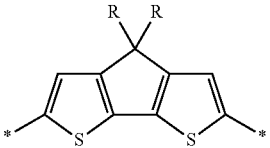
(V-5)

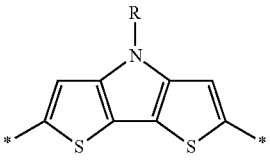
(V-6)

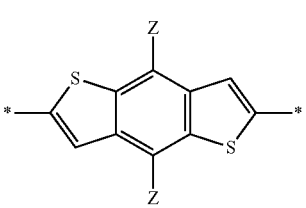
(V-7)

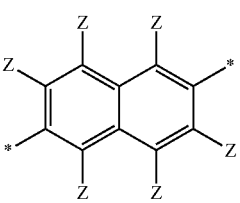
(V-8)

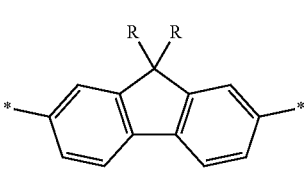
(V-9)

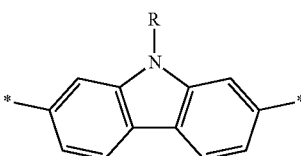
(V-10)

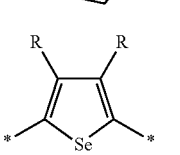
(V-11)

-continued

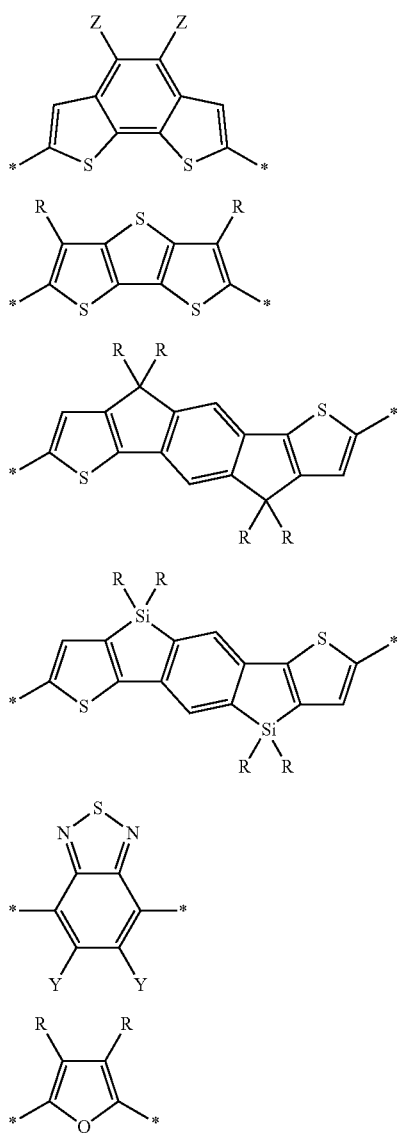

in Formulae (V-1) to (V-17), * represents a position where the divalent linking group is bonded to any of Ar$^1$ to Ar$^4$ and Ar$^{101}$ to Ar$^{104}$ when m, m$^{101}$, p, or p$^{101}$ is 1, and represents a position where the divalent linking group is bonded to any of Ar$^1$ to Ar$^4$, Ar$^{101}$ to Ar$^{104}$, and the divalent linking groups represented by Formulae (V-1) to (V-17) when m, m$^{101}$, p, or p$^{101}$ is equal to or greater than 2; each R in Formulae (V-1), (V-2), (V-5), (V-6), (V-9) to (V-11), (V-13) to (V-15), and (V-17) independently represents a hydrogen atom or an alkyl group; the groups adjacent to each other represented by R may form a ring by being bonded to each other; each Z in Formulae (V-4), (V-7), (V-8), and (V-12) independently represents a hydrogen atom, an alkyl group, or an alkoxy group; the groups adjacent to each other represented by Z may form a ring by being bonded to each other; each Y in Formula (V-16) independently represents a hydrogen atom, an alkyl group, an alkoxy group, a CN group, or a F atom; and the groups adjacent to each other represented by Y may form a ring by being bonded to each other.

20. The compound according to claim 19,
wherein in Formulae (1-1), (1-2), (101-1) and (101-2), each of V$^1$, V$^2$, V$^{101}$, and V$^{102}$ is independently a divalent linking group represented by any of Formulae (V-1) to (V-8) and (V-11) to (V-15).

21. The compound according to claim 14,
wherein in Formulae (1-1), (1-2), (101-1) and (101-2), each of Ar$^1$ to Ar$^4$ and Ar$^{101}$ to Ar$^{104}$ is independently a divalent linking group represented by the following Formula (4-1), (4-2), or (4-3);

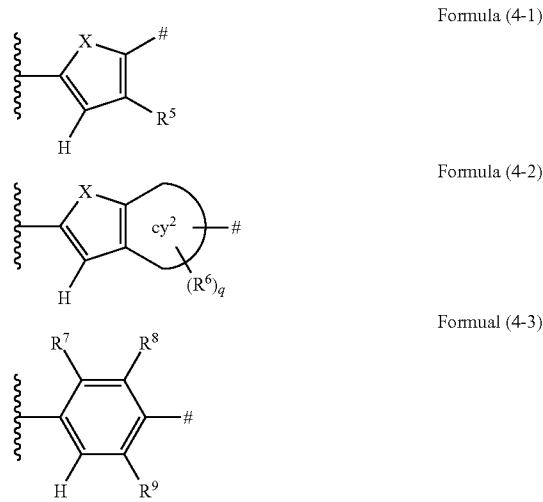

in Formulae (4-1) to (4-3), X represents a S atom, an O atom, or a Se atom; Cy$^2$ represents a structure in which 1 to 4 rings are condensed; each of R$^5$ to R$^9$ independently represents a hydrogen atom or a substituent; q represents an integer of 0 to 6; when q is equal to or greater than 2, two or more groups represented by R$^6$ may be the same as or different from each other; the wavy line represents a position where the divalent linking group is bonded to a cyclohexadienone ring-condensed site; and #represents a position where the divalent linking group is bonded to V$^1$, V$^2$, V$^{101}$, or V$^{102}$.

22. The compound according to claim 21,
wherein in Formulae (1-1), (1-2), (101-1) and (101-2), each of Ar$^1$ to Ar$^4$ and Ar$^{101}$ to Ar$^{104}$ is independently a divalent linking group represented by Formula (4-1) or (4-2).

23. The compound according to claim 21,
wherein the divalent linking group represented by Formula (4-2) is a divalent linking group represented by any of the following Formulae (5-1) to (5-8);

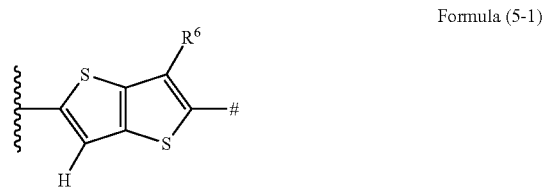

-continued

Formula (5-2)
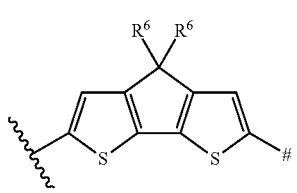

Formula (5-3)
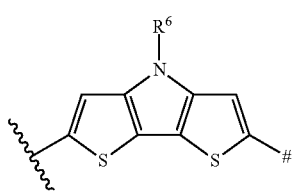

Formula (5-4)
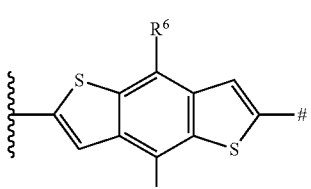

Formula (5-5)
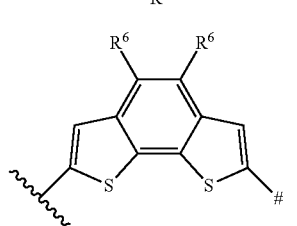

Formula (5-6)
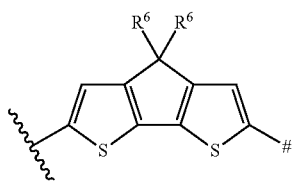

Formula (5-7)
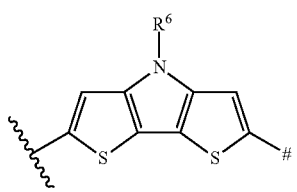

Formula (5-8)
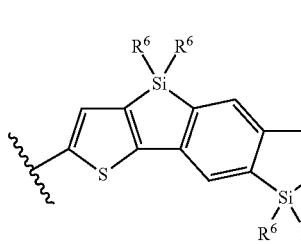

in Formulae (5-1) to (5-8), $R^6$ represents a hydrogen atom or a substituent; two or more groups represented by $R^6$ may be the same as or different from each other; the wavy line represents a position where the divalent linking group is bonded to a cyclohexadienone ring-condensed site; and #represents a position where the divalent linking group is bonded to $V^1$, $V^2$, $V^{101}$, or $V^{102}$.

24. The compound according to claim 14,
wherein each of at least one of $R^{11}$ to $R^{14}$ in Formula (1-1), at least one of $R^{15}$ to $R^{18}$ in Formula (1-2), at least one of $R^{111}$ to $R^{114}$ in Formula (101-1) and at least one of $R^{115}$ to $R^{118}$ in Formula (101-2) is a group represented by the following Formula (W);

-L-R    Formula (W)

in Formula (W), L represents a divalent linking group represented by any of the following Formulae (L-1) to (L-12) or a divalent linking group formed by bonding of two or more divalent linking groups represented by any of the following Formulae (L-1) to (L-12); R represents a substituted or unsubstituted alkyl group, an oligo-oxyethylene group in which a repetition number v of an oxyethylene unit is equal to or greater than 2, an oligosiloxane group having two or more silicon atoms, or a substituted or unsubstituted silyl group; and R represents a substituted or unsubstituted silyl group only when L adjacent to R is a divalent linking group represented by any of the following Formulae (L-1) to (L-3); and

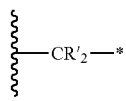 (L-1)

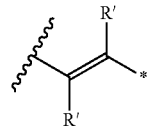 (L-2)

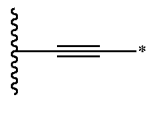 (L-3)

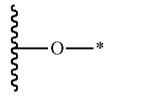 (L-4)

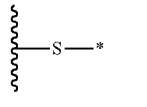 (L-5)

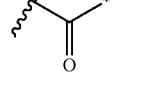 (L-6)

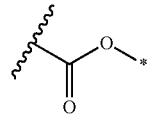 (L-7)

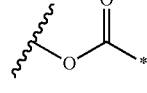 (L-8)

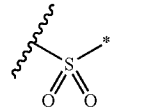 (L-9)

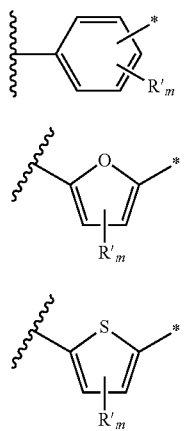

in Formulae (L-1) to (L-12), the portion of a wavy line represents a position where the divalent linking group is bonded to a cyclohexadienone skeleton; * represents a position where the divalent linking group is bonded to any of the divalent linking groups represented by Formulae (L-1) to (L-12) and R; m in Formula (L-10) is 4; m in Formulae (L-11) and (L-12) is 2; and each R' in Formulae (L-1), (L-2), (L-10), (L-11), and (L-12) independently represents a hydrogen atom or a substituent.

25. The compound according to claim 24,
wherein in Formula (W), L is a divalent linking group represented by any of Formulae (L-1), (L-4), and (L-8) or a divalent linking group formed by bonding of two or more divalent linking groups described above.

26. The compound according to claim 14,
wherein in Formulae (1-1), (1-2), (101-1) and (101-2), each n is independently equal to or greater than 10.

27. A composition comprising:
the compound according to claim 14; and
an organic solvent.

28. The composition according to claim 27,
wherein the organic solvent is an aromatic hydrocarbon-based solvent, an ether-based solvent, or a ketone-based solvent.

29. An organic semiconductor material for a non-light-emitting organic semiconductor device, comprising:
the compound according to claim 14.

30. A material for an organic film transistor, comprising:
the compound according to claim 14.

31. A coating solution for a non-light-emitting organic semiconductor device, comprising:
the compound according to claim 14.

32. A coating solution for a non-light-emitting organic semiconductor device, comprising:
the compound according to claim 14; and
a polymer binder.

33. An organic semiconductor film for a non-light-emitting organic semiconductor device, comprising:
the compound according to claim 14.

34. An organic semiconductor film for a non-light-emitting organic semiconductor device, comprising:
the compound according to claim 14; and
a polymer binder.

35. The organic semiconductor film for a non-light-emitting organic semiconductor device according to claim 33 that is prepared by a solution coating method.

* * * * *